United States Patent [19]

King et al.

[11] 4,387,423
[45] Jun. 7, 1983

[54] MICROPROGRAMMED SYSTEM HAVING SINGLE MICROSTEP APPARATUS

[75] Inventors: Richard L. King, Hollis, N.H.; John J. Bradley, Framingham; Ming T. Miu, Chelmsford, both of Mass.

[73] Assignee: Honeywell Information Systems Inc., Waltham, Mass.

[21] Appl. No.: 12,676

[22] Filed: Feb. 16, 1979

[51] Int. Cl.³ ............................................. G06F 13/00
[52] U.S. Cl. ................................... 364/200; 365/222
[58] Field of Search ........................................ 365/222; 364/200 MS File, 900 MS File; 307/208; 371/9

[56] References Cited

U.S. PATENT DOCUMENTS

| | | | |
|---|---|---|---|
| 3,077,984 | 2/1963 | Johnson | 364/200 |
| 3,609,391 | 9/1971 | Hatano | 307/208 |
| 3,786,430 | 1/1974 | Hajdu et al. | 364/200 |
| 3,796,998 | 3/1974 | Appelt | 365/222 |
| 3,810,129 | 3/1974 | Behman et al. | 365/222 |
| 3,813,531 | 5/1974 | King | 364/200 X |
| 3,846,765 | 11/1974 | Devries | 365/222 |
| 3,909,802 | 9/1975 | Cassarino, Jr. | 364/200 |
| 3,980,935 | 9/1976 | Worst | 365/228 |
| 4,048,481 | 9/1977 | Bailey, Jr. et al. | 364/200 |
| 4,063,221 | 12/1977 | Watson et al. | 364/900 |
| 4,106,108 | 8/1978 | Cislaghi et al. | 365/222 |
| 4,112,513 | 9/1978 | Elsner | 365/222 |

Primary Examiner—James D. Thomas
Assistant Examiner—David Y. Eng
Attorney, Agent, or Firm—William A. Linnell; Nicholas Prasinos

[57] ABSTRACT

In a data processing system which includes a central processing unit and one or more main memory units comprised of semiconductor dynamic random access memory chips, logic is provided within the system to provide for the single stepping of the central processing unit clock thereby allowing for the execution of one CPU cycle. The system logic is organized such that the memory refresh command signals, which are normally generated by the CPU, are generated by the single step logic thereby maintaining the contents of the main memory modules. The logic of the overall data processing system is organized such that most transfers of information between the main memory, the CPU and I/O controllers, to which peripheral devices are connected, may take place in the single step mode of operation without the loss of information.

8 Claims, 64 Drawing Figures

SYSTEM CONFIGURATION

SYSTEM CONFIGURATION

EXAMPLE SYSTEM CONFIGURATION

CPU REGISTERS

WORD AND ADDRESS FORMATS

SYSTEM BUS ADDRESS / DATA LINE FORMATS

| FUNCTION | MNEMONIC | TYPE LINE | ON BUS | SOURCE | DESCRIPTION |
|---|---|---|---|---|---|
| ADDRESS/ DATA | BUSA00+ THROUGH BUSA15+ | TRI | A | CPU/IOC | SIXTEEN BIDIRECTIONAL LINES TRANSMIT DATA, WORD ADDRESSES AND CONTROL INFORMATION BETWEEN I/O CONTROLLERS, MAIN MEMORY, AND THE CPU. |
| | BUSB00+ THROUGH BUSB15+ | TRI | B | CPU/IOC | |
| BYTE OFFSET | PBYTEX+ | OC | A/B | CPU/IOC | THIS BIDIRECTIONAL LINE IS USED:<br><br>1 BY THE CPU DURING AN OUTPUT ADDRESS SEQUENCE TO INDICATE TO A DMA I/O CONTROLLER THAT THE FIRST DMA DATA TRANSFER DEALS WITH BYTE 1 OF THE WORD IN THE ADDRESS ON ADDRESS/DATA LINES.<br><br>PBYTEX LOW (A BINARY ZERO) = BYTE 0 (BITS 0-7)<br>PBYTEX HIGH (A BINARY ONE) = BYTE 1 (BITS 8-15)<br><br>2. BY AN I/O CONTROLLER (AT PROCEED TIME) TO NOTIFY THE CPU OF THE TYPE (DMA OR DMC) OF I/O CONTROLLER BEING ADDRESSED.<br><br>PBYTEX LOW = DMA IOC<br>PBYTEX HIGH = DMC IOC<br><br>3. BY AN I/O CONTROLLER DURING AN INTERRUPT SEQUENCE TO INDICATE THAT THIS IS A BACKSPACE INTERRUPT FROM A DMC I/O CONTROLLER |

SYSTEM BUS A AND B INTERFACE SIGNALS SHEET 1 OF 7

FIG. 6

| FUNCTION | MNEMONIC | TYPE LINE | ON BUS | SOURCE | DESCRIPTION |
|---|---|---|---|---|---|
| ENCODED COMMAND | RDDT29+BA THROUGH RDDT31+BA  RDDT29+BB THROUGH RDDT31+BB | TTL | A  B | CPU | THREE ENCODED LINES FROM THE CPU FIRMWARE CONTROL WORD WHICH GENERATE CONTROL COMMANDS TO I/O CONTROLLERS WHEN COMMAND STROBE (PIOCTX) IS LOW (A BINARY ZERO).  SEE FIGURE 18 FOR THE I/O COMMAND CODES. |
| COMMAND STROBE | PIOCTA-  PIOCTB- | TTL | A  B | CPU | THIS LINE INDICATES TO THE I/O CONTROLLER THAT LINES RDDT29, 30 AND 31 ARE VALID FOR DECODING THE COMMAND. IT IS ACTIVE WHEN LOW (A BINARY ZERO) AND IS GENERATED FROM THE CPU FIRMWARE WORD. |
| CYCLE TIME IN/OUT | BCYCOT-BA  BCYCOT-BB | TTL | A  B | CPU | THIS SIGNAL IS GENERATED BY THE CPU EVERY FOUR MICROSECONDS FOR A DURATION OF 500 NS. THIS SIGNAL IS ACTIVE WHEN LOW (A BINARY ZERO). IT IS PASSED TO THE NEXT I/O CONTROLLER WHICH NAMES THE SIGNAL BCYCIN. EACH CONTROLLER DELAYS THE SIGNAL 500 NS BEFORE PASSING IT ON TO THE NEXT CONTROLLER ON THE SYSTEM BUS. THE INTERVAL DURING WHICH AN I/O CONTROLLER DELAYS THE SIGNAL DEFINES THE PERIOD IN WHICH THAT I/O CONTROLLER CAN MAKE A SYSTEM BUS REQUEST. |

SYSTEM BUS A AND B INTERFACE SIGNALS
SHEET 2 OF 7

FIG. 6

| FUNCTION | MNEMONIC | TYPE LINE | ON BUS | SOURCE | DESCRIPTION |
|---|---|---|---|---|---|
| PRIMARY TIME 3 | PTIME3-BA<br><br>PTIME3-BB | TTL | A<br><br>B | CPU | THIS SIGNAL IS DEVELOPED FROM TIME 3 OF THE CPU CLOCK AND IS USED BY THE I/O CONTROLLERS TO SET/RESET CONDITIONS ON THE SYSTEM BUS AND TO ACT AS A DATA STROBE. THIS SIGNAL IS ACTIVE WHEN LOW (A BINARY ZERO). |
| INITIALIZE | PCLEAR-BA<br><br>PCLEAR-BB | TTL | A<br><br>B | CPU | THIS LINE INITIALIZES THE I/O CONTROLLERS AND INITIATES THE I/O CONTROLLER'S QLT FIRMWARE. THIS SIGNAL IS ACTIVE WHEN LOW (A BINARY ZERO). |
| ENABLE DATA DRIVERS | PENBSA-<br><br>PENBSB- | TTL | A<br><br>B | CPU | THIS LINE ALLOWS AN I/O CONTROLLER TO DELIVER ADDRESS, DATA OR INTERRUPT INFORMATION ON THE SYSTEM BUS BY ENABLING THE I/O CONTROLLER'S DRIVERS. THIS SIGNAL IS ACTIVE WHEN LOW (A BINARY ZERO). |
| PROCEED | PROCED-2A<br><br>PROCED-2B | OC | A<br><br>B | CPU/IOC | THIS BIDIRECTIONAL LINE IS ACTIVE WHEN LOW (A BINARY ZERO) AND IS USED:<br><br>1. BY THE CPU TO NOTIFY AN I/O CONTROLLER THAT THE CPU ACCEPTED THE LAST INTERRUPT ON THE SYSTEM BUS.<br><br>2. BY AN I/O CONTROLLER TO NOTIFY THE CPU THAT THE I/O CONTROLLER ACCEPTED THE LAST COMMAND ON THE SYSTEM BUS RDDT LINES. |

SYSTEM BUS A AND B INTERFACE SIGNALS
SHEET 3 OF 7

FIG. 6

| FUNCTION | MNEMONIC | TYPE LINE | ON BUS | SOURCE | DESCRIPTION |
|---|---|---|---|---|---|
| PROCEED (CON'T.) | | | | | 3. BY AN I/O CONTROLLER IN CONJUNCTION WITH THE PBUSY LINE ALSO BEING LOW (A BINARY ZERO) TO INDICATE THAT THE I/O CONTROLLER IS TEMPORARILY BUSY AND THAT THE CPU SHOULD WAIT AND RETRY THE COMMAND. |
| BUSY | PBUSY-2A<br>PBUSY-2B | OC | A<br>B | CPU/IOC | THIS BIDIRECTIONAL LINE IS ACTIVE WHEN LOW (A BINARY ZERO) AND IS USED:<br><br>1. BY THE CPU TO NOTIFY AN I/O CONTROLLER THAT THE CPU DID NOT ACCEPT THE LAST INTERRUPT. (IOC STACKS INTERRUPT).<br><br>2. BY AN I/O CONTROLLER TO NOTIFY THE CPU THAT I/O CONTROLLER IS BUSY AND CANNOT ACCEPT THE I/O COMMAND.<br><br>3. BY AN I/O CONTROLLER IN CONJUNCTION WITH THE PBUSY LINE ALSO BEING LOW (A BINARY ZERO) TO INDICATE THAT THE I/O CONTROLLER IS TEMPORARILY BUSY AND THAT THE CPU SHOULD WAIT AND RETRY THE COMMAND. |
| DMA DATA REQUEST | PDMAR1-<br>PDMAR2- | OC | A<br>B | IOC | THIS LINE WHEN LOW (A BINARY ZERO) INDICATES A DMA I/O CONTROLLER HAS DATA TO TRANSFER TO MAIN MEMORY OR IS REQUESTING DATA FROM MAIN MEMORY. |

SYSTEM BUS A AND B INTERFACE SIGNALS SHEET 4 OF 7

FIG. 6

| FUNCTION | MNEMONIC | TYPE LINE | ON BUS | SOURCE | DESCRIPTION |
|---|---|---|---|---|---|
| DMC DATA REQUEST | PDMCR1-<br><br>PDMCR2- | OC | A<br><br>B | IOC | THIS LINE WHEN LOW (A BINARY ZERO) INDICATES A DMC I/O CONTROLLER HAS DATA TO TRANSFER TO MAIN MEMORY OR IS REQUESTING DATA FROM MAIN MEMORY. |
| INTERRUPT REQUEST | PINTR1-<br><br>PINTR2- | OC | A<br><br>B | IOC | THIS LINE WHEN LOW (A BINARY ONE) INDICATES THAT AN I/O CONTROLLER HAS AN INTERRUPT PENDING. |
| WRITE BYTE 0 | PWRTB0+ | OC | A/B | CPU/IOC | IF THIS LINE IS DRIVEN HIGH (A BINARY ONE) DURING A MEMORY ACCESS SEQUENCE, BITS 0 THROUGH 7 ARE WRITTEN INTO MEMORY. |
| WRITE BYTE 1 | PWRTB1+ | OC | A/B | CPU/IOC | IF THIS LINE IS DRIVEN HIGH (A BINARY ONE) DURING A MEMORY ACCESS SEQUENCE, BITS 8 THROUGH 15 ARE WRITTEN INTO MEMORY. IF BOTH LINES PWRTB0 AND PWRTB1 ARE LOW (A BINARY ZERO) DURING A MEMORY ACCESS SEQUENCE, BITS 0 THROUGH 15 (A WORD) ARE READ FROM MEMORY. |
| MAIN MEMORY ERROR | MEMPER- | OC | B | MEM/CPU | THIS LINE WHEN LOW (A BINARY ZERO) INDICATES TO THE CPU OR I/O CONTROLLER THAT MAIN MEMORY DETECTED A PARITY ERROR WHILE READING A FULL WORD OR IT INFORMS AN I/O CONTROLLER THE CPU DETECTED AN ATTEMPT TO ACCESS A NONEXISTENT MAIN MEMORY LOCATION. |

SYSTEM BUS A AND B INTERFACE SIGNALS
SHEET 5 OF 7

*FIG. 6*

| FUNCTION | MNEMONIC | TYPE LINE | ON BUS | SOURCE | DESCRIPTION |
|---|---|---|---|---|---|
| MAIN MEMORY ERROR | PMMPAR- | TTL | A | CPU | THIS LINE WHEN LOW (A BINARY ZERO) NOTIFIES AN I/O CONTROLLER THAT THE CPU HAS DETECTED AN ATTEMPT TO ACCESS A NONEXISTENT MAIN MEMORY LOCATION OR THAT THE CPU IS RELAYING A MAIN MEMORY DETECTED PARITY ERROR. |
| MEMORY GO | PMEMGO- | TTL | B | CPU | WHEN THIS LINE IS DRIVEN LOW (A BINARY ZERO) BY THE CPU IT INDICATES TO THE MAIN MEMORY THAT THE MEMORY SHOULD INITIATE A READ/WRITE/REFRESH CYCLE. |
| MEMORY REFRESH | PMFRSH- | TTL | B | CPU | WHEN THIS LINE IS DRIVEN LOW (A BINARY ZERO) BY THE CPU IT CAUSES MOS MAIN MEMORY TO PERFORM A MEMORY REFRESH CYCLE. |
| ENABLE MEMORY DATA DRIVERS | PBSFMD- | TTL | B | CPU | WHEN THIS LINE IS DRIVEN LOW (A BINARY ZERO) BY THE CPU IT ALLOWS MAIN MEMORY TO PLACE READ DATA ON THE BUS BY ENABLING THE MEMORY DRIVERS. |
| MEMORY VALID | MEMVAL- | TTL | A | MS | THIS SIGNAL IS ONLY PRESENT AT THE CPU AND INDICATES TO THE CPU THAT A CHARGED MEMORY SAVE UNIT IS INSTALLED IN THE SYSTEM. |

SYSTEM BUS A AND B INTERFACE SIGNALS
SHEET 6 OF 7

*FIG. 6*

| FUNCTION | MNEMONIC | TYPE LINE | ON BUS | SOURCE | DESCRIPTION |
|---|---|---|---|---|---|
| 60 HZ | BWAC60+ | TTL | A | PS | THIS SIGNAL IS ONLY PRESENT AT THE CPU AND PROVIDES A 60 HZ SIGNAL TO THE CPU FOR THE REAL TIME CLOCK AND WATCHDOG TIMER. |
| POWER ON | BPOWON+ | TTL | A/B | PS | THIS LINE, WHEN HIGH (A BINARY ONE) INDICATES THAT DC VOLTAGE HAS BEEN VALID FOR A MINIMUM OF TWO MILLISECONDS. IF DRIVEN LOW (A BINARY ZERO) IT INDICATES POWER LOSS IN A MINIMUM OF TWO MILLISECONDS. |
| +5VDC<br>+12VDC<br>-12VDC<br>GROUND | ZVP05<br>ZVP12<br>ZVN12<br>ZGND | | A/B | PS<br>PS<br>PS<br>PS | +5VDC SYSTEM POWER<br>+12VDC SYSTEM POWER<br>-12VDC SYSTEM POWER<br>GROUND |

DEFINITIONS

TRI   TRI-STATE LINE
OC    OPEN COLLECTOR LINE
      (PULLUP REGISTERS IN CPU)
TTL   TRANSISTOR TO TRANSISTOR LINE
CPU   CENTRAL PROCESSOR
IOC   I/O CONTROLLER
MEM   MAIN MEMORY
PS    POWER SUPPLY
MS    MEMORY SAVE UNIT

SYSTEM BUS A AND B INTERFACE SIGNALS
SHEET 7 OF 7

FIG. 6

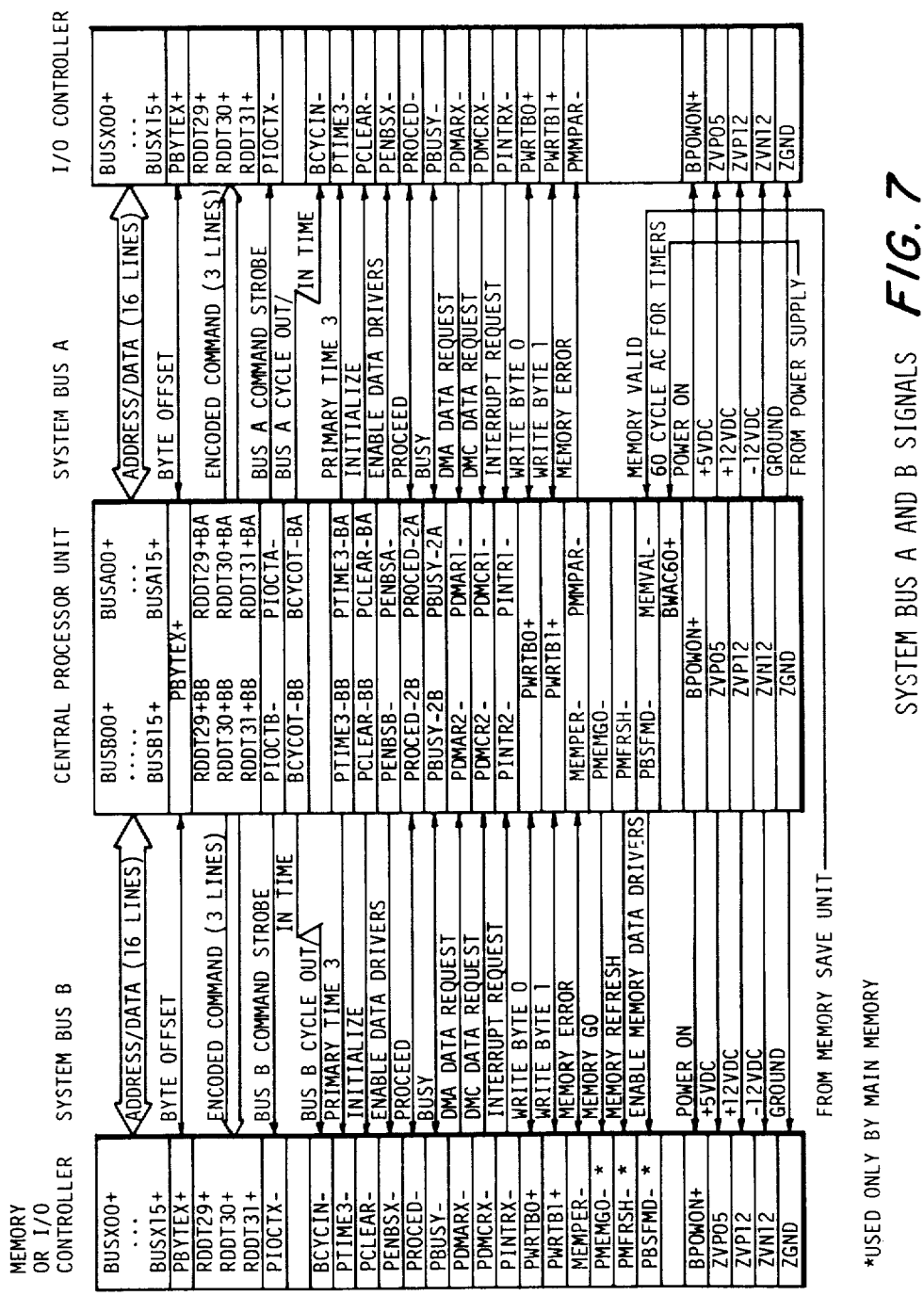
FIG. 7 SYSTEM BUS A AND B SIGNALS

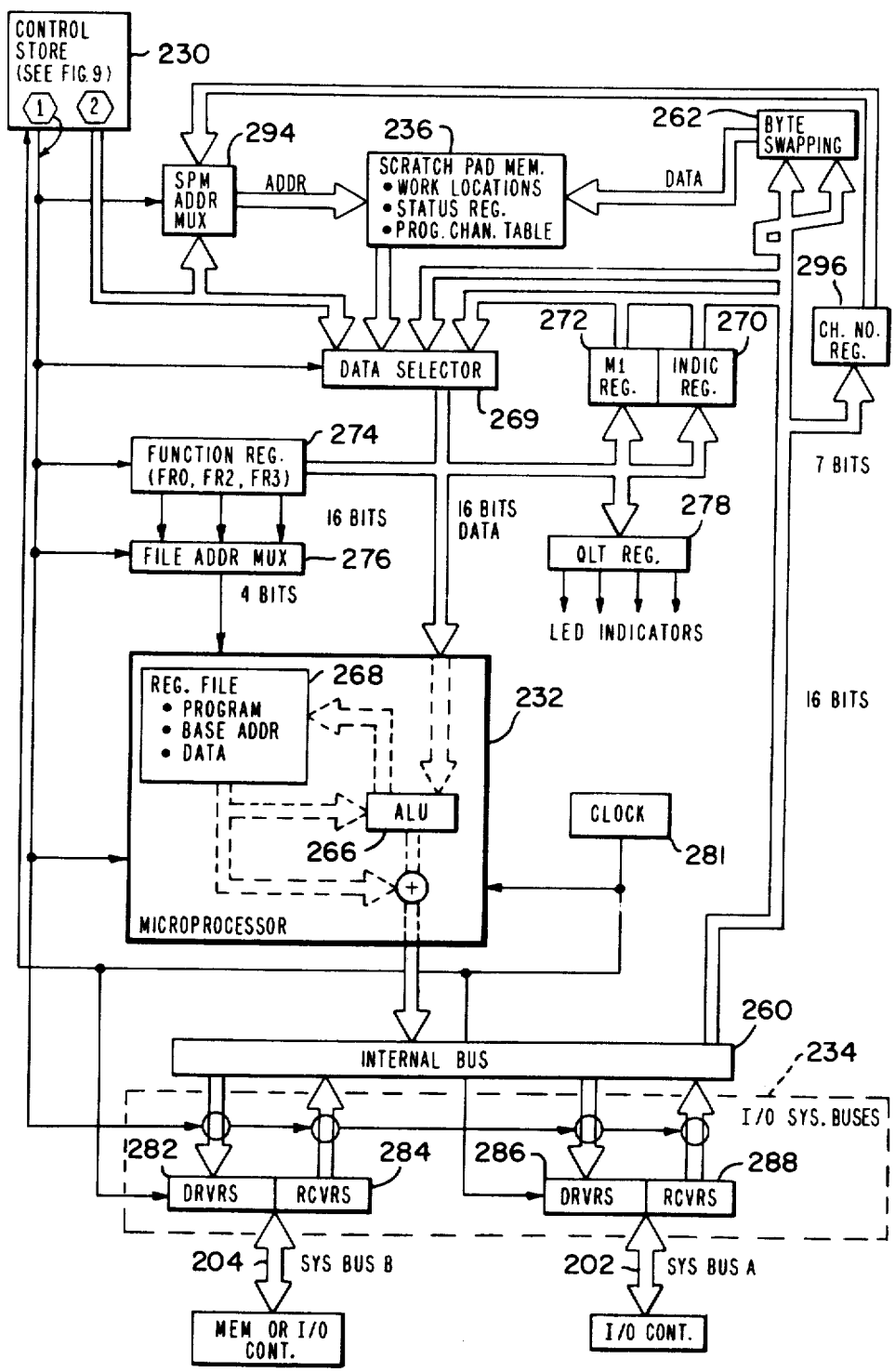
FIG. 8 CPU BLOCK DIAGRAM

CONTROL STORE BLOCK DIAGRAM

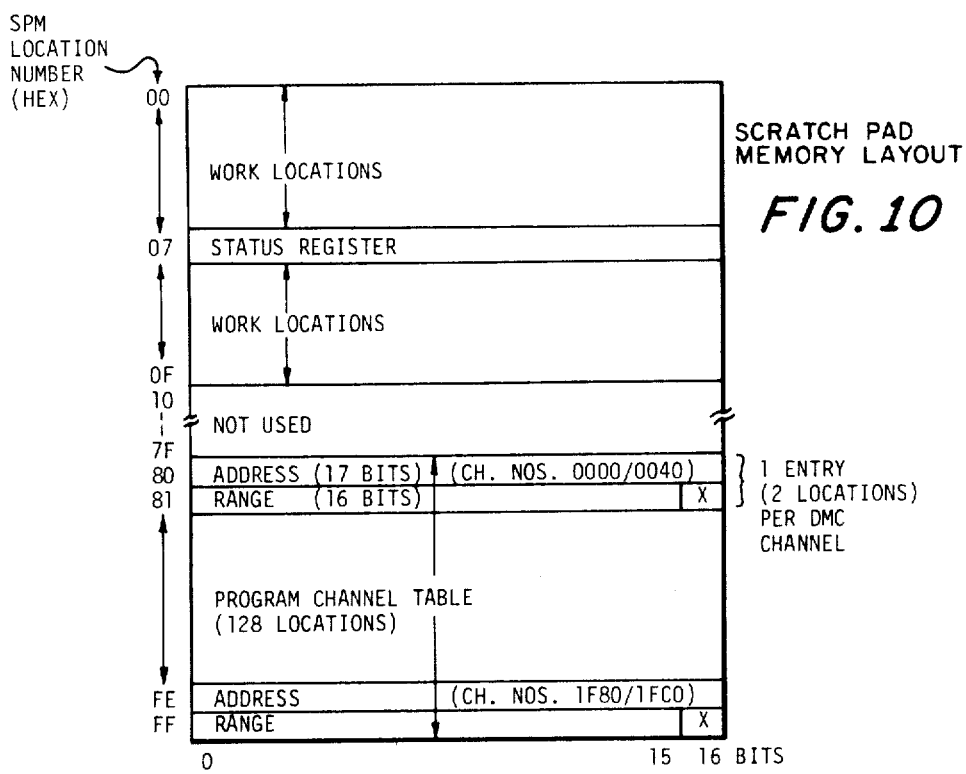

SCRATCH PAD MEMORY LAYOUT

FIG. 10

| REGISTER - CONTENTS | MAINTAINED IN |
|---|---|
| PANEL ENTERED MEMORY ADDRESS | SPM WORK LOC. (USUALLY LOC. 01) |
| MEMORY DATA | SPM WORK LOC. (USUALLY LOC. 00) |
| BASE REGISTERS (B1 THRU B7) | MICROPROCESSOR REGISTER FILE |
| MASK REGISTER (M1) | M1 REGISTER |
| INDICATOR REGISTER (I) | I REGISTER |
| INSTRUCTION (DO) | SPM WORK LOC. 02 |
| DATA REGISTER (D1 THRU D7) | MICROPROCESSOR REGISTER FILE |
| PROGRAM COUNTER (P) | MICROPROCESSOR REGISTER FILE |
| PROGRAM COUNTER HISTORY (PH) | SPM WORK LOC. 08 |
| STATUS REGISTER (S) | SPM LOC. 07 |

CPU REGISTERS

FIG. 11

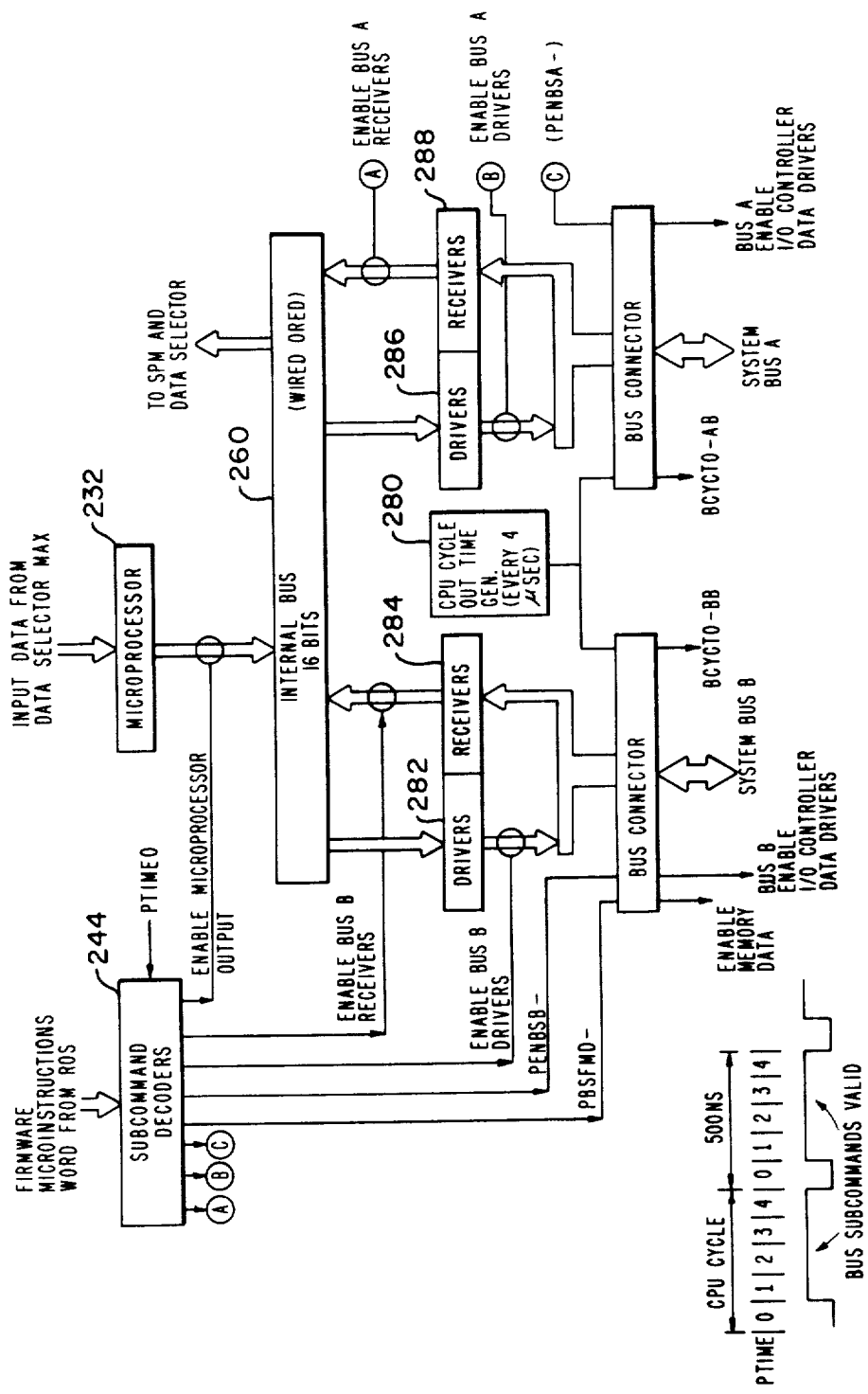
FIG. 12 SYSTEM BUS A & B DATA CONTROL

BASIC SYSTEM TIMING LOGIC

BASIC SYSTEM TIMING

SYSTEM STARTUP/
INITIALIZATION
SEQUENCE

| ENCODED COMMAND LINES RDDT29 RDDT30 RDDT31 | COMMAND NAME | DESCRIPTION |
|---|---|---|
| 000 | ASCMD (ANSWER COMMAND) | INDICATES THAT THE CPU HAS STROBED THE PROCEED OR BUSY RESPONSE OF AN IOC TO A CPU COMMAND INITIATION ATTEMPT |
| 001 | ASINT (ANSWER INTERRUPT) | ACKNOWLEDGES THAT THE CPU HAS RECOGNIZED AN INTERRUPT REQUEST INITIATED BY AN IOC |
| 010 | ASDMA (ANSWER DMA) | ACKNOWLEDGES THAT THE CPU HAS RECOGNIZED A DMA DATA REQUEST INITIATED BY AN IOC |
| 011 | ASDMC (ANSWER DMC) | ACKNOWLEDGES THAT THE CPU HAS RECOGNIZED A DMC DATA REQUEST INITIATED BY AN IOC |
| 100 | CPCMD (CPU COMMAND) | THE CPU HAS INITIATED A COMMAND BY PLACING A CHANNEL NUMBER AND FUNCTION CODE ON THE DATA LINES OF THE SYSTEM BUSES |
| 101 | EOFRG (END-OF-RANGE) | THE CPU HAS SENSED END OF RANGE IN CONJUNCTION WITH THE CURRENT DMC DATA TRANSFER |
| 110 | EOFLK (END-OF-LINK) | THE CURRENT SYSTEM BUS DIALOG SEQUENCE HAS ENDED |
| 111 | RESUM (RESUME INTERRUPTS) | INDICATES TO ALL PERIPHERAL IOC'S THAT THE CPU HAS PERFORMED A LEVEL CHANGE OPERATION, STACKED INTERRUPTS ARE TO BE RETRIED. |

I/O COMMANDS ENCODED ON SYSTEM BUS RDDT LINES

*FIG. 18*

SYSTEM BUS MEMORY ACCESS SEQUENCE

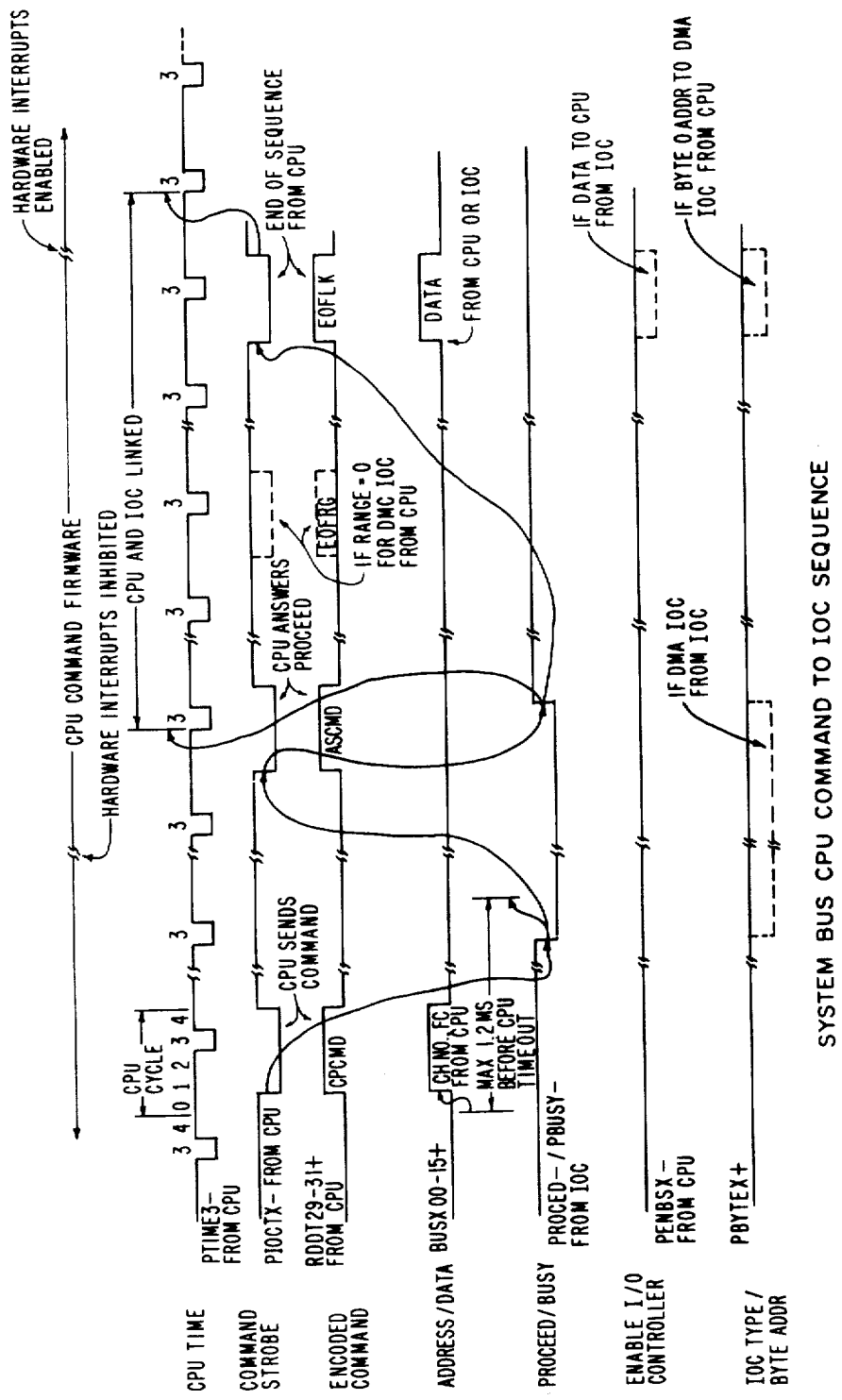
FIG. 20 SYSTEM BUS CPU COMMAND TO IOC SEQUENCE

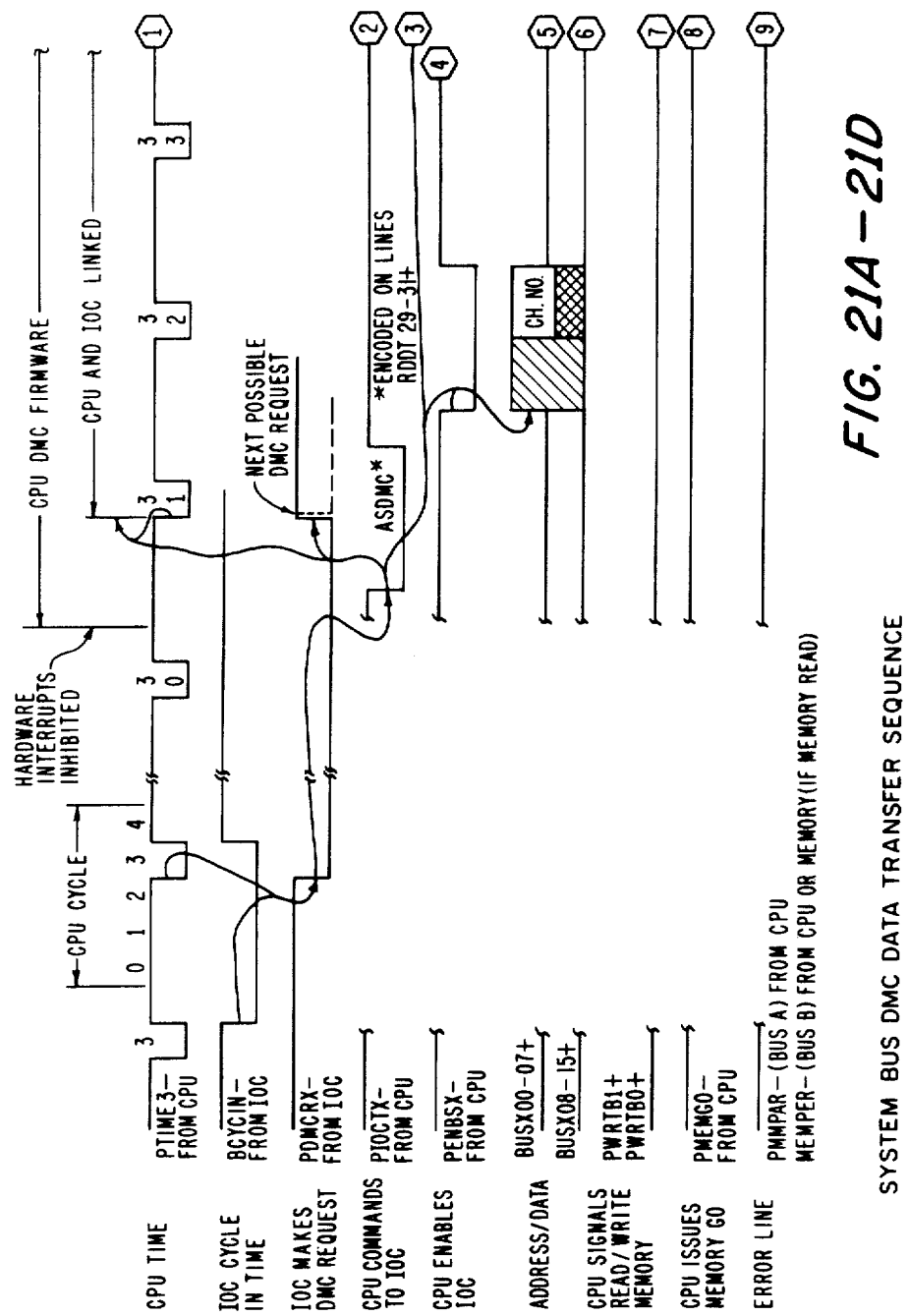

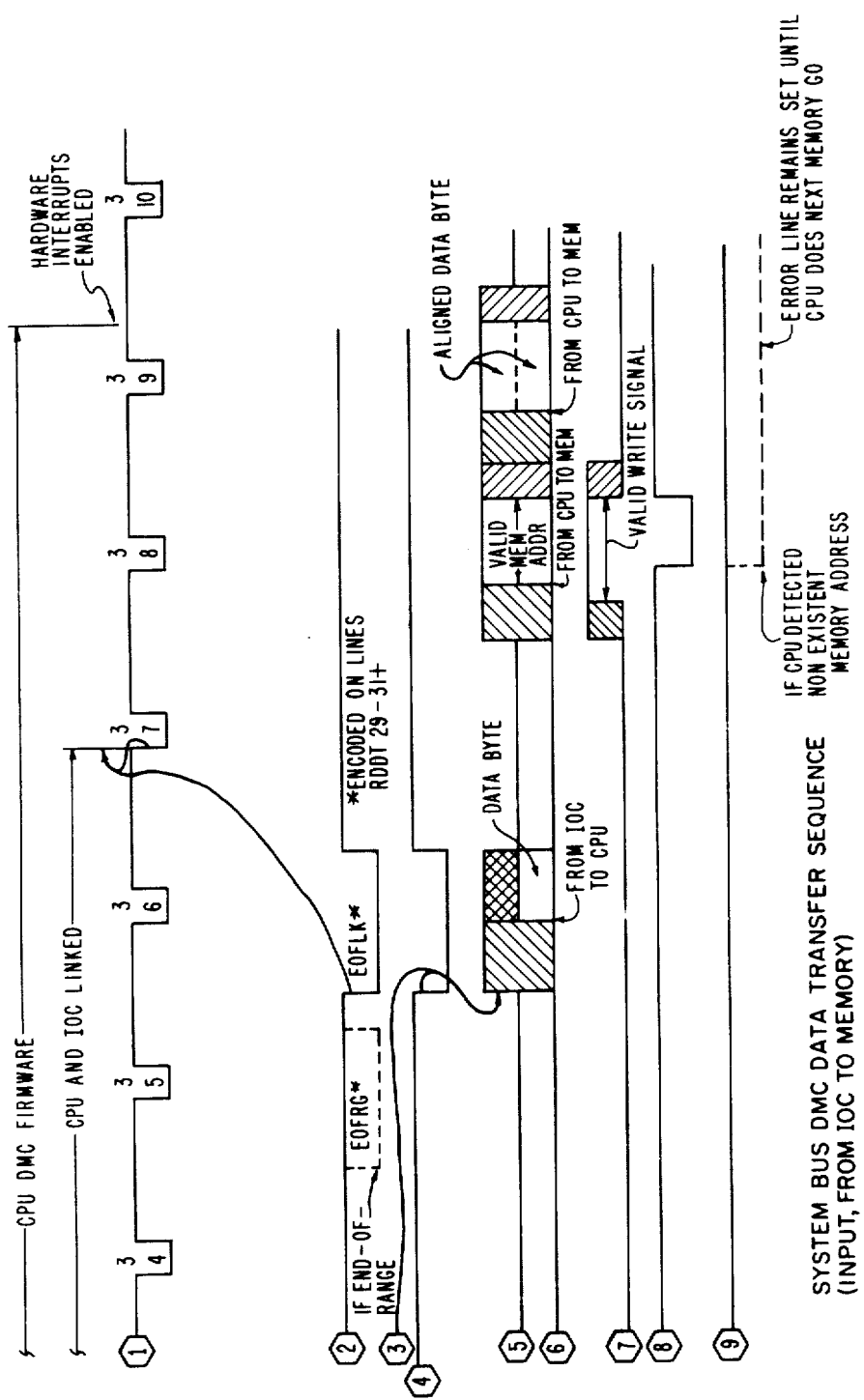
FIG. 21A SHEET 2 OF 2

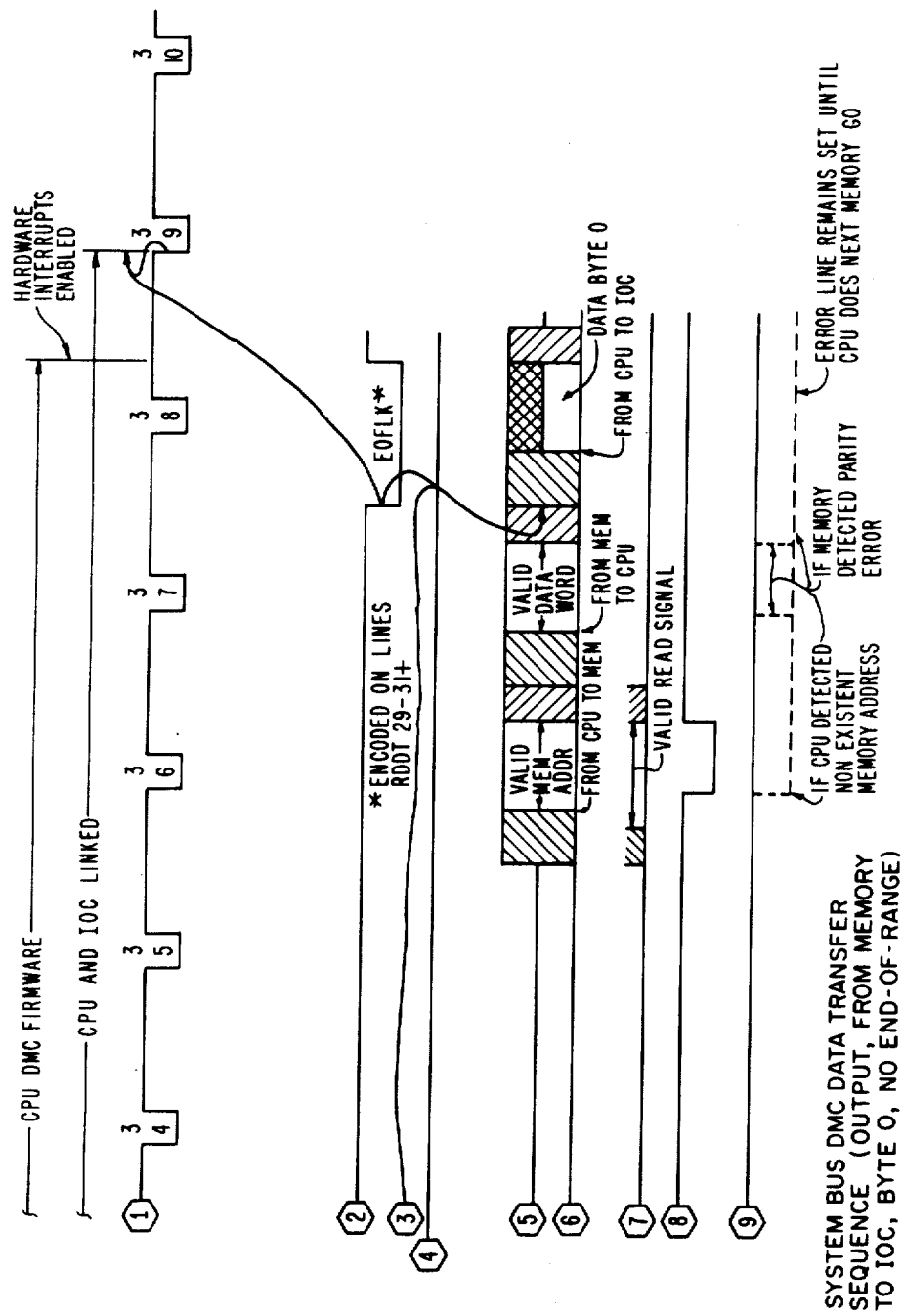
FIG. 21B SHEET 2 OF 2

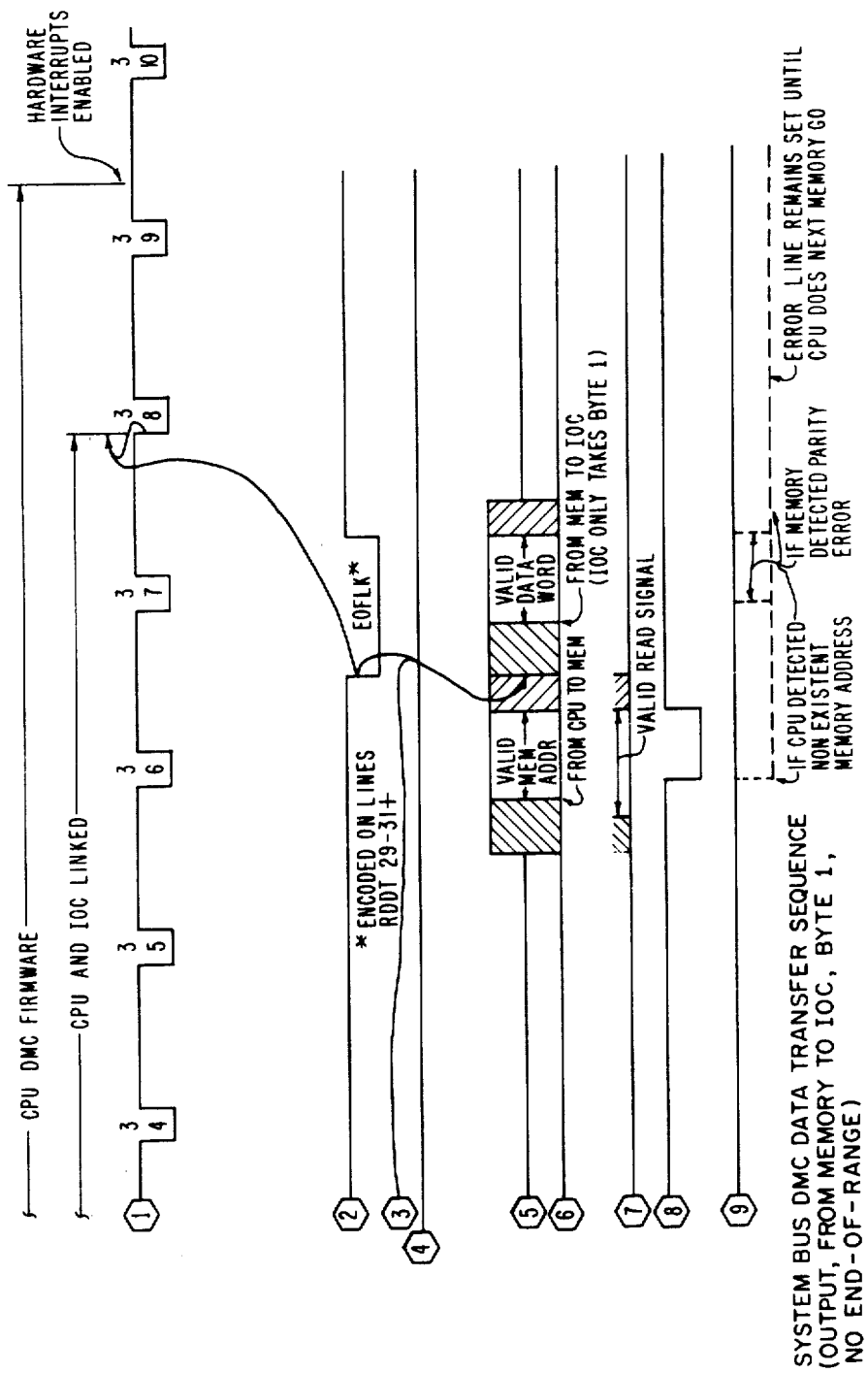

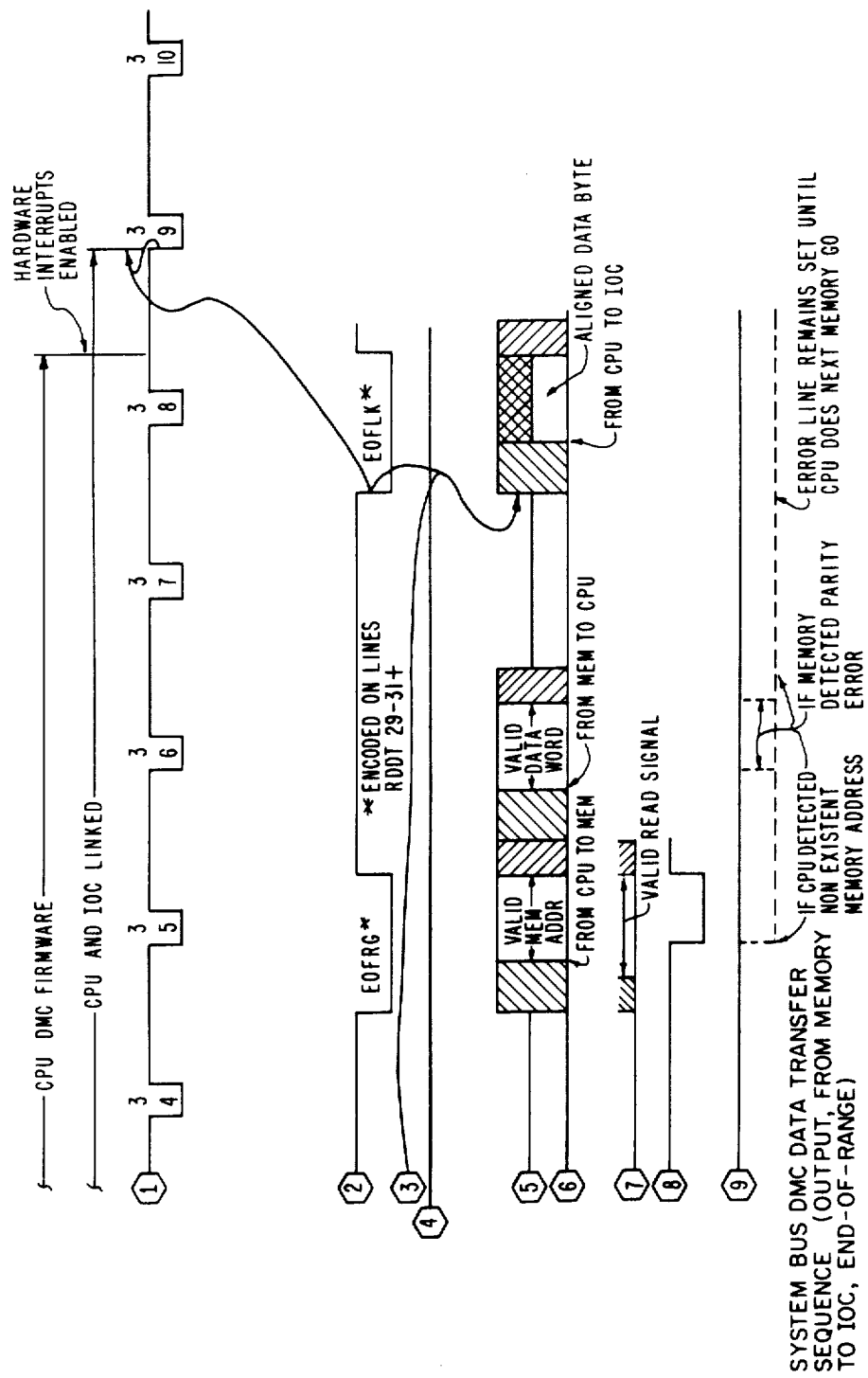
FIG. 21D SHEET 2 OF 2

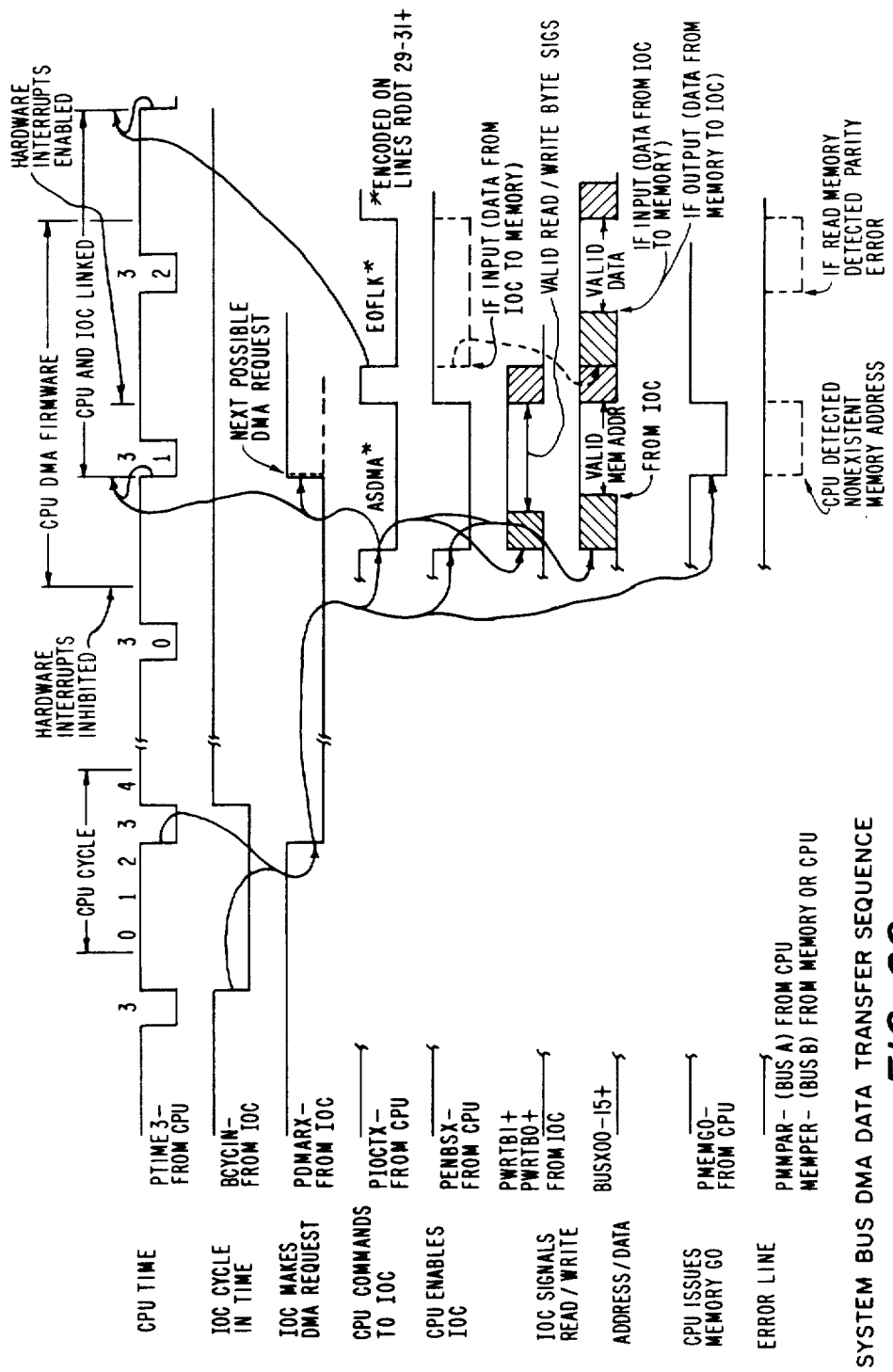
FIG. 22 SYSTEM BUS DMA DATA TRANSFER SEQUENCE

SYSTEM BUS I/O INTERRUPT SEQUENCE

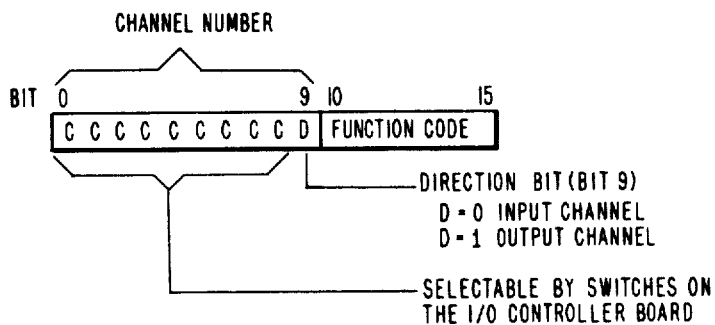
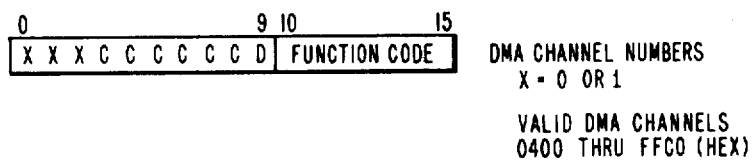
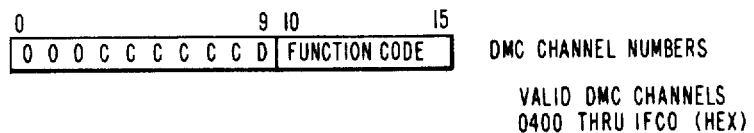
I/O SOFTWARE INSTRUCTION CONTROL WORD FORMAT
*FIG. 24*

| COMMANDS | FUNCTION CODES (HEX) | OPERATION |
|---|---|---|
| OUTPUT (ODD CODES) | 01 | OUTPUT CONTROL WORD |
| | 03 | OUTPUT INTERRUPT CONTROL WORD |
| | 05 | OUTPUT CHANNEL CONTROL WORD |
| | 07 | OUTPUT TASK WORD |
| | 09 | OUTPUT MEMORY ADDRESS |
| | 0D | OUTPUT RANGE |
| | 11 | OUTPUT CONFIGURATION WORD A |
| | 13 | OUTPUT CONFIGURATION WORD B |
| INPUT (EVEN CODES) | 02 | INPUT INTERRUPT CONTROL WORD |
| | 06 | INPUT TASK WORD |
| | 08 | INPUT ADDRESS |
| | 0A | INPUT MODULE |
| | 0C | INPUT RANGE |
| | 10 | INPUT CONFIGURATION WORD A |
| | 12 | INPUT CONFIGURATION WORD B |
| | 18 | INPUT STATUS WORD 1 |
| | 1A | INPUT STATUS WORD 2 |
| | 26 | INPUT DEVICE IDENTIFICATION CODE |

I/O FUNCTION CODES

*FIG. 25*

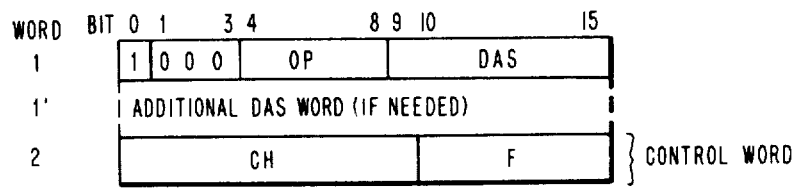
FIG. 26A  IO AND IOH INSTRUCTION FORMAT
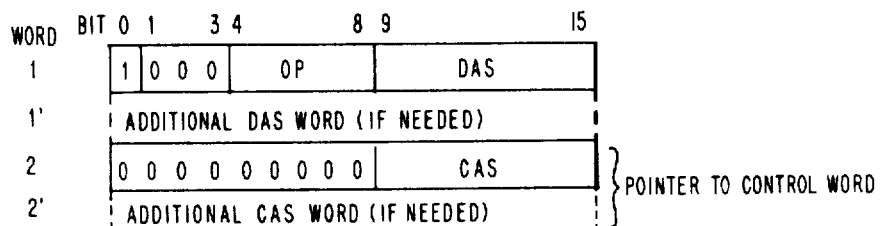
FIG. 26B  IO AND IOH INSTRUCTION FORMAT
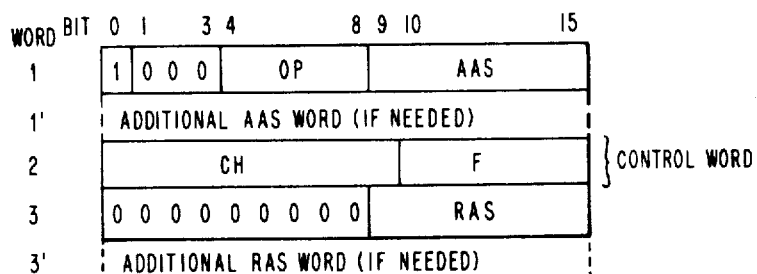
FIG. 27A  IOLD INSTRUCTION FORMAT
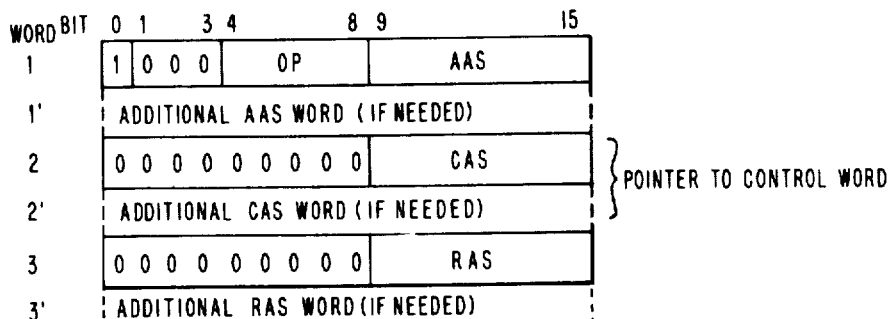
FIG. 27B  IOLD INSTRUCTION FORMAT

IO INSTRUCTION FLOW CHART

IO INSTRUCTION FLOW CHART

IO INSTRUCTION FLOW CHART

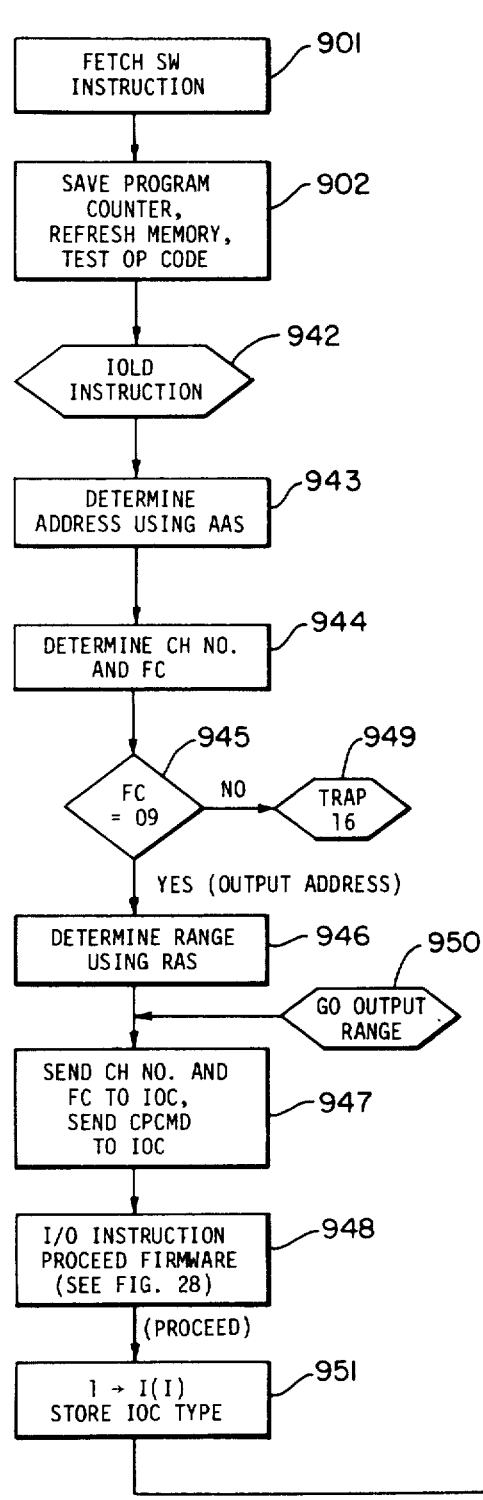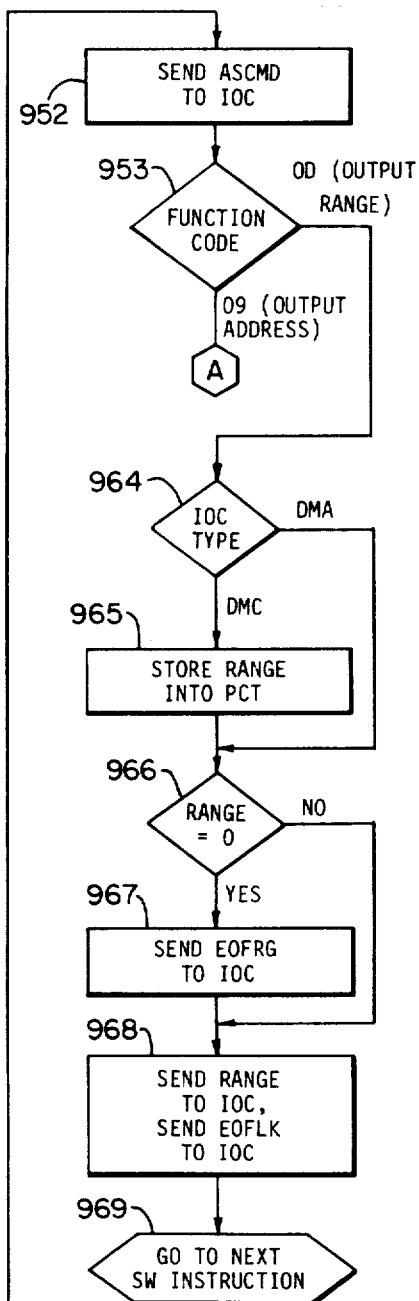
IOLD INSTRUCTION
FLOW CHART
*FIG. 29*
*SHEET 1 OF 2*

IOLD INSTRUCTION FLOW CHART

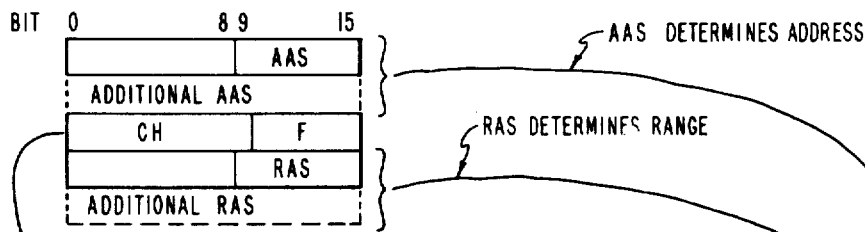
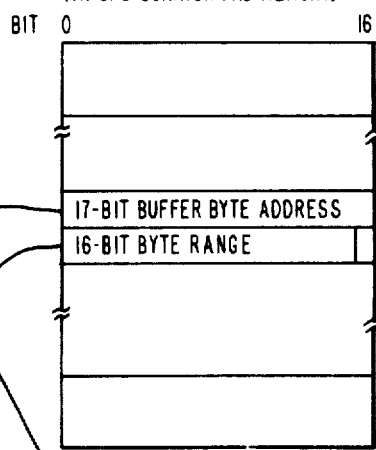
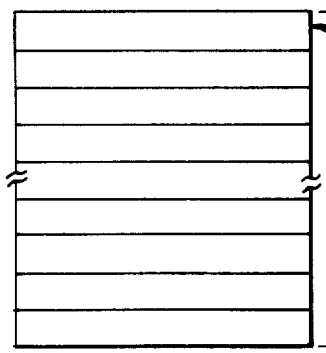
IOLD INSTRUCTION—
PROGRAM CHANNEL
TABLE INTERACTION
FIG. 30

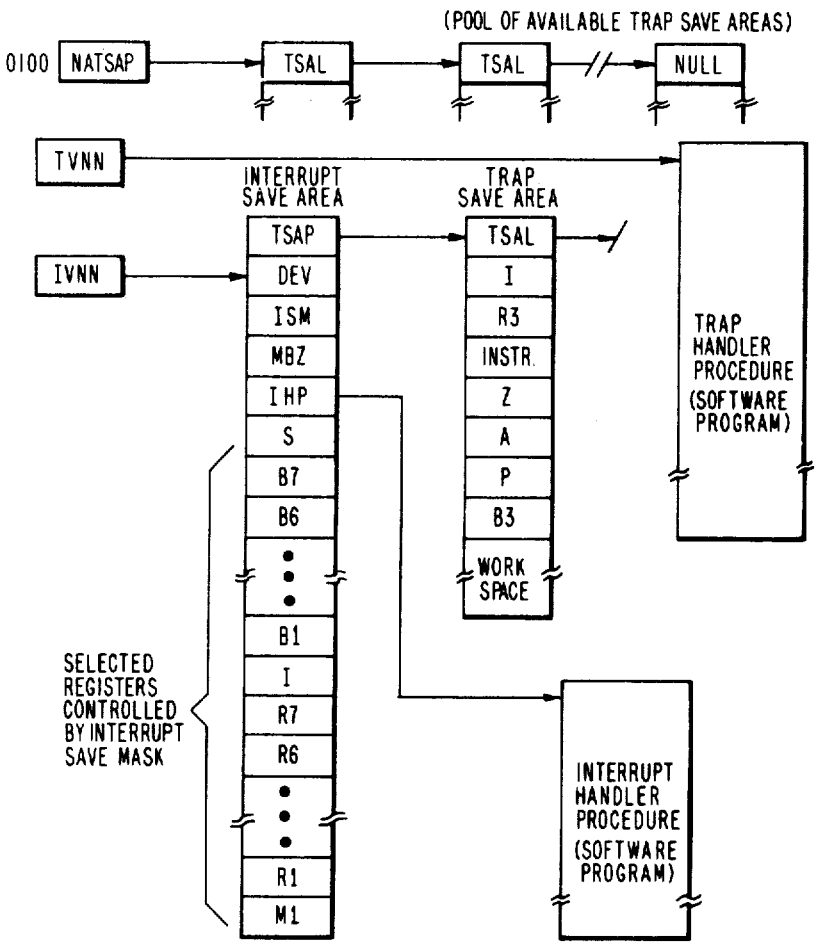

NOTES:

DEV = IDENTITY OF INTERRUPTING DEVICE (CHANNEL NUMBER AND INTERRUPT LEVEL)
IHP = INTERRUPT HANDLER PROCEDURE POINTER
ISM = INTERRUPT SAVE MASK (REGISTER SAVE/RESTORE CONTROL)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| M | R1 | R2 | R3 | R4 | R5 | R6 | R7 | 1 | B1 | B2 | B3 | B4 | B5 | B6 | B7 |

IVNN = INTERRUPT VECTOR FOR LEVEL NUMBER (NN)
NATSAP = NEXT AVAILABLE TSA POINTER
MBZ = MUST BE ZERO
THP = TRAP HANDLER PROCEDURE
TSA = TRAP SAVE AREA
TSAL = TRAP SAVE AREA LINK
TSAP = TRAP SAVE AREA POINTER
TVNN = TRAP VECTOR FOR CLASS NUMBER (NN)
Z = MISCELLANEOUS INFORMATION ABOUT SOFTWARE INSTRUCTION

TRAP AND SOFTWARE INTERRUPT LINKAGE  FIG. 31

DEDICATED MAIN MEMORY LOCATIONS

FIRMWARE FLOW OVERVIEW

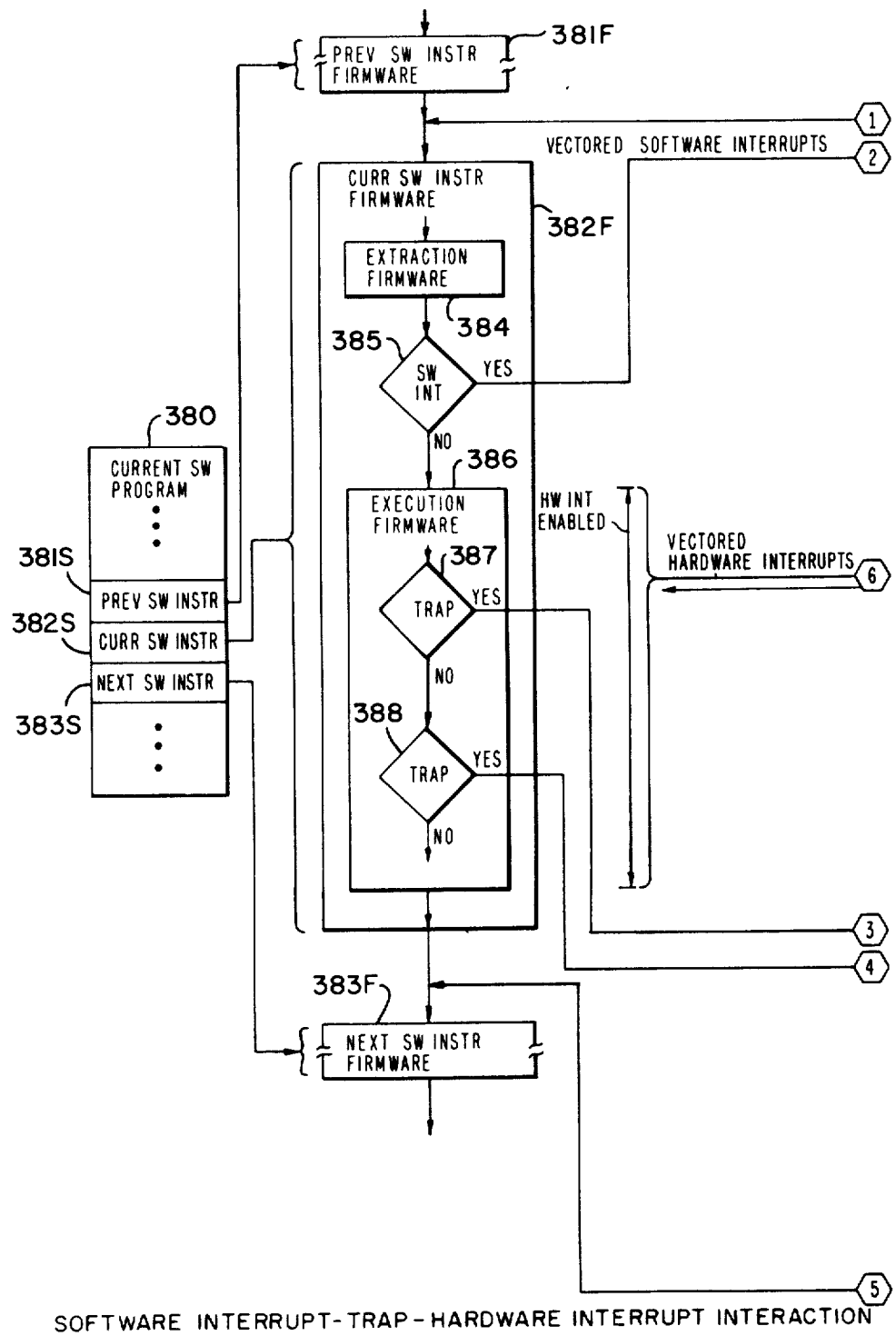
SOFTWARE INTERRUPT-TRAP-HARDWARE INTERRUPT INTERACTION
*FIG. 34* SHEET 1 OF 2

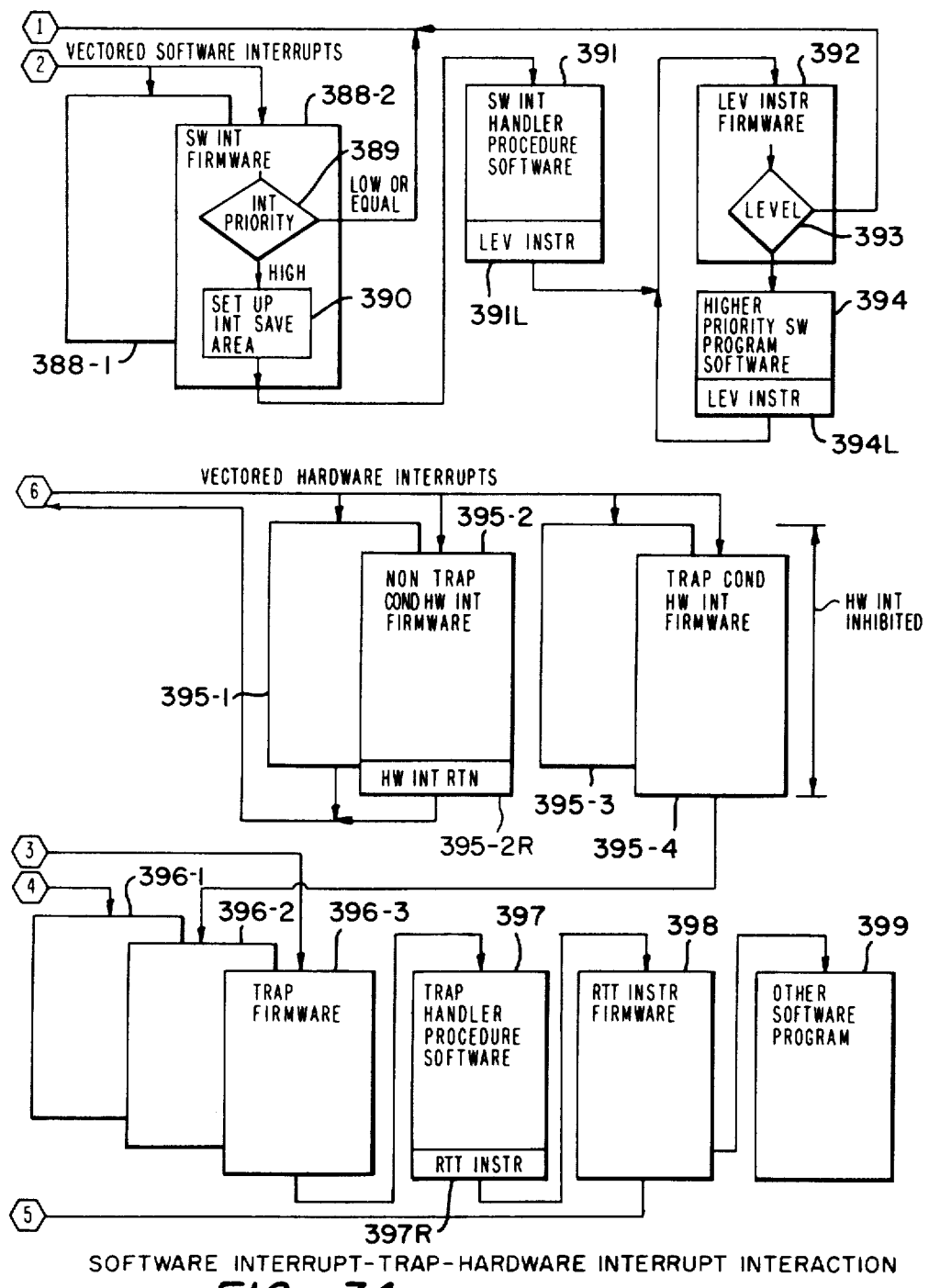
SOFTWARE INTERRUPT-TRAP-HARDWARE INTERRUPT INTERACTION
FIG. 34 SHEET 2 OF 2

CPU FIRMWARE MICROINSTRUCTION WORD

SCRATCH PAD MEMORY CONTROL FIELD

ALU CONTROL FIELD

SUBCOMMANDS AND CONTROL FIELD

ROS ADDRESSING FIELD

MICROPROCESSOR OPERATIONS

FIG. 36

| ALU SOURCE BITS | | | CARRY INJECT (BIT 19) = 0 — ALU FUNCTION BITS 13 14 15 | | | | | | | | CARRY INJECT (BIT 19) = 1 — ALU FUNCTION BITS 13 14 15 | | | | | | | |
|---|---|---|---|---|---|---|---|---|---|---|---|---|---|---|---|---|---|---|
| 10 | 11 | 12 | 000 | 001 | 010 | 011 | 100 | 101 | 110 | 111 | 000 | 001 | 010 | 011 | 100 | 101 | 110 | 111 |
| 0 | 0 | 0 | A+Q | Q-A-1 | A-Q-1 | A∨Q | A∧Q | $\overline{A}$∧Q | A⊻Q | $\overline{A⊻Q}$ | A+Q+1 | Q-A | A-Q | A∨Q | A∧Q | $\overline{A}$∧Q | A⊻Q | $\overline{A⊻Q}$ |
| 0 | 0 | 1 | A+B | -1 | -1 | A | A | -1 | A | $\overline{A}$ | A+B+1 | 0 | 0 | A | A | -1 | A | $\overline{A}$ |
| 0 | 1 | 0 | Q | Q-1 | -Q-1 | Q | 0 | Q | Q | $\overline{Q}$ | Q+1 | Q | -Q | Q | 0 | Q | Q | $\overline{Q}$ |
| 0 | 1 | 1 | B | B-1 | -B-1 | B | 0 | B | B | $\overline{B}$ | B+1 | B | -B | B | 0 | B | B | $\overline{B}$ |
| 1 | 0 | 0 | A | A-1 | -A-1 | A | 0 | A | A | $\overline{A}$ | A+1 | A | -A | A | 0 | A | A | $\overline{A}$ |
| 1 | 0 | 1 | D+A | A-D-1 | D-A-1 | D∨A | D∧A | $\overline{D}$∧A | D⊻A | $\overline{D⊻A}$ | D+A+1 | A-D | D-A | D∨A | D∧A | $\overline{D}$∧A | D⊻A | $\overline{D⊻A}$ |
| 1 | 1 | 0 | D+Q | Q-D-1 | D-Q-1 | D∨Q | D∧Q | $\overline{D}$∧Q | D⊻Q | $\overline{D⊻Q}$ | D+Q+1 | Q-D | D-Q | D∨Q | D∧Q | $\overline{D}$∧Q | D⊻Q | $\overline{D⊻Q}$ |
| 1 | 1 | 1 | D | -D-1 | D-1 | D | 0 | 0 | D | $\overline{D}$ | D+1 | -D | D | D | 0 | 0 | D | $\overline{D}$ |

NOTE

- A = PRIMARY OUTPUT OF MICROPROCESSOR REGISTER FILE
- B = DUPLICATE (0-15) OUTPUT OF MICROPROCESSOR REGISTER FILE
- Q = OUTPUT OF MICROPROCESSOR INTERNAL WORK REGISTER
- D = DATA INPUT TO MICROPROCESSOR
- 0 = PERFORM LOGIC 0 OPERATION
- + = PERFORM ARITHMETIC ADDITION
- - = PERFORM ARITHMETIC SUBTRACTION
- ∧ = PERFORM LOGICAL AND
- ∨ = PERFORM LOGICAL OR
- ⊻ = PERFORM LOGICAL EXCLUSIVE OR
- OVERSCORE = LOGICAL INVERSION

| BITS 28-31 (HEX) | FUNCTION |
|---|---|
| 8 | RESET MAINTENANCE PANEL OPERATION FLOP |
| 9 | RESET FIRMWARE WDT STORAGE FLOP |
| A | RESET FIRMWARE TRAP FLOP |
| B | RESET POWER FAILURE FLOP |
| C | SET FIRMWARE WDT FLOP |
| D | RESET FIRMWARE WDT FLOP |
| E | SET FIRMWARE RTC FLOP |
| F | RESET FIRMWARE RTC FLOP |

INTERRUPT COMMANDS

*FIG. 37A*

| BITS 24-27 (HEX) | BITS 28-31 (HEX) | FUNCTION |
|---|---|---|
| 3 | 8 | SET CONTROL PANEL CHECK AND LOAD INDICATORS |
| 3 | 9 | LOAD DATA INTO CONTROL PANEL DATA REGISTER |
| 3 | A | RESET CONTROL PANEL CHECK INDICATOR |
| 3 | B | SET CONTROL PANEL AUTOMATIC POWER UP FLOP |
| 3 | C | RESET CONTROL PANEL TRAFFIC INDICATOR |
| 3 | D | SET CONTROL PANEL TRAFFIC INDICATOR |
| 3 | E | RESET CONTROL PANEL LOAD INDICATOR |
| 3 | F | RESET CONTROL PANEL EXECUTE FLOP |

CONTROL PANEL COMMANDS

*FIG. 37B*

| BITS | | | FUNCTION |
|---|---|---|---|
| 24 | 25 | 26 | |
| 0 | 0 | 0 | NOT USED |
| 0 | 0 | 1 | CPU TO CONTROL PANEL STROBE (SEE FIGURE 37B FOR COMMANDS) |
| 0 | 1 | 0 | CPU HAS ACCEPTED THE LAST INTERRUPT (SET PROCED- LOW) |
| 0 | 1 | 1 | CPU CANNOT ACCEPT THE LAST INTERRUPT (SET PBUSY- LOW) |
| 1 | 0 | 0 | ENABLE SYSTEM BUS A RECEIVERS, SET PENBSA- LOW, RESET CONTROL FLOP 3 (CF3) |
| 1 | 1 | 0 | ENABLE SYSTEM BUS B RECEIVERS, SET PENBSB- LOW, SET CONTROL FLOP 3 (CF3) |

I/O COMMANDS 1 *FIG. 37C*

| BITS | | FUNCTION |
|---|---|---|
| 27 | 28 | |
| 1 | 1 | LOAD CHANNEL NUMBER REGISTER, LOAD PDMCIO FLOP WITH PBYTEX |
| 0 | 1 | I/O CONTROL TO SYSTEM BUS A (SET PIOCTA- LOW) |
| 1 | 0 | I/O CONTROL TO SYSTEM BUS B (SET PIOCTB- LOW) |
| 0 | 0 | I/O CONTROL TO BOTH SYSTEM BUSES A AND B (SET PIOCTA- AND PIOCTB- LOW) |

I/O COMMANDS 2A *FIG. 37D*

| BITS | | | FUNCTION |
|---|---|---|---|
| 29 | 30 | 31 | |
| 0 | 0 | 0 | ANSWER COMMAND |
| 0 | 0 | 1 | ANSWER INTERRUPT |
| 0 | 1 | 0 | ANSWER DMA |
| 0 | 1 | 1 | ANSWER DMC |
| 1 | 0 | 0 | CPU COMMAND |
| 1 | 0 | 1 | END-OF-RANGE |
| 1 | 1 | 0 | END-OF-LINK |
| 1 | 1 | 1 | RESUME INTERRUPT |

I/O COMMANDS 2B *FIG. 37E*

| BITS | | | | FUNCTION |
|---|---|---|---|---|
| 24 | 25 | 26 | 27 | |
| 0 | 0 | 0 | 0 | NOT USED |
| 0 | 0 | 0 | 1 | SWAP BYTES FROM INTERNAL BUS ON WAY INTO SCRATCH PAD MEMORY |
| 0 | 0 | 1 | 0 | ENABLE BOOT PROM FOR QLT |
| 0 | 0 | 1 | 1 | RESET BOOT LOAD STORE FLOP |
| 0 | 1 | 0 | 0 | LOAD QLT REGISTER |
| 0 | 1 | 0 | 1 | ENABLE SYSTEM BUS A TO INTERNAL BUS |
| 0 | 1 | 1 | 0 | RESET PCLEAR FLOP |
| 0 | 1 | 1 | 1 | NOT USED |
| 1 | 0 | 0 | 0 | NOT USED |
| 1 | 0 | 0 | 1 | SET CONTROL FLOP 1 (CF1) |
| 1 | 0 | 1 | 0 | LOAD CONTROL FLOP 1 (CF1) WITH INTERNAL BUS BIT 15 |
| 1 | 0 | 1 | 1 | RESET CONTROL FLOP 1 (CF1) |
| 1 | 1 | 0 | 0 | LOAD INDICATOR REGISTER FROM INTERNAL BUS (BITS 8-15) |
| 1 | 1 | 0 | 1 | SET INDICATOR REGISTER INPUT/OUTPUT INDICATOR (BIT 12) |
| 1 | 1 | 1 | 0 | LOAD CONTROL FLOP 3 (CF3) WITH PROCED SIGNAL FROM SYSTEM BUS A |
| 1 | 1 | 1 | 1 | RESET INDICATOR REGISTER INPUT/OUTPUT INDICATOR (BIT 12) |

SUBCOMMANDS 1

*FIG. 37F*

| BITS | | | | FUNCTION |
|---|---|---|---|---|
| 28 | 29 | 30 | 31 | |
| 0 | 0 | 0 | 0 | NOT USED |
| 0 | 0 | 0 | 1 | NOT USED |
| 0 | 0 | 1 | 0 | LOAD INDICATOR REGISTER OVERFLOW INDICATOR (BIT 8) WITH ALU OVERFLOW CONDITION |
| 0 | 0 | 1 | 1 | LOAD INDICATOR REGISTER CARRY INDICATOR (BIT 10) WITH ALU CARRY CONDITION |
| 0 | 1 | 0 | 0 | LOAD INDICATOR REGISTER OVERFLOW AND CARRY INDICATORS (BITS 8 AND 10) WITH ALU OVERFLOW AND CARRY CONDITIONS |
| 0 | 1 | 0 | 1 | LOAD INDICATOR REGISTER BIT TEST INDICATOR (BIT 11) WITH ALU EQUAL ZERO CONDITION |
| 0 | 1 | 1 | 0 | LOAD INDICATOR REGISTER BIT TEST INDICATOR (BIT 11) WITH INTERNAL BUS BIT 0 |
| 0 | 1 | 1 | 1 | LOAD INDICATOR REGISTER GREATER THAN, LESS THAN AND UNLIKE SIGN INDICATORS (BITS 13-15) FROM ALU CONDITIONS |
| 1 | 0 | 0 | 0 | NOT USED |
| 1 | 0 | 0 | 1 | SET CONTROL FLOP 2 (CF2) |
| 1 | 0 | 1 | 0 | NOT USED |
| 1 | 0 | 1 | 1 | RESET CONTROL FLOP 2 (CF2) |
| 1 | 1 | 0 | 0 | LOAD M1 REGISTER FROM INTERNAL BUS (BITS 8-15) |
| 1 | 1 | 0 | 1 | SET CONTROL FLOP 4 (CF4) |
| 1 | 1 | 1 | 0 | LOAD CONTROL FLOP 4 (CF4) WITH INTERNAL BUS BIT 0 |
| 1 | 1 | 1 | 1 | RESET CONTROL FLOP 4 (CF4) |

SUBCOMMANDS 2

*FIG. 37G*

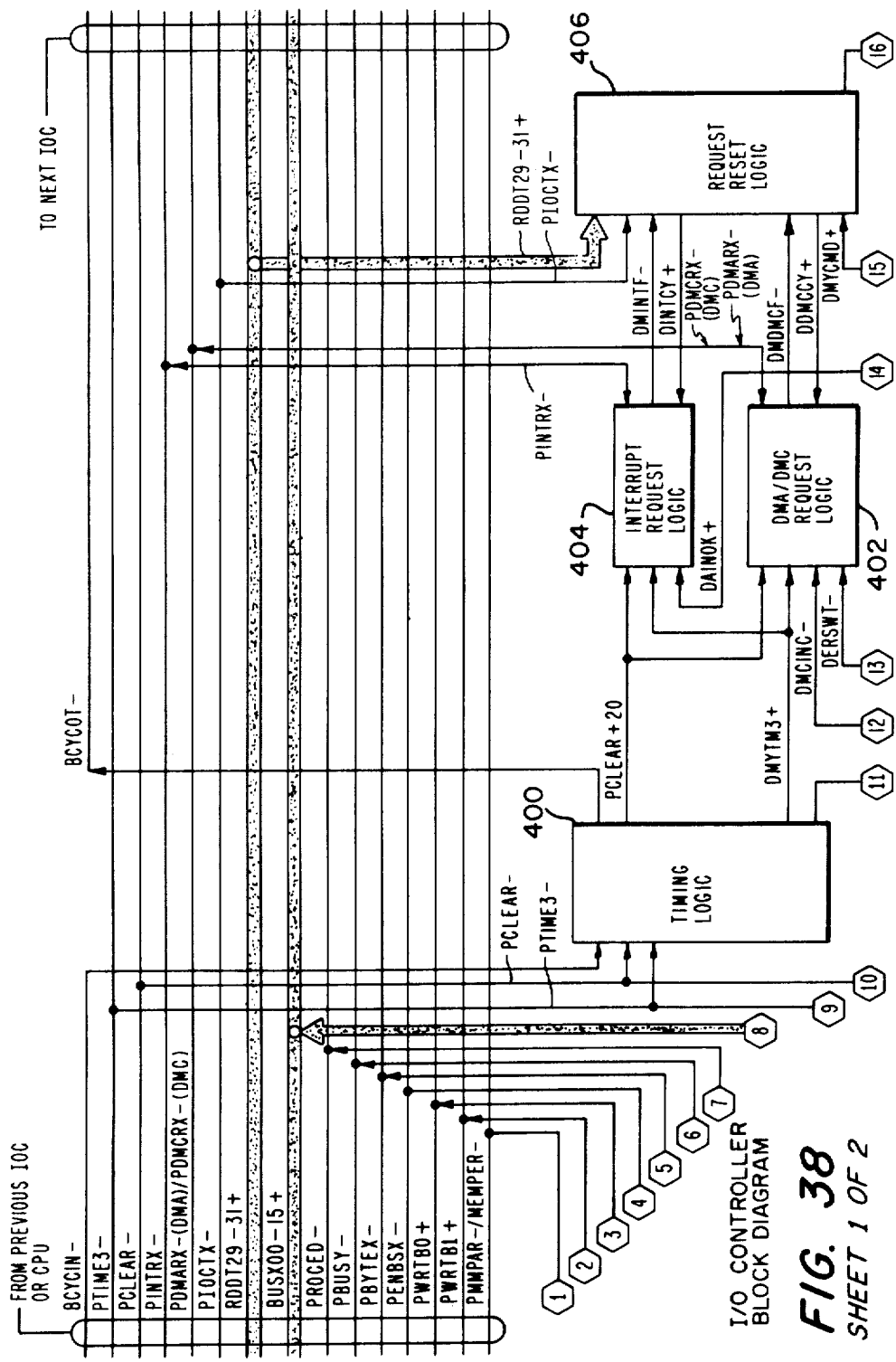
FIG. 38 SHEET 1 OF 2
I/O CONTROLLER BLOCK DIAGRAM

I/O CONTROLLER BLOCK DIAGRAM

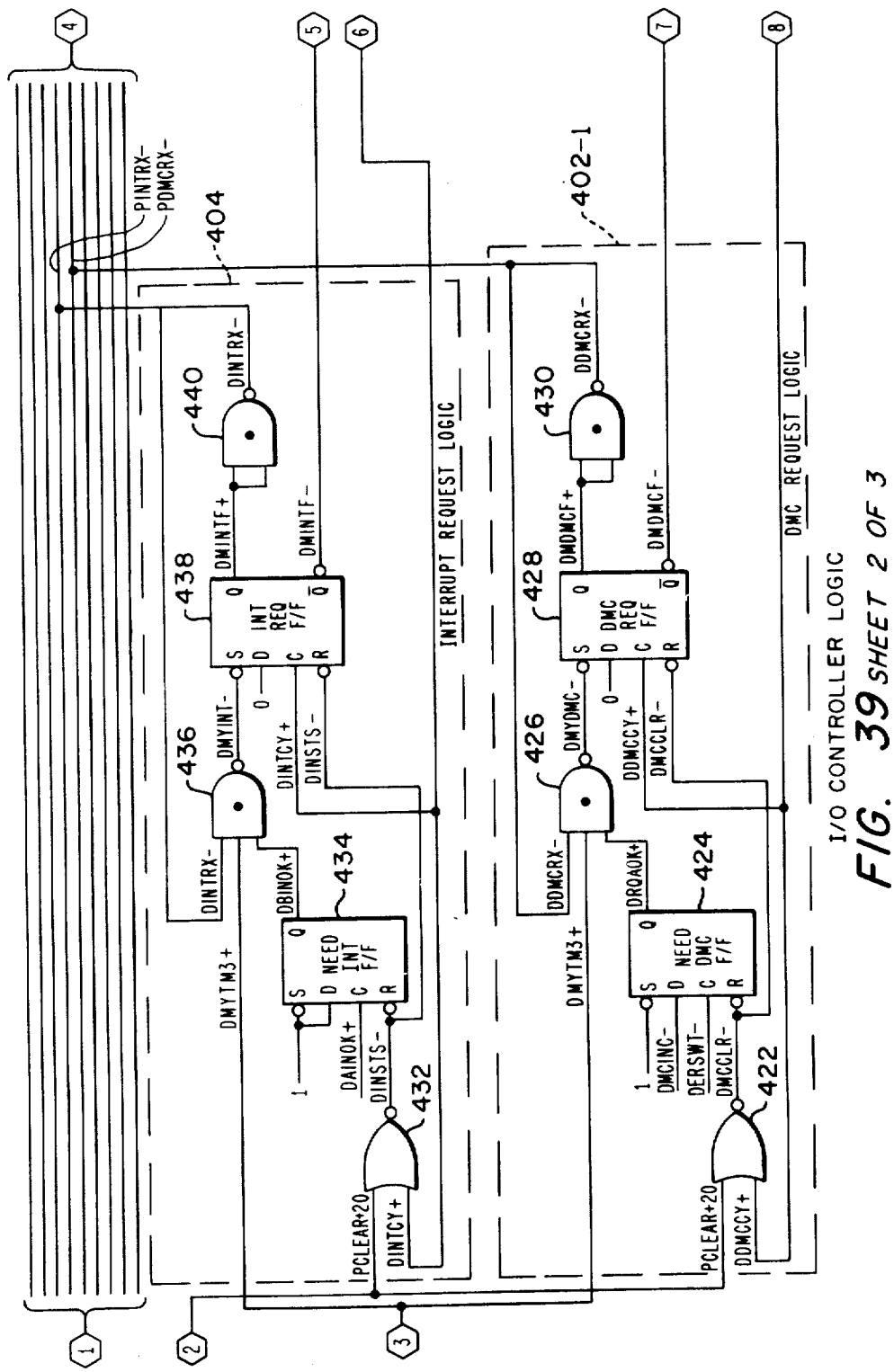

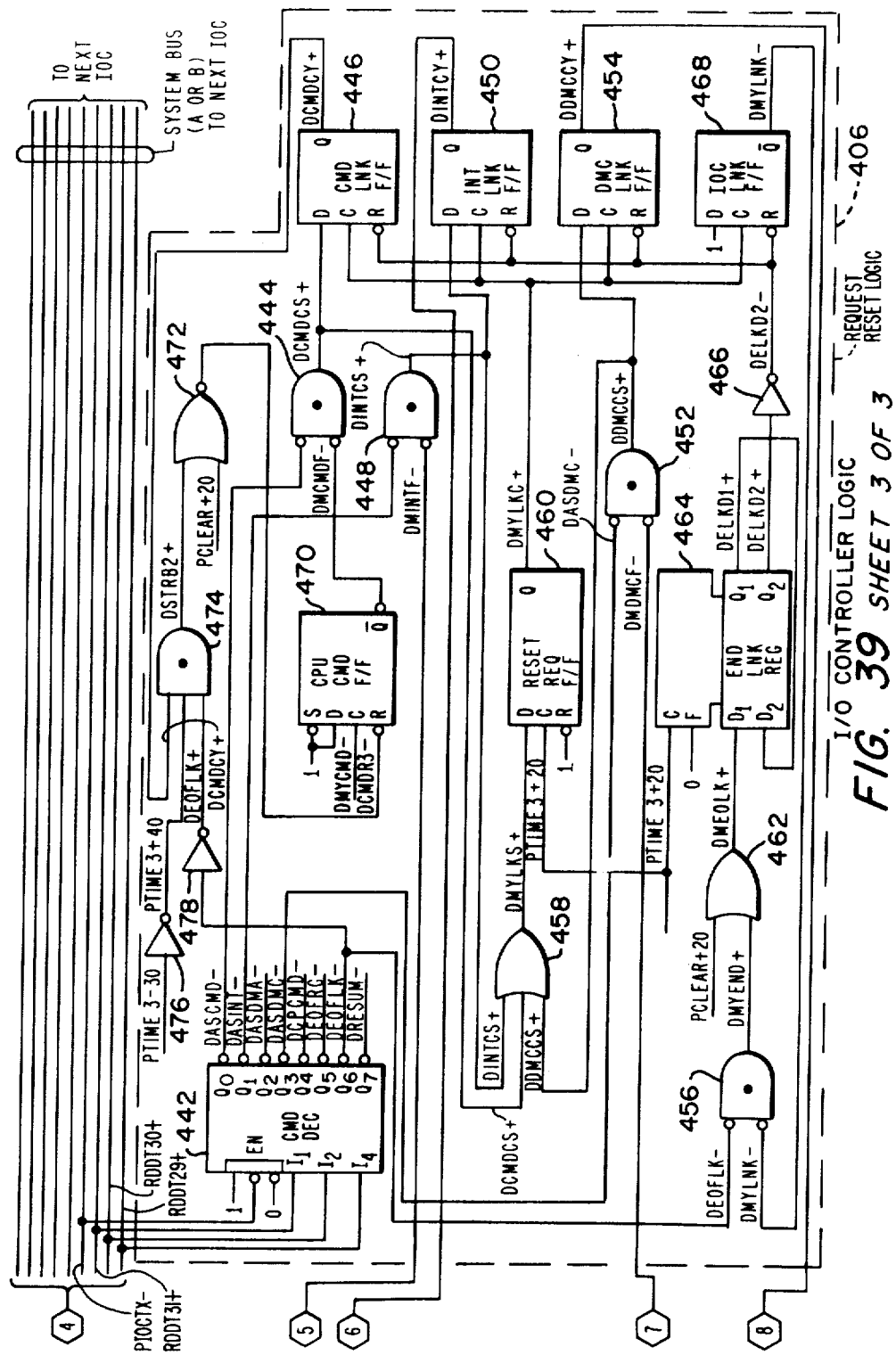
FIG. 39 SHEET 3 OF 3

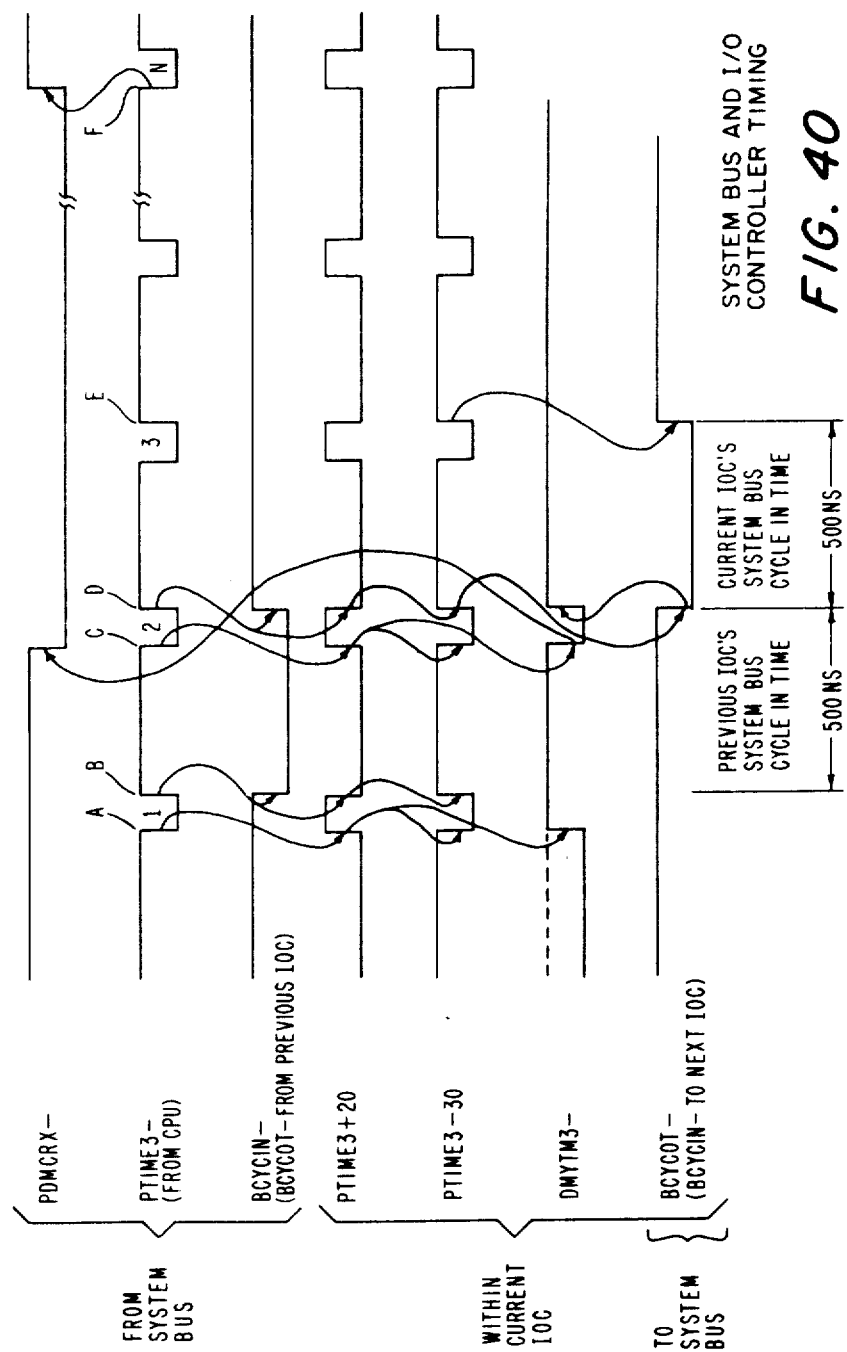

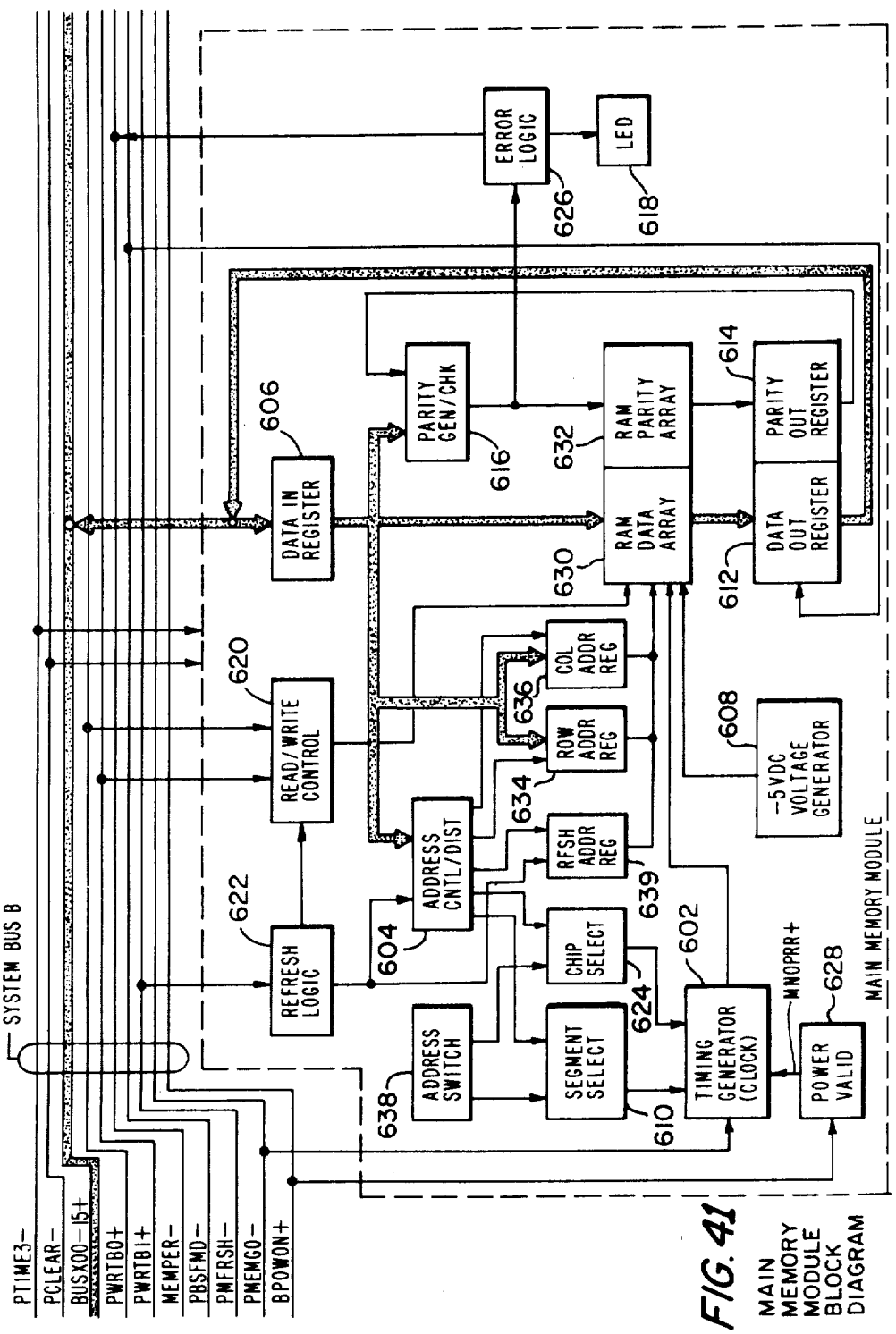

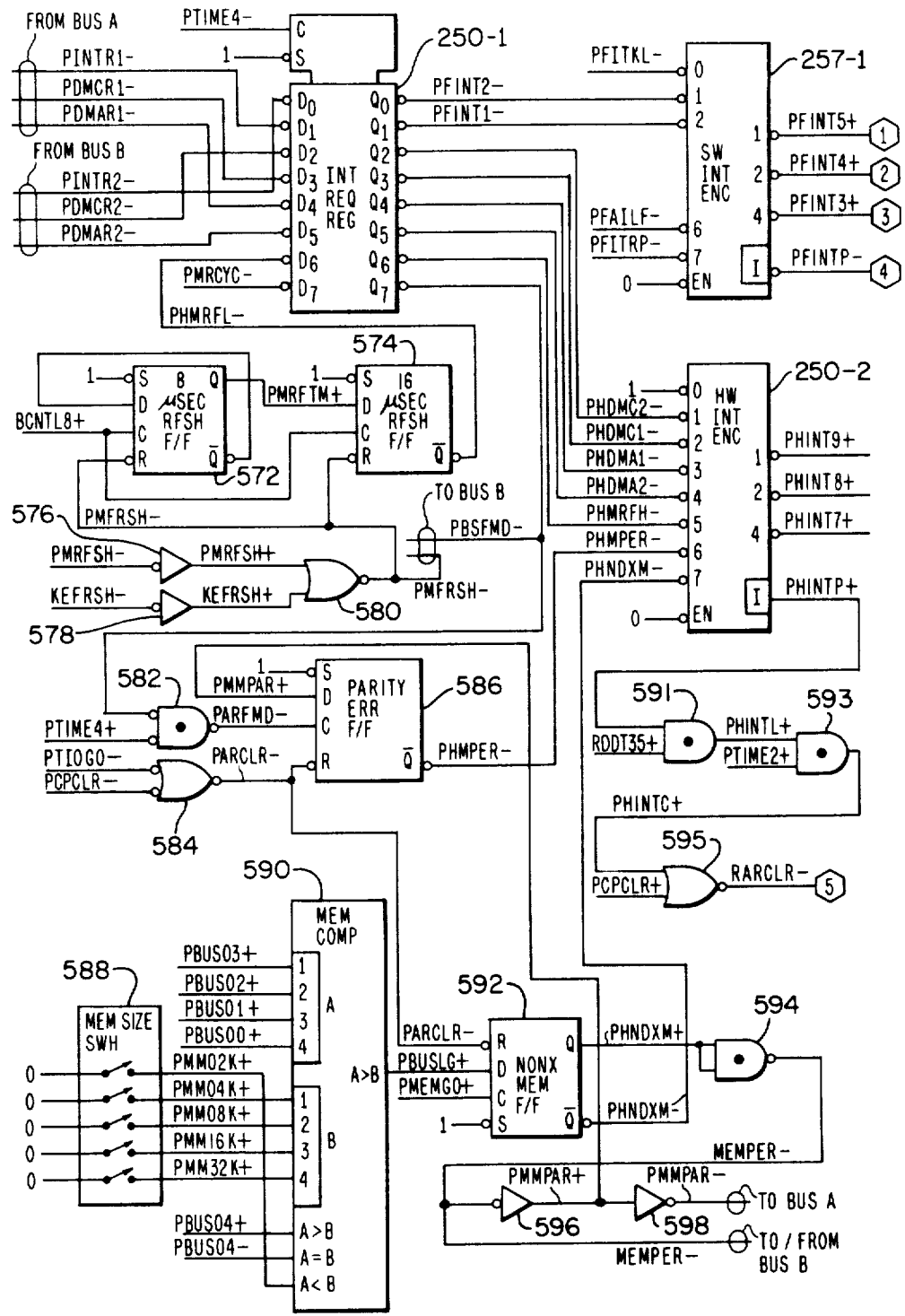
CONTROL STORE LOGIC  FIG. 42  SHEET 1 OF 3

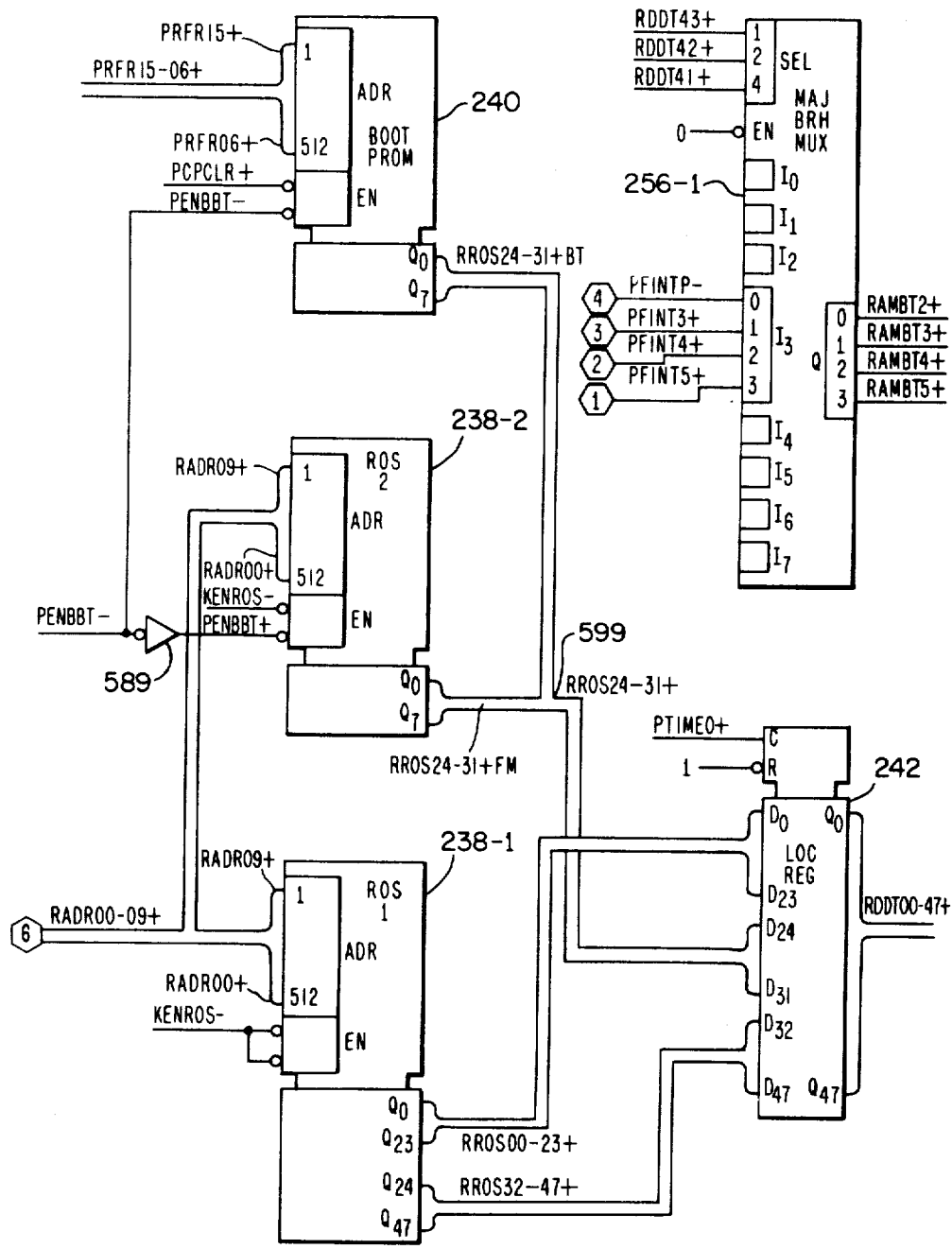
CONTROL STORE LOGIC  FIG. 42  SHEET 2 OF 3

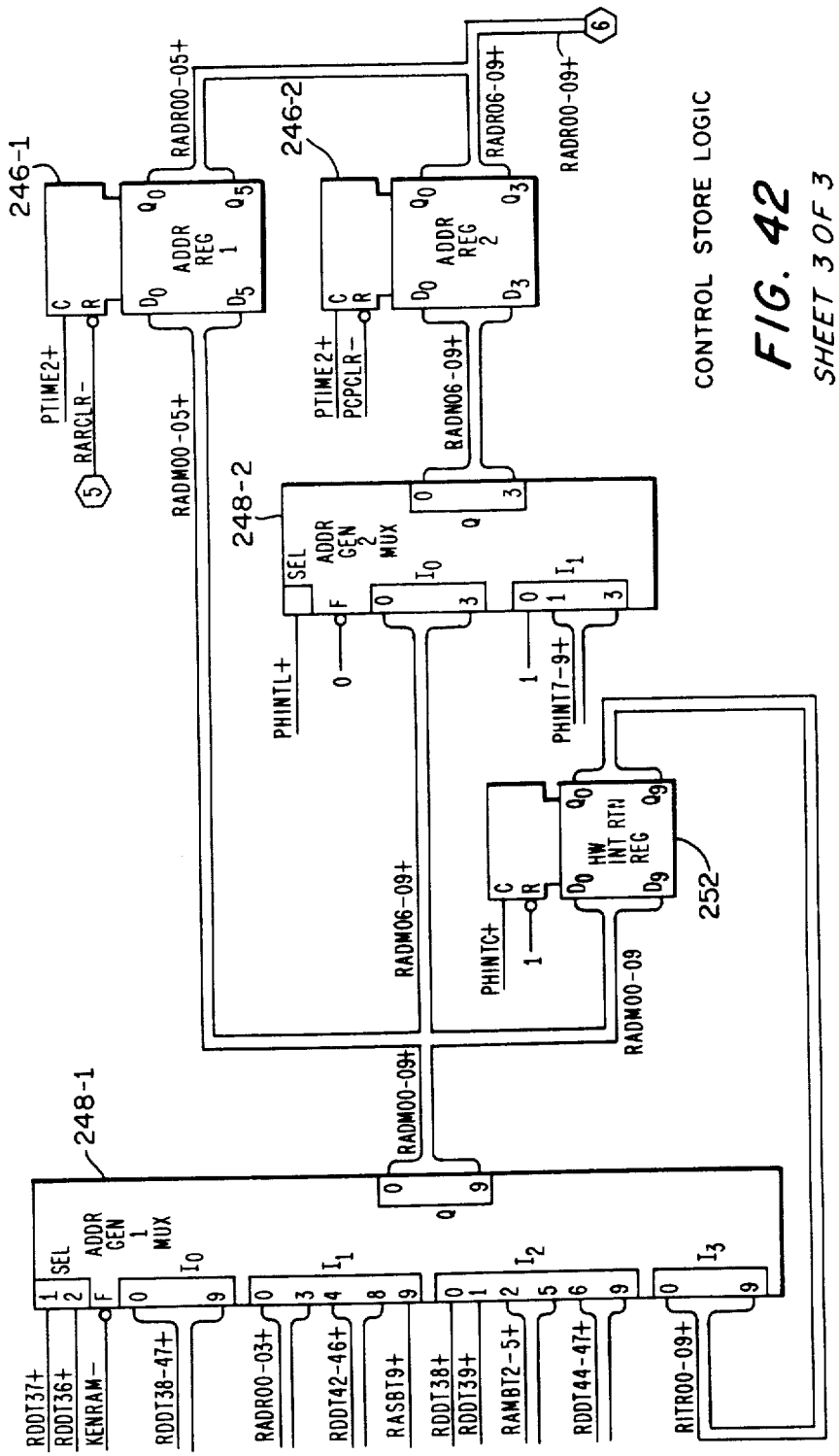

SHEET 1 OF 3
CPU LOGIC

CPU LOGIC

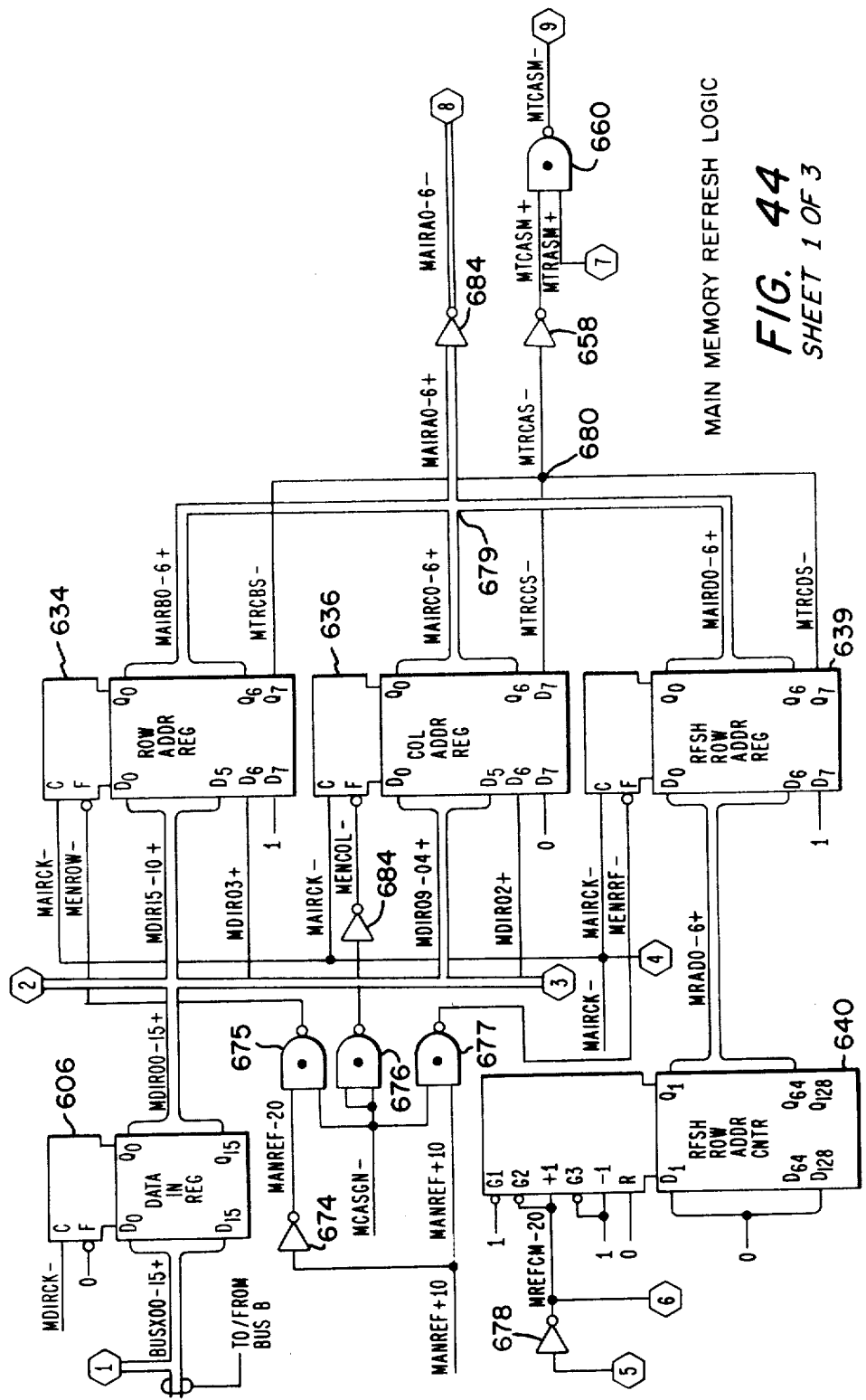
FIG. 44 SHEET 1 OF 3
MAIN MEMORY REFRESH LOGIC

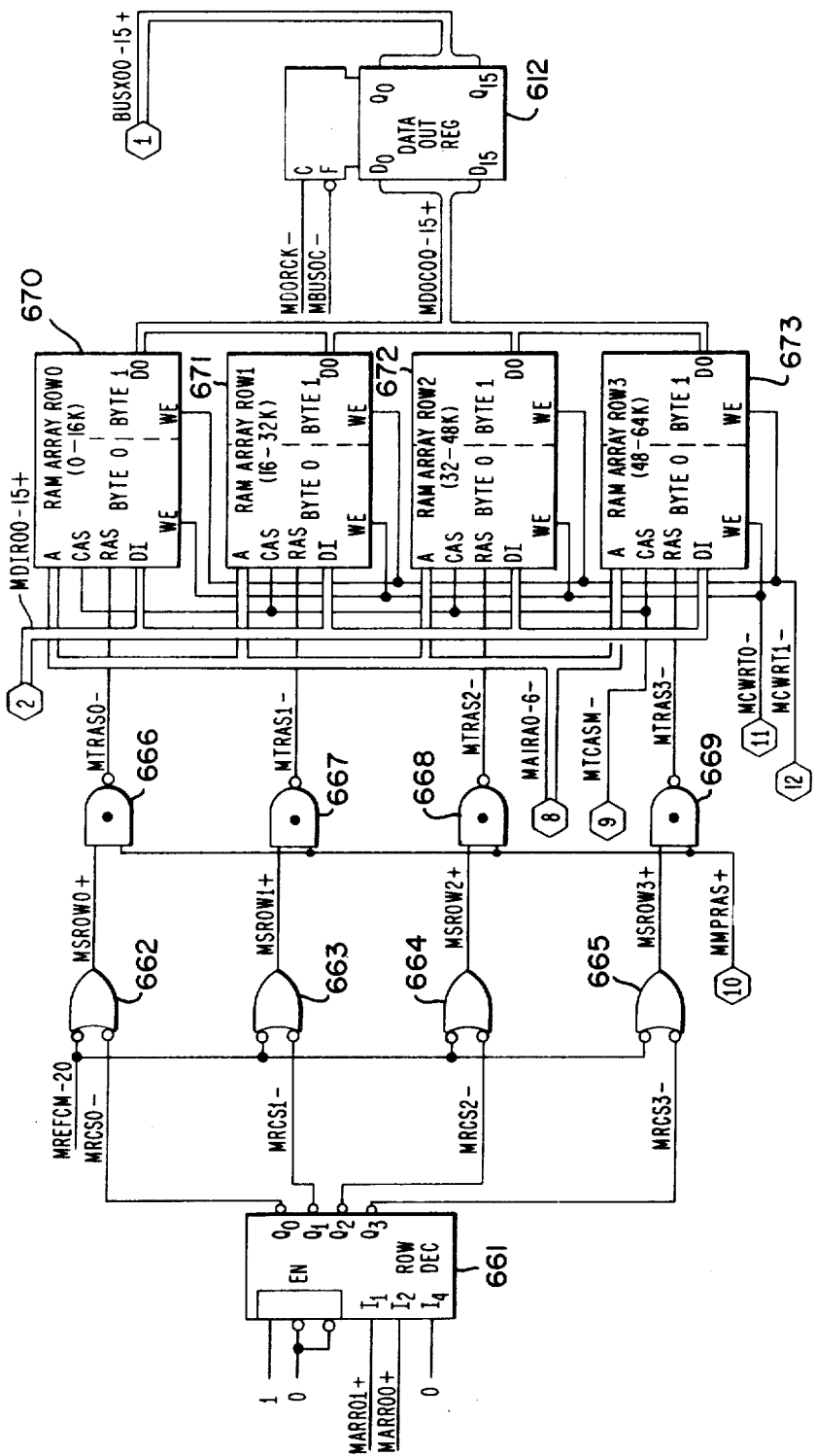

MAIN MEMORY REFRESH LOGIC

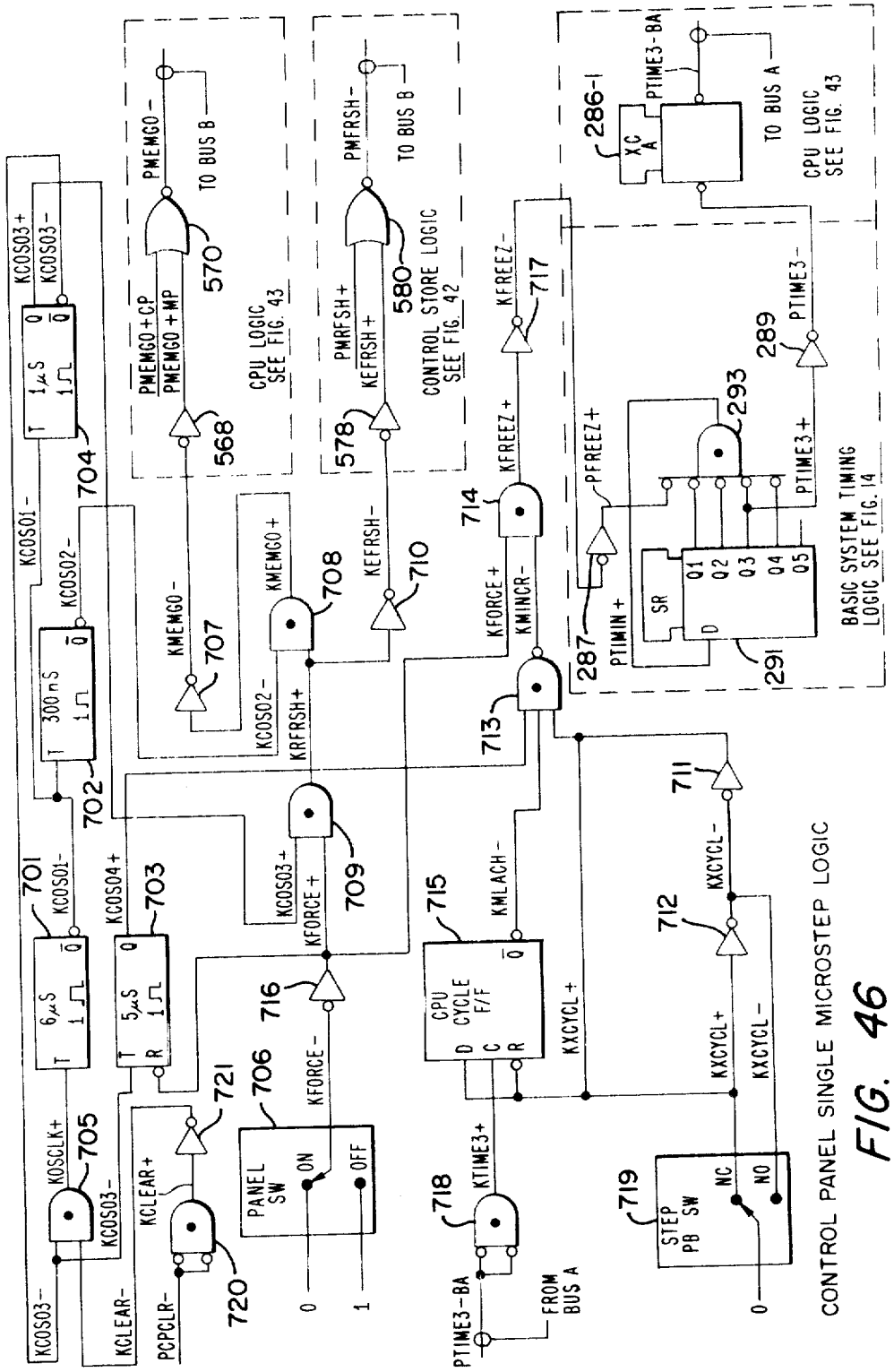
FIG. 46 CONTROL PANEL SINGLE MICROSTEP LOGIC

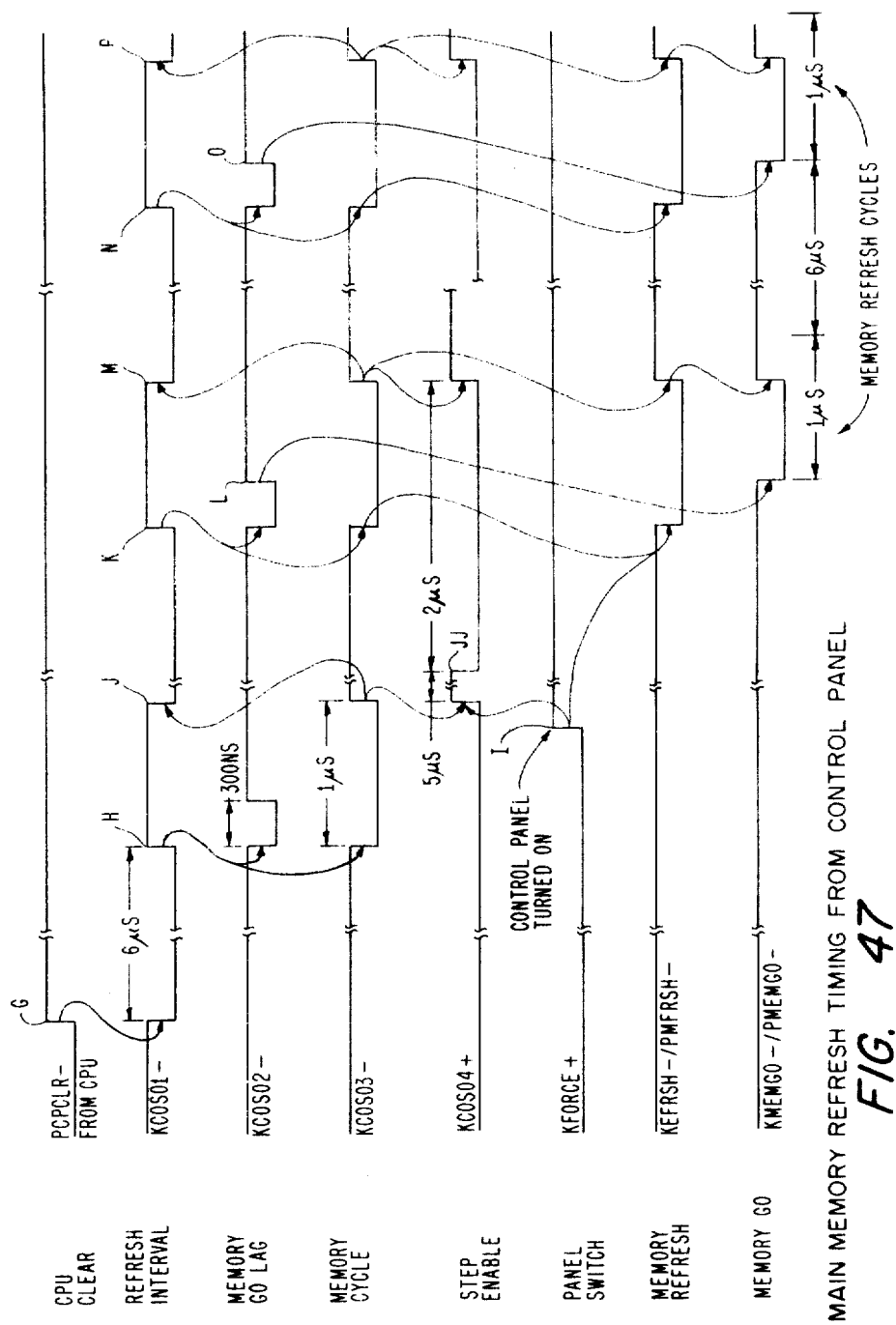
FIG. 47 MAIN MEMORY REFRESH TIMING FROM CONTROL PANEL

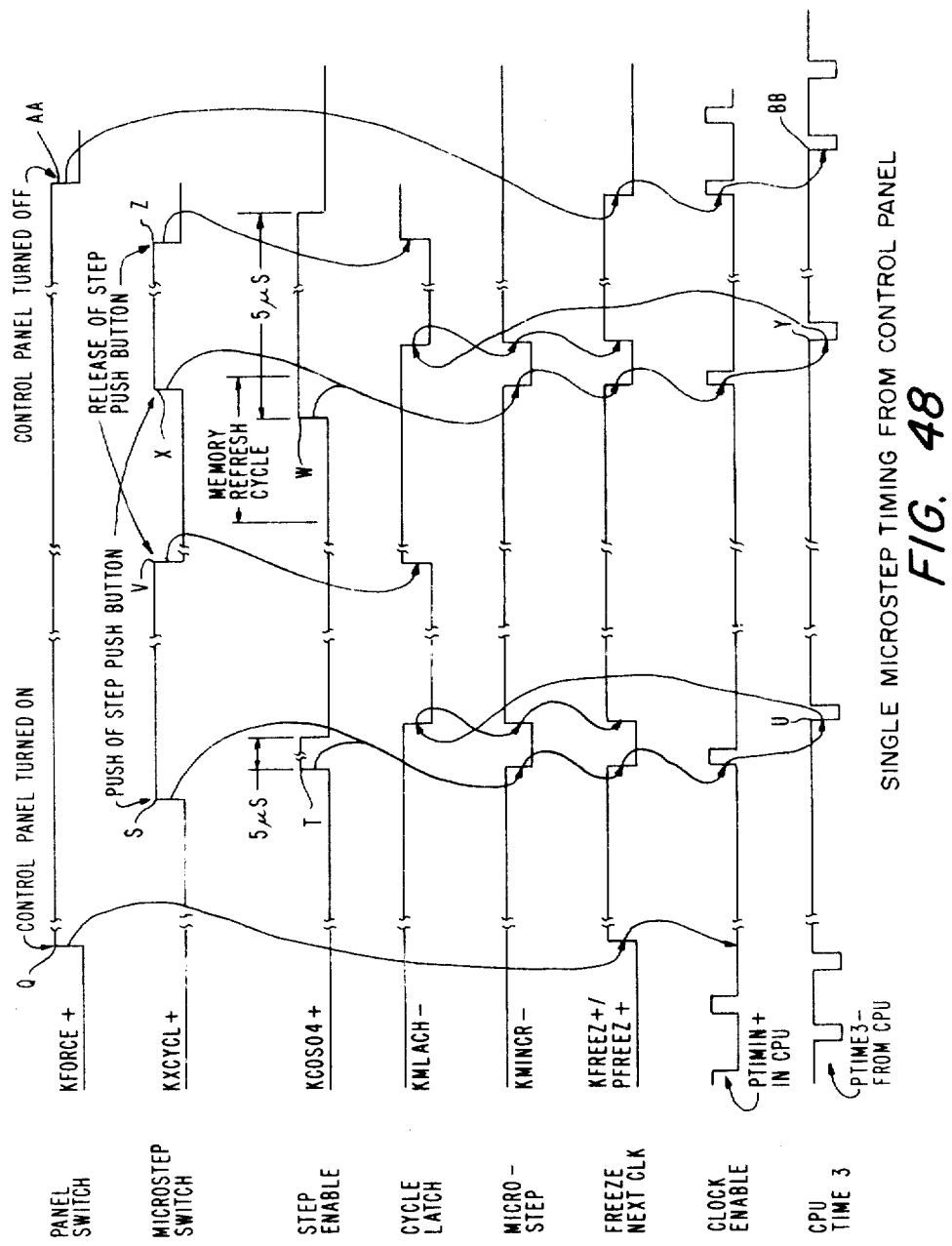

MICROPROGRAMMED SYSTEM HAVING SINGLE MICROSTEP APPARATUS

CROSS-REFERENCE TO RELATED APPLICATIONS

The following patent applications which are assigned to the same assignee as the instant application have related subject matter. Certain portions of the system and processes herein disclosed are not our invention, but are the invention of the below named inventors as defined by the claims in the following patent applications:

| TITLE | INVENTORS | SERIAL NO. |
|---|---|---|
| Data Processing System Having Centralized Nonexistent Memory Address Detection | Ming T. Miu<br>John J. Bradley<br>William Panepinto, Jr.<br>Jian-Kuo Shen | 008,010 |
| Data Processing System Having Centralized Data Alignment for I/O Controllers | Jian-Kuo Shen<br>John J. Bradley<br>Richard L. King<br>Robert C. Miller<br>Ming T. Miu<br>Theodore R. Staplin, Jr. | 008,121 |
| Data Processing System Having Synchronous Bus Wait/Retry Cycle | Theodore R. Staplin, Jr.<br>John J. Bradley<br>Richard L. King<br>Robert C. Miller<br>Ming T. Miu<br>Jian-Kuo Shen | 008,122 |
| Data Processing System Having Hardware Interrupt Apparatus | Ming T. Miu<br>John J. Bradley<br>Jian-Kuo Shen | 008,005 |
| Data Processing System Having Data Multiplex Control Apparatus | John J. Bradley<br>Robert C. Miller<br>Ming T. Miu<br>Jian-Kuo Shen<br>Theodore R. Staplin, Jr. | 008,003 |
| Data Processing System Having Data Multiplex Control Bus Cycle | Robert C. Miller<br>John J. Bradley<br>Richard L. King<br>Ming T. Miu<br>Jian-Kuo Shen<br>Theodore R. Staplin, Jr. | 008,002 |
| Data Processing System Having Direct Memory Access Bus Cycle | John J. Bradley<br>Thomas O. Holtey<br>Robert C. Miller<br>Ming T. Miu<br>Jian-Kuo Shen<br>Theodore R. Staplin, Jr. | 008,001 |
| Data Processing System Having Centralized Bus Priority Resolution | Ming T. Miu<br>John J. Bradley<br>Jian-Kuo Shen | |
| Data Processing System Having Multiple Common Buses | John J. Bradley<br>Ming T. Miu<br>Jian-Kuo Shen | 008,004 |
| Data Processing System Having Backspace Apparatus | Robert C. Miller<br>John J. Bradley<br>Boyd E. Darden<br>Ming T. Miu<br>Jian-Kuo Shen<br>Theodore R. Staplin, Jr. | 011,001 |
| Data Processing System Having Centralized Memory Refresh | William Panepinto, Jr.<br>Ming T. Miu<br>Chester M. Nibby, Jr.<br>Jian-Kuo Shen | 012,081 |

BACKGROUND OF THE INVENTION

1. Field of the Invention

This invention generally relates to data processing systems and more specifically to apparatus for diagnosing errors in such a system.

2. Discussion of the Prior Art

It is well known that data processing systems provide checking apparatus for conditioning the system to be manually stepped through its operation either in a software instruction by software instruction basis or on a cycle by cycle basis. Additionally, some systems provide for halting system operation on a particular instruction which bears address designated by selector switches on a control panel. An example of such an arrangement is disclosed in U.S. Pat. No. 3,077,984. Additionally, some systems provide for halting system operation on a particular instruction operation code specified by setting up a plurality of switches which are used to specify the bit pattern of the operation code. An example of such an arrangement is disclosed in U.S. Pat. No. 3,813,531 issued to Richard L. King et al, and entitled "Diagnostic Checking Apparatus". More recently, with the advent of microprogrammed control stores, systems have been designed to provide for the halting of the control store at a specified control store address or microinstruction bit pattern. An example of such an arrangement is disclosed in U.S. Pat. No. 3,909,802 issued to Frank V. Cassarino, Jr., et al, entitled "Diagnostic Maintenance and Test Apparatus".

While the arrangements described above assist maintenance personnel in diagnosing system malfunctions, these arrangements cannot be used in systems employing semiconductor random access memories which are periodically recharged under microprogram control. For example, if a microprogram periodically issues memory refresh commands to the rechargeable memory, halting the execution of the microprogram will rapidly result in the loss of the information contained within the rechargeable memory. Alternatively, in a system designed such that the rechargeable memory is refreshed asynchronously from the microprogram executing in the control store, logic must be provided within the system to recover from those cases in which the unit desiring to access the rechargeable memory finds the memory temporarily busy because the memory is engaged in a refresh operation.

OBJECTS OF THE INVENTION

Accordingly, it is a primary object of the present invention to provide diagnostic apparatus for use in a data processing system to facilitate diagnosing both hardware and microprogram malfunctions.

It is a further more specific object of the present invention to provide diagnostic apparatus which can be incorporated into a system with the addition of a minimum amount of logic circuits.

It is still a further object of the present invention to provide diagnostic apparatus which will permit most transfers of information between units of the system to take place without loss of information in a rechargeable memory when the system is operated in a single step mode.

SUMMARY OF THE INVENTION

In accordance with the present invention, in a system comprising a microprogrammed processing unit and a rechargeable memory, logic is provided whereby under normal system conditions the refreshing of the rechargeable memory is done under the control of the microprogrammed processing unit which executes microinstructions stored in an addressable control store included in said microprogrammed processing unit. Logic is provided to bring the microprocessing unit to an orderly halt thereby halting the execution of said microinstructions. Further logic is provided within the system to generate alternate memory refresh commands while said microprogrammed processing unit is halted. Still further logic is provided to allow the microprogrammed processing unit to execute one microinstruction by executing one microprogrammed processing unit clock cycle. Logic is provided to insure that the microprogrammed processing unit clock cycle will be phased such that any memory operation initiated thereby will be complete before an alternate refresh command is executed and to insure that any alternate refresh command is complete before the beginning of the microprogrammed processing unit clock cycle.

This invention is pointed out with particularity in the appended claims. An understanding of the above and further objects and advantages of this invention may be obtained by referring to the following description taken in conjunction with the drawings.

BRIEF DESCRIPTION OF THE DRAWINGS

The manner in which the apparatus of the present invention is constructed and its mode of operation can best be understood in light of the following detailed description together with the accompanying drawings in which like reference numerals identify like elements in the several figures and in which:

FIG. 6 illustrates the system bus interface signals of the present invention;

FIG. 7 is a general block diagram of the system bus signals shown in FIG. 6;

FIG. 8 is a more detailed block diagram of the CPU shown in FIG. 3;

FIG. 10 illustrates the CPU scratch pad memory layout of the present invention;

FIG. 11 illustrates the place where the CPU registers are maintained in the CPU of the present invention;

FIG. 12 is a more detailed block diagram of the system bus data control shown in FIG. 8;

FIG. 18 illustrates the input/output commands encoded on the RDDT lines of the system bus of the present invention;

FIG. 20 illustrates a timing diagram of the CPU command to input/output controller sequence on the system bus of the present invention;

FIG. 21A through FIG. 21D illustrate timing diagrams of the DMC data transfer sequence on the system bus of the present invention;

FIG. 22 illustrates a timing diagram of the DMA data transfer sequence on the system bus of the present invention;

FIG. 24 illustrates the format of the control word transferred on the system bus in response to an input/output software instruction of the present invention;

FIG. 25 illustrates the input/output function codes of input/output software instructions of the present invention;

FIG. 26A and FIG. 26B illustrate the formats of the IO and IOH software instructions of the present invention;

FIG. 27A and FIG. 27B illustrate the formats of the IOLD software instructions of the present invention;

FIG. 30 illustrates the interaction between the IOLD software instruction and the program channel table contained in the CPU scratch pad memory of the present invention;

FIG. 31 illustrates the linkage between traps and software interrupts of the present invention;

FIG. 34 illustrates a flow chart of the CPU firmware and shows the interaction between software interrupts, traps, and hardware interrupts of the present invention;

FIG. 36 illustrates the operations performed by the microprocessor of the CPU of the present invention;

FIG. 37A through FIG. 37G illustrate in greater detail the functions performed by the subcommands and control field of the CPU firmware microinstruction word shown in FIG. 35C;

FIG. 40 illustrates a timing diagram of the timing signals found on the system bus and in an I/O controller of the present invention;

FIG. 41 is a block diagram of a main memory module of the present invention;

FIG. 42 illustrates the logic of the control store shown in FIG. 9;

FIG. 46 illustrates the single microstep logic of the control panel of the present invention;

FIG. 47 illustrates a timing diagram of the main memory refresh signals in the control panel and on the system bus of the present invention; and FIG. 48 illustrates a timing diagram of the single microstep signals in the control panel and in the CPU of the present invention.

TABLE OF CONTENTS

Figure 1:
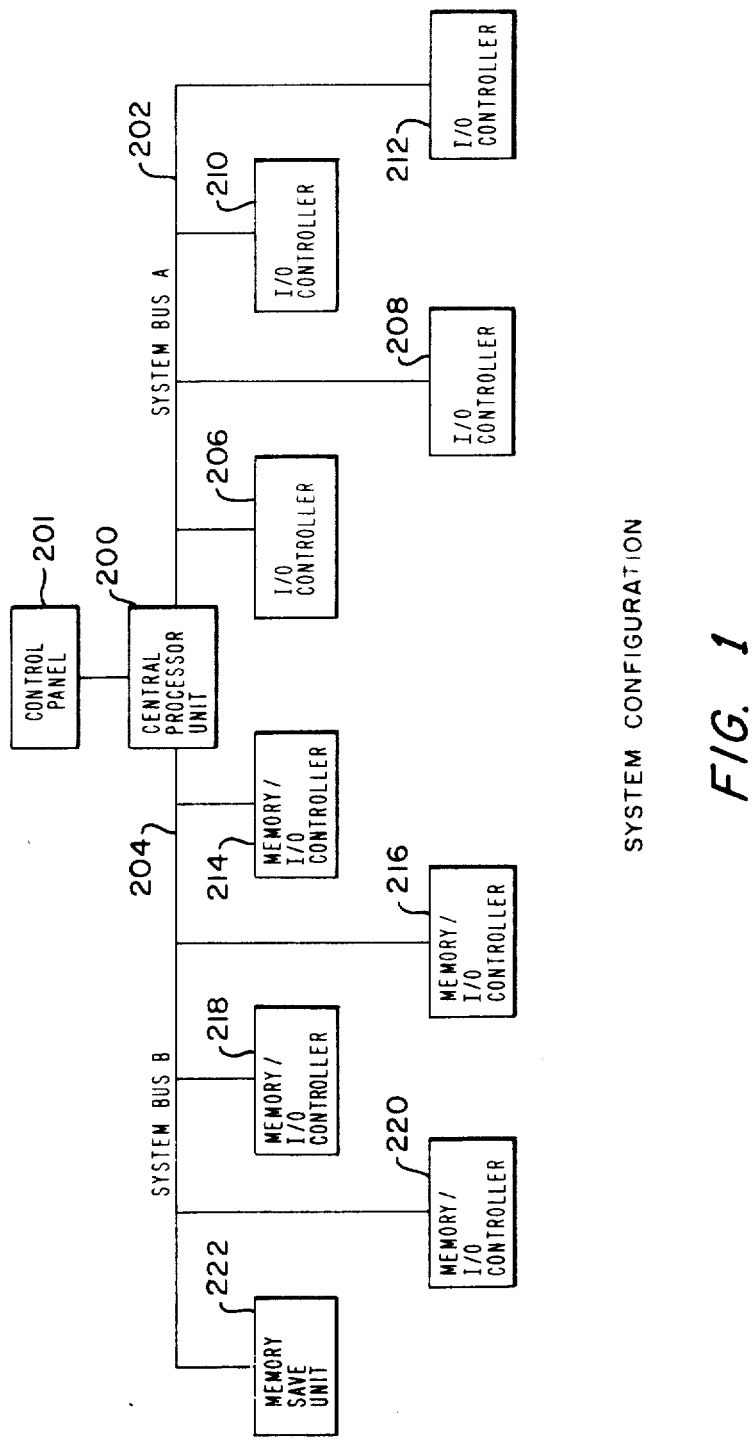
FIG. 1 is a general block diagram illustration of the system configuration of the present invention.

DESCRIPTION OF THE PREFERRED EMBODIMENT
  DESCRIPTION CONVENTIONS
  SYSTEM BUS OVERVIEW
  CENTRAL PROCESSOR DESCRIPTION
    CPU MAJOR COMPONENTS
    PROGRAMMING CONSIDERATIONS
      Software Visible Registers
      Word and Address Formats
      Main Memory
    CPU AND SYSTEM BUS INTERFACES
      SYSTEM BUS A
      SYSTEM BUS B
    CPU HARDWARE DESCRIPTION
      MICROPROCESSOR
      SYSTEM BUS CONTROL
      CONTROL PANEL
      BASIC SYSTEM TIMING
      SYSTEM INITIALIZATION
    SYSTEM BUS OPERATIONS
      MEMORY ACCESS
      MEMORY REFRESH
      FUNCTION CODE TO I/O CONTROLLER
      DMC DATA TRANSFER REQUEST
      DMA DATA TRANSFER REQUEST
      I/O CONTROLLER INTERRUPT
      EXECUTION OF INPUT/OUTPUT INSTRUCTIONS
        Channel Numbers
        I/O Function Codes
          Output Function Code Commands
          Input Function Code Commands
        Software Input/Output Instructions
          I/O Instruction
          IOLD Instruction
          IOH Instruction
        Traps and Software Interrupts
          Software Interrupts
          Traps
  FIRMWARE OVERVIEW
    GENERAL DESCRIPTION OF FIRMWARE FLOW
    SOFTWARE INTERRUPT, TRAP, HARDWARE INTERRUPT INTERACTION
      Software Program
      Firmware Microprograms
      Software Interrupts, Hardware Interrupts and Traps
        Software Interrupts
        Hardware Interrupts
        Traps
      Interrupts and Traps
    CPU FIRMWARE WORD DESCRIPTION
      SCRATCH PAD MEMORY CONTROL
      ARITHMETIC LOGIC UNIT CONTROL
      SUBCOMMANDS AND CONTROL
      READ ONLY STORAGE ADDRESSING
  I/O CONTROLLER LOGIC DETAILS
    I/O CONTROLLER DEVICE LOGIC
      Command Logic
      Task and Configuration Logic
      Interrupt Logic
      Status and Device Identification Logic
      Data Transfer Logic
      Address and Range Logic
    I/O CONTROLLER TIMING LOGIC
    I/O CONTROLLER REQUEST LOGIC
    I/O CONTROLLER INTERRUPT REQUEST LOGIC
    I/O CONTROLLER REQUEST RESET LOGIC
    DMA IOC REQUEST AND RESET LOGIC
    I/O CONTROLLER SYSTEM BUS REQUEST AND LINK LOGIC SUMMARY
  CPU LOGIC DETAILS
    CONTROL STORE LOGIC DETAILS
      ROS Address Generation Logic
      Hardware Interrupt Logic
        Main Memory Refresh Timeout Logic
        Main Memory Parity Error Logic
        Nonexistent Memory Detection Logic
      Software Interrupt Logic
      Boot PROM Logic
    CPU LOGIC DETAILS
      Data Transceiver Logic
      Scratch Pad Memory Logic
      Byte Swapping Logic
      Microprocesor and Data Selection Logic
      I, M1 and F Register Logic
      Bus Command Logic
        I/O Command Logic
        Proceed and Busy Logic
        Read/Write Byte Logic
        Memory Go Logic
  MAIN MEMORY DESCRIPTION
    SYSTEM BUS INTERFACE
      Data Word
      Address Word
    MAIN MEMORY ORGANIZATIONAL OVERVIEW
    MODULE PHYSICAL/ORGANIZATIONAL CHARACTERISTICS
      Module Addressing
    MEMORY SAVE UNIT
    MAIN MEMORY FUNCTIONAL OVERVIEW
      Main Memory Timing
      Main Memory Modules
        Timing Generator Negative 5 Volt Generator
Power Failure Logic
RAM Address Control and Distribution Logic
Segment Select Logic
Data In/Data Out Registers
Parity Generator and Check Logic
Read/Write Control Logic
Refresh Logic
Chip Select Logic
MAIN MEMORY SUMMARY
MAIN MEMORY REFRESH LOGIC DETAILS
Refresh Cycle Signal Generation
Refresh Row Address Logic
Refresh Row Address Strobe Logic
MAIN MEMORY REFRESH SUMMARY
SINGLE MICROSTEP FUNCTIONAL OVERVIEW
MAIN MEMORY REFRESH SIGNAL TIMING LOGIC
CPU CLOCK SINGLE CYCLE LOGIC
SINGLE MICROSTEP FUNCTIONAL SUMMARY

DETAILED DESCRIPTION OF THE PREFERRED EMBODIMENT

DESCRIPTION CONVENTIONS

In the system of the invention, electrical signals indicative of binary digits (bits) are applied to and obtained from various logic gates or other circuit elements. For the sake of brevity in the discussion which follows, the bits themselves are sometimes referred to rather than the signals manifesting the bits. In addition, for the sake of brevity, the signal names are sometimes used to label the lines connecting the various logic gates and circuit elements. These signals are sometimes referred to by a group of letters or numbers. For example, in FIG. 14, BCYCOT− at the upper right identifies a signal output by NAND gate 295. Sometimes a group of letters is followed by a plus sign or a minus sign. The plus sign means that when the signal represents a binary ONE (or true), it is a high level signal and the minus sign means that when the signal represents a binary ZERO (or false), it is a low level signal. In some cases the plus sign or minus sign may be followed by a couple of letters or numbers to distinguish that signal name from similar signal names with identical name beginnings. For example, in FIG. 43, signal PROCED− is output by decoder 244−3, signal PROCED−2A is output by inverter 546 and signal PROCED−20 is output by NOR gate 550. When the meaning is clear, sometimes the plus sign or the minus sign or other qualifying suffixes (letters or numbers) are omitted. For example, in FIG. 39 sheet 1, the suffix BA and BB are omitted from the signal RDDT29+ meaning that the signal would be RDDT29+BA if the I/O controller is connected to system bus A and the signal would be RDDT29+BB if the I/O controller is connected to system bus B. In other cases, when the meaning is clear, the letter "X" is used in signal name to indicate one of several signals. For example, in FIG. 39 sheet 1, the signal names PINTRX− and PIOCTX− refer to signal PINTR1 and PIOCTA− if the I/O controller is connected to system bus A and they refer to signals PINTR2− and PIOCTB− if the I/O controller is connected to system bus B. In some cases, a series of signals is indicated by using a hyphen after the first signal name followed by the suffix of the last signal name. For example, in FIG. 42 sheet 2, the output of register 242 is 48 signals named RDDT00+ through RDDT47+.

For the sake of simplicity, logic gates are referred to as AND, OR, NAND and NOR gates, the difference between an AND gate and a NAND gate being that the NAND gate has an inverter, designated by a little circle in the drawing, on its output line. The presence of an inverter on the output line is also used to distinguish between a NOR gate and an OR gate. Inverters on the input lines of gates do not affect the name given to the logic gate. For example, in FIG. 42 sheet 1, gate 591 is referred to as an AND gate, gate 594 as a NAND gate (inverted output) and gates 584 and 595 as NOR gates (both with inverted outputs with the inverters on gate 584 inputs ignored for reference purposes).

It is also assumed, for purposes of illustration, that logic requiring positive inputs for a positive output is employed unless indicated otherwise. That is, the logic circuits such as AND and OR circuits, for example, are operated by high signal levels at the input to produce a high level signal at the output. Logic levels which are not high will be termed low.

SYSTEM BUS OVERVIEW

A block diagram of the system is shown in FIG. 1. The central processor unit (CPU) 200 controls the system bus. The system bus is composed of two buses named system bus A, 202 and system bus B, 204. System buses A and B, 202 and 204, are used to interconnect the CPU 200, input/output (I/O) controllers 206, 208, 210 and 212, main memories or I/O controllers 214, 216, 218 and 220 and the memory save unit 222.

For simplicity, FIG. 1 shows only four main memory or I/O controllers connected to each system bus. In the preferred embodiment, up to eight I/O controllers can be connected to each system bus if the physical packaging (available printed circuit board slots) of the system permits. As will be seen later, the limitation of eight I/O controllers per system bus is due to timing consideration and a change in the system timing could permit more or less I/O controllers per system bus.

The control panel 201 connects directly to the CPU 200. System bus B 204 is similar to system bus A 202; however, system bus B contains additional memory control signals which are not present on system bus A. Therefore, only I/O controllers may be installed on system bus A whereas main memory or I/O controllers may be connected to system bus B. The I/O controllers connected to the system buses are used to control the operation of peripheral devices connected to the I/O controllers. The main memory, which can connect only to system bus B, is used to store the software programs which are processed by the CPU.

The control panel 201 connected directly to CPU 200 is used by the system operator to initiate, monitor and direct the operation of the system. The optional memory save units 222 provide the DC voltages to the system's volatile semiconductor random access main memories. During normal power up conditions, the memory save unit 222 operates from DC voltages supplied by a local system power supply (not shown) generating the required memory voltages while keeping its rechargeable batteries at full charge. During power outages, the memory save unit 222 provides an emergency capability for retaining the volatile semiconductor main memory contents by providing battery back-up for a period of time, for example, 5 to 10 minutes, depending upon the amount of main memory being powered.

Figure 2:
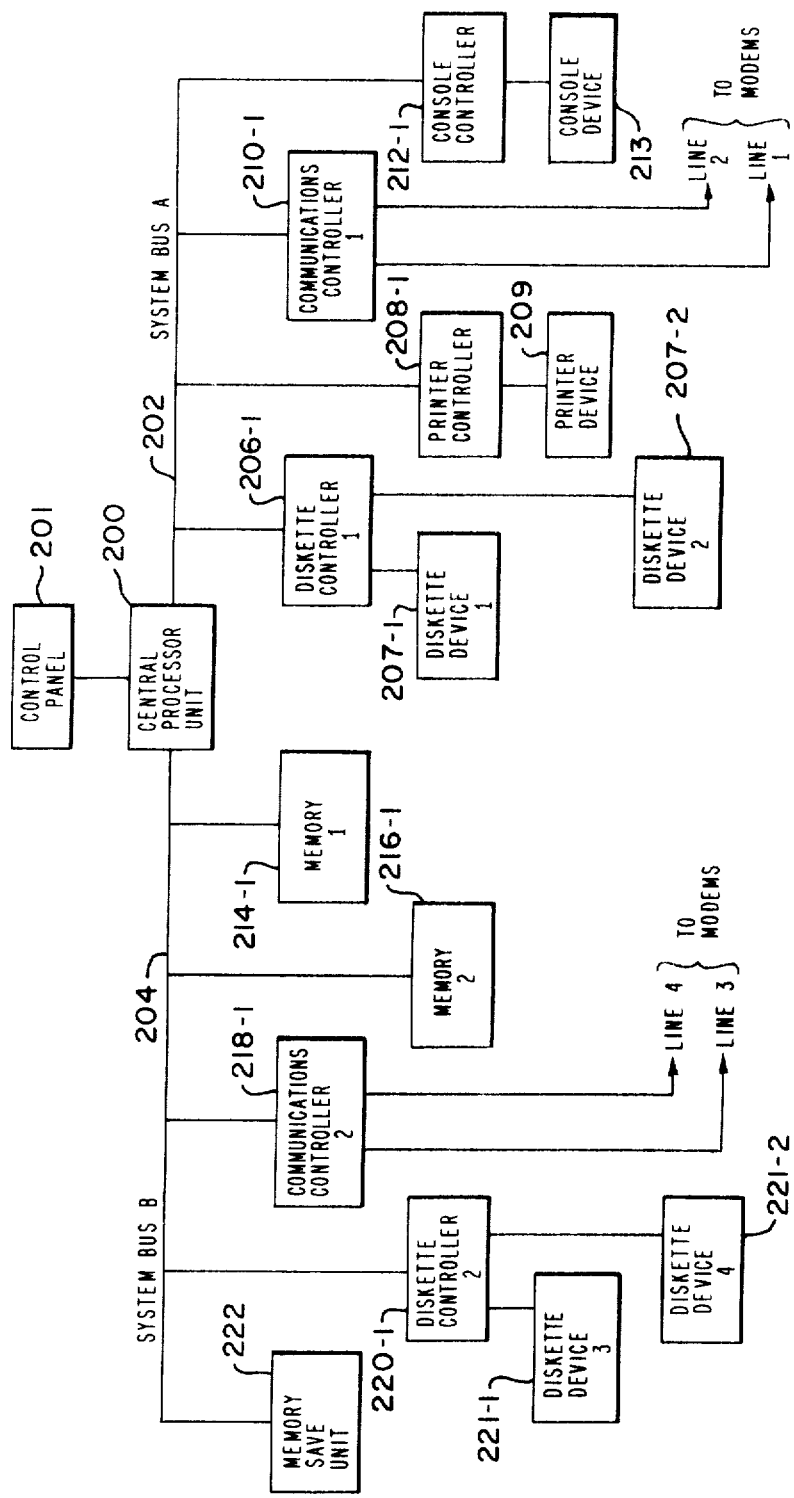
FIG. 2 is a block diagram illustration of an example configuration of the present invention.

The system shown in FIG. 1 can be configured into a variety of particular configurations by choosing various combinations of main memory, I/O controllers and peripheral devices. One such example system configuration is shown in FIG. 2. Now referring to FIG. 2, an example system configuration having a CPU 200 connected to system bus A 202 and system bus B 204 is shown. FIG. 2 shows a central processor unit with 64K words (1K=1024) of main memory, four diskette peripheral drives, a line printer, four communication lines, a console device and a printer connected as follows. Main memory 1, 214-1, containing 48K words and main memory 2, 216-1 containing 16K words, are connected to system bus B 204. Memory save unit 222 is also connected to system bus B 204. System bus A 202 and system bus B 204 are connected to CPU 200, control panel 201 is directly connected to CPU 200. Diskette peripheral devices 1 and 2, 207-1 and 207-2, are connected to system bus A 202 via diskette controller 1, 206-1. Diskette peripheral devices 3 and 4, 221-1 and 221-2, are connected to system bus B 204 via diskette controller 220-1. Communication lines 1 and 2 are connected to system bus A 202 via communications controller 210-1. Printer peripheral device 209 is connected to system bus A via printer controller 208-1. The console peripheral device 213 is connected to system bus A 202 via console controller 212-1. It should be noted that a like numbered element in one figure refers to the same numbered element in another figure; for example, control panel 201 in FIG. 2 refers to the same element as shown as control panel 201 in FIG. 1.

CENTRAL PROCESSOR DESCRIPTION

The Central Processor Unit (CPU) is a firmware directed processor designed as the controlling element within the system. The CPU contains an internal bus with two ports: system bus A and system bus B which interconnect the CPU, I/O controllers and main memory (shown in FIGS. 1 and 2). CPU firmware combined with system bus hardware provides control for I/O controller and main memory transfers. Data from any source is placed on a system bus by CPU firmware command and a main memory access can only be initiated by the CPU whether the main memory access is being performed on behalf of the CPU or an I/O controller. Thus, the need for priority resolution logic within each controller and main memory to resolve conflicting requests to use the system bus is eliminated.

The CPU I/O structure supports dialog between main memory and I/O controllers on two types of I/O channels: Data Multiplex Control (DMC) channels and Direct Memory Access (DMA) channels.

For channel of either type DMC or DMA, the system maintains a next data address (i.e., the address of the location in main memory where the next unit of information transferred to or from a peripheral device, via an I/O controller is to be read from or written into main memory) and a range. The range is the count of the number of units of information to be transferred between main memory via the CPU and the I/O controller (peripheral device). In the preferred embodiment the main memory is organized into words containing two 8-bit bytes. The next data addresses are specified as byte addresses and the range is specified as the number of bytes to be transferred.

For DMC channels, the CPU retains and manages the range and next data address information within the CPU resident Scratch Pad Memory (SPM). For DMA channels, the range and next data address is maintained locally within the I/O controller. I/O controllers are designed exclusively for the system and are either a DMC type or a DMA type. Channel assignment is by the channel number in the software I/O instruction. The CPU supports a predetermined number of DMC input/output channel pairs, where each input/output channel pair contains one input channel and one output channel. For example, there are 64 input/output channel pairs in the preferred embodiment and they can only be used by DMC I/O controllers. However the DMC channel numbers may be assigned to a DMA or DMC I/O controller, but not both in the same system.

The CPU supports operating software which includes visible registers, data formats, instruction sets, and trap and interrupt operations. Operator interface is via the control panel and the console peripheral device. The control panel permits operator access to initialize the system.

CPU MAJOR COMPONENTS

Figure 3:
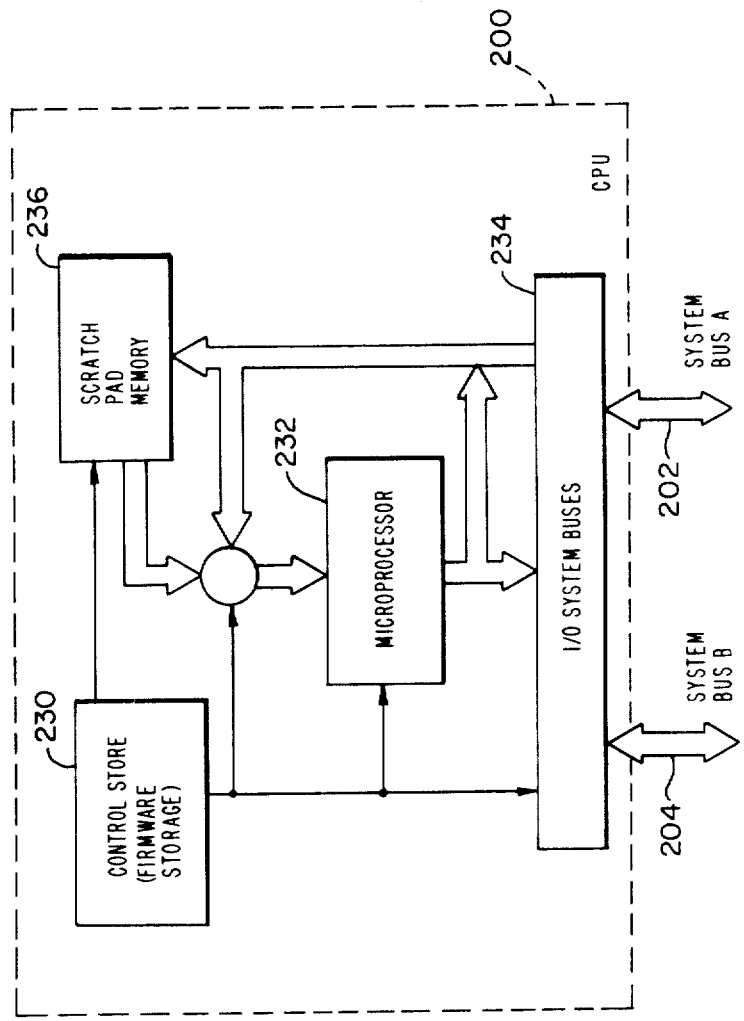
FIG. 3 is a general block diagram of the central processor unit of the present invention.

A major block diagram of the CPU functional areas is illustrated in FIG. 3 and is described in the following paragraphs.

Control store 230 is the controller element of the CPU. It contains a read only memory which stores firmware microprograms. These firmware microprograms contain the functionality necessary to control CPU operations. Also contained within this area is all of the addressing and decoding logic necessary to sequence through firmware microprograms and issue commands to the hardware in a step-by-step manner.

Microprocessor 232 is the primary processing element within the CPU. It performs all the arithmetic, compare, and logical product operations and is exclusively controlled by firmware microinstruction commands.

The I/O system bus area 234 contains all the drivers/receivers and control circuits necessary for the CPU to communicate with the I/O controllers. Two buses are available: system bus A and system bus B. Main memory can only be connected to system bus B 204. The system bus area 234 is controlled by hardware and firmware microinstruction commands.

Scratch pad memory 236 is a read/write memory which provides temporary storage for the CPU data. Maintained in this memory is the range and address information for DMC channels and various working registers necessary for CPU operation. This scratch pad memory 236 is controlled by firmware microinstruction commands.

PROGRAMMING CONSIDERATIONS

This section describes the various CPU registers that are software visible and defines the various data and address formats used by the central processor unit.

Program Visible Registers

Figure 4:
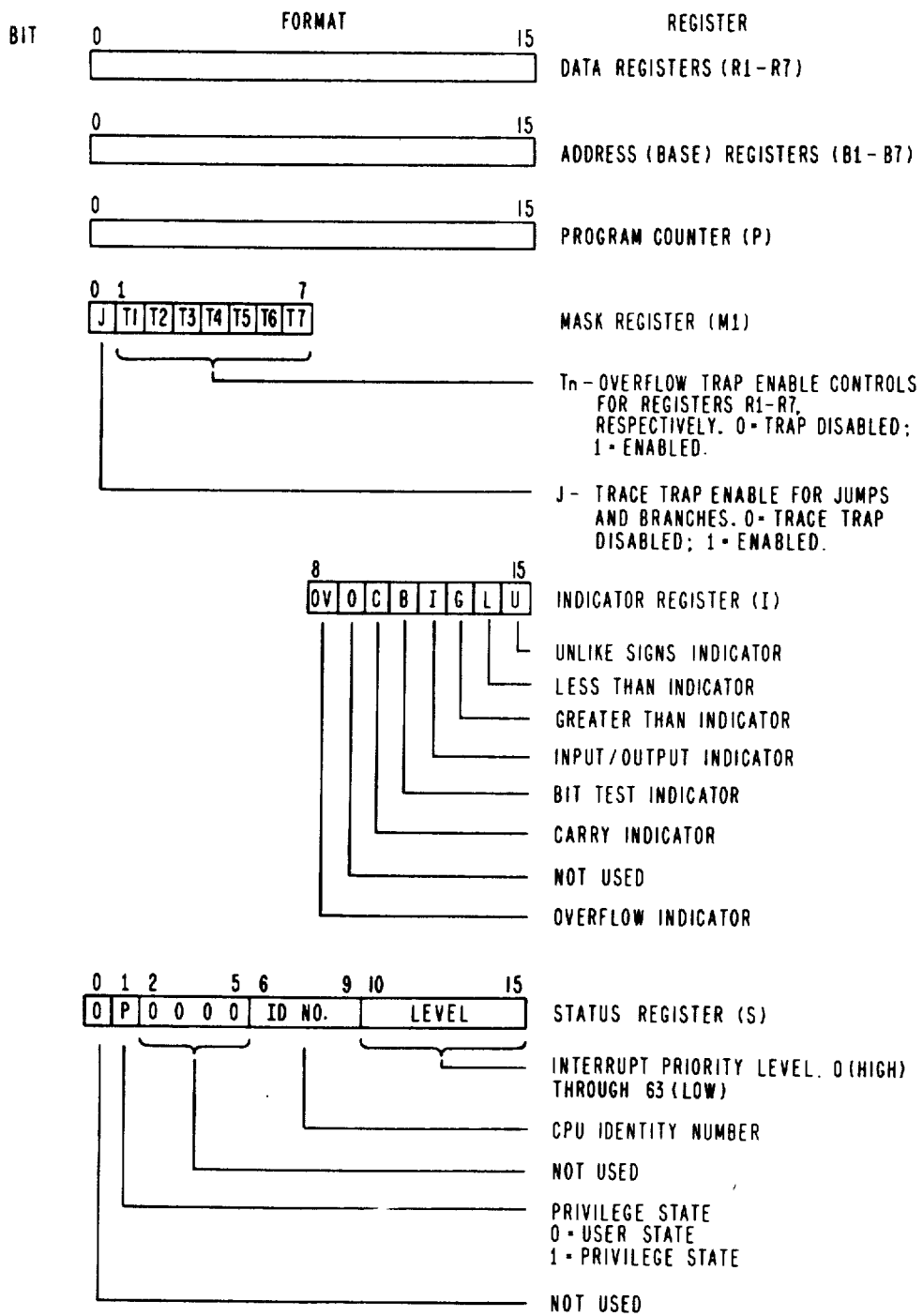
FIG. 4 illustrates the format of the CPU registers of the present invention.

There are 18 central processor registers visible to the programmer using the software instruction set. The front and significant bits of each register are shown in FIG. 4. These registers are as follows:

Software Visible Registers

Seven word operand registers (R1-R7). Three of these are also index registers (R1-R3). These registers are 16-bits each.

Eight address registers (B1-B7 and P). These registers are 16-bits each.

Mask (M1) register (eight bits controlling trace and overflow trap enable).

Indicator (I) register (eight bits; overflow, reserved for future use (RFU-not used), carry-out, bit test, I/O, greater than, less than and unlike signs).

Status (S) register (16 bits; privileged mode bit, processor ID (four bits), priority level number (six bits)).

Word and Address Formats

Figure 5:
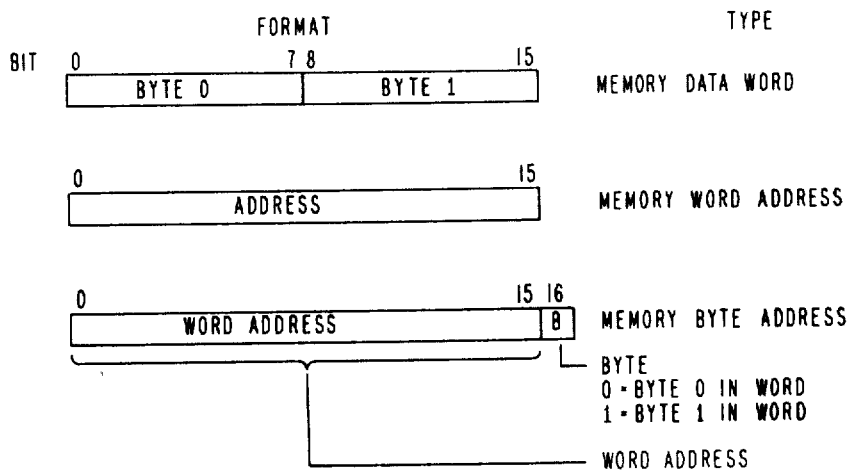
FIG. 5 illustrates the word and address formats of the present invention.

This section defines the various word and address formats that are used by the central processor unit and shown in FIG. 5.

All data word elements, such as a bit or a byte, are based on 16-bit main memory words. The format of each word is defined from left to right with the first bit numbered 0 and the last bit numbered 15. Main memory data elements may be accessed by instructions to the bit, byte, word or multiword data item level. In all cases, the leftmost element is the most significant element of the word, e.g., bit 0 is the first bit, bit 1 is the second bit, bits 0 through 7 are the first byte, bits 8 through 15 are the second byte, etc. Multiword items require successive word locations; the lowest address is defined as the leftmost or most significant part of the data item.

An address pointer is used to point to bit, byte, word or multiword data items. This address indicates the leftmost and most significant elements of the data item. Within an array, data items are numbered left to right. CPU addresses, address registers and program counters contain 16-bits and store word addresses. The rightmost bit (bit 15) of any address field is the least significant bit of the word address and all address fields are unsigned. The system can be configured for addressing up to 128K bytes (1K=1024). Byte dependent addresses for DMC data requests are stored in CPU scratch pad memory as a 17-bit address. The least significant bit (bit 16) is set when byte one is addressed. The address formats for a memory word and a memory byte are shown in FIG. 5.

Main Memory

Main memory can be configured from a minimum of 4 KW (kilowords) to a maximum of 64 KW. Memory consists of a read/write random access memory. The main memory is contained on memory boards installed on system bus B. Main memory size can be increased in 4 KW increments with a minimum of 4 KW of main memory configured in the lowest 4 KW address space. The memory size switch on the CPU must be set to correspond to the size of the main memory configured in the system so that the CPU can check for memory addresses that attempt to reference nonexistent main memory. As will be discussed in detail later, the CPU checks for references to nonexistent main memory for all memory access whether the access is being done on behalf of the CPU (for software instructions or data), or on behalf of a DMA or DMC I/O controller (for data from or to a peripheral device).

CPU AND SYSTEM BUS INTERFACES

There are two external interfaces for the central processor with the system bus: system bus A interface and system bus B interface.

The system buses A and B are part of the system chassis and provide a communications path between the CPU, main memory or the I/O controllers. These system buses also distribute power to the controllers and main memory. The system buses A and B are nearly identical and contain approximately 50 wires, or signals, each, the difference being that system bus B has a main memory interface in addition to the set of signals on system bus A. Refer to FIG. 6 for a list of signals.

SYSTEM BUS A

System bus A distributes power and provides a communications path for data transfers and interrupts between the CPU and each I/O controller (IOC) inserted in the bus connectors on the system bus A side of the system chassis. The CPU controls system bus usage and allocates service request cycles on a separate time basis. Each IOC on system bus A is only allowed to request service (for data transfer or interrupt purposes) at a time that is unique to that I/O controller and is a function of the position (relative to the CPU) of the I/O controller on system bus A. The operation of system buses A and B is described hereinafter.

FIG. 7 shows the signals on the system bus A. System bus A contains two signals (MEMVAL, BWAC60) which are unique to the CPU. These signals are only present on the CPU chassis slot connector of system bus A. All other signals on this bus are on identical pins of each bus connector with the exception of two positions. The BCYCOT-BA signal (system bus A cycle out time) pin of one bus connector is wired to the next bus connector's BCYCIN-BA signal (system bus A cycle in time) pin. In this way a priority timing signal is passed from one IOC to the next IOC on the bus. FIG. 6 indicates the functionality and source of each signal on system buses A and B.

SYSTEM BUS B

System bus B distributes power and provides a communications path for data transfers and interrupts between the CPU and each main memory board or I/O controller inserted in bus connectors on the system bus B side of the system. System bus B is similar to system bus A. However, it contains three additional main memory control signals, PMEMGO, PMFRSH, PBSFMD, which are not present on the system bus A. Therefore, main memory boards can only be installed in chassis slots on the system bus B side of the system. All other system bus B signals are similar to the system bus A but are driven by a separate set of drivers. No signals unique to the CPU chassis slot connector are present on system bus B, each signal feeds all chassis slot connectors on system bus B. The operation and control of the system buses A and B are described hereinafter. FIG. 6 gives the functionality and source of each system bus signal.

As in the case of system bus A, each I/O controller on system bus B is only allowed to request service (for data transfer or interrupt purposes) at the time that is unique to that IOC and is a function of the position (relative to the CPU) of the IOC on system bus B. Main memory, although located on system bus B, does not make service requests but must still pass on the priority timing signal (BCYCOT-BB and BCYCIN-BB) for use by I/O controllers on system bus B. Although only one I/O controller on a given system bus (A or B) can make a service request at a time, two service requests can be made simultaneously by I/O controllers in the same relative (time slot) position, one on system bus A and one on system bus B. For example, referring to FIG. 2, diskette controller 2, 220-1, on system bus B can make an interrupt request at the same time that printer controller, 208-1, on system bus A makes a DMC data request. Priority between these simultaneous system bus requests, as well as other outstanding but unresponded to earlier system bus requests, are resolved by the CPU as described hereinafter.

It should be noted that printer controller 208-1 on system bus A is in the second physical bus connector slot, relative to the CPU, and second bus request time slot whereas diskette controller 2, 220-1, is in the fourth physical bus connector slot, relative to the CPU, but in the second bus request time slot on system bus B. The difference between the physical bus connector slot and the bus request time slot on system bus B is due to the fact that each main memory board occupies one physical bus connector slot but does not occupy a bus request time slot because main memory never requests the system bus (i.e., main memory does not initiate any data transfers on the system bus and therefore the priority timing signals BCYCOT-BB and BCYCIN-BB need not be delayed by the main memory board).

CPU HARDWARE DESCRIPTION

A block diagram of the central processor unit hardware is illustrated in FIG. 8. Major CPU Functional Areas The central processor hardware is divided into four major areas: control store, scratch pad memory, microprocessor and I/O system buses as shown in FIG. 3. The following paragraphs describe at a block diagram level the components that are in each area. Control Store Now referring to FIG. 9, the control store 230 is the primary controlling element in the system. It is comprised of a read only storage (ROS) memory containing firmware microprograms and associated addressing and decoding logic necessary to interpret these microprograms. Firmware is the link between software-controlled programming and system hardware operations. Firmware contains all the functionality to control all control store, scratch pad memory, microprocessor and I/O system bus operations. These microprograms are made up of firmware words (microinstructions) arranged in a logical order. Each firmware microinstruction word contains 48 bits of encoded data, which when decoded, causes specific hardware operations. Every 500 nanoseconds, a firmware word is cycled out of ROS memory and decoded to determine the next firmware address, and to generate specific commands to the microprocessor, scratch pad memory and I/O system buses. By executing firmware microprograms in a sequential manner, hardware operations are performed in the proper order to accomplish the desired central processor action. Many firmware microprograms may be executed for one hardware activity (i.e., control panel operation, servicing an interrupt) or the execution of one software instruction. An overview of firmware flow and a description of the firmware word is provided hereinafter.

Figure 9:
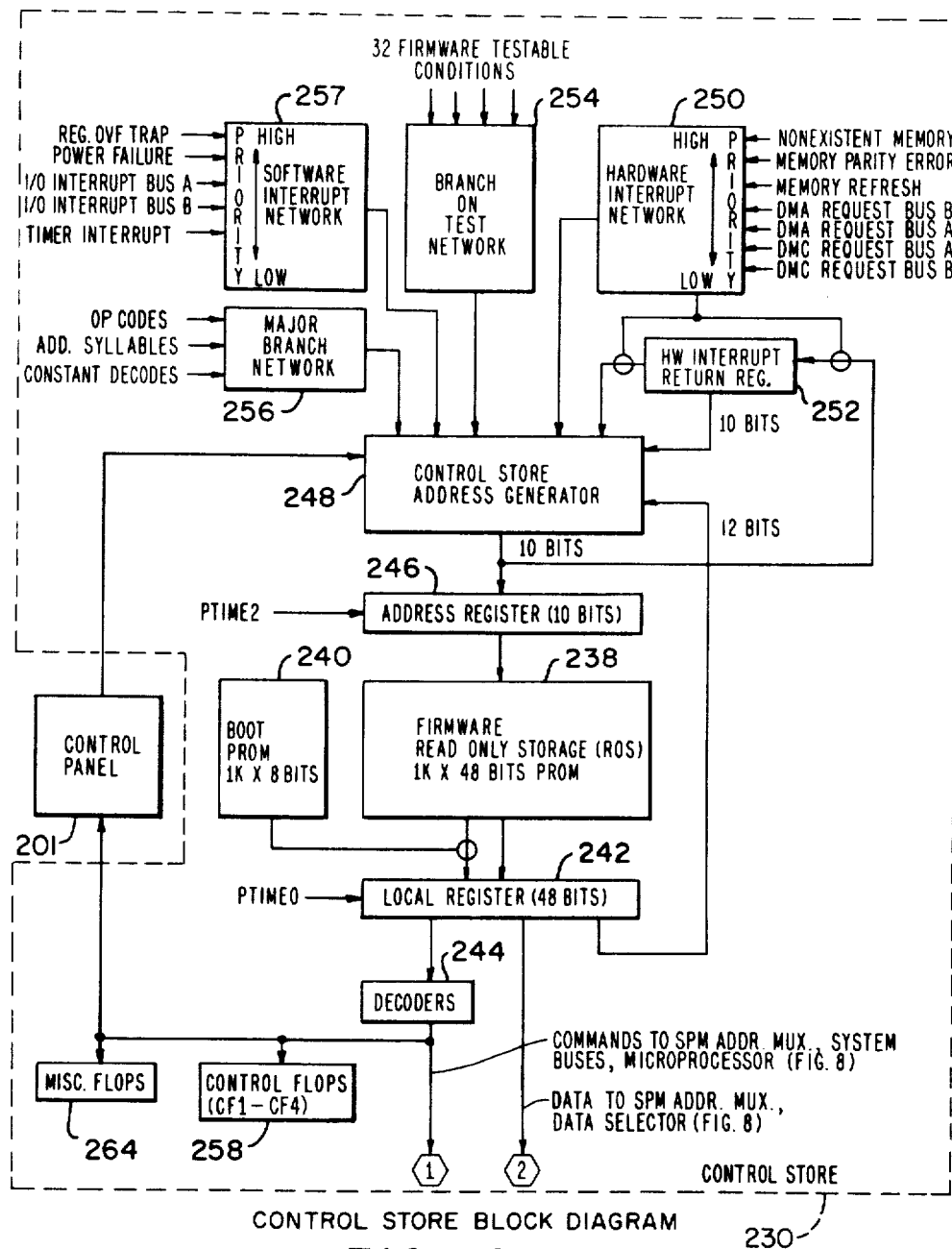
FIG. 9 is a more detailed block diagram of the control store of the CPU shown in FIG. 8.

An intermediate block diagram of control store is illustrated in FIG. 9 to assist in the description of CPU hardware and each block is explained in the following paragraphs. Referring now to FIG. 9, firmware is stored in a 1 K location by 48-bit read only store (ROS) memory 238. Each location stores one firmware word which is permanently written in the ROS memory at the factory and cannot be altered. When an address is applied to this ROS memory the corresponding firmware word is read out.

Boot PROM 240 is a 1 K by 8-bit ROS memory which is only used during bootstrap operations. It contains software instructions which are loaded into main memory during initialization. The output of boot PROM 240 is wired-ORed to bits 24 through 31 of the output of normal firmware ROS memory 238. During a bootstrap operation this boot PROM is enabled and bits 24 through 31 of the normal ROS are disabled.

Local register 242 is a 48-bit register that receives the addressed firmware word from ROS memory. This data is strobed in at time PTIME0 and denotes the beginning of a 500-nanosecond CPU cycle. Decoders 244 is a network of multiplexers and decoding logic which generates specific hardware commands according to the firmware word currently stored in the local register 242. The output of command decoders 244 is distributed to control panel 201, control flops 258, miscellaneous flops 264 and to other CPU Logic (see FIG. 8). Decoders 244 control various indicator lights on control panel 201.

Control flops 258 consists of four flip-flops (CF1 through CF4) which can be set and tested directly by the CPU firmware under microinstruction control. They are used to remember and test for certain conditions between firmware steps. For example, control flop 3 (CF3) is used during a DMC data transfer sequence by the CPU firmware to remember on which system bus (A or B) the I/O controller requesting the data transfer is located.

Miscellaneous flops 264 consists of other flip-flops which are directly settable and/or testable by the CPU firmware. Included in the group of flip-flops are the firmware watchdog timer (WDT) flop, firmware real time clock (RTC) flop and the power failure flop. Also included in this group of miscellaneous flip-flops 264 is the PCLEAR flop and the PDMCIO flop which are used by the CPU firmware to remember the state of system bus signal PBYTEX set by the responding I/O controller during proceed time to inform the CPU of the I/O controller type (DMA or DMC) during a CPU command sequence (see FIG. 20). The CPU uses the IOC type stored in the PDMCIO flop during an input address or input range CPU command to determine whether the IOC's address and range will be found within the CPU's SPM program channel table, as is the case for a DMC IOC, or received from the system bus after being placed there by a DMA IOC.

Address register 246 is a 10-bit register which stores the current firmware word address. Its output is used to address ROS memory 238. The next firmware word address is clocked into this register at time PTIME2 (primary time 2) of each CPU cycle.

Control store address generator 248 selects the address of the next firmware word to be read out of ROS memory 238. All addresses are branch addresses and can be either decoded directly from the current firmware word (microinstruction) of can be forced by hardware interrupts.

Four types of firmware addresses are decoded directly from the firmware word and CPU test conditions (see FIG. 35D): (1) unconditional branch (UCB) to the firmware address in bits 38 through 47 of the current firmware word; (2) branch on test (BOT) condition (2 way test branch) selects one of 32 firmware testable conditions and causes a branch address to one of two firmware locations depending on the true or false state of the selected conditions; (3) branch on major test (BMT) (multiple test branch) is used by the firmware to decode software instruction operation codes and address syllables, stored constants and software interrupts by performing a 16-way branch on the selected test condition; and (4) return to normal (RTN) (hardware interrupt return branch) causes a branch to the firmware address stored in the hardware interrupt return register and is used to return to the normal firmware flow at the completion of a hardware interrupt firmware sequence.

Hardware interrupt network 250 forces a branch address in the control store address generator 248 whenever immediate action by the CPU is required. A hardware interrupt address can be generated on each CPU cycle and a separate address is generated for each hardware interrupt condition. The hardware interrupt condition and priorities are shown in FIG. 9. Firmware can inhibit the detection of any or all hardware interrupt conditions. If a hardware interrupt occurs, the normal next firmware address is stored in the hardware interrupt return register 252.

Hardware interrupt return register 252 is 10-bits wide and stores the next normal firmware word address when a hardware interrupt occurs. This address is then used to reenter normal firmware flow at the completion of the hardware interrupt sequence.

Branch on test network 254 uses the current firmware word to select one of 32 firmware testable conditions and inform the control store address generator 248 of the true or false state of the selected condition.

Major branch network 256 generates the next firmware address when a BMT (16-way) branch is performed. The current firmware word (bits 40, 41, 42 and 43) indicates if either an op-code, address syllable, constant or software interrupt condition is used to form the next firmware address.

Software interrupt network 257 detects conditions that can interrupt software processing and generates a unique firmware address for each condition on a priority basis. Firmware uses these addresses to branch to the correct firmware routine to service the interrupt condition. It should be noted that BMT branch for testing software interrupt conditions is only performed at the beginning of a software instruction fetch from main memory sequence. The following listing contains the software interrupt conditions in the highest to lowest priority order:

(1) register overflow trap when an overflow occurs in a CPU register (R1-R7) during data manipulation and that register has its corresponding bit set in the trap enable mark register (M1);

(2) power failure when the power supply detects that a power loss will occur in a minimum of two milliseconds;

(3) I/O interrupt system bus A when an I/O controller attached to the system bus A has requested an interrupt cycle;

(4) I/O interrupt system bus B when an I/O controller attached to the system bus B has requested an interrupt cycle; and (5) timer interrupt when a fixed timed interrupt derived from the ac line signal used to update a real time clock.

Returning now to FIG. 8, scratch pad memory (SPM) 236 is a 256 location by 17-bit random access memory used to store CPU status, I/O range and buffer addresses for DMC channels. It also provides temporary storage for data, addresses, constants and I/O byte transfers. Maintained in SPM are: 15 work locations, CPU status register and program channel table (PCT).

Not all locations of the SPM are used. Refer to FIG. 10 for the scratch pad memory layout.

The 15 work locations (locations 00 through 06 and 08 through 0F, hexadecimal) are used for temporary storage. Some of the uses of these work locations are temporary storage of I/O data before transfer to memory, maintaining previous program address and intermediate storage for byte swapping during DMC data transfers.

The CPU status register is location 07 (hexadecimal) of SPM. This location is directly accessible by software. This location always contains the current CPU status. See FIG. 4 for bit definitions.

The program channel table (PCT) occupies the upper (higher address) 128 locations of SPM. It is used exclusively by the CPU to manage DMC channel operations. The attributes of the program channel table are:

(1) it consists of 64 entries, where each entry can be used as either an input or output channel because the input/output channels are half duplex (i.e., either in the input mode or output mode at any instant in time), therefore only one entry is needed per input/output channel pair; and (2) each entry consists of a 17-byte address and a 16-bit range and occupies two consecutive SPM locations.

A PCT entry is loaded whenever an I/O load (IOLD) software instruction is directed to its associated DMC channel. Each time a DMC data transfer occurs the appropriate PCT entry is updated. Information can be read from a PCT entry via a software I/O instruction to a DMC channel specifying in its function code field one of the following I/O commands: (1) input address; (2) input range; and (3) input module.

Scratch pad memory is directly controlled by the current firmware word (see firmware word description below). SPM write occurs at PTIME4 if bit 0 of the firmware word is a binary ONE. Data input to SPM 236 is from the internal bus 260 via a byte swapping multiplexer 262 (see FIG. 8). In byte operations multiplexer 262 swaps the left and right byte of the SPM input data if the left byte of the word on the internal bus 260 is to be manipulated. For DMC channels, the firmware resets bit 16 of the PCT entry address pointer in the SPM to identify that the left byte of a memory word is being manipulated. Addressing of location within the SPM is also controlled by firmware. The SPM access address comes directly from the firmware word when accessing work locations and the status register from decoders 244 in FIG. 9 via SPM address multiplexer 294 in FIG. 8. Otherwise, the DMC channel number is used when access to PCT is required in which case the SPM address comes from channel number register 296 via SPM address multiplexer 294 in FIG. 8. When performing a DMC data transfer operation, the CPU firmware uses the low order bit of the channel number (bit 9 in FIG. 24) to determine whether an input or output operation is to be performed using the address and range stored in the PCT entry for the associated input/output channel pair.

MICROPROCESSOR

Again referring to FIG. 8, all activity in the central processor centers around the processing capabilities of the firmware controlled microprocessor 232. All arithmetic, compare and logical product operations within the CPU are performed by the microprocessor 232 which is composed of four cascaded 4-bit sliced microprocessors to form a 16-bit microprocessor. In the preferred embodiment, microprocessor 232 is composed of four type Am2901 microprocessors produced by Advance Micro Devices Inc., of Sunnyvale, Calif. Within the microprocessor 232 is a 16-location by 16-bit register file 268, an eight function 16-bit wide arithmetic logic unit (ALU) 266, shift logic and miscellaneous logic necessary to support the microprocessor capabilities.

Data input to the microprocessor 232 is the 16-bit output from the data selector multiplexer 269. The multiplexer 269 can select data from either SPM 236 output, the internal bus 260, the contents of the indicator register 270 plus the M1 register 272 or, a constant from the current firmware word from local register 242 (see FIG. 9). Input data to the microprocessor 232 can be stored in the register file 268 or work registers within the microprocessor or it can be delivered via the ALU 266 to the internal bus 260 as microprocessor output data. This is determined by the firmware input to the microprocessor.

Bits 8 through 19 of the current firmware word control the microprocessor (see firmware word description below). These bits control data inputs to the ALU, the function which the ALU is to perform, and the destination of the results of the ALU. The microprocessor performs a new operation according to the firmware word at each CPU cycle (500 nanoseconds in the preferred embodiment).

Maintained in the microprocessor 232 are 16 registers in register file 268, of which 15 are visible to software (see FIG. 11). A four bit address supplied to the microprocessor is used to address the register file. This address can be selected from the function register (FR) 274 or directly from the firmware word. The FR register 274 initially stores the operation code and then contains various address syllables and constants or can be incremented or decremented as determined by firmware flow. For file addressing, the FR register 274 is divided into three sections, (FR0, FR2 and FR3) and any one of these sections can be selected by file address multiplexer 276 to be used to address the microprocessor register file 268. Data input to the register file 268 is via the ALU 266. Register file 268 output data can be delivered to the ALU 266, an internal work register (Q), or the internal bus 260 as determined by the current firmware word.

Data output from the microprocessor 232 is wired ORed with data input receivers from the system buses A and B at the internal bus 260. Therefore, if either of the system buses A or B receivers are enabled, the output of the microprocessor is disabled. However, firmware testable signals (ALU) equals zero, SIGN, overflow, carry) are always outputted from the microprocessor 232.

In addition to providing input data to microprocessor 232, the output of data selection multiplex 269 can be gated into the M1 register 272 and indicator register 270 under firmware control. Four bits of the output of data selector 269 can also be gated into quality logic test (QLT) register 278 under firmware control. The output of QLT register 278 controls the lighting of four LED indicators located on the CPU board which are used to give the data processing system operator a visual indication of the success or failure of the quality logic tests performed during system initialization.

Figure 14:
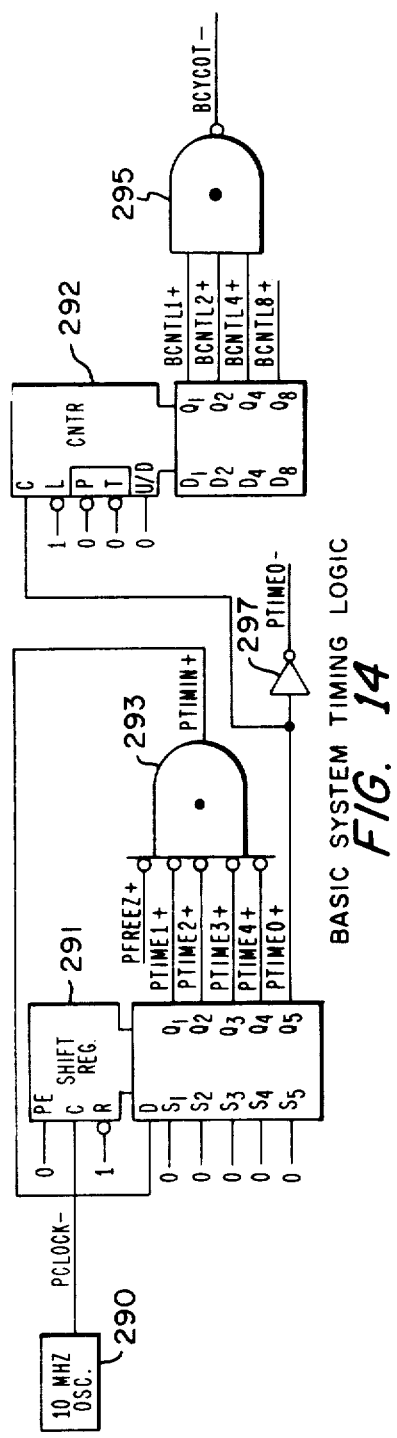
FIG. 14 is a logic diagram of the basic system timing logic of the present invention.
Figure 15:
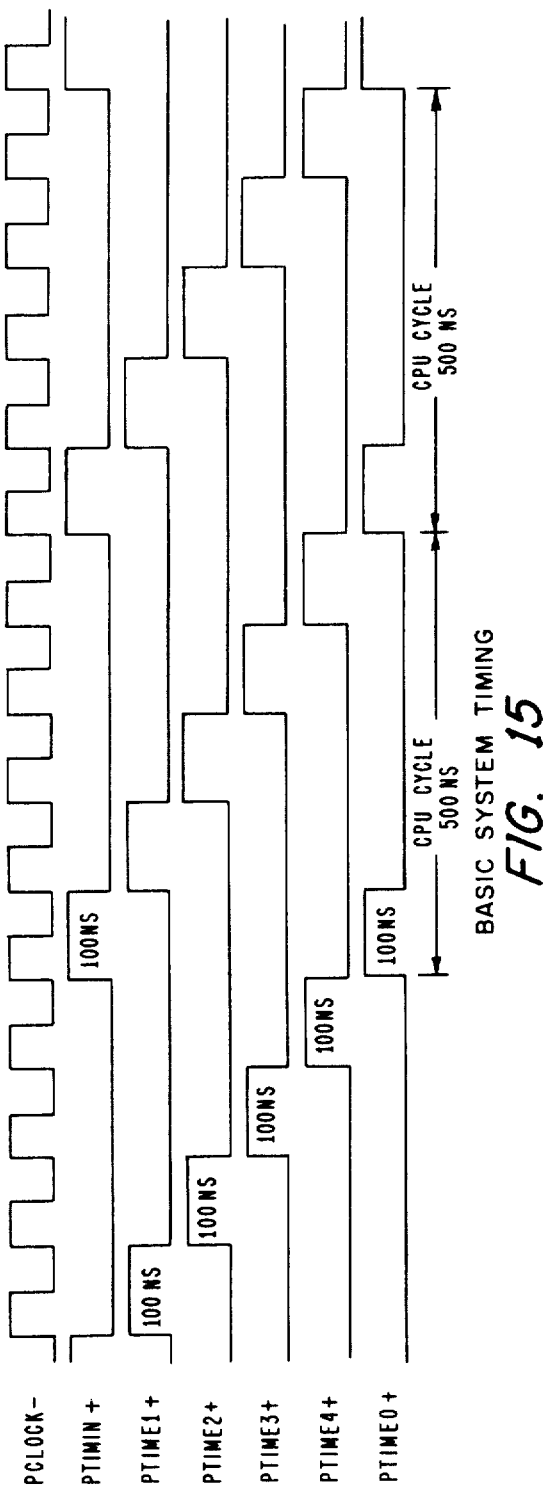
FIG. 15 is a timing diagram of the basic system timing logic shown in FIG. 14.

CLock 281 provides the various timing signals (PTIME0 through PTIME4 and BCYCOT) used throughout the system (see FIGS. 14 and 15).

SYSTEM BUS CONTROL

FIG. 12 illustrates both system buses (A and B), data paths and control signal development. The principle elements are bus subcommand decoders 244, CPU internal bus 260, separate receivers 284 and 288 and drivers 282 and 286 for each I/O system interface data/address lines, and CPU cycle out time generator 280.

Firmware controls data flow over both system buses A and B and any transfer that occurs through the 16-bit CPU internal bus 260. During each CPU cycle the subcommand decoders 244 interprets the current firmware word and generates bus control subcommands which are valid from time PTIME1 through PTIME4 of the cycle. These decoded subcommands enable specific data paths and cause data transfers as required by firmware. The dialogs which can be performed over the system buses are described in the systems bus operation section below. Basic system bus control is described in the following paragraphs.

Separate subcommands determine if either system bus receivers 284 or 288 are enabled to place data on the internal bus 260. If both A and B bus receivers 284 and 288 are disabled, the output of the microprocessor 232 is transferred to the internal bus 260. If data is to be sent to an I/O controller, the appropriate CPU to system bus drivers 282 or 286 are enabled causing data at the internal bus 260 to be transferred to the enabled system bus data/address lines. If data is to be transferred from an IOC to the CPU, the appropriate enable I/O controller data driver signal (PENBSA− or PENBSB−) is decoded and sent via the I/O interface to all I/O controllers on the specific system bus. However, only the IOC that requested the bus access places data on the system bus. A separate subcommand is generated when main memory is to transfer data to the CPU. The appropriate CPU receiver path must also be enabled to transfer main memory data to the internal bus.

As mentioned before, all transfers are via the internal bus 260. For example, if firmware determines data is to be transferred from an IOC on system bus A to main memory on system bus B, it enables the data drivers in the IOC on system bus A (via signal PENBSA−) and system bus A receivers 288 causing data to be transferred from the controller to the internal bus 260. If it is a Direct Memory Access (DMA) transfer, firmware simultaneously enables system bus B drivers 282 causing the data at the internal bus 260 to be transferred to main memory. If it is a DMC transfer, internal bus data is first sent to SPM 236 (FIG. 8) for possible byte swapping. During a later CPU cycle, the data is retrieved from SPM 236 via the microprocessor 232 and system bus B drivers 282 are enabled, causing data to be transferred from the internal bus 260 to main memory on system bus B.

The CPU cycle out time signal (BCYCOT) is used to permit the requesting of a system bus for a data transfer or interrupt by an IOC. It ensures that only one I/O controller communicates with the CPU at one time. This signal is generated every four microseconds and is propagated from controller to controller down each system bus. Each I/O controller accepts the pulse and delays it for 500 nanoseconds before passing it on to the next controller (see FIG. 13). The time in which an I/O controller delays the signal is called cycle in time for that I/O controller. As discussed hereinbefore, because main memory never makes a data transfer or interrupt request, main memory does not delay the cycle out time signal on the system bus. Instead main memory passes signal BCYCOT to the next main memory or IOC on system bus B without delay. During cycle in time is the only interval in which an I/O controller can request system bus access. If CPU firmware grants access, a link between the CPU and the I/O controller is formed, preventing any other I/O controller from access to the system bus.

During this period in which the CPU and IOC are linked, other I/O controllers on the same or alternate system bus can make system bus request during their cycle in time but the CPU will not grant access to the system bus. This CPU-IOC link is done under firmware control by inhibiting software and hardware interrupts until the link is released. The CPU-IOC link is established and maintained by each firmware microinstruction word of the microprograms used to process the data transfer or interrupt request having a bit reset to inhibit hardware (and also software) interrupts. The first microinstruction with the hardware interrupt bit reset establishes the CPU-IOC link, and after establishment, the first microinstruction word with the bit set releases the link.

CONTROL PANEL

The control panel (201 in FIG. 9) connects directly to the CPU and allows the operator to manually initialize, bootload and start the system. The control panel includes a pushbutton (momentary) switch used to start the initialize (bootload) sequence. Depressing the initialize pushbutton switch resets the ROS address register (246 in FIG. 9 via control store address generator 248) causing a branch to the initialize firmware routine. It also momentarily grounds signal PCLEAR— on both system buses causing the I/O controllers to initiate quality logic tests (QLTs).

BASIC SYSTEM TIMING

Now referring to FIG. 14, the basic system timing is developed from a 10-megahertz oscillator 290, the output of which, signal PCLOCK—, is connected to the clock (C) input 5-bit shift register 291. Shift register 291 is the type SN7496 manufactured by Texas Instruments Inc. of Dallas, Texas and described in their publication entitled "The TTL Data Book for Design Engineers", Second Edition and incorporated by reference herein. Shift register 291 has a binary ZERO at the preset enable (PE) input, a binary ONE at the clear (R) input and a binary ZERO at the preset inputs (S1 through S5). The output of AND gate 293 (signal PTIMIN+) is connected to the serial (D) input of shift register 291. The outputs of shift register 291, signals PTIME0+ through PTIME4+, are used to produce a basic 500 nanosecond CPU cycle which is divided into 5 equal 100 nanosecond time periods and is shown in FIG. 15. These times are used throughout the system to strobe and gate specific events, specifically:

PTIME0 denotes the beginning of a CPU cycle. The addressed firmware word is gated into the control store local register 242 and the decoders 244 are enabled (see FIG. 9).

The beginning of PTIME1 enables all system bus control signals which remain enabled through the end of PTIME4. The signal PTIME0+, which when inverted is a binary ONE from PTIME1 through PTIME4, enables the specific data paths within the system buses and internal buses via subcommand decoders 244 (see FIG. 12).

PTIME2 is used to gate the next firmware address which is valid at this time into the control store address register 246 (see FIG. 9).

PTIME3 is sent to all I/O controllers on the system buses and synchronizes the CPU and I/O controllers. Bus data is valid at this time.

PTIME4 is primarily used by the CPU microprocessor. Any writing or storing of information within the microprocessor 232 and scratch pad memory 236 occurs at this time (see FIG. 8).

Returning now to FIG. 14, the operation of the basic system timing logic will be briefly explained. Assuming initially that the outputs of shift register 291, signals PTIME0+ through PTIME4+, are a binary ZERO and that the clock stall signal PFREEZ+ is a binary ZERO indicating that the clock is not to be stalled, the output of AND gate 293 (signal PTIMIN+) will be a binary ONE. With a binary ONE at the serial (D) input of shift register 291, the occurrence of the transition from a binary ZERO to the binary ONE state of the clocking signal PCLOCK— from oscillator 290 will cause the output signal PTIME1+ to become a binary ONE which will in turn cause the output of AND gate 293 (signal PTIMIN+) to become a binary ZERO as shown in FIG. 15. With each succeeding clock pulse from oscillator 290, one of the outputs of shift register 291 becomes a binary ONE and the other four outputs become (or remain) a binary ZERO as shown in FIG. 15. Each of the outputs of shift register 291 is fed to an inverter to provide the inverse of the timing signals (i.e., signals PTIME0— through PTIME4—). For simplicity, only inverter 297 for signal PTIME0+ is shown in FIG. 14. Signal PTIME0+ is also used as the clocking (C) input to synchronous up/down binary counter 292. Counter 292 is of the type SN74LS169A manufactured by Texas Instruments Inc., of Dallas, Texas, and described in their heretofore mentioned publication. Counter 292 in conjunction with NAND gate 295 is used to produce the CPU cycle out time signal BCYCOT— which is fed down both system buses (A and B) for use by I/O controllers on the system buses to insure that only one I/O controller per system bus makes a request for that system bus at a given time. By counting down eight PTIME0+ signal transitions from the binary ZERO to the binary ONE state, counter 292 in conjunction with NAND gate 295 causes signal BCYCOT— to be a binary ZERO for one CPU cycle time (500 nanoseconds) followed by a binary ONE for seven CPU cycle times. Specifically: the load (L) input of counter 292 is set to a binary ONE so that data inputs D1 through D8 are ignored (i.e., not used to preload the counter), both count enable inputs (P and T) are set to a binary ZERO enabling counting, and the up/down (U/D) input is set to a binary ZERO setting the counter to the count down mode. Thus, upon the occurrence of the first transition of the clocking signal PTIME0+ from the binary ZERO to the binary ONE state the four outputs of counter 292 (signals BCNTL1+ through BCNTL8+) become a binary ONE (counting down from zero to a binary fifteen) and the output of NAND gate 295 (signal BCYCOT−) becomes a binary ZERO. Upon the second occurrence of the transition of the signal PTIME0+ from the binary ZERO to the binary ONE state, the signal BCNTL1+ will become a binary ZERO and the output of NAND gate 295 will become a binary ONE. Signal BCYCOT− will stay a binary ONE until the 9th occurrence of signal PTIME0+ transitioning from the binary ZERO to the binary ONE state at which time the signals BCNTL1+, BCNTL2+ and signals BCNTL4+ will once again all be a binary ONE resulting in the output of NAND gate 295 becoming a binary ZERO. The relationship between the CPU primary time signals PTIME0 through PTIME4 and the CPU cycle out time signal BCYCOT− is shown in FIG. 13.

Figure 13:
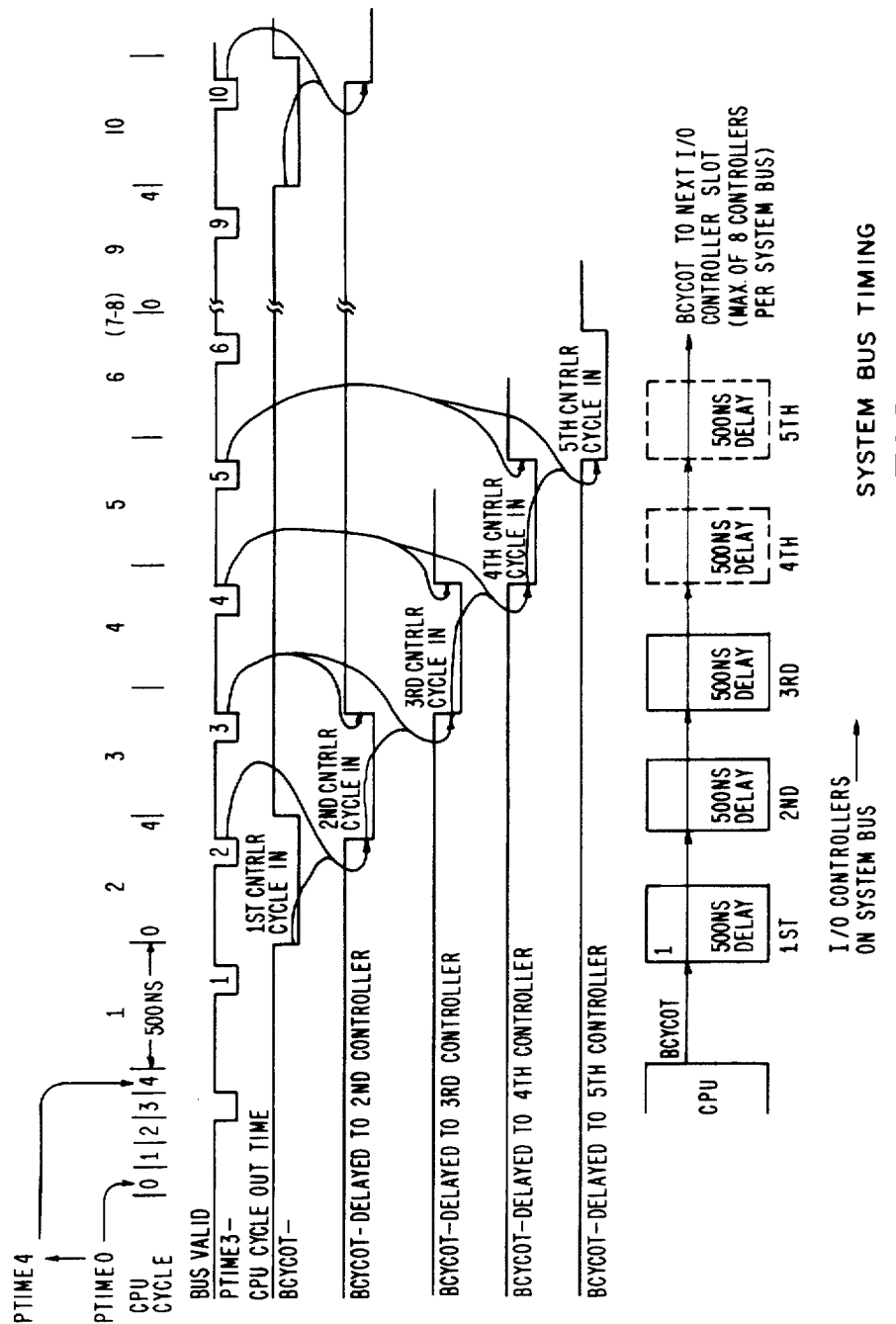
FIG. 13 is a system bus timing diagram of the present invention.

Now referring to FIG. 13, it can be seen that the CPU cycle out time signal BCYCOT− (first controller cycle in) transitions from the binary ONE to the binary ZERO state at the leading edge of PTIME0 of the second CPU cycle and transitions from the binary ZERO to the binary ONE state at the leading edge of PTIME0 of the third CPU cycle. This is contrasted with the second and subsequent controller's cycle in (BCYCOT−) signals which transition from the binary ONE to the binary ZERO state upon the occurrence of the trailing edge of the PTIME3− signal and transitions from the binary ZERO to the binary ONE state upon the next occurrence of the trailing edge of the PTIME3− signal. This difference results from deriving the CPU cycle out signal by counting every eighth PTIME0, as explained hereinbefore, whereas each controller's cycle out signal is derived by receiving the trailing edge of PTIME3 signal while the cycle out signal from the previous (neighbor toward the CPU) I/O controller is a binary ZERO, as will be explained hereinafter with respect to FIG. 40. The necessary condition met by the system as embodied to function properly is that only one IOC on a system bus sees the trailing edge of PTIME3 while the cycle out signal from the neighboring IOC (or CPU) is a binary ZERO. It should be noted that at each point in time the BCYCOT− signal received by (for example) a second IOC on system bus A from the first IOC on system bus A is in the same state as the BCYCOT− signal received by a second IOC on system bus B from the first IOC on system bus B.

SYSTEM INITIALIZATION

Figure 16:
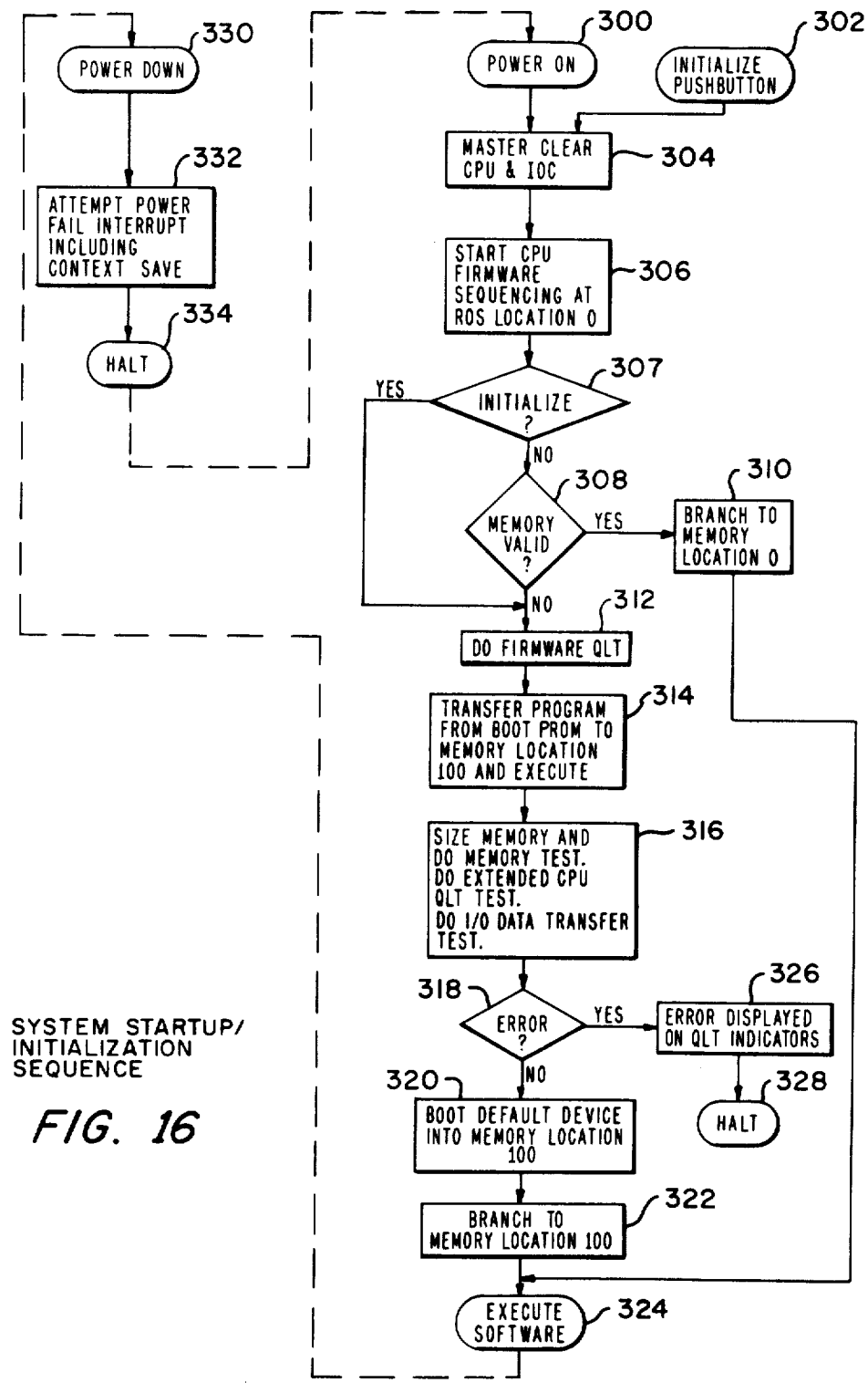
FIG. 16 illustrates a flow chart of the CPU firmware for system start up/initialization sequence of the present invention.

The CPU will react to power-up or initialize signal as shown in FIG. 16.

Now referring to FIG. 16, entry is made to the CPU initialization sequence at block 300 if the occurrence of the power on signal from the power supply is detected. Entry is also made from block 302 if the power is already on and the initialize pushbutton on the CPU control panel is pushed.

In block 304 a master clear signal is sent to the I/O controller causing the IOC to initialize their logic thereby clearing the system buses A and B to invoke any self contained IOC quality logic tests (QLTs). Master clear also initializes the CPU logic and block 306 is entered. Block 306 initiates CPU firmware sequencing at control store ROS (238 in FIG. 9) location 0. In block 307 the CPU firmware tests to determine if sequence entry was initiated by depression of the initialize pushbutton (i.e., via block 302) and if so a full initialization is to be performed and block 312 entered. If sequence entry was made upon the detection of power on via block 300, block 307 exits to block 308 and less than a full initialization may be made.

Block 308 tests if the content of main memory is valid (i.e., signal MEMVAL− is a binary ZERO indicating that the memory save unit has a charged battery so that main memory refresh voltage has been maintained during any power off period). If main memory is valid, only a limited initialization need be performed and block 310 is entered executing a branch to main memory location 0 and software execution is begun. Main memory location 0 contains the first word of the software start up procedure. Block 310 then exits to block 324 with the software executing.

If main memory is not valid, or if sequence entry was made from the initialize pushbutton, a full initialization is to be performed and block 312 is entered. The CPU firmware QLTs (resident in ROS memory 238 in FIG. 9) are executed in block 312. When the CPU firmware QLTs are completed, block 314 is entered and the software program in the boot PROM (240 in FIG. 9) is transferred to main memory (locations 100 through 2FF hexadecimal) and is executed. In block 316, execution of the software program loaded from the boot PROM results in the sizing of main memory, performance of a parity test on all available main memory and the performance of an extended CPU QLT and I/O test. In block 318, the results of the extended CPU software QLT tests are checked. If no error was detected by the extended CPU QLTs, block 320 is entered and the software boot program loads the first record off the boot load device into main memory location 100 (hexadecimal). In block 322, once the first record is loaded into main memory, a branch to main memory location 100 is executed and the CPU is running with the initialization sequence complete at block 324. If the extended CPU software QLT results in the detection of an error, block 326 is entered from block 318 and the control panel check indicator on the control panel remains illuminated and the CPU QLT indicators (LED light on the CPU board) indicate the error. Block 328 is then entered and the CPU halts.

If during software execution in block 324 an impending power failure is detected by the power supply, block 330, software execution is interrupted and block 332 is entered. In block 332, the CPU attempts to perform a power failure interrupt sequence including the context save of the software program executing at the time of the power failure. Before the context save, the CPU clears the system buses to get them free for use by CPU to main memory data transfers. The context save results in the volatile CPU registers, which will lose their information if power is not maintained, being stored into main memory for preservation during the power off period. Approximately 2 milliseconds after the detection of the impending power failure main memory will stop responding to CPU requests causing the halting of software execution in block 334. CPU firmware execution will also halt in block 334 when there is no longer sufficient power. The later detection of power on by the power supply in block 300 will cause the CPU to exit block 334 and perform a partial or complete initialization depending upon whether main memory has remained valid during the power off period.

SYSTEM BUS OPERATIONS

Figure 17:
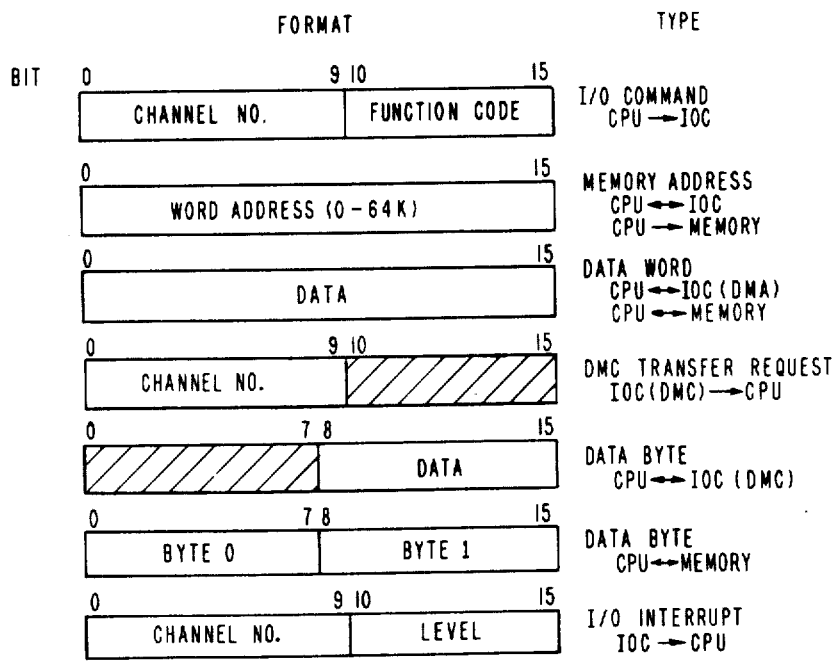
FIG. 17 illustrates the format of the address and data transfers on the address/data lines of the system bus of the present invention.

System bus operations transfers addresses, data, and control information between the CPU and the I/O controller and main memory attached to the system (see FIG. 17 for data formats). All system bus operations are controlled by CPU timing and firmware sequences. This section describes the sequence of events on the system buses (A and B) that occur when the CPU communicates with an I/O controller or main memory.

System bus operations can be initiated by either the CPU or an I/O controller. The CPU initiates system bus dialog for the following reasons: (1) all main memory accesses; (2) main memory refresh; and (3) function codes to I/O controllers. An I/O controller initiates system bus dialog for the following: (1) direct memory access (DMA) data transfers; (2) data multiplex control (DMC) data transfers; and (3) I/O controller interrupts. The main memory does not initiate any system bus dialog.

All I/O controller initiated bus activity is on a separate time basis. Controller logic only permits an IOC to initially request a bus cycle during that I/O controller's unique cycle in time (see FIG. 13) and if no other IOC on that particular bus has already made the same type of bus cycle request (e.g., an IOC on system bus B can not make a DMC request if another IOC on system bus B has already set the line PDMCR2 to a binary ZERO but the fact that another DMC IOC on system bus A has already made a DMC request by setting line PDMCR1 to a binary ZERO will not inhibit the DMC request on system bus B). Since I/O controllers can only request the system bus during its unique cycle in time no priority circuits are required in the I/O controllers.

Since two I/O buses are available and I/O controllers can request the bus for different purposes, CPU firmware reacts in the following highest to lowest priority: (1) B bus requests a DMA transfer; (2) A bus requests a DMA transfer; (3) A bus requests a DMC transfer; (4) B bus requests a DMC transfer; (5) A bus requests an interrupt; and (6) B bus requests an interrupt.

By referring to FIG. 9 it can be seen that the four highest priority bus requests (DMA/DMC transfers) are treated as hardware interrupts and handled by hardware interrupt network 250. The two lowest priority bus requests (interrupts) are treated as software interrupts and handled by software interrupt network 258.

Each system bus operation is controlled by CPU firmware sequences. Specific firmware commands informing the I/O controllers that the actions required are issued over the system bus. These I/O controllers commands are issued on the RDDT lines (RDDT29, RDDT30, RDDT31 of FIG. 6) of the system bus and come directly from the current CPU firmware word. When firmware issues a command to an IOC, the encoded command is placed on the system bus RDDT lines and the command strobe line (PIOCTA on system bus A or PIOCTB on system bus B or both PIOCTA and PIOCTB, see FIG. 7) is forced to a binary ZERO. This causes the IOCs on the system buses to decode the command and the desired action is performed. FIG. 18 lists all the CPU firmware I/O commands that can be issued to an I/O controller.

As will be discussed hereinafter in greater detail, the I/O commands listed in FIG. 18 are broadcast on the RDDT lines of both system bus A and B independent of whether the I/O controller to which a command is directed is on system bus A or B. In those cases in which the command must be directed to only one system bus, for example when answering a DMA request of an IOC on system bus B, only one command strobe line (PIOCTA on system bus A or PIOCTB on system bus B) is set to the binary ZERO state so that I/O controllers on only that system bus will see the I/O command. In other cases when the CPU is directing an I/O command to an IOC which may be on either system bus, for example, when initiating a CPU command (CPCMD) to an IOC, both command strobe lines (PIOCTA and PIOCTB) are set to a binary ZERO so that all I/O controllers will see the I/O command.

MEMORY ACCESS

Figure 19:
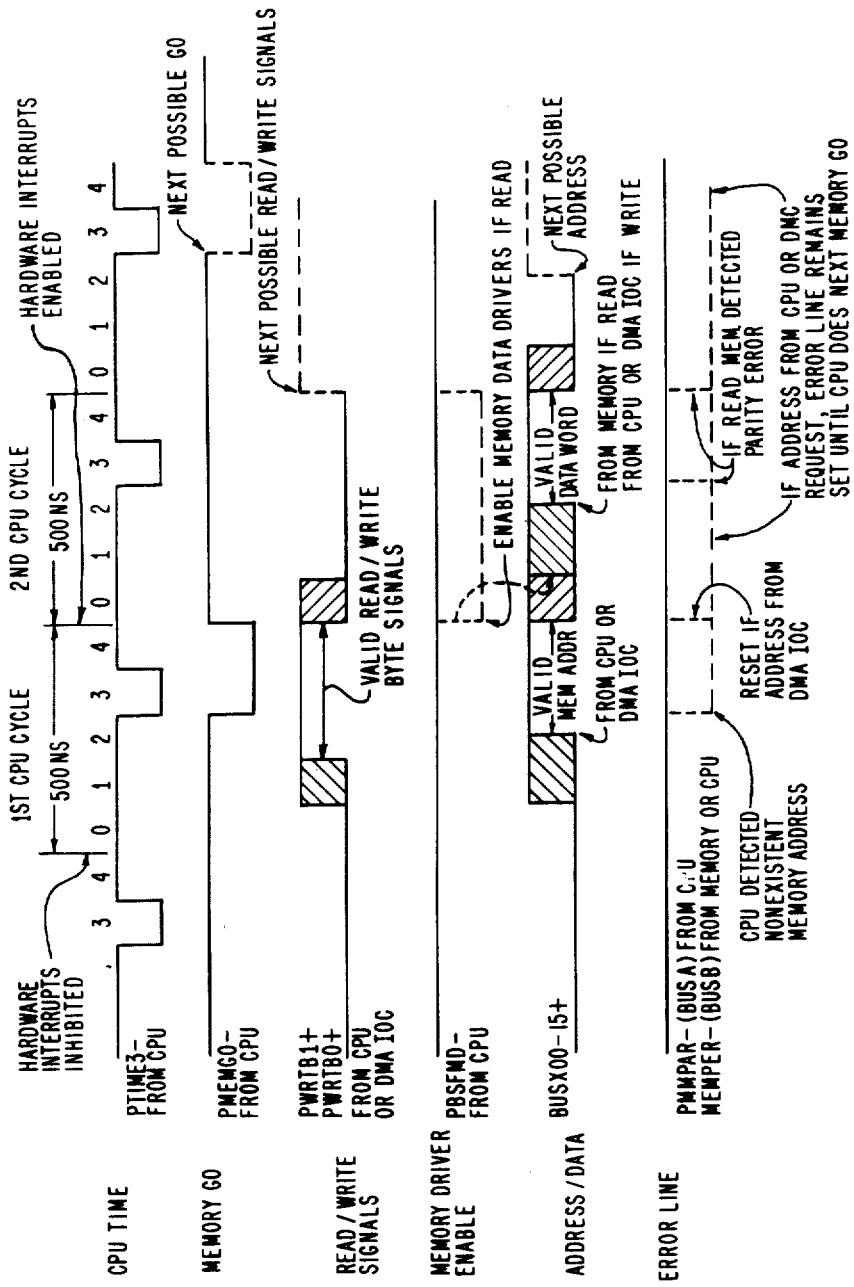
FIG. 19 illustrates a timing diagram of a memory access sequence on the system bus of the present invention.

All memory accesses are generated by CPU firmware. It requires two CPU cycles (one microsecond total) to access memory. FIG. 19 shows the sequence of events and signals required to transfer data to/from memory.

During the first CPU (500 nanosecond) cycle, the write byte signals are generated (PWRTB1, PWRTB0). Signal PWRTB0 is a binary ONE if the left byte (zero) of the data is to be writen into memory. Signal PWRTB1 is a binary ONE if the right byte (one) of the data is to be written into memory. These signals can come from a DMA controller or CPU firmware. In either case they are valid from primary time one through time four of the initial CPU cycle. These signals inform memory to either read a word or write the associated byte(s). At primary time three of the first CPU cycle the memory go pulse (PMEMGO) is generated. Along with the memory go pulse, the word address (16 bits) is placed on the address/data lines (BUSB00 through BUSB15) of system bus B. This address can come from either a DMA I/O controller or the CPU. In all cases it passes through the internal bus from one system bus (A or B) to the other system bus (B or A). The address (during the first cycle) and the data (during the second cycle) is placed on both system buses A and B via the internal bus. The placement of the address or data on both system buses occurs even when the address (or data) originates from a DMA I/O controller on system bus B or from the CPU as a matter of convenience to allow either system bus to be monitored for addresses or data and is not otherwise required in these cases for proper system operation. The memory go pulse causes the memory to accept the address and start its access sequence. If the access is due to DMA I/O controller request, the CPU examines the address against the maximum address allowed by the setting of the main memory configuration switch on the CPU. If the address is greater than the switch settings, it forces the memory error signals (PEMPAR and MEMPER) informing the I/O controller of the detection of a nonexistent address. The I/O controller then sets the correct bit in its status register. CPU initiated memory requests are checked for nonexistent memory addresses prior to memory go and a trap 15 results.

During the second CPU cycle, data transfer occurs. If the CPU or I/O controller is to receive data, the CPU enables the memory board data drivers (PBSFMD) and at primary time 3, memory places the data on system bus B and via the CPU internal bus on system bus A. If memory was performing a full word read and detects a parity error, it forces the memory error signal (MEMPER). The CPU passes the error to system bus A with a parity check error signal (PMMPAR). If the access was due to an I/O controller request, the controller sets an error bit in its status. Parity error detected on CPU requested main memory accesses cause a trap 17. Any main memory error signals are reset at the next memory go of the next main memory operation. If data is to be written into memory the CPU or I/O controller places the data on the system bus during the second cycle and memory writes the data according to the write byte signals into the addressed location at primary time three.

MEMORY REFRESH

A main memory refresh cycle occurs if the CPU issues a memory go (PMEMGO) along with the memory refresh signal (PMFRSH) on system bus B. No other system bus dialog is required. The CPU issues a main memory refresh signal at least every 15 microseconds. If CPU firmware determines main memory is not being used, it can issue the memory refresh signal at anytime, thus preventing the interruption of the CPU processing to issue a memory refresh.

FUNCTION CODE TO I/O CONTROLLER

The CPU transfer function codes to an I/O controller during the execution of IO, IOH, IOLD software instructions, resulting in a 16-bit word being transferred to or received from the I/O controller. FIG. 20 shows the sequence of events and signals required to perform this system bus operation.

The sequence is initiated by the CPU issuing a CPU command (CPCMD) on the RDDT lines and placing the channel number and function code on the address-/data lines (BUSX00 through BUSX15) of both system buses A and B. The CPU will wait a maximum of 1.2 milliseconds for a response from the I/O controller identified by the channel number. During this time the CPU effectively stalls, no software interrupt can be honored but data transfer requests are serviced. The CPU stall results from firmware looping within the CPU microprogram processing the software instruction (IO, IOH, IOLD) that caused the CPU command to be issued to the I/O controller. This looping within the I/O software instruction prohibits the processing of other software instructions or responding to software interrupts. During this looping, the CPU firmware is waiting for the proceed or busy signal (PROCED or PBUSY) from the I/O controller to occur before the firmware counts down a time out counter stored in a SPM work location. The following responses are possible.

No response is received if the CPU has attempted to access a nonexistent or defective resource. A CPU firmware timer detects this condition and trap 15 results.

The address I/O controller is busy and it cannot presently accept a command. In this case the I/O controller forces the busy line (PBUSY) to a binary ZERO causing the instruction to terminate.

The retry (wait) response is received if the addressed I/O controller cannot accept the new command because of a temporary condition within the I/O controller which is not related to the addressed channel number. The controller forces both the proceed (PROCED) and busy (PBUSY) lines to a binary ZERO causing the CPU to re-extract the current instruction and reinitiate the dialog.

The normal response is for the I/O controller to force the proceed (PROCED) line to a binary ZERO, signalling that the I/O controller is not busy and that the CPU should complete the sequence. If the addressed I/O controller is a DMA type, it also forces signal PBYTEX low (a binary ZERO) to inform the CPU of the type of I/O controller responding.

On detecting a response from the I/O controller, the CPU will issue an answer-command (ASCMD) command on the RDDT lines causing the I/O controller to reset the busy/proceed lines. When the answer command is issued, the CPU and I/O controller are linked and the CPU firmware is devoted to the CPU-I/O controller transfer.

During link time the CPU examines the range value if it is a DMC controller. If the range value equals zero, the CPU informs the IOC of this condition by issuing an end-of-range (EOFRG) command on the RDDT lines. Some DMC I/O controllers require this information, others ignore it.

Approximately six microseconds after the CPU issues the answer command (ASCMD), it issues an end-of-link (EOFLK) command on the RDDT lines. The time interval between when the CPU issues the ASCMD command the EOFLK command depends on the number of CPU firmware steps (microinstruction words) which must be executed for the particular function code sent in the CPCMD command. Because the CPU and IOC are linked during this time, with the CPU firmware and system buses dedicated to the IOC sequence, and hardware interrupts inhibited, as a design parameter this time is limited to approximately six microseconds to guarantee system responsiveness to hardware interrupts and system bus requests. At the beginning of the end-of-link time, if the function code was an input type, the CPU enables the IOC data drivers (PENBSX) and the data word is transferred over the address/data lines to the CPU. If the function code was an output type, the CPU places the data on the system bus address/data lines and the IOC strobes the data off the bus at primary time 3 of end-of-link time. If the CPU is transferring a 17-bit address to a DMA controller, line PBYTEX reflects the low order address bit (byte offset) during end-of-link time. The CPU-IOC link is reset as a result of end-of-link being detected.

DMC DATA TRANSFER REQUEST

A DMC I/O controller initiates the DMC data transfer request sequence when the I/O controller requires a byte of data to be transferred to/from an I/O buffer in main memory. This request can only occur after a software IOLD instruction has been issued to the DMC IOC initiating an input/output operation. FIGS. 21A through 21D show the system bus dialog for the DMC data transfer sequence.

Now referring to FIG. 21A, when a data transfer is required, the DMC I/O controller informs the CPU firmware by forcing the DMC data request line (PDMCRX) to a binary ZERO on the system bus on which the requesting I/O controller is located. The IOC is only permitted to force this line to a binary ZERO if the following two conditions are met: (1) the line is not already activated by some other IOC on that particular system bus and (2) at primary time 3 of cycle in time for this IOC. Cycle in time (BCYCIN signal) ensures that only one IOC at a time on a particular system bus can start a data transfer sequence. The DMC request line (PDMCRX) remains set until the CPU responds.

Activation of the DMC request line causes a hardware interrupt of the CPU to the DMC request CPU firmware microprogram. When the hardware interrupt occurs, which is a function of other higher priority hardware interrupts and whether or not the CPU firmware is inhibiting hardware interrupts, the CPU acknowledges the DMC request by issuing an answer-DMC request (ASDMC) command on the RDDT lines (RDDT29 through RDDT31). At this time the CPU and IOC become linked. For approximately the next six microseconds, depending upon the number of CPU firmware steps involved in the DMC transfer, the CPU is dedicated to this DMC data transfer and no other traffic will be allowed on either system bus A or B except that associated with the DMC data transfer.

At the next cycle after ANSDMC, the CPU enables the I/O controller drivers (via signal PENBSX), thus informing the IOC to place its channel number on the address/data lines (BUSX00 through BUSX15). The channel number is used by the CPU firmware to access the program channel table in scratch pad memory and also determines the direction of transfer.

During the next six to seven CPU cycles, the CPU obtains the memory address and range information for this channel from the program channel table. The range is decremented and the memory address incremented and stored in the program channel table. If the range is depleted by this request, the CPU issues an end-of-range (EOFRG) command on the RDDT lines, informing the IOC that this is the last transfer (FIGS. 21A through 21D). If data is to be read from memory (FIGS. 21B through 21D) the CPU accesses memory, performs any byte swapping necessary and positions the data on the system bus address/data lines in byte position one (i.e., bits 8-15).

The CPU then issues an end-of-link (EOFLK) command on the RDDT lines. This indicates to the I/O controller that data from main memory is on the data/address lines if reading from memory. The I/O controller takes this data at primary time 3 of EOFLK if a memory read is being performed. If writing in main memory, the CPU enables the I/O controller drivers via signal PENBSX, the I/O controller places the data in byte position one (i.e., bits 8-15) and the byte is transferred to SPM for possible byte swapping and then the CPU performs a memory access to write the data in main memory. End-of-link (EOFLK) causes the link between the CPU and I/O controller to be terminated and resetting of the I/O controller so that it will no longer respond to certain system bus commands until another link is established between the CPU and the I/O controller. The completion of the CPU firmware microprogram for the DMC data transfer results in the enabling of hardware interrupts (DMA and DMC data transfer requests and main memory refresh time out) each of which if pending will result in system bus traffic. It should be noted that since all system bus traffic is under the control of CPU firmware, the termination of the CPU-IOC link is not sufficient to establish other system bus traffic without the CPU firmware also allowing hardware interrupts. For example, in FIG. 21A, during CPU cycles 8 and 9 no system bus traffic can occur on either system bus because the CPU is still occupied executing the firmware microprogram for DMC input transfer from the IOC to memory.

DMA DATA TRANSFER REQUEST

A DMA I/O controller initiates a DMA data transfer sequence when the I/O controller requires either a byte or word of data to be transferred to/from the I/O buffer in main memory. This request can only occur after a software IOLD instruction has been issued to the I/O controller. FIG. 22 shows the system bus dialog for this sequence.

The DMA I/O controller informs the CPU it requires a DMA data request by forcing the DMA request line (PDMARX) on the system bus on which the requesting I/O controller is located to a binary ZERO. This line (PDMARX) remains activated until a response is received from the CPU. The I/O controller is only permitted to set this line (at primary time three) if the following two conditions are met: (1) the line is not already activated by some other I/O controller on that particular system bus; and (2) at primary time 3 (PTIME3) of cycle in time BCYCIN- a binary ZERO) for this I/O controller. Activation of the DMA request line causes a hardware interrupt of the CPU to the DMA request microprogram. When this occurs, the CPU acknowledges the request by issuing an answer-DMA-request (ASDMA) command on the RDDT lines (RDDT29 through RDDT31) and enables the I/O controller drivers by setting the (PENBX) line on the appropriate system bus. The CPU and I/O controller are linked and all system bus activity is dedicated to this DMA transfer only.

When the I/O controller detects the answer-DMA-request (ASDMA) command it immediately does the following: (1) resets the request line (PDMARX); (2) places the memory word address on the address/data lines (BUSX00 through BUSX15); and (3) gates the write byte signals on the bus lines PWRTB1 and PWRTB0. Note, if the controller is on system bus A, the CPU enables the address and write byte signals to system bus B for main memory use.

At primary time three of the answer-DMA-request (ASDMA) command cycle, the CPU issues a memory go signal (PMEMGO) and the main memory strobes using the memory go signal. If the CPU detects the address is greater than that permitted by the memory configuration switch, located on the CPU board, it informs the I/O controller by setting the memory error line (PMMPAR on system bus A and MEMPER on system bus B), causing an error bit to be set in the I/O controller's status register.

In the CPU cycle following the answer command (ASDMA), the CPU issues an end-of-link command (EOFLK) on the RDDT lines specifying that the data transfer is to take place. If it is a write operation, the CPU enables the controller drivers PENSBX and the I/O controller places the data word on the address/data lines. If the I/O controller is on system bus A, the CPU enables the data transfer to system bus B and main memory. If the operation is a memory read, memory drivers are enabled by the CPU and main memory places the data on the bus (the CPU enables the data to system bus A if required) and the I/O controller takes the data at primary time 3 of the end-of-link (EOFLK) cycle. If main memory detected a parity error, it informs the I/O controller by setting main memory parity error (MEMPER) line. If required, this error is passed to system bus A by the CPU on line PMMPAR.

During the CPU cycle immediately following the end-of-link signal, the CPU I/O controller link is terminated and the memory error signals (MEMBER and PMMPAR) are reset.

I/O CONTROLLER INTERRUPT

Figure 23:
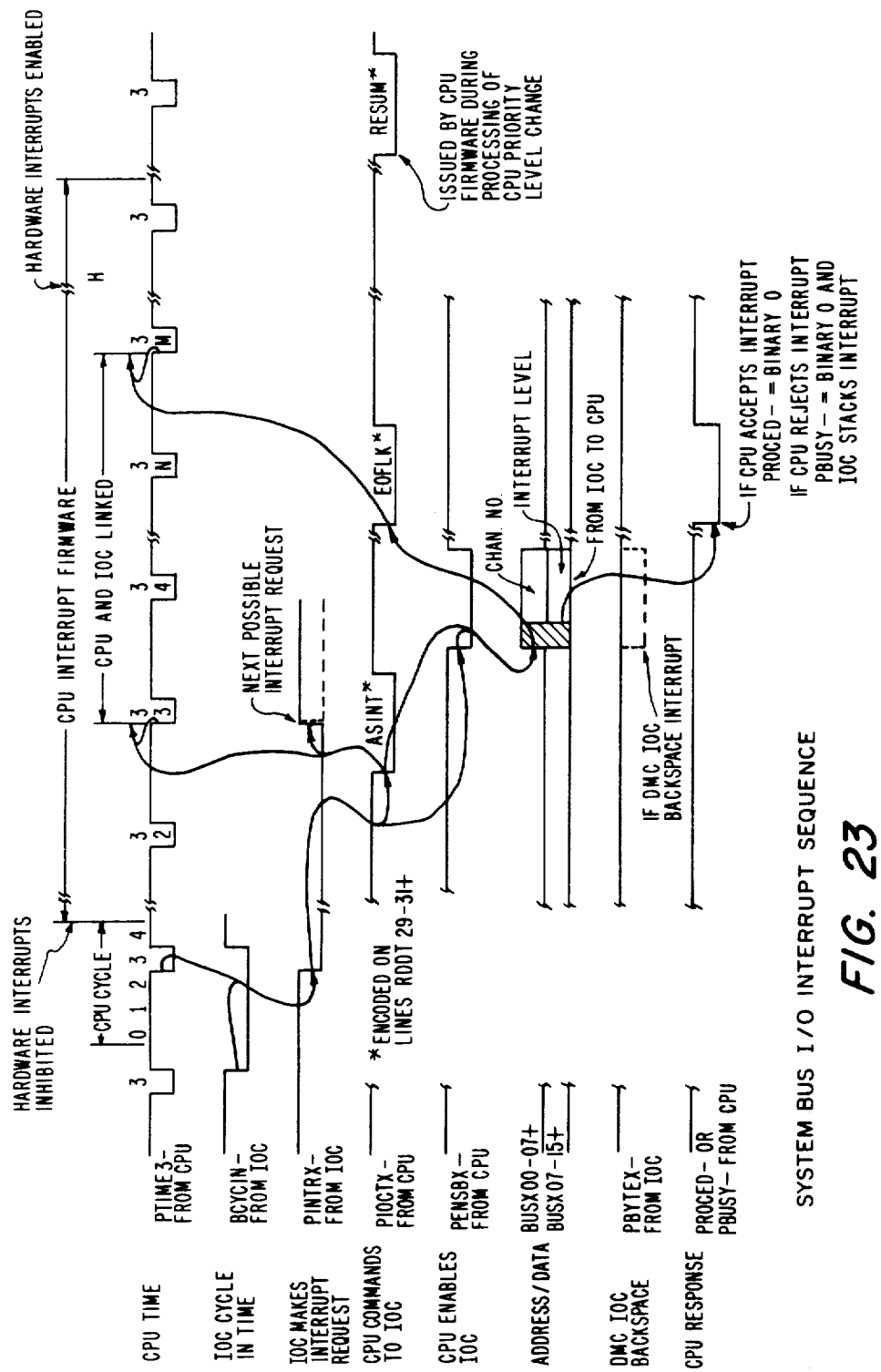
FIG. 23 illustrates a timing diagram of the input/output interrupt sequence on the system bus of the present invention.

An I/O controller initiates a system bus I/O interrupt sequence when some data transfer is complete or some device status changes. FIG. 23 shows the dialog performed over the system bus.

It should be noted that the I/O interrupt is a software interrupt and not a hardware interrupt. That is, an I/O interrupt, if accepted by the CPU, interrupts the execution of the current software program by forcing the CPU to save the current state of the software. The CPU then initiates the execution of other software dedicated to servicing the I/O interrupt. Upon completion of the I/O interrupt software, the state of the interrupted software is restored and the CPU continues executing the original interrupted software program.

When an interrupt is required the I/O controller informs the CPU firmware by forcing the interrupt request line (PINTRX) to a binary ZERO. This line remains set until the CPU responds. The IOC is only permitted to activate this line at primary time 3 of that I/O controller's cycle in time and if that line is not already activated by some other IOC on the same system bus (A or B).

The activation of an I/O interrupt request line (PINTRX) on either system bus causes the CPU to branch to the I/O interrupt firmware when the CPU firmware begins processing the next software instruction.

Software interrupts can only occur between the execution of software instructions (i.e., the presence of a software interrupt will not be acted upon by the CPU during the execution of a software instruction but only at the beginning of the next software instruction). This is accomplished by microprogramming the CPU firmware used to implement the CPU software instructions to only branch on pending software interrupts only at the beginning of the CPU firmware microprogram which fetches and decodes the next software instruction from main memory. If an I/O interrupt is pending at the beginning of the execution of a software instruction, the CPU firmware will abort the execution of the next software instruction and branch to the CPU firmware microprogram which handles the I/O interrupt processing. During the processing of the I/O interrupt the sequence shown in FIG. 23 occurs on the system bus. If the I/O interrupt is accepted, (i.e., the priority level of the IOC is higher than the priority level of the currently executing software program) by the CPU, the CPU firmware saves the current software stae and begins executing the software program associated with the I/O interrupt. If the I/O interrupt is rejected, the CPU firmware continues the execution of the software instruction without interruption.

Now, referring to FIG. 23, when the CPU branches to the I/O interrupt firmware, the CPU acknowledges the request by issuing an answer-interrupt (ASINT) command on the RDDT lines. This causes the IOC to reset the interrupt request line. The CPU and I/O controller are linked and all system bus, main memory and CPU activity is dedicated to servicing the system bus I/O interrupt request.

Immediately after the answer-interrupt (ASINT) command, the CPU activates the enable controller driver line PENSBX and the IOC places its channel and interrupt level on the address/data lines. If the IOC is a DMC type and the interrupt is due to a backspace, the IOC informs the CPU by setting the PBYTEX- line to a binary ZERO when transmitting the channel number and the interrupt level to the CPU on the system bus address/data lines (BUSX00 through BUSX15). In the case of a backspace interrupt, the level is ignored and the interrupt is always accepted. A backspace interrupt causes the memory address and range count in the PCT for the associated DMC channel to be altered by the CPU firmware to ignore the previous character.

If not a backspace, when the CPU receives the interrupt level it determines if the level presented by the IOC is of higher priority than the current level running in the CPU. If the IOC interrupt is of high priority, the CPU will set the proceed line (PROCED) in conjunction with issuing an end-of-link (EOFLK) command on the RDDT lines and the link is terminated. If the controller interrupt is of lower priority (or equal), the CPU sets the busy line (PBUSY) in conjunction with issuing an EOFLK. In this case, the link is terminated and the IOC stacks the I/O interrupt and must wait until the CPU issues a resume-interrupt (RESUM) command on the RDDT lines.

The CPU issues a resume-interrupt (RESUM) command whenever a level change occurs. The RESUM command is broadcast on both system buses A and B and monitored by each I/O controller on the system buses. When an IOC with stacked interrupts decodes a RESUM command, it sets an indicator within the I/O controller so that during that IOC's cycle in time (BCYCIN time) the IOC reissues the I/O interrupt request and the interrupt sequence starts again. The reissued I/O interrupt request will then either be accepted or rejected. If the interrupt request is rejected (PBUSY is ZERO), the IOC will once again stack the I/O interrupt and wait for a RESUM command from the CPU.

Whenever a RESUM command is issued, each IOC with stacked interrupts on each system bus will make an I/O interrupt request during its cycle in time if the interrupt request line (PINTRX) is not already set by another IOC on that particular system bus. Because the I/O interrupt request line is reset by the IOC in response to the ASINT command from the CPU, whether or not the CPU accepts or rejects the interrupt, another IOC can make an I/O interrupt request (i.e., set PINTRX to a binary ZERO) while the CPU is still processing the first I/O interrupt request. This second I/O interrupt request will not be acted upon by the CPU until the CPU firmware starts processing the next software instruction. The rejection of an I/O interrupt request, which results in the interrupt being stacked in the requesting IOC, does not block or otherwise interfere with other I/O controllers on that particular system bus making their I/O interrupt requests (stacked or otherwise) following a RESUM command. This is because a stacked interrupt will not be retried until the IOC receives a RESUM command after stacking the I/O interrupt. Thus, each IOC will make an interrupt request for its stacked interrupt following each RESUM command (unless a second RESUM command occurs before each IOC has had an opportunity to make a interrupt request).

It should be noted that the acceptance of software interrupt does not block other software interrupts but only raises the CPU priority level. Therefore, another software interrupt request can be accepted during the processing of a first software interrupt if the second interrupt is of higher priority level than the first interrupt. This acceptance of higher levels can result in nesting interrupts to as many priority levels as there are waiting to execute at any given instant limited only by the requirement that the interrupting level be of higher priority than the interrupted level and by the number of levels in the CPU (64 in the preferred embodiment).

EXECUTION OF INPUT/OUTPUT INSTRUCTIONS

There are three types of software I/O instructions supported by the CPU: IO, IOLD and IOH.

Execution of these instructions causes the CPU to initiate a dialog with the I/O controller assigned to the selected channel and report to software via the CPU's I indicator whether or not the IOC accepted the command. The I indicator is bit 12 of the indicator register (see FIG. 4). If I=0 then the IOC did not accept the command. If I=1 then the IOC accepted the command. A trap 15 occurs when no response was detected from the I/O controller. A CPU firmware timer of 1.2 milliseconds times out if a response (PROCED or PBUSY signal) is not received from the I/O controller. During the 1.2 millisecond time out period, software interrupt can not occur (because it is after the beginning of the execution of the I/O software instruction) but hardware interrupts can occur because they are not inhibited by the CPU time out firmware (see FIG. 20). Once the CPU receives the proceed (PROCED) signal from the IOC, the CPU firmware inhibits hardware interrupts and issues the answer (ASCMD) command. The CPU firmware maintains the inhibiting of hardware interrupts until after issuing the end-of-link (EOFLK) command.

Channel Numbers

Input/output data transfer channels exist for each unit (CPU, I/O controller or main memory) attached to the system buses with the exception of main memory which is identified only by a memory address. Channel numbers identify the I/O channel associated with the processor, peripheral devices, and if required, I/O controllers attached to the system. The CPU is always numbered channel zero. The first eight I/O channel pairs are reserved for use by the CPU (i.e., channel numbers 0000 through 0300 hex) so that of the 64 DMC I/O channel pairs in the preferred embodiment, 56 are actually available for the use of peripheral devices connected to DMC I/O controllers althogh space is reserved for 64 channel pairs in the SPM program channel table (see FIG. 10).

Software uses the channel numbers to identify to which I/O controller it wishes to direct a software I/O instruction. (The channel number is contained in the control word of the software I/O instruction). The channel number is also used by the CPU to identify the direction of the data transfer during data transfer time (i.e., bit 9 of the channel number determines direction).

FIG. 24 shows the software I/O instruction control word format. FIG. 24 also gives the valid DMC channel numbers and valid DMA channel numbers. For both DMA and DMC, the first 8 channel pairs (16 channel numbers) are reserved for CPU use and are therefore not valid I/O channel numbers. Any software I/O instruction specifying a channel number which does not correspond to the channel number switch setting of an I/O controller installed in the system will result in a trap 15 being posted by the CPU upon expiration of the CPU firmware timer.

The I/O controllers use the channel number to identify its channel when it requires service from the CPU. Two types of services exist: (1) Interrupt—used by all (i.e., DMA and DMC) channels to signify its level number to the CPU (see FIG. 17); and (2) Data—used by a DMC channel to send or receive a byte. Note that the channel number is used by the CPU to address the program channel table (PCT). The channel number sent to the CPU will have the format shown in FIG. 24. Note that for DMC data transfer requests, bits 10 through 15 of the control word are ignored as shown in FIG. 17.

I/O Function Codes

The I/O function codes are presented in FIG. 25. The function codes specify the specific I/O function to be performed by an I/O controller. All odd function codes designate output transfers (write) while all even function codes designate input transfer requests (read). The function code commands always input/output either 16 bits (if issued via an IO instruction) or eight bits (if issued via an IOH instruction) from/to the channel. Nevertheless, I/O controllers can elect to use only part or all of the data bits involved in a transfer.

Output Function Code Commands

The eight output function code commands are described below.

Initialize (FC=01). This command will load a 16-bit control word to the channel. Individual bits will cause specific action as follows: Bit 0=initialize; Bit 1=1 stop I/O; and Bits 2 through 15=reserved for future use. This command will be accepted regardless of the channel busy condition. Initialize (IOC oriented): causes the IOC to run its resident quality logic test (QLT) (if any); clears all channels of the IOC; clears the bus interface; blocks interrupts; and clears the busy condition. Stop I/O (channel oriented): clears busy condition; causes interrupt if enabled; abruptly stops transfer from channel; and does not affect other channels on the same IOC.

Output Interrupt Control Word (FC=03). This command sends a 16-bit interrupt control word to the channel specifying the CPU channel number (zero) in bits 0 through 9 and interrupt level in bits 10 through 15. The channel will store the interrupt control word in its interrupt control register. On interrupting, the IOC will return the interrupt control word as shown in FIG. 17.

Output Task (FC=07). This command outputs a task word (or byte) to the channel. The meanings of individual bits are device specific. Output task is intended for those functions which have to be output frequently (e.g., read a disk record, etc.) as compared with relatively static information which is output via the configuration command (see below).

Output Address (FC=09). This command outputs a 17-bit quantity which is used by the channel as the starting byte address to/from where a data transfer will be made. If the command is directed to a DMA channel, then the byte address is sent over the bus to the channel and stored in the IOC. If the command is directed to a DMC channel then the byte address is stored in the appropriate PCT entry in the CPU. The output address FC is used in conjunction with a software IOLD instruction. Usage of this command with any of the other input/output instructions will cause unspecified results.

Output Range (FC=0D). This command outputs range information to the channel within the range of 0 through $2^{15}$-1. If the command is directed to a DMA channel, then the range is sent over the bus to the channel and stored in the IOC. If the command is directed to a DMC channel, then the range is stored in the appropriate PCT entry in the CPU. The output range FC is used in conjunction with a software IOLD instruction. Use of this command with any of the other input/output instructions will cause unspecified results.

Output Configuration Word A (FC=11). This command outputs configuration information to the channel. The meanings of individual bits are device (or IOC) specific. Output configuration is intended for those functions which are output only infrequently (e.g., terminal speed, card read mode, etc.).

Output Configuration Word B (FC=13). This command outputs additional configuration information to the channel. The meanings of the bits are device (or IOC) specific. This command is used where more information is required than can be coded into configuration word A.

Input Function Code Commands

The 10 input function code commands are described below.

Input Interrupt Control (FC=02). This command causes a channel to place the contents of its interrupt control register on the system bus data lines (BUSX00 through BUSX15). The format of data is as shown in FIG. 17. Note the channel number is that of the CPU (i.e., zero) and not that of the responding IOC.

Input Task (FC=06). This command causes the channel to place the contents of its task register on the system bus data lines (BUSX00 through BUSX15).

Input Address (FC=08). This command causes a DMA channel to place the contents of its address register (low order 16 bits) on the system bus data lines (BUSX00 through BUSX15). This command when directed to a DMC channel causes the CPU to extract the address (residual) information from the appropriate PCT entry in the CPU.

Input Module (FC=0A). This command causes a DMA channel to place the high order bit of its address register (right justified) on the system bus. This command when directed to a DMC channel causes the CPU to extract the high order bit of the address information from the appropriate PCT entry in the CPU. The high order address bit (or module number) is right justified on the system bus and is placed on data line BUSX15.

Input Range (FC=0C). This command causes a DMA channel to place the contents of its range register on the system bus data lines (BUSX00 through BUSX15). This command when directed to a DMC channel causes the CPU to extract the residual range from the appropriate PCT entry in the CPU.

Input Configuration Word A (FC−10). This command causes the channel to place the contents of its configuration word A on the system bus data lines (BUSX00 through BUSX15).

Input Configuration Word B (FC=12). This command causes the channel to place the contents of its configuration word B on the system bus data lines (BUSX00 through BUSX15).

Input Status Word 1 (FC=18). This command causes the channel to place its first status word on the system bus data lines (BUSX00 through BUSX15).

Input Status Word 2 (FC=1A). This command causes the channel to place its second status word on the system bus data lines (BUSX00 through BUSX15). Status bit definitions are IOC specific.

Input Device Identification (FC=26). This command causes the channel to place its 16-bit device identification number on the system bus data lines (BUSX00 through BUSX15). Each peripheral device type is assigned a unique identification number thereby enabling a software program to identify the particular peripheral device type that is attached to each channel in a system.

Software Input/Output Instructions

The CPU recognizes and executes via firmware three types of software I/O instructions: (1) data word and command I/O instructions (software programming mnemonic of IO); (2) data byte (half word) and command I/O instructions (software programming mnemonic of IOH); and (3) address and range load I/O instructions (software programming mnemonic of IOLD).

IO Instruction

The IO software instruction is used to send or receive control words to/from I/O controllers. The function code defined by the IO instruction determines the direction of the information transfer. Typically, the software will use an IO instruction to pass to an IOC the necessary task word and configuration information required to perform a data transfer. Also, upon completion of the I/O operation, software will again use the IO instruction to retrieve status and residual range information.

The format of the IO software instruction (and also the IOH instruction) is shown in FIGS. 26A and 26B.

The IO instruction specifies two quantities, namely: (1) data word identified by DAS; and (2) control word identifying the external channel (or device) and function it is to perform.

The control word may be imbedded directly in the IO instruction as shown in the format of FIG. 26A or it may be elsewhere in the software program and pointed to by the IO instruction as shown in the format of FIG. 26B. Now, referring to FIGS. 26A and 26B where:

OP=Instruction operation code field.
  OP=00000 (binary) for an IO instruction
    =00010 (binary) for an IOH instruction.
DAS=Data address syllable. It specifies a location in main memory or CPU register from/to which a word (for IO instruction) or byte (for IOH instruction) is transferred to/from the I/O channel. The data address syllable (DAS) can have one of three formats:
  • Register address syllable in which a CPU register is the source of destination for the operation.
  • Immediate operand address syllable in which an operand of appropriate size (word or byte) is imbedded directly in the instruction.
  • Memory address syllable in which an address of a location in main memory containing the operand is specified.
CH=Channel number or I/O device address.
F=Function code, which is IOC or device specific under the constraint:
  • If F is even, data will be transferred from the IOC to the CPU/memory (e.g., read status)
  • If F is odd, data will be transferred from the CPU/memory to the IOC (e.g., load control register).
CAS=Control word address syllable, pointing to control word containing CH and F. The format for CAS is the same as DAS.

Execution of the IO software instruction is controlled by CPU firmware. See FIG. 28 for a flowchart of the IO instruction. System bus operations during IO instruction execution were described above.

When executing an I/O instruction directed to a DMC channel, the CPU will check the function code to determine if it is one of the following:
• Input Module (one bit module number)

- Input Address (16 bit byte address)
- Input Range

If it is one of the above functions codes, the CPU directly executes all or part of the instruction since it manages this information in scratch pad memory. If it is not one of the above function codes, the data will be transferred to or received from the I/O controller.

When executing an I/O instruction directed to a DMA channel the CPU passes the function code to the I/O controller and either receives or sends one word of information to/from the I/O controller.

Figure 28:
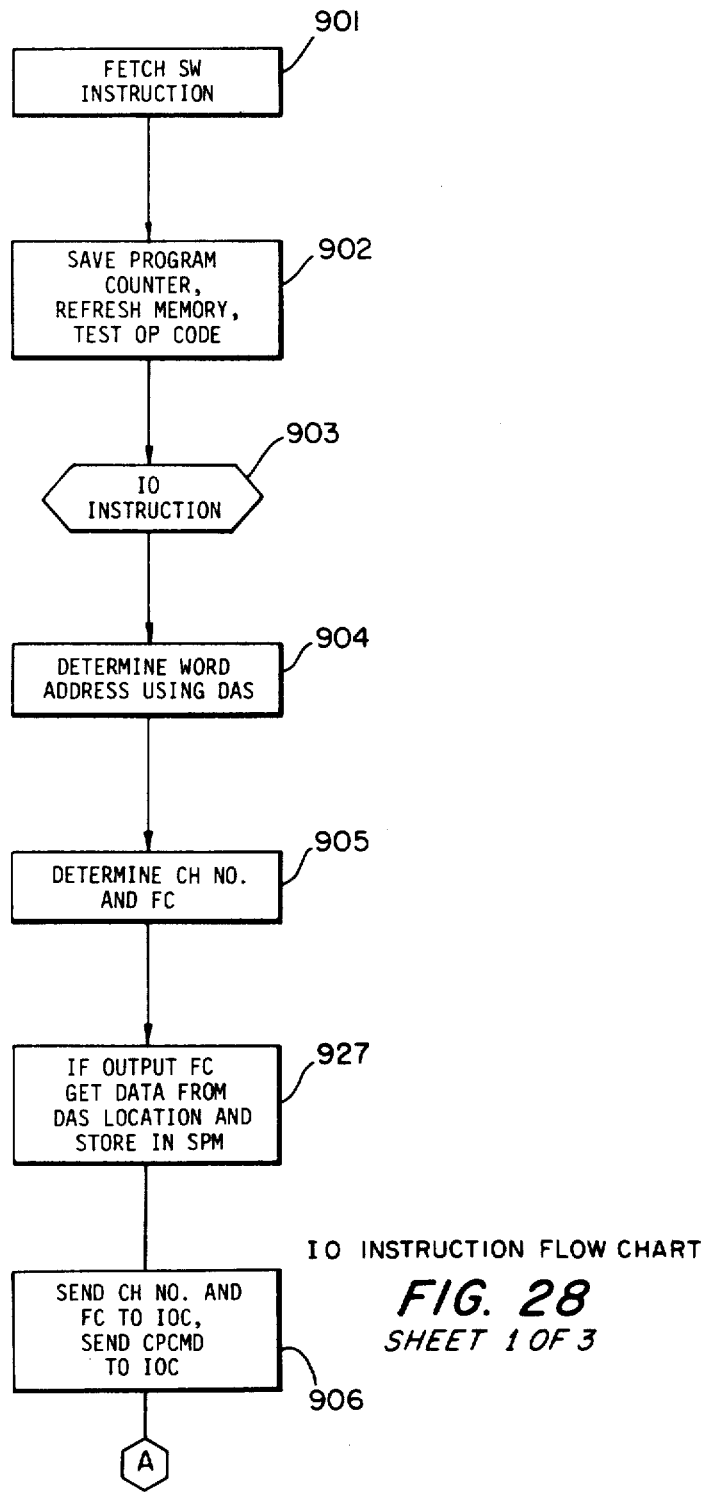
FIG. 28 illustrates a flow chart of the CPU firmware which implements the IO software instruction shown in FIG. 26A and FIG. 26B.
Figure 28:
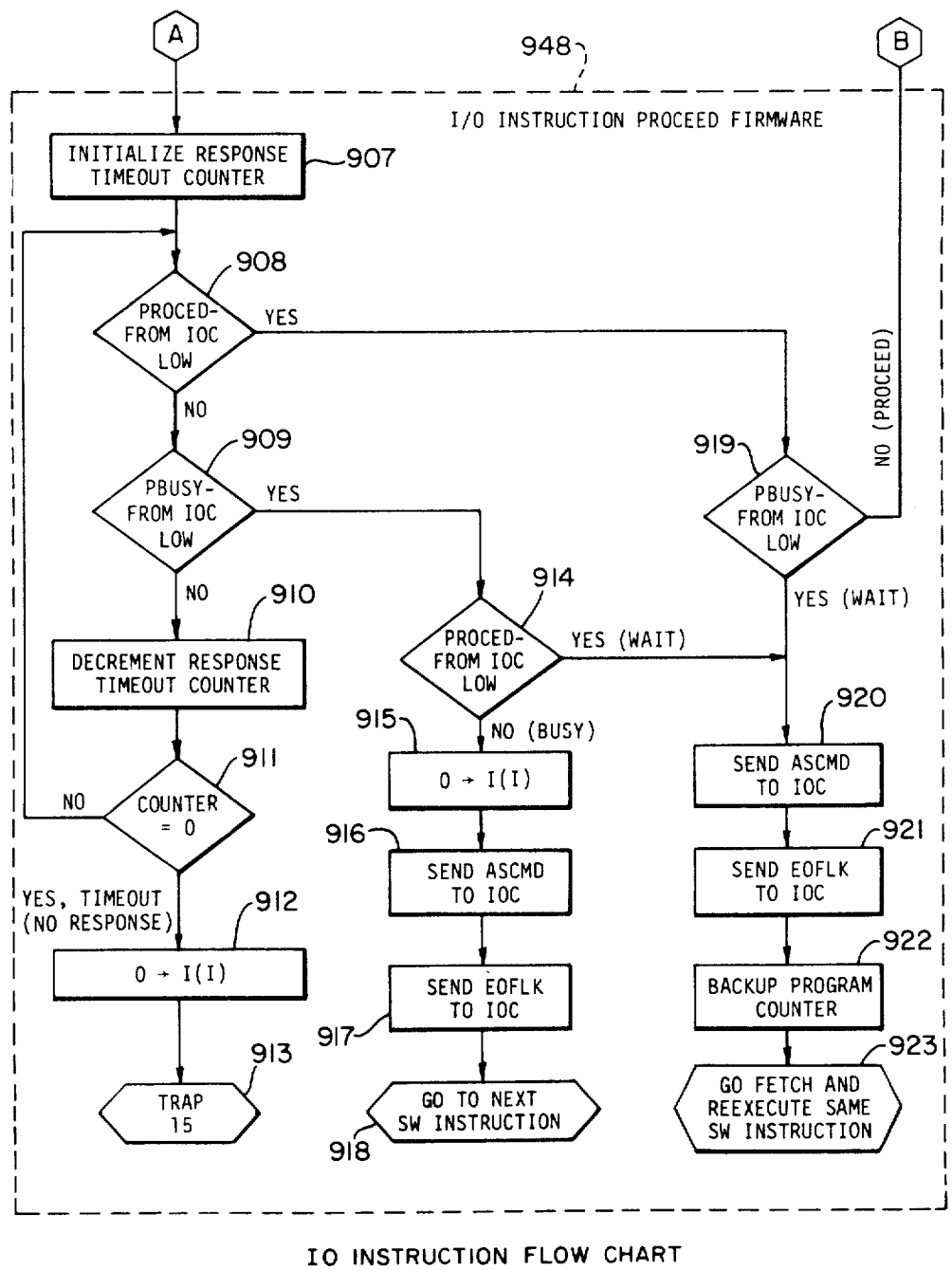
Figure 28:
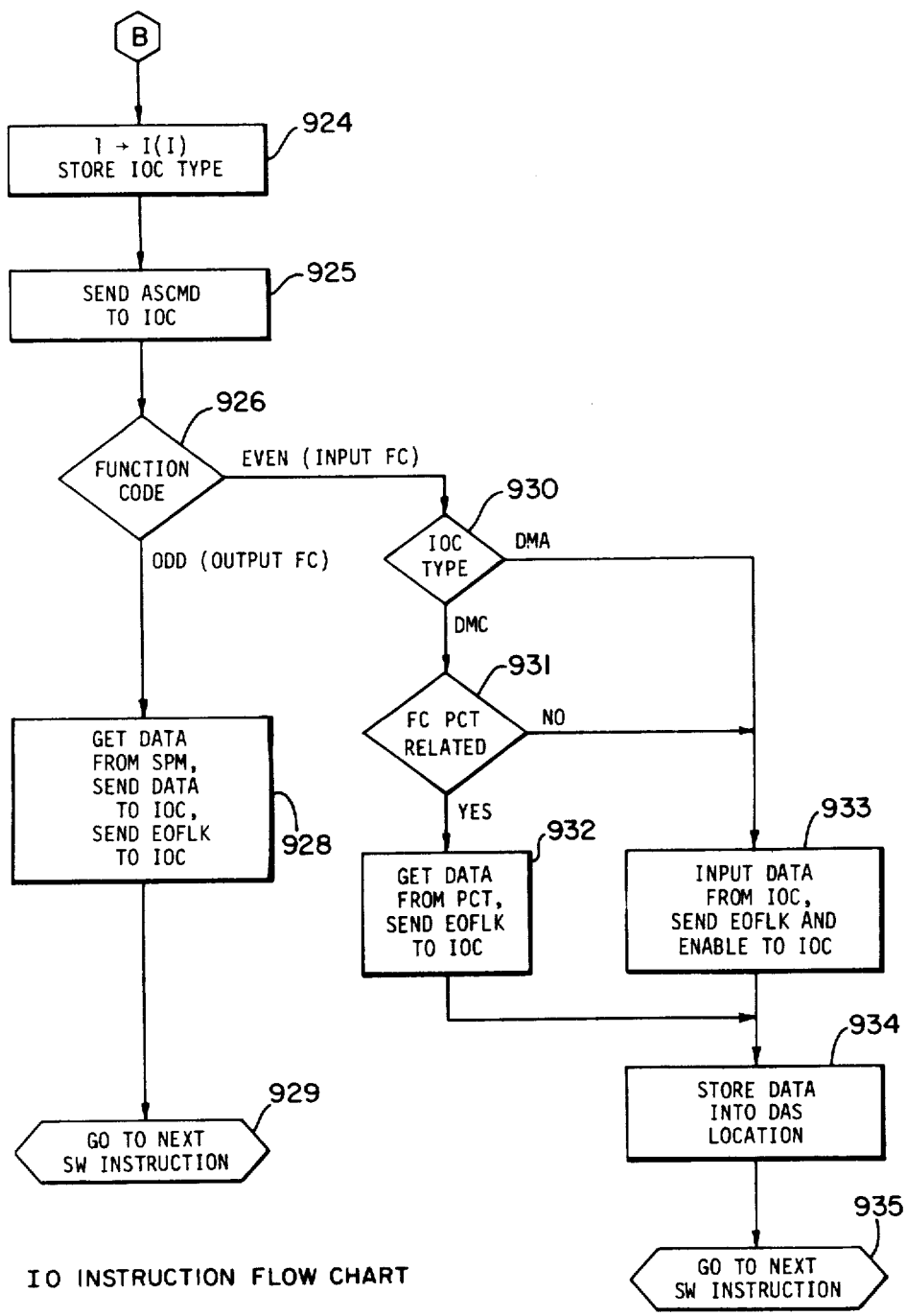

Now referring to FIG. 28, the CPU firmware used to implement the IO software instruction will be discussed in detail. Before describing FIG. 28 it should be noted that there is not necessarily a one to one correspondence between the block shown in the flow chart and the number of CPU firmware microinstructions used to implement each block. For example, multiple CPU firmware microinstructions are used to perform the function shown as block 904 and one CPU firmware microinstruction is used to perform the function shown as blocks 914 and 920.

The CPU firmware begins processing the IO software instruction at block 901 where the firmware fetches the first word of the software instruction from main memory. Following the reading of the first word of the software instruction from main memory, the CPU firmware does a test to see whether any software interrupts are pending (not shown in FIG. 28, but see FIGS. 33 and 34). If no software interrupt is pending, block 902 is entered and the program counter which points to the first word of the software instruction is saved, a memory refresh operation is initiated because the memory will not be accessed during the next CPU cycle, and a test of the operation code of the software instruction fetched from main memory is performed. If the operation code of the software instruction fetched from main memory is an IO software instruction, 903 is entered, and the CPU firmware routine associated with the execution of the IO instruction is begun. In block 904 the CPU firmware determines the word address using the data address syllable (DAS) (see FIG. 26). If indexing is specified, then the index value will be in terms of words, as opposed to bytes. The word address specified by the DAS specifies a location in main memory or a CPU register from/to which a word of data is to be transferred to/from the IOC. The specified location contains a word of data to be sent to the IOC or is where the word of data read from the IOC is to be stored. In block 905 the CPU firmware determines the channel number and function code specified by the IO software instruction using CAS if required (see FIG. 26B). In block 927 a test is made to determine if the function code is an output function code and if so the data word specified by DAS is accessed and stored in a scratch pad memory work location. In block 906 the channel number and function code are sent to the IOC on the system bus data/address lines (BUSX00 through BUSX15) (see FIG. 17, I/O command format). In addition in block 906, the CPU sends the CPCMD command on the system bus RDDT lines indicating to all IOCs that a channel number and function code are present on the system bus (see FIG. 20).

Following the CPU sending the CPCMD command, the firmware enters I/O instruction proceed firmware, block 948, which loops until the addressed (by channel number) IOC accepts or rejects the CPCMD command or informs the CPU to retry the I/O software instruction. I/O instruction proceed firmware block 948 begins by initializing a response timeout counter in block 907. This response timeout counter is contained in a scratch pad memory work location and is counted down as the firmware loops waiting for the IOC to acknowledge CPCMD command from an input/output (IO, IOH or IOLD) software instruction. If the IOC does not acknowledge or reject the CPCMD command within 1.2 milliseconds, the response timeout counter will be decremented to zero and the CPU firmware will cause a trap (see FIG. 20). After initializing the response timeout counter, the CPU firmware tests whether the IOC has set the system bus PROCED line low in block 908. If the PROCED line is not low, block 909 is entered and a test is performed to see if the IOC has set the PBUSY line on the system bus low. If the system bus PBUSY line is not low, block 910 is entered and the response timeout counter is decremented. In block 911 a test is made to see whether the response timeout counter is equal to zero and if yes the 1.2 millisecond timeout has expired indicating that the CPCMD command was directed to a nonexistent, or malfunctioning I/O controller (i.e., no IOC on either system bus A or B responds to the channel number). If no IOC on either system bus A or B responds, block 912 is entered and a zero is set in the input/output indicator (I) bit of indicator (I) register. This input/output indicator bit in the indicator register may be tested by subsequent software instructions to determine whether or not the previous I/O command was accepted. After setting the input/output bit indicator, block 913 is entered and a trap number 15 is performed indicating that an unavailable resource has been addressed and execution of the I/O software instruction is terminated.

Returning now to block 908, if the IOC sets system bus PROCED line low, block 919 is entered and the PBUSY line is tested. In block 919, if system bus line PBUSY is set low by the IOC, it indicates that the IOC is temporarily busy and that the CPU should retry the instruction (i.e., a wait condition). If a wait condition exists, block 920 is entered and the CPU firmware sends the IOC an ASCMD command on the system bus RDDT lines which establishes the CPU-IOC link. This is followed by the CPU sending a EOFLK command in block 921 to the IOC on the system bus RDDT lines which terminates the CPU-IOC link (see FIG. 20). After terminating the CPU-IOC link, block 922 is entered and the program counter saved earlier is backed up to point to the first word of the I/O software instruction currently being executed. Block 923 is then entered and the CPU firmware goes to fetch the first word of the software instruction pointed to by the program counter. This will result in the software refetching and reexecuting the same I/O software instruction which received the wait response from the I/O controller.

Because the I/O software instruction is retried from the beginning, care must be taken not only to restore the program counter but also any other CPU register which could be changed during a previous execution attempt which could receive a wait response from a temporarily busy IOC. In the preferred embodiment, this is accomplished by not permitting forms of operand addressing which result in automatic incrementation or decrementation of registers used in address development. This restriction eliminates the need to restore any register other than the program counter.

Returning now to block 909, the IOC has set the system bus PBUSY line low, block 914 is entered and a test is made to see whether the PROCED line is also low. If both PBUSY and PROCED lines are low, block 920 is entered and the CPU establishes and then terminates the CPU-IOC link and then reexecutes the I/O software instruction as described above. In block 914 if system bus PROCED line is not low, indicating that the IOC is busy, block 915 is entered. Again in block 915, the input/output indicator (I) bit in the indicator (I) register is set to zero for testing by subsequent software instructions to indicate that an IOC did not accept the last I/O command. Block 916 is then entered and the CPU sends the ASCMD command to the IOC to establish the CPU-IOC link. In block 917 the CPU firmware sends the IOC an EOFLK command on the system bus RDDT lines thereby terminating the CPU-IOC link. Block 918 is then entered and the CPU firmware goes to fetch the next software instruction from main memory.

Before leaving the discussion of the I/O instruction proceed firmware, 948, it is important to note that during the time that the CPU firmware is looping (i.e., waiting for an I/O controller to respond with a proceed, busy, wait or timeout, and that although hardware interrupts are inhibited between some of the firmware microinstructions within the loop of blocks 908 through 911, the hardware interrupts are permitted at the end of each pass through the loop. Therefore the CPU firmware may be interrupted and the system bus may be used to perform a DMA data transfer, a DMC data transfer, or a memory refresh operation. As will be seen later with respect to FIG. 34, no software interrupt will be responded to during this 1.2 millisecond timing operation because software interrupts are tested for by the CPU firmware only immediately following the fetch of a software instruction from main memory (i.e., only after block 901).

When the CPU firmware detects a proceed condition (i.e., the responding IOC has set system bus PROCED line low and left PBUSY line high) block 924 is entered. In block 924 the CPU firmware sets a binary ONE in the input/output indicator (I) bit of the indicator (I) register and also stores the state of the system bus PBYTEX line in the PDMCIO flip-flop for later testing of the IOC type. If the system bus PBYTEX line is high it indicates that the responding IOC is a DMC IOC and if low it indicates that the responding IOC is a DMA IOC. CPU firmware then sends the responding IOC an ASCMD command in block 925 on the system bus RDDT lines establishing the CPU-IOC link. In block 926 the function code is tested. If the function code is odd, indicating an output function code, block 928 is entered and the CPU firmware gets the word of data pointed to by the data address syllable (DAS) from the SPM work location. The data word is sent to the IOC on the system bus address/data lines (BUSX00 through BUSX15) and the CPU also sends the EOFLK command to the IOC on the RDDT lines. When the IOC sees the EOFLK command it takes the data word from the address/data lines and terminates the CPU-IOC link. Block 928 completes the processing of the IO software instruction and the CPU then exits to block 929 which goes to the CPU firmware to fetch the next software instruction.

From block 926, if the function code is even, indicating an input function code, block 930 is entered and a test is performed to determine the IOC type. If the responding IOC is a DMC IOC, block 931 is entered and a further test is made to determine whether the function code is program channel table (PCT) related. If the function code from the IO software instruction is program channel table related (i.e., input module, input address, or input range), block 932 is entered and the data specified by the function code is extracted from the program channel table stored in the scratch pad memory and an EOFLK command is sent to the IOC terminating the CPU-IOC link. Again returning to block 930, the IOC type is determined by testing the state of the PDMCIO flop which was loaded in block 924 above. If the IOC is a DMA IOC block 933 is entered. In block 933 the IOC places the data on the address/data lines (see FIG. 17, data word format) of the system bus upon receiving the EOFLK and enable (PENBSX) signal from the CPU (see FIG. 20). In block 934 the data, either extracted from the program channel table (PCT) or received from the IOC, is stored in the location specified by the data address syllable (DAS) of the IO software instruction. The IO software instruction is completed with the storing of the data word in the DAS location and the CPU firmware then goes and fetches the next software instruction in block 935.

Before leaving the discussion of the IO software instruction it should be noted that, from the software point of view, the results of executing the IO software instruction are the same whether or not the I/O controller is a DMA I/O controller or a DMC I/O controller. The differences between the DMA and DMC I/O controllers are masked from the software by the CPU firmware. The software programmer need not be cognizant of whether the device for which he is writing an input/output program is attached to a DMA or DMC I/O controller.

IOLD Instruction

The IOLD software instruction is used to prepare for the data transfer to/from an I/O buffer within main memory. For some I/O controllers, the IOLD software instruction also initiates the data transfer. For DMC I/O controllers the CPU always ensures that the I/O buffer is contained within the configured main memory. If not, then an unavailable resource trap (TV 15) results.

The format of the IOLD software instruction is shown in FIGS. 27A and 27B.

The IOLD instruction specifies three quantities, namely: (1) I/O buffer starting address identified by AAS; (2) control word identifying the external channel (or device) and function it is to perform; and (3) I/O buffer range (size) identified by RAS.

The control word may be imbedded directly in the IOLD instruction as shown in the format of FIG. 27A or it may be elsewhere in the software program and pointed to by the IOLD instruction as shown in the format of FIG. 27B. Now, refer to FIGS. 27A and 27B where:

OP= Instruction operation code field.
OP=00011 (binary) for an IOLD instruction
AAS= Address address syllable. It specifies a byte location in main memory from/to which one or more bytes is transferred to/from the I/O channel. The address address syllable (AAS) has two formats:
- Immediate operand address syllable in which an I/O buffer of the appropriate size (one or two bytes) is embedded directly in the instruction.
- Memory address syllable in which the address of the starting byte of the I/O buffer in main memory is specified.

CH= Channel number or I/O device address.

F= Function Code of 09 (hex) which specifies output address. During the execution of the IOLD software instruction by the CPU firmware, after the address is output, the CPU firmware changes the function code to OD (hex) and outputs the range.

CAS= Control word address syllable, pointing to control word containing CH and F. The format for CAS is the same as DAS (see IO software instruction).

RAS= Range address syllable. It specifies a location from which the range of the I/O buffer, in terms of number of bytes of data, is to be transferred to the I/O channel. The format for RAS is the same as DAS (see IO software instruction).

Execution of an IOLD instruction is controlled by CPU firmware. See FIG. 29 for a flowchart of software IOLD instruction execution. System bus operation during IOLD execution and the I/O controller request for I/O buffer transfer after execution were described above.

IOLD instruction execution by the CPU firmware varies as determined by the IOC type it is directed to, specifically:

- IOLD instructions directed to DMA I/O controllers will cause two system bus transfers: The first transfer is a 17-bit byte address which specifies the I/O buffer starting location in main memory; the second transfer is a 16-bit range value which specifies the I/O buffer size in terms of the number of bytes to be transferred during the I/O operation. This appears to the channel as two separate bus transfers and they have function codes of 09 (hex) for the address transfer and OD (hex) for the range transfer. The programmer need only specify the first function code in the IOLD instruction control word and the CPU firmware will generate the second function code.

Address Transfer—The first transfer is a 17-bit quantity which is used by the channel as the starting byte address for data transfers to/from the I/O buffer.

Range Transfer—The second transfer is a 16-bit range value which represents the number of bytes to be transferred during the DMA operation. The range is a positive integer data word where the range value can be 0000 through 7FFF (hex). When this range transfer occurs, it also conditions some I/O controllers to initiate a data transfer request to the I/O buffer. The data transfer is initiated in other I/O controllers by use of IO software instructions with IOC specific function codes.

- IOLD instructions directed to DMC IOCs will cause the CPU to store the 17-bit byte address and 16-bit range value in the appropriate program channel table entry. (See FIG. 30). Upon completion of the I/O operation, the residual address and range will be available in the PCT. The CPU will also generate the two transfers which send the buffer address and range values to the I/O controller over the system bus. If the programmer coded a range value of zero some I/O controller specific action may be required. To inform the DMC IOC of this condition, the CPU during execution of an IOLD directed to a DMC channel will send an end of range signal to the I/O controller. Some DMC I/O controllers ignore this condition.

Now referring to FIG. 29, the CPU firmware used to implement the IOLD software instruction will be discussed in detail. Again as described with respect to FIG. 28, in FIG. 29, it should be noted that there is not necessarily a one to one correspondence between the blocks shown in the flow chart and the number of CPU firmware microinstructions used to implement each block.

The CPU firmware begins processing the IOLD software instruction at block 901 where the firmware fetches the first word of the software instruction from main memory. Following the reading of the first word of the software instruction from main memory, the software does a test to see whether any software interrupts are pending (not shown in FIG. 29 but see FIGS. 33 and 34). If no software interrupt is pending, block 902 is entered and the program counter which points to the first word of the software instruction is saved, a memory refresh operation is initiated because the memory will not be accessed during the next CPU cycle, and a test of the operation code of the software instruction fetched from main memory is performed. If the operation code of the software instruction fetched from main memory is an IOLD software instruction, block 942 is entered and the CPU firmware routine associated with the IOLD software instruction is executed. It should be noted that blocks 901 and 902 of FIG. 29 are the same firmware instructions as shown in blocks 901 and 902 of FIG. 28.

In block 943 the CPU firmware determines the byte address using the address address syllable (AAS) (See FIG. 27). If indexing is specified then the index value will be in terms of bytes, as opposed to words. The byte address specified by the AAS specifies the beginning byte location in the main memory of the I/O buffer from/to which the data transfer to/from the IOC is to take place (see FIG. 30). In block 944, the CPU firmware determines the channel number and function code specified by the IOLD software instruction using CAS if required (see FIG. 27B). In block 945 a test is performed on the function code to determine if it is 09 (hex) and if not, a trap 16 is performed by block 949 indicating a program error and execution of the IOLD software instruction is terminated. If block 945 determines that the function code is the output address function code (09 hex) block 946 is entered.

In block 946 the CPU firmware uses the range address syllable (RAS) to determine the range (in number of bytes) of the I/O transfer and store the range in a SPM work location. In block 947, the channel number and function code are sent to the IOC on the system bus address/data lines (BUSX00 through BUSX15) (see FIG. 17, I/O command format). In addition, in block 947, the CPU sends the CPCMD command on the system bus RDDT line indicating to all IOCs that a channel number and function code are present on the system bus (see FIG. 20). Following the CPU sending the CPCMD command, the firmware enters I/O instruction proceed firmware, block 948 in FIG. 28, which loops until the addressed (by channel number) IOC accepts or rejects the CPCMD command or informs the CPU to try the I/O software instruction again (i.e., wait). If the addressed IOC acknowledges the CPCMD command, block 948 exits to block 951.

When the CPU firmware detects a proceed condition (i.e., a responding IOC has set system bus PROCED line low and left PBUSY line high) block 951 is entered. In block 951 the CPU firmware sets a binary ONE in the input/output indicator (I) register and also stores the state of the system bus PBYTEX line in the PDMCIO flip-flop. If the system bus PBYTEX line is high, it indicates that the responding IOC is a DMC IOC and if low, it indicates the responding IOC is a DMA IOC (see FIG. 20). CPU firmware then sends the responding IOC an ASCMD command on the system bus RDDT lines establishing the CPU-IOC link. In block 953 the function code is tested. If the function code is 09 (hex) indicating an output address function code, block 954 is entered. In block 954 the function code is augmented by four, changing the output address function code of 09 (hex) to an output range function code of 0D (hex). By augmenting the function code from 09 to 0D, when the firmware is executed again for the output range function of the IOLD software instruction after entering at block 947, block 953 will take the output range path and go to block 964.

After augmenting the function code, block 955 is entered and the PDMCIO flip-flop is tested to determine the type of IOC that responded to the CPCMD command. If the responding IOC is a DMC IOC, block 956 is entered and the IO buffer starting byte address determined by AAS is stored into the program channel table entry associated with the specified channel number in the scratch pad memory (see FIG. 30). Also, in block 956 the beginning byte address of the IO buffer is placed on the system bus address/data lines (BUSX00 through BUSX15) with system bus line PBYTEX indicating whether it is byte zero or byte one. In addition, block 956 sends the EOFLK command to the IOC indicating that data for the IOC is on the system bus. Although the beginning byte address of the buffer is broadcast on the system bus for DMC as well as DMA IOCs, DMC IOCs ignore the beginning byte address. The sending of the EOFLK command in block 956 to the IOC terminates the CPU-IOC link established by the ASCMD command sent in block 952. In block 957 the CPU firmware determines the upper bound of the I/O buffer by taking the I/O buffer beginning byte address and adding the range (in bytes) of the I/O buffer.

In block 958, the CPU firmware determines whether the last byte of the I/O buffer exists in the main memory physically present within the system by doing a memory refresh operation addressing the last word (containing the last byte) of the I/O buffer. If the CPU logic detects an attempt to address a nonexistent memory location, a hardware interrupt will be caused and block 970 will be entered and branch to trap 15 (block 961) which will terminate the execution of the IOLD software instruction. If the last byte of the I/O buffer is contained in a main memory location physically present within the system, block 959 is entered and a further check is made to see whether the I/O buffer wrapped around the high end of the 64K word memory and into the low address memory locations. If wrap around occurred, block 961 is entered and a trap 15 (unavailable resource) is executed and the execution of the IOLD software instruction is terminated. If the I/O buffer did not wrap around, block 959 exits to block 960 which reenters the IOLD firmware and outputs the range. Block 960 goes to block 950 which enters block 947 and begins the processing at this time of the output range (0D hex) function code.

Returning now to block 955, if the IOC type is a DMA IOC block 962 is entered. In block 962 the beginning byte address of the I/O buffer is sent to the DMA IOC on the system bus address/data lines (BUSX00 through BUSX15) (see FIG. 17, memory address format) with system bus line PBYTEX indicating byte zero or byte one. Block 962 also sends the EOFLK command to the IOC on the system bus RDDT lines thereby informing the IOC that the address is on the system bus and also terminating the CPU-IOC link established above in block 952. The CPU firmware then exits to block 963 to output the range which in turn enters block 947 via block 950.

When block 947 is entered the second time, to output the range to the IOC, the channel number and function code are again sent to the IOC along with the CPCMD command. When the addressed IOC responds with proceed, block 951 is entered followed by block 952 which reestablishes the CPU-IOC link for the second time. Block 953 is then entered and the function code tested, this time the output range function code 0D (hex) will result in block 964 being entered. In block 964 the PDMCIO flip-flop is tested to determine the IOC type and if a DMC IOC responded, block 965 will be entered. In block 965 the CPU firmware gets the range from the SPM work location and stores the range into the second word of the program channel table entry associated with the channel number (see FIG. 30). Following block 965 if a DMC IOC responded or if a DMA IOC responded, block 966 is entered and a test is made to determine whether the range spicified in the IOLD software instruction is equal to zero. If the range is zero, block 967 is entered and the CPU sends an EOFRG command to the IOC on the system bus RDDT lines. Some I/O controllers store this end-of-range condition in their status indicators and other IOCs ignore this condition. In block 968 the CPU sends the range, in number of bytes, to the IOC on the system bus address/data lines (see FIG. 17, data word format) and also sends the EOFLK command on the system bus RDDT lines. DMA and some DMC IOCs store the range within the IOC and other DMC IOCs ignore the range. The EOFLK command in block 968 terminates the CPU-IOC link established in block 952 and frees the system bus for other use. The termination of the CPU-IOC link completes the processing of the IOLD software instruction and the CPU firmware exits to fetch the next software instruction in block 969.

Before leaving the discussion of the IOLD software instruction it should be noted that, from the software point of view, the results of executing the software IOLD instruction are the same whether or not the I/O controller is a DMA I/O controller or a DMC I/O controller. The differences between the DMA and the DMC I/O controllers are masked from the software by the CPU firmware. Again as in the case of the IO software instruction, the programmer need not be cognizant of whether the device for which he is writing an input/output program is attached to a DMA or DMC I/O controller.

Although the software programmer need not be cognizant of the IOC type, there is a difference in the way the system responds to an IOLD instruction which specifies an out of bound I/O buffer depending on whether the device is connected to a DMA IOC or DMC IOC. As described above, for a DMC I/O controller, the IOLD CPU firmware checks whether the end of the I/O buffer is within the physical memory present in the system and if not an unavailable resource (trap 15) will result and the execution of the IOLD software instruction will be terminated without ever initiating any data transfer between the IOC and the main memory. Because main memory within the system must be physically contiguous (i.e., no holes in the address space), if the end main memory location of the IO buffer is physically present in the system, the beginning and all in between locations must also be present. Therefore, this initial check for the DMC I/O controllers alleviates the necessity of checking whether each individual location is physically present in the system on a per DMC data transfer operation. For DMA I/O controllers, no initial I/O buffer range check is made and a check is made during each DMA data transfer to determine whether the addressed location is physically present in main memory. Therefore, DMA I/O controllers must be capable of storing the unavailable resource indicator received on system bus lines MEMPER or PMMPAR and storing this error indicator for later reporting to the CPU when the status of the transfer is requested by the CPU.

IOH Instruction

The IOH software instruction is used to send or receive control bytes or data to/from I/O controllers. This instruction is similar to the IO instruction except that it deals with a byte transfer instead of a word transfer.

As with the IO software instruction, CPU firmware controls execution of the IOH instruction. The flow chart of the IOH instruction is similar to that of the IO instruction with the following differences. Referring now to FIG. 28, for an IOH instruction: in block 904 a byte address is determined; in block 927 a byte of data is accessed; in block 928 a byte is sent to the IOC; and in block 933 a byte is read from the IOC. System bus operations during IOH instruction execution are described above.

Traps and Software Interrupts

Software interrupts are caused by events external to the current instruction being executed by the CPU, such as power failure, IOC interrupt, etc., which are acted upon at the completion of the current software instruction. Traps, however, are caused by events related to the current software instruction, such as parity error, program error, addressing nonexistent resource, etc., and are acted upon immediately, not waiting for instruction completion.

Software Interrupts

Every program in the central processor executes at some software priority level but can be interrupted by an event with a higher priority. Each interrupting event is assigned a priority level. There are 64 levels of software interrupts, numbered from 0 to 63; level 0 has the highest priority, 63 the lowest. Priority levels 0, 1 and 2 are reserved for fixed source, other events are dynamically assigned interrupt levels by software. In the preferred embodiment, the 64 software interrupt levels are assigned as follows; power failure is level 0 (highest level), watchdog timer (WDT) runout is level 1, used last trap save area is level 2, real time clock (RTC) is any level other than 0-2 (software assigned level is indicated in main memory location 0016 hex), peripheral device or IOC requiring service is any level other than 0-2 (dynamically controlled by software), and the level change (LEV) software instruction—any level (the level is specified in the LEV software instructions).

Associated with each software interrupt level is a dedicated main memory location that contains an interrupt vector. The interrupt vector is a pointer to an interrupt save area (see FIG. 31) that is associated with the level. Software sets up an interrupt save area for each level active in a particular software program. An interrupt save area always contains six locations and can contain an additional sixteen. The layout of each interrupt save area is as follows:

The first location is a pointer to a list of Trap Save Areas (TSAP) currently associated with this level.

The second location contains the channel number and interrupt level of the interrupting device (DEV). This location is loaded by CPU firmware.

The third location contains the interrupt save mask (ISM). This mask determines which registers are to be saved in the variable locations.

The fourth location is reserved for future use and must be zero (MBZ).

The fifth location contains the interrupt handler procedure (IHP) pointer. It acts as a pointer to the interrupt handling procedure (software program) for a new level and is used to store the return address for the return from the interrupt handling procedure.

The sixth location stores the status (S) register (i.e., interrupt level and CPU ID).

The remaining locations are reserved for the registers stored under control of the interrupt save mask. If the mask is all zeros none of these locations is used.

Figure 32:
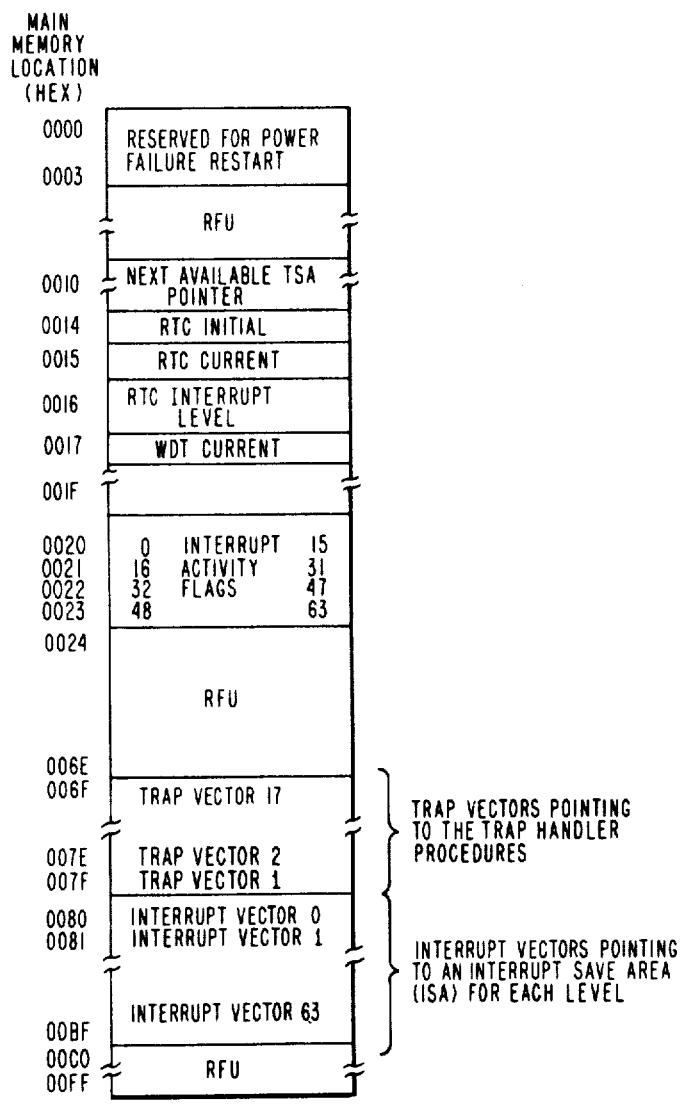
FIG. 32 illustrates the main memory locations dedicated to various functions in the system of the present invention.

An active/inactive flag bit for each interrupt priority level is maintained in dedicated main memory (see FIG. 32). Flags are set when a software instruction is initiated and are set/reset by a software level change (LEV) instruction. CPU firmware scans these flags to determine the highest level software interrupt to be processed.

Traps

Traps are caused by events and are synchronous with the execution of the current software instruction. Associated with each type of trap is a dedicated main memory location containing a pointer to the software trap handling procedure. These locations are called trap vectors (TV). Seventeen trap vectors are available (locations 006F through 007F in FIG. 32), in the preferred embodiment not all are used. The preferred embodiment has trap vectors that are used to handle the following events with the trap vector number listed in parenthesis: parity error (17), program error (16), unavailable resource (15), priviledge operation violation (13), integer arithmetic overflow (6), uninstalled (non scientific) operation (5), uninstalled scientific operation (3), trace/-break point trap (2), and monitor call (1).

When a trap event occurs, CPU firmware shorts execution of the software instruction causing the trap and extracts the trap handling procedure pointer from the associated trap vector in main memory and branches to the trap handler. A trap can occur at any software interrupt level and several traps can be pending at one time. A trap could be entered at one software level, that level interrupted during execution of the software trap procedure, and then the same software trap procedure enters at a different level, or a new trap could occur while processing the original trap.

To accommodate this possibility, a pool of trap save areas is available. These trap save areas are maintained in main memory and are used to store certain registers and information related to that trap (see FIG. 31). Dedicated main memory location 0010 (head) always points to the next available trap save area. When a trap occurs, CPU firmware stores the context of the related registers in the next available trap save area and the pointer (TSAP) in the first word of the current interrupt save area is adjusted so that it points to the trap save area (i.e., the new trap save area is linked at the beginning of the list). The pointer in the first location of the trap save area link (TSAL) is a link pointing to any other traps that occurred at the same interrupt level. If this location is null in the list (zero), it indicates that this area is the last trap save area for the software interrupt level. If the link is not null, it points to the next trap save area associated with this software interrupt level. In turn, the first location of the pointed to trap save area may be null or point to another trap save area for that software interrupt level. At the end of each trap handling procedure, a return from trap software instruction must be executed; this causes a restoration of the trap context that was saved, unlinks the trap save area from the beginning of the list and resets the link pointer to its original state.

The relationship of traps and interrupts and their vector linkage is shown in FIG. 31. The trap vector points to a trap handling procedure. The trap save areas are associated with an interrupt level. Interrupt vectors point to interrupt save areas which in turn point to associated trap save areas and interrupt handling procedures. The trap save areas contain the following information:

The first location contains the trap save link (TSAL) that points to any other trap save areas associated with this interrupt level.

The second location stores the contents of the indicator (I) register when a trap occurs.

The third location stores the contents of general register R3 when a trap occurred.

The fourth location stores the first word of the software instruction (INST) causing the trap.

The fifth location (Z) stores miscellaneous information (i.e., size of trapped instructions, a field information valid, privilege state, etc.).

The sixth location (A) stores the effective address generated by the trapped software instruction.

The seventh location stores the program (P) counter address used to return from the trap handling procedure.

The eighth location stores the contents of the base (B3) register when the trap occurs.

FIRMWARE OVERVIEW

GENERAL DESCRIPTION OF FIRMWARE FLOW

The CPU firmware comprises a set of functional routines that are resident in the 1024 word by 48-bit read only store (ROS) (element 238 in FIG. 9). These routines control various hardware operations in response to software instructions and hardware conditions. These operations are: initialization/power-up autostart, instruction extraction, instruction execution, and interrupts (hardware or software).

When a firmware step is decoded, certain hardware operations occur such as causing the ALU to arithmetically add the contents of two registers and load the register contents back into one of the registers or write the request into scratch pad memory.

Sequencing is performed by grouping microoperations into microinstructions, and then, by grouping microinstructions. One microinstruction is performed during each firmware step (CPU cycle) of 500 nanoseconds. These sequences of microinstructions are termed microroutines or microprograms. They provide a link between software controlled system programming and hardware operation.

During software instruction extraction from main memory which is done under CPU firmware control, branching is performed, on software interrupts and the format of the software instruction to be executed, to select a particular microroutine in the ROS containing the firmware for processing a pending software interrupt or the software instruction which was just read from main memory. As each firmware instruction (microinstruction) of the microroutine is decoded, it in turn enables the proper hardware paths.

After the specified microinstruction is performed, either the next firmware microinstruction is addressed and executed or a branched-to microinstruction is executed. Under some circumstances a branch on condition test is performed to determine the next microinstruction address.

In this way, the CPU firmware cycles through various sequences required to complete the execution of the software instruction. When complete, the next software instruction is fetched from main memory and executed in similar fashion.

Figure 33:
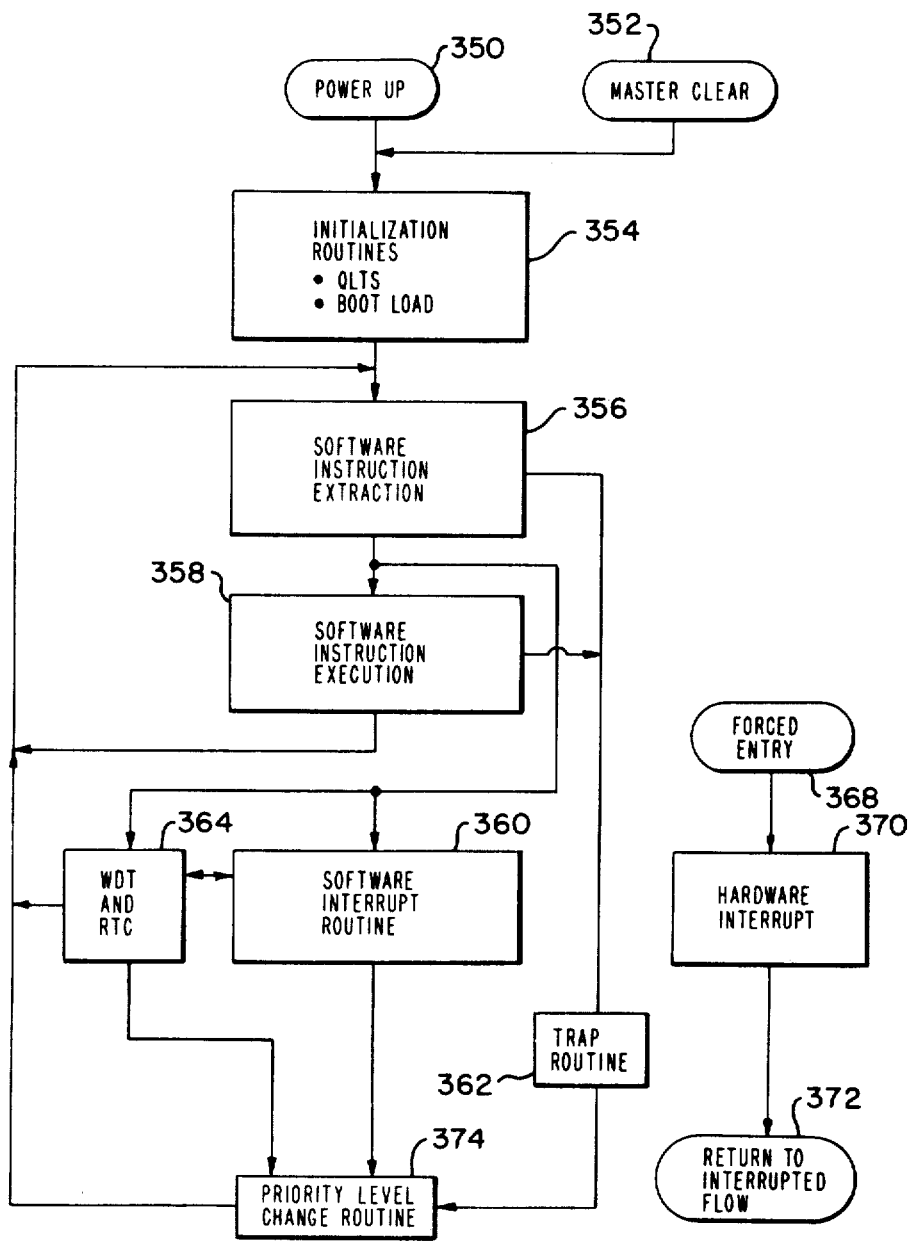
FIG. 33 is a general flow chart of the CPU firmware of the present invention.

The general firmware flow is shown in FIG. 33. The system is initialized by either applying power to the system, block 350, or depressing the CLEAR pushbutton on the control panel, block 352. The initialize sequence, block 354, runs the firmware resident quality logic test (QLT) and bootloads software into main memory from a peripheral device attached to the system bus. When the bootload is completed, the firmware loop for software instruction extraction, block 356, and execution, block 358, is entered. If a trap condition occurs, the trap firmware is entered to process the condition. The trap routine, block 362, firmware does the initial processing of the trap condition and exits to the priority level change routine, block 374. In the priority level change routine, no software priority level change is made (i.e., the trap is processed on the same software priority level as the level of the software instruction causing the trap) but the firmware completes the processing of the trap save area and sets up the program counter so that, upon exiting to the software instruction extraction sequence, the first software instruction of the trap handling procedure will be extracted. The software trap handling procedure will terminate by executing a return from trap (RTT) software instruction which restores the registers that were saved in the trap save area and control returns to the next software instruction to be executed (determined by the event that caused the trap). It should be noted that the trap routine block 362 of FIG. 33 is a set of CPU firmware microinstructions which are executed in preparation of the CPU starting the execution of the software trap handling procedure shown in FIG 31.

Referring again to FIG. 33, any servicing of an I/O software interrupt, block 360; the watch dog timer, block 364; or real time clock, block 364; is performed by firmware at the completion of the software instruction extraction sequence and before the software instruction execution sequence is begun. Upon completion of the interrupt firmware (blocks 360 and 364), the firmware branches back to the software instruction extraction sequence.

If the software priority level of the software interrupt is greater than the priority level of the program currently being executed by the CPU as determined by the firmware in block 360, or if a counter associated with the watch dog timer (WDT) or real time clock (RTC) in block 364 is decremented to zero, the priority level change firmware routine block 374 is entered and the currently executing software program is interrupted. In the case of a priority level change, the priority level change routine exits to the software instruction extraction sequence, block 356, and begins executing the first software instruction of the interrupt handling procedure associated with the software interrupt being serviced. Upon completion of the software interrupt handling procedure, the CPU will change software priority levels by executing a software level change (LEV) instruction. If the interrupted program is the highest priority level waiting to be executed, the firmware will pickup execution of the interrupted software program by reextracting the software instruction that was interrupted between extraction and execution. If the software priority level of the software interrupt is less than or equal to the priority level (again as determined by the firmware in block 360) of the program currently being executed by the CPU, software priority levels will not be changed and interrupt routine block 360 will exit by branching back to the software instruction reextraction sequence in block 356 which will result in the reextraction of the software instruction whose execution was aborted. In this case the lower priority software interrupts will remain pending and will be honored when the CPU lowers the priority level of the software program being executed by eventually entering the priority level change routine block 374. It should be noted that the software interrupt routine block 360 and priority level change routine 374 of FIG. 33 are a set of CPU firmware microinstructions which are executed in preparation of the CPU starting the execution of the software interrupt handling procedure shown in FIG. 31.

Referring again to FIG. 33, if a hardware interrupt condition is detected, an immediate forced entry, block 368, to the hardware interrupt firmware, block 370, is executed and the condition is serviced. At the completion of the hardware interrupt sequence a return branch, block 372, to the interrupted firmware flow is executed.

SOFTWARE INTERRUPT, TRAP, HARDWARE INTERRUPT INTERACTION

The relationship of the software program being executed by the CPU and the CPU firmware can be seen in FIG. 34 which shows the software interrupt, trap, and hardware interrupt interaction.

Software Program

Now referring to FIG. 34, the current software (SW) program being executed in the CPU is shown as block 380. In the preferred embodiment, during execution the current software program 380 is resident in main memory and one instruction at a time is read from main memory and processed by the CPU under firmware control. In FIG. 34, three software instructions are shown in detail, the previous software instruction 381S, the current software instruction 382S and the next software instruction 383S. The modifiers: previous, current, and next, deal with the temporal relationship of the software instructions and need not necessarily describe the spatial relationship of the software instructions. That is, in practice the previous software instruction may be located at location 1000 in main memory and if it is a branch instruction it may branch to the current software instruction located at location 2000 with the next software instruction located at location 2001. Therefore, the modifiers: previous, current, and next, describe the order in which the instructions are executed and not necessarily their relative location within main memory.

Firmware Microprograms

Again referring to FIG. 34, previous software instruction firmware block 381F, current software instruction firmware block 382F and next software instruction firmware block 383F represent the sequence of CPU firmware microinstructions which are executed in processing previous software instruction 381S, current software instruction 382S and next software instruction 383S respectively. It should be noted that the firmware represented by blocks 381F through 383F represent the sequence of CPU firmware microinstructions which are executed and not necessarily the firmware microinstructions themselves which are individually stored in the firmware ROS (238 in FIG. 9). It should be noted that the firmware instructions executed in block 382F can be the same as the firmware instructions executed in block 381F if the current software instruction 382S is the same as the previous software instruction 381S. In particular it should be noted that the extraction firmware block 384 within the current software instruction firmware block 382F is also executed in the previous software instruction firmware block 381F and the next software instruction firmware block 383F as is software interrupt decision block 385, both of which are independent of the particular software instruction being executed. As with the software instruction relationship, the terms previous, current and next with regard to the software instruction firmware show the temporal relationship between the firmware execution sequences and do not represent the spatial relationship of the firmware instructions themselves as stored within the firmware ROS. Thus it can be seen in FIG. 34 that when the previous software instruction firmware 381F completes the processing of the previous software instruction 381S the current software instruction firmware 382F is entered and upon its completion the next software instruction firmware 383F will be entered.

Software Interrupts, Hardware Interrupts and Traps

Referring now to current software instructions firmware block 382F, it can be seen that the execution of the current software instruction 382S may be broken by the occurrence of a software interrupt, a hardware interrupt, or a trap. As will be seen below, the occurrence of a software interrupt will always result in a suspension of the processing of the current software instruction and may, depending upon the software interrupt priority level, result in the execution of the software interrupt handler procedure prior to recommencing the execution of the current software instruction. The occurrence of a hardware interrupt results in the suspension of the execution of the current software instruction firmware during which time the CPU firmware processes the hardware interrupt and upon its completion returns to the processing of the current software instruction at the point of the hardware interrupt. The occurrence of a trap will result in the abandoning of the execution of the current software instruction and the processing of the trap by a trap handler procedure which is a set of software instructions dedicated to processing that trap. Upon completion of the trap handler procedure software, the next software instruction following the trapped software instruction may be processed or another software program execution may be started as will be seen below.

Software Interrupts

Now, turning to the discussion of the current software instruction firmware 382F in detail, the processing of the current software instruction by the CPU firmware is begun by the firmware extracting the current software instruction from main memory under firmware control in block 384. Upon completion of extracting the first word of the current software instruction, a firmware branch is made to test if there is any software interrupt pending in block 385. If there are one or more software interrupts pending, the firmware branch branches to the firmware microprogram of the highest priority pending software interrupt. In FIG. 34 there are two software interrupt firmware routines shown, blocks 388-1 and 388-2 with each block representing a CPU firmware microprogram to handle a particular software interrupt. Within a particular software interrupt firmware microprogram, such as 388-2, a test is made to see whether the priority of the software interrupt is higher than the priority of the currently executing software program. This test is done in block 389. If the software interrupt is of lower or equal priority to that of the currently executing software program, the interrupt will not be accepted and the low or equal branch from block 389 is taken and the firmware recommences the execution of the current software instruction by reentering block 382F followed by the reextraction of the current software instruction from the main memory in block 384. If the priority of the software interrupt is higher than the currently executing software program, the software interrupt is accepted and block 389 enters block 390 which sets up the interrupt save area which saves the state of the current software program and branches to the software interrupt handling procedure associated with the software interrupt. The software interrupt handling procedure, which is a set of software instructions, in block 391 is then executed with each of the software instructions contained therein being processed by the CPU firmware. The last instruction within the software interrupt handler procedure software is a level change (LEV) software instruction 391L which results in the CPU firmware scanning for the highest priority software program which is awaiting execution. The level software instruction 391L is executed by the level instruction firmware microprogram 392 which in block 393 determines the highest priority software program currently awaiting execution. If a higher priority software program 394 is awaiting execution, that software program is executed under CPU firmware control and is also terminated by a LEV software instruction 394L. The level of software instruction 394L results in the execution of the LEV instruction firmware microprogram 392 and again a test for the highest priority software program level is performed in 393. If the level test in 393 determines that the previously suspended current software program 380 is the highest priority program awaiting execution, the current software instruction firmware 382F is entered and the current software instruction 382S is reextracted by extraction firmware 384 and the CPU firmware execution of the current software instruction continues.

In summary, it can be seen that the CPU firmware while executing a software instruction: tests for the pending of a software interrupt, is vectored to the particular software interrupt firmware microprogram which is dedicated to handling a particular software interrupt, that the software interrupt firmware tests for the priority of the software interrupt relative to the priority of the current software program, and that if the priority is lower or equal to that of the current software program the current software program is not interrupted and the processing of the current software instruction by the CPU firmware is recommenced. On the other hand, if the software interrupt is of higher priority than the currently executing software program, the software interrupt is serviced by saving the state of the current software program in the interrupt save area and commencing execution of the software interrupt handler procedure which is itself a set of software instructions. The software interrupt handling procedure then terminates by a level software instruction which will sooner or later result in the reactivation of the interrupted current software program with the execution of the current software instruction being reinstituted by reextracting the current software instruction from main memory.

Hardware Interrupts

If, during the execution of the current software instruction there are no software interrupts pending, block 385 will exit to the execution firmware block 386. The execution firmware, block 386, performs those firmware steps necessary to complete the execution of the current software instruction. During the course of the performing of the execution firmware in block 386, a hardware interrupt may occur. Unlike software interrupts which are detected by the CPU firmware branching on the pending of the software interrupt to a particular software interrupt firmware routine to handle the particular pending software interrupt, hardware interrupts are not tested for by the CPU firmware but instead result from the hardware interrupt logic forcing the CPU firmware to begin executing a sequence of microinstructions associated with the hardware interrupt. In FIG. 34, there are four hardware interrupt firmware microprograms shown, 395-1 through 395-4. These hardware interrupt firmware microprograms 395-1 through 395-4 are composed of CPU firmware microinstructions which are designed to handle the particular interrupt condition which caused the hardware interrupt. Of these four hardware firmware microprograms, two are for non-trap hardware interrupt conditions and are shown as 395-1 and 395-2. Looking at non-trap condition hardware interrupt firmware routine 395-2 it is seen that the last microinstruction, 395-2R, of the microprogram contains a hardware interrupt return microoperation which results in the firmware returning control to the firmware microinstruction following the one that was executed just prior to the occurrence of the hardware interrupt. For example, a condition which can result in a hardware interrupt is the occurrence of a DMA data transfer request on the system buses. In this case the execution of the current software instruction by the CPU firmware is suspended, the DMA data transfer is handled by CPU firmware routine and upon its completion, the execution of the current software instruction is picked up at the point of occurrence of the DMA hardware interrupt. Returning now to the two trap condition hardware interrupt firmware microprogram shown in FIG. 34, blocks 395-3 and 395-4, the occurrence of a hardware interrupt associated with a trap condition will cause the associated hardware interrupt firmware microprogram to be entered, such as 395-4. The trap condition hardware interrupt firmware microprogram does some preliminary processing of the hardware interrupt prior to exiting to a trap firmware microprogram which completes the processing of the trap. For example, block 395-4 exits to trap firmware block 396-2. Because the trap condition hardware interrupt firmware microprograms, 395-3 and 395-4, do not return to the execution firmware 386 at the point of interruption, the execution of the current software instruction is aborted in the case of the trap condition being detected by a hardware interrupt. On the other hand, the non-trap condition hardware interrupts result only in the suspension of the execution of the current software instruction because they return to the execution firmware 386 at the point of interruption. An example of the trap condition which is detected by a hardware interrupt is a main memory parity error which will result in the occurrence of a hardware interrupt. In case of parity error, the CPU firmware is not returned to processing the current software instruction at the point of the occurrence of the hardware interrupt but instead exits to a trap firmware microprogram such as 396-2 to continue processing the parity error. This results in the aborting of the execution of the current software instruction. As can be seen in FIG. 34, vectored hardware interrupts can occur only during the execution firmware block 386 and then only during the time in which hardware interrupts are enabled (i.e., not inhibited). As can be further seen in FIG. 34, during the processing of a hardware interrupt, the hardware interrupt firmware microprogram itself inhibits hardware interrupts such that the hardware interrupt firmware microprograms will not themselves be interrupted by a further hardware interrupt (i.e., hrdware interrupts are not nested whereas software interrupts can be nested).

Traps

Now returning to the execution firmware block 386, it can be seen that during the execution of the current software instruction the firmware itself may conduct one or more tests for trap conditions. For example, block 387 represents a CPU firmware test for the existence of a trap condition and if a trap condition is detected, the execution firmware branches to trap firmware block 396-3 to process the trap condition. Later during the execution of the current software instruction one or more other trap tests may be conducted by the firmware. One more trap test is shown as block 388 which, if it detects a trap condition, will exit to trap firmware microprogram 396-1. Turning now to trap firmware microprogram 396-3, the function of the trap firmware microprogram is to set up the trap save area in which the state of the current software program is saved before the CPU firmware begins processing the trap handler procedure. The trap handler procedure is a set of software instructions written to process the trap condition. The trap handler procedure 397 is associated with the particular trap condition detected by block 387 and further processed by block 396-3. There is a separate trap handler procedure for each of the trap conditions detected by the CPU firmware. The trap handler procedure 397 is then executed by the CPU firmware, as is any other software program, and terminated by a return from trap (RTT) software instruction 397R. The return from trap software instruction 397R is executed by RTT instruction firmware 398 which may restore the software context saved in the trap save area by trap 396-3 and return to begin processing the next software instruction by entering the next software instruction firmware block 383F. Alternatively, RTT instruction firmware 398 may result in the starting of the execution of another software program as shown in block 399. The exit from the RTT instruction firmware block 398 is determined by the contents of the trap save area which may have been modified by the trap handler software procedure 397 during the processing of the trap condition. An example of a condition which may be handled by a trap is the detection by the execution firmware in block 387 of a scientific software instruction operation (floating point) which will result in trap firmware block 396-3 being entered. In block 396-3 the trap save area is set up and block 397 is entered. Trap handler procedure 397 will be a set of software instructions to simulate the results of these optional scientific software instructions and will perform the indicated operation. The execution of the return from trap software instruction 397R will cause the RTT instruction firmware 398 to be executed which in turn will result in the next software instruction firmware 383F to be executed thereby executing the next software instruction 383S. It can be seen that in this example the occurrence of a trap results in the aborting of the execution of the current software instruction and the completion of the current software instruction by the trap handler procedure software routine followed by the execution of the next software instruction.

Interrupts and Traps

In summary it can be seen that the software interrupts and traps occur by the CPU firmware making explicit firmware tests for various conditions during the execution of a software instruction. The software interrupt will further result in the recommencing of the execution of the current software instruction, starting with the reextraction of the interrupted current software instruction from main memory. On the other hand, a trap will result in the aborting of the execution of the current software instruction and, depending upon the trap handler procedure software written to handle the particular trap condition, may or may not result in the execution of the next software instruction. Hardware interrupt conditions need not be tested for by the CPU firmware. The occurrence of a hardware interrupt results in suspension of the processing of the current software instruction followed by the servicing of the hardware interrupt by the CPU firmware. If the hardware interrupt is for a non-trap condition, the hardware interrupt firmware microprogram then returns to the processing of the current software instruction at the point of interruption. If the hardware interrupt is associated with a trap condition, a trap firmware routine is entered and the return to the processing of the current software program is determined by the particular trap handler procedure software program associated with the trap condition. If the trap handler procedure does return control to the current software program, control is usually returned such that the next software instruction will be processed.

CPU FIRMWARE WORD DESCRIPTION

Figure 35:
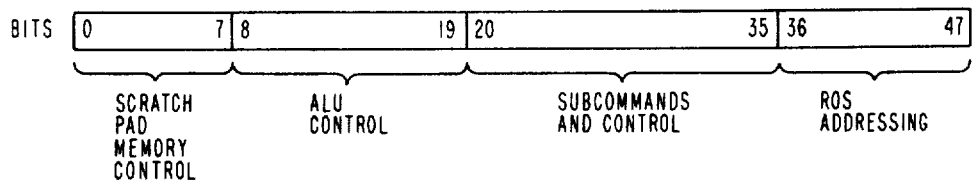
FIG. 35 illustrates the format of the CPU firmware microinstruction word of the present invention.

The overall CPU firmware word is shown in FIG. 35. The microinstruction word is partitioned into four major fields with major fields subdivided into various subfields.

Figure 35A:
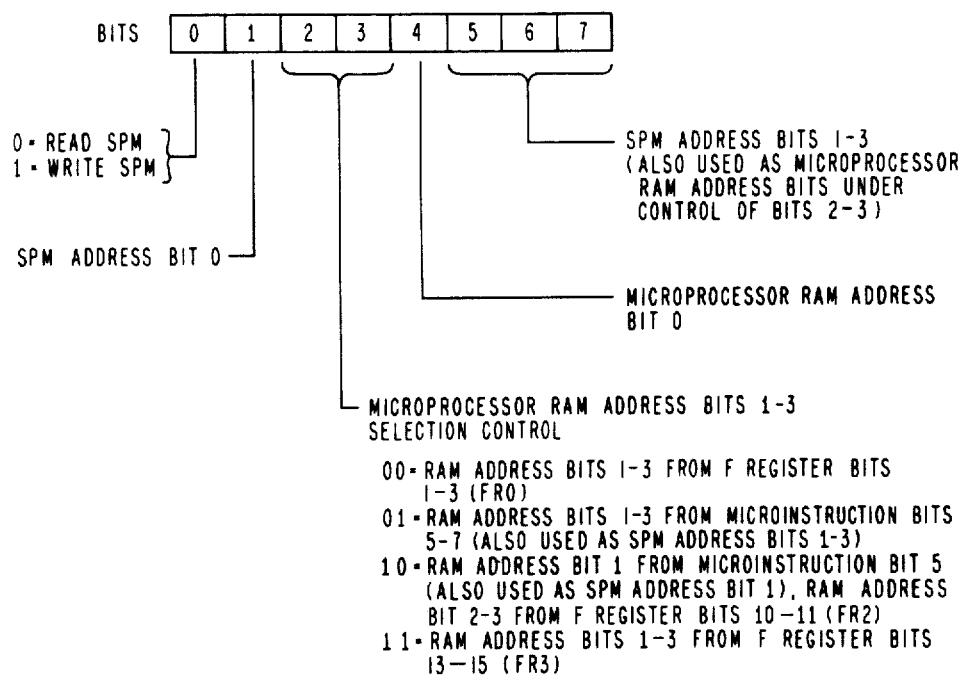
FIG. 35A through FIG. 35D illustrate in greater detail the various control fields of the CPU firmware microinstruction word of the present invention.

The scratch pad memory control field of the CPU firmware word is shown in FIG. 35A.

Bits 0 through 7 are used to control both the scratch pad memory (SPM, element 236 in FIG. 8) and the microprocessor register file (element 268 in FIG. 8). The subfields are shown in FIG. 35A. Bit 0 determines the scratch pad memory operation. When set, a binary ONE, data can be written and when reset, a binary ZERO, data can be read. Bits 1, 5, 6 and 7 comprise the scratch pad memory work location addresses, locations 00 through 0F in FIG. 10, to/from which data is being written or read. Bits 2, 3 and 4 address registers in the microprocessor RAM (register file 268 in FIG. 8).

Figure 35B:
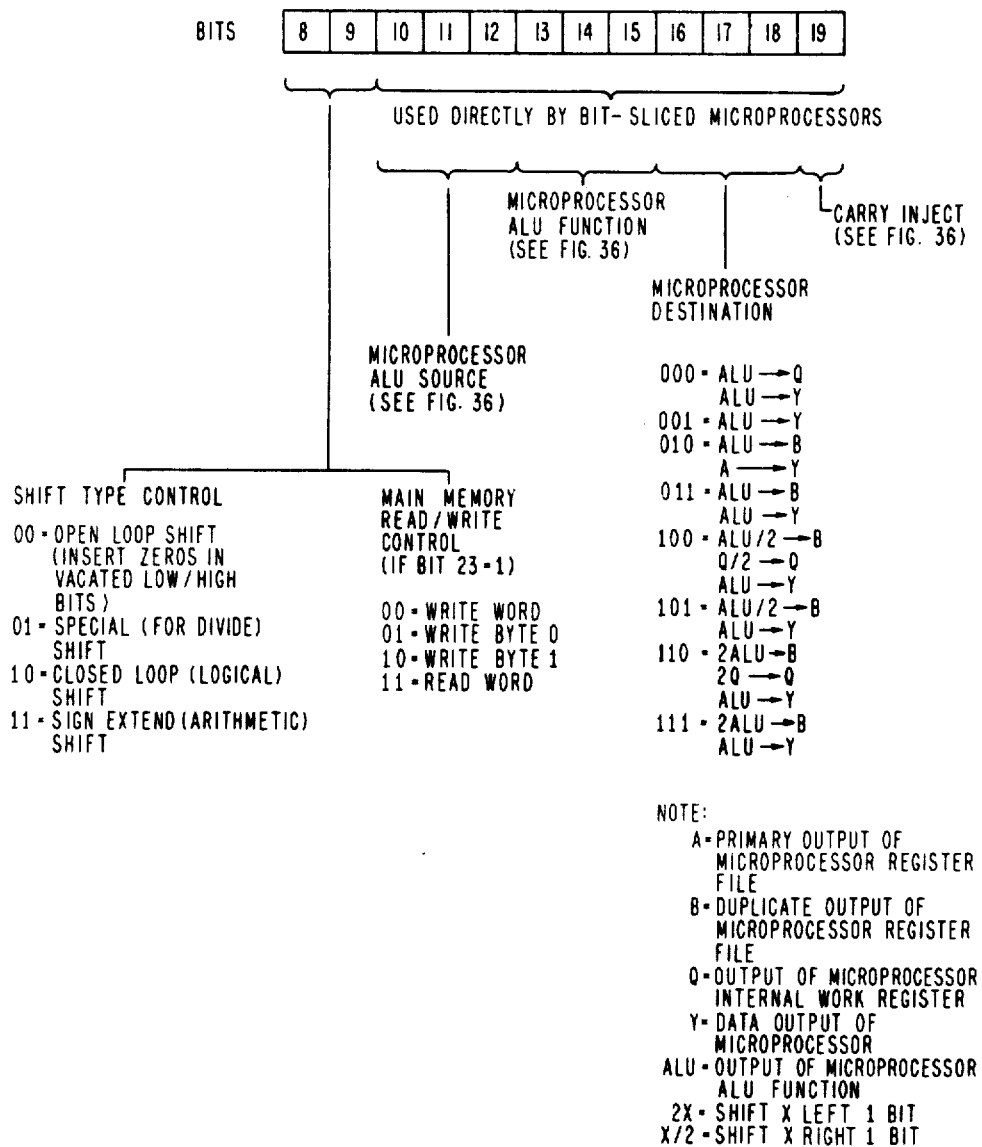

The arithmetic logic unit (ALU) control field of the CPU firmware word is shown in FIG. 35B.

Bits 8 through 19 are used for ALU (element 266 in FIG. 8) control. The subfields are shown in FIG. 35B.

Bits 8 and 9 provide a shift type control while bits 10, 11 and 12 determine the source of the data to be processed. Bits 13, 14 and 15 determine the function to be performed on that data by the microprocessor ALU. Bit 19 is set if a carry inject is required for the operation. The carry in, in turn, is used to modify the source and function combination in accordance with FIG. 36.

Bits 16, 17 and 18 designate the destination, in accordance with FIG. 36, to which the data, resulting from the function performed by the ALU, is to be sent.

Bits 8 and 9 in addition to providing shift type control for the ALU also serve as main memory read/write control when bit 23 is a binary ONE indicating that a main memory operation is to be performed.

Figure 35C:
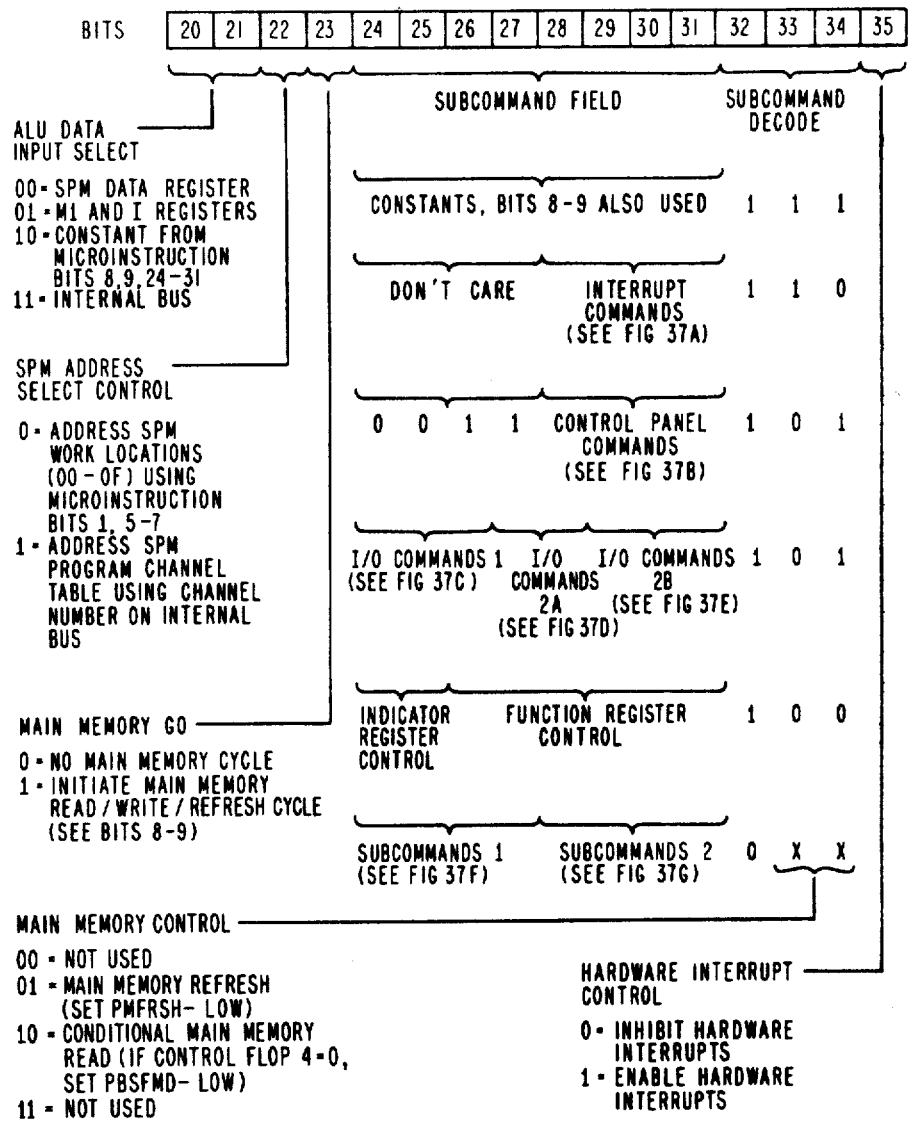

The subcommand and control field of the CPU firmware word is shown in FIG. 35C.

Bits 20 through 35 comprise a subcommand and control field. The subfields are shown in FIG. 35C.

Bits 20 and 21 control the input ports on the data selector multiplexer (269 in FIG. 8), thereby determining the source of data sent to the ALU. Bit 23 is a memory control bit which when set, a binary ONE, causes a memory go (MEMGO) signal on system bus B to initiate a main memory read, write or refresh cycle. The memory operation to be performed is determined by bits 8 and 9 of the microinstruction. The functions of bits 24 through 31 are determined by the states in bits 32 through 34 which are used as a subcommand decode field.

Bit 35 controls hardware interrupts; when set, a binary ONE, it enables hardware interrupts and when reset, a binary ZERO, it inhibits hardware interrupts.

FIG. 37A lists the various interrupt commands that can be decoded when subcommand decode bits 32 through 34 equal a binary 110. When firmware bits 32-34 indicate an interrupt command, bits 24 through 27 are ignored (don't care). FIGS. 37B through 37E list other commands that can be decoded when the subcommand decode bits 32 through 34 equal a binary 101. When subcommand decode bits 32-34 equal 101 (binary), the control panel commands listed in FIG. 37B are performed if the bits 24-27 equal 3 (hex), which as shown in FIG. 37C will result in a control panel strobe (bits 24-26 equal 001, bit 27 equal don't care). When subcommand decode bits 32-34 equal 101 (binary) and bits 24-27 do not equal 0011 (binary), coded combinations of the I/O commands listed in FIGS. 37C through 37E are performed. These I/O commands are partitioned into sets of 3, 2 and 3 bits, allowing one command from each of these command sets to be executed simultaneously. Use of the various I/O commands listed in FIGS. 37C through 37E can be seen in FIGS. 20 through 23 which illustrate the various sequences that occur on the system buses under CPU firmware control.

When bit 32 of the subcommand decode field is zero, the entire subcommands field is interpreted as two subcommand fields, subcommand field 1 (FIG. 37F) being specified by bits 24 through 27 of the firmware word, and subcommand field 2 (FIG. 37G) being specified by bits 28 through 31 of the CPU firmware word. In addition, when bit 32 is a zero, bits 33 and 34 provide main memory control as shown in FIG. 35C.

Figure 35D:
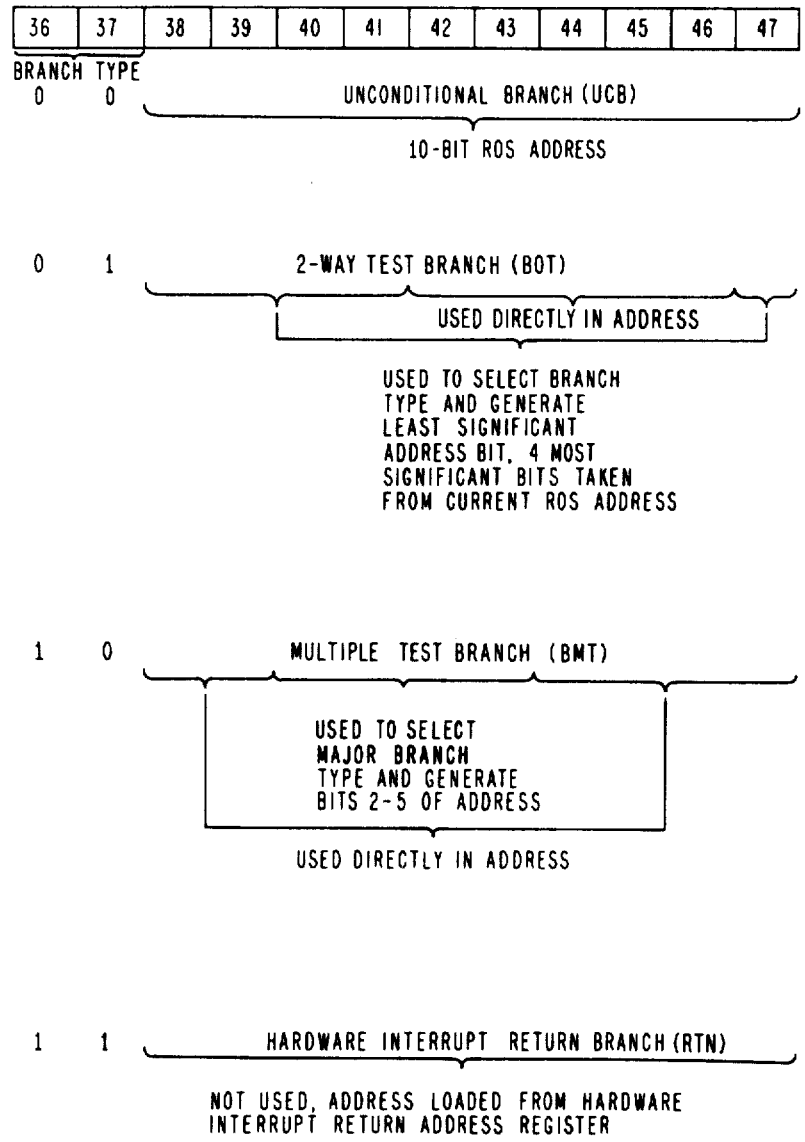

The read only storage (ROS) addressing field of the CPU firmware word is shown in FIG. 35D. Bits 36 through 47 comprise the ROS addressing field. The subfields are shown in FIG. 35D. The ROS addressing field determines the next sequential firmware address used to access the ROS (element 238 in FIG. 9). Bits 36 and 37 determine the type of address found in sets of bits between 38 and 47 as listed in FIG. 35D. When an unconditional branch is indicated (a binary 00 in bits 36 and 37), the firmware will branch to the address contained within bits 37 to 47. When a branch on test is indicated (a binary 01 in bits 36 and 37), bits 38 through 41 and bit 47 are used, indicating a two-way branch. When a branch multiple test is indicated (a binary 10 in bits 36 and 37), bits 40–43 are used, indicating a 16-way test branch. When bits 36 and 37 are both set, the address contained in bits 38 through 47 is ignored and the firmware address to which the flow returns after the hardware interrupt is obtained from the hardware interrupt return address register (252 in FIG. 9).

SCRATCH PAD MEMORY CONTROL

The Scratch Pad Memory Control Field of the CPU firmware word is shown in FIG. 35A. Bits 0, 1 and 5 through 7 are used to control the Scratch Pad Memory (SPM) 236 in FIG. 8). Bit 0 determines the scratch pad memory operation. When set, a binary ONE, data can be written and when reset, a binary ZERO, data can be read. Bits 1 and 5 through 7 form the address used to address the scratch pad memory work locations, locations 00 through 0F in FIG. 10, to/from which data is to be written or read. Bits 2 and 3 control the selection of the 3 low order bits of the 4-bit address used to address the microprocessor random access memory (RAM) (register file 268 in FIG. 8). The various combinations in bits 2 and 3 permit the low order bits of the microprocessor RAM address to be selected from the subfields (FR0, FR2 and FR3) of the function (F) register (274 in FIG. 8) or from bits 5 through 7 of the firmware word itself. The high order bit (bit 0) of the microprocessor RAM address is always determined by bit 4 of the firmware word. This ability of the CPU firmware word bits 2 and 3 to control the selection of the microprocessor RAM addressing bits from the various subfields of the F register is important in allowing for the fast decoding of the software instruction contained in the F register. Within a software instruction, subfield FR0 in the F register usually contains a register number and subfields FR2 and FR3 compose the address syllable of the software instruction.

ARITHMETIC LOGIC UNIT CONTROL

The ALU control field of the CPU firmware word is shown in FIG. 35B. Bits 8 through 19 are used for microprocessor (element 232 in FIG. 8) control. The subfields are shown in FIG. 35B. As indicated hereinbefore, the 16-bit microprocessor 232 in FIG. 8 is composed of cascading four 4-bit sliced microprocessors of the type Am2901 microprocessor produced by Advanced Micro Devices Inc., of Sunnyvale, California. Some of the microprocessor control fields are used directly by the cascaded bit sliced microprocessors and others (shift type control and carry inject) are used to control the end conditions generated by the most significant bit microprocessor and the least significant bit microprocessor.

Firmware word bits 8 and 9 provide shift type control by controlling the bits shifted into and out of the most significant and least significant bits of the cascaded microprocessors. Bits 10 through 12 determine the microprocessor ALU source and are used to directly control each of the four bit sliced microprocessors. Exact definition of these bits may be found in the publication "A Micro Programmed 16-Bit Computer" published by Advanced Micro Devices, Inc., of Sunnyvale, California, and incorporated herein by reference. Bits 13 through 15 control the microprocessor ALU function and are also used directly by each of the 4-bit sliced microprocessors. Bits 16 through 18 control the microprocessor destination and again are used directly by each of the four bit sliced microprocessors. Bit 19 controls the carry inject input and is used directly by the least significant of the four cascaded bit sliced microprocessors. The microprocessor ALU source subfield controls the source of the ALU inputs and may select between; the primary (A) output of the microprocessor register file, the duplicate (B) output of the microprocessor register file, the output of the microprocessor internal work register (Q), or data (D) input from the scratch pad memory. The microprocessor ALU function subfield determines the operation (e.g., arithmetic addition, logical AND, etc.) to be performed by the arithmetic logic unit. The microprocessor destination subfield determines the destination to which the data resulting from the function performed by the ALU is to be sent. The operation performed by the 16-bit microprocessor is a function of the microprocessor ALU source, microprocessor ALU function and carry inject subfields are shown in FIG. 36.

In addition to providing shift type control, firmware bits 8 and 9 also provide main memory read/write control. When firmware bit 23 is a binary ONE, bits 8 and 9 control whether a word, byte 0, or byte 1 is to be written into main memory or whether a word is to read from main memory.

SUBCOMMANDS AND CONTROL

The subcommands and control field of the CPU firmware word are shown in FIG. 35C. Bits 20 through 35 comprise a subcommands and control field. Bits 20 and 21 control the data selector 269 of FIG. 8 which is a four-to-one multiplexer, the output of which is connected directly to the data input ports of the microprocessor thereby determining the source of data sent to the microprocessor ALU. The ALU input may be selected from; the SPM data register which contains the output of the scratch pad memory 236, the indicator (I) register 270 and M1 register 272, a constant generated by using microinstruction bits 8, 9 and 24 through 31 or the data from internal bus 260 (all shown in FIG. 8). Bit 22 is scratch pad memory address select control and allows for the microinstruction to address either the scratch pad memory work locations (locations 00 through 0F in FIG. 10) using microinstruction bits 1 and 5 through 7 or the program channel table (locations 80 through FF) using the channel number obtained from the channel number register 296 in FIG. 8. Bit 23 is the main memory go control bit and when set causes the PMEMGO-signal on system bus B to go low initiating a memory read/write cycle.

Bits 24 through 31 form a subcommands field, the meaning of which is interpreted by bits 32 through 34 which form the subcommands decode subfield. Depending upon the value in the subcommands decode subfield (bits 32 through 34) the subcommands field (bits 24 through 31) may be either an 8-bit constant, interrupt commands, control panel commands, I/O commands, function (F) register control or subcommands. The meaning of these various subcommands fields is tabulated in FIGS. 37A through 37G.

Bit 35 is the hardware interrupt control field which permits the CPU microprogrammer writing firmware to inhibit or enable the occurrence of hardware interrupts between microprogram firmware steps. When bit 35 is a binary ZERO, hardware interrupts are inhibited and the microprogram cannot be interrupted following the current microinstruction. When bit 35 is a binary ONE, hardware interrupts are enabled and, if a hardware interrupt is currently pending, the microprogram will be interrupted at the completion of the execution of the current microinstruction.

FIG. 37A lists the interrupt commands which can be decoded from bits 28 through 31 (bits 24 through 27 are ignored). FIG. 37B lists the control panel commands which are decoded from bits 28 through 31 when bits 24 through 27 are equal to 0011 (binary). The coded combinations of I/O commands listed FIGS. 37C through 37E are given in binary. These are partitioned into sets of 3, 2 and 3 bits, allowing these sets of I/O commands to be executed simultaneously. When bit 32 is a binary ONE and bits 33 and 34 are binary ZERO's, the subcommands field is interpreted as function register control commands. When bit 32 is a binary ZERO, the entire subcommands field is interpreted as two subcommands, subcommands 1 (see FIG. 37F) being specified by bits 24 through 27 of the firmware word and subcommands 2 (see FIG. 37G) being specified by bits 28 through 31 of the CPU firmware word.

READ ONLY STORAGE ADDRESSING

The read only storage (ROS) addressing field of the CPU firmware word is shown in FIG. 35D. Bits 36 through 47 comprise the ROS addressing field. The subfields are shown in FIG. 35D. The ROS addressing field determines the next sequential firmware address used to access the next firmware word from the ROS (element 238 in FIG. 9). Bits 36 and 37 determine the type of branch address found in sets of bits between bits 38 through 47.

When bits 36 and 37 are 00 (binary), the firmware will branch to the address contained within bits 38 through 47 by using the 10-bit address to retrieve the next firmware word from the ROS. When a 2-way test branch is indicated (a binary 01 in bits 36 and 37), bits 38 through 41 and bit 47 are used to select the test and generate the least significant ROS address bit (bit 9). The four most significant bits (bits 0 through 3) of the next ROS address are taken from the four most significant bits of the current ROS address and bits 42 through 46 of the firmware word are used directly as ROS address bits 4 through 8. These 2-way branches are used by the firmware to test the status of various conditions such as the state of control flops 1 through 4 (CF1-CF4) and various bits of the function register.

When a multiple test branch is indicated (a binary 10 in bits 36 and 37), bits 38, 39 and 44 through 47 are used directly in the next ROS address and bits 40 through 43 are used to indicate one of sixteen different multiple test branches. The multiple test branches are used by the firmware programmer to help decode the software instruction and to respond to software interrupts.

When bits 36 and 37 are both set (a binary 11), bits 38 through 47 of the firmware word are not used and the next ROS address is obtained from the hardware interrupt return address register (element 252 in FIG. 9) which contains the next ROS address at the time the CPU firmware was interrupted by a hardware interrupt. The hardware interrupt return branch is used by the firmware programmer at the end of a hardware interrupt firmware microprogram (block 395-2 in FIG. 34) to return control to the point at which the firmware was interrupted by the hardware interrupt.

I/O CONTROLLER LOGIC DETAILS

Having described the operation of the central processor, the I/O controllers and the various dialogs on the system buses, the I/O controller logic will now be described in detail.

Figure 38:
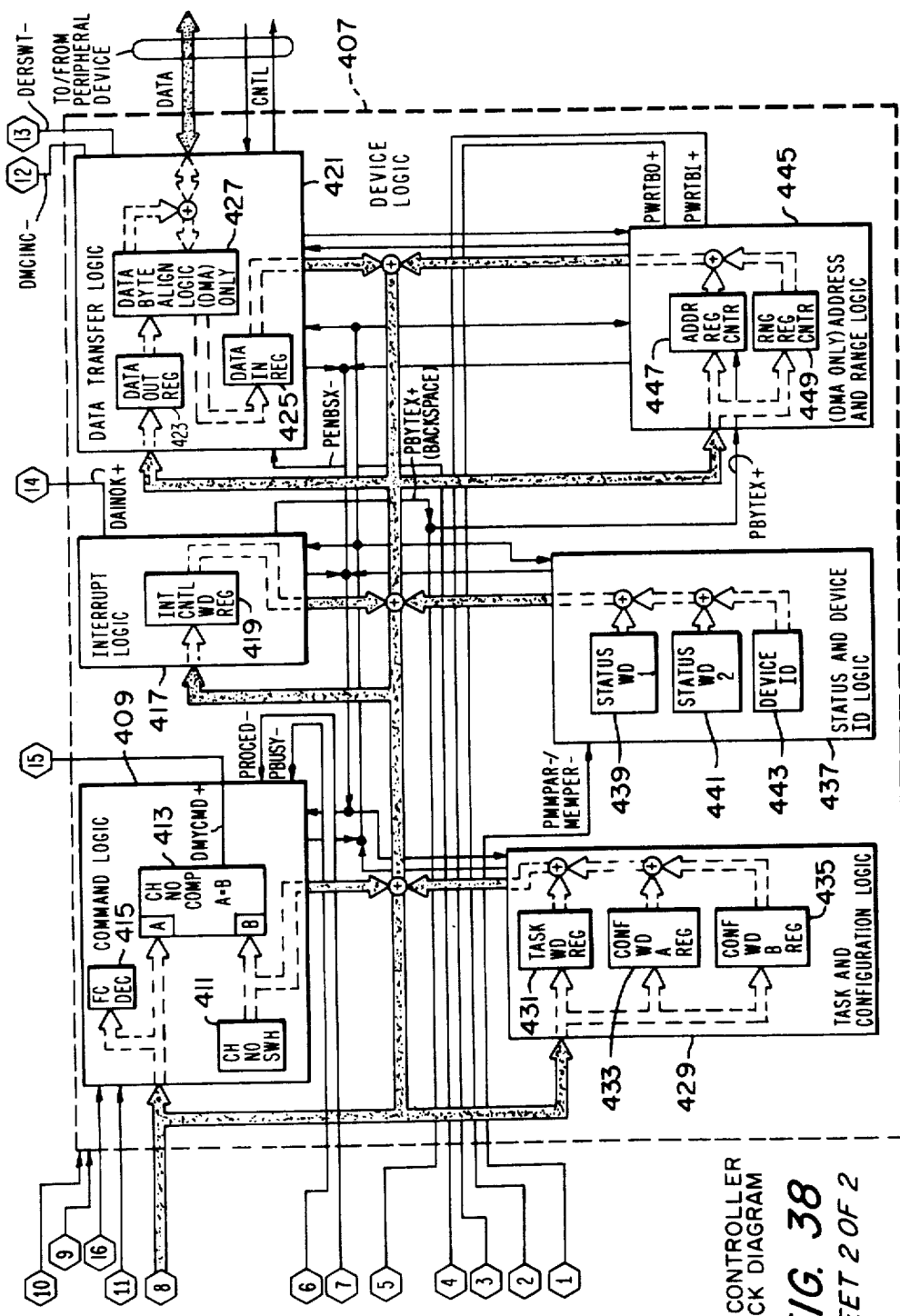
FIG. 38 is a block diagram of an input/output controller of the present invention.

FIG. 38 is a logic block diagram of an I/O controller constructed in accordance with the principles of the present invention. Referring to FIG. 38, it is seen that the major sections of the I/O controller include: timing logic 400, DMA/DMC request logic 402, interrupt request logic 404, request reset logic 406, and device logic 407.

Timing logic 400 provides the basic I/O synchronization signals used throughout the I/O controller (signals PTIME3+20 and DMYTM3+). In addition, timing logic 400 takes the bus cycle out signal from the previous I/O controller (or CPU if the I/O controller is the first I/O controller on either system bus A or B) and delays the signal for 500 nanoseconds before passing it on to the next I/O controller. Further, timing logic 400 is used to generate an IOC initialize signal (PCLEAR+20) which is used to initialize the controller and initiate the IOC's quality logic test (QLT) firmware.

The DMA/DMC request logic 402 is used to set the system bus DMA or DMC request lines (PDMARX— or PDMCRX—) to a binary ZERO during the IOC's time slot if the IOC requires a DMA or DMC data transfer cycle and the DMA or DMC request line is not already set by another DMA or DMC I/O controller on that particular system bus. A particular I/O controller is either a DMA or DMC IOC. For DMA IOCs the DMA request line (PDMARX—) is used and for DMC IOCs the DMC request line (PDMCRX—) is used.

Interrupt request logic 404 is used to set the bus interrupt request line (PINTRX—) to a binary ZERO during the IOC's time slot if the IOC wishes to interrupt the execution of the software in the CPU and another IOC on the particular system bus has not already set the interrupt request line. The IOC will initiate an interrupt sequence whenever a state change in one of the peripheral devices connected to the I/O controller is sensed or whenever a particular I/O order is completed, for example, upon the expiration of the range following a read or a write command.

The request reset logic 406 is used to reset the DMA or DMC or interrupt request flops of the I/O controller in response to the CPU response encoded on system bus lines RDDT 29+ through RDDT31+. As will be noted hereinafter, a given IOC can have both a DMA or DMC request and an interrupt request pending concurrently. This is particularly true for IOCs which have multiple peripheral devices attached to them such that one device may have completed a read or write operation, thereby requesting an interrupt, and a second device may be in the process of doing a read or a write operation and be requesting the next word or byte of data to be read or written to the peripheral device.

I/O CONTROLLER DEVICE LOGIC

Continuing to refer to FIG. 38, the operation of device logic 407 will be discussed. Device logic 407 consists of command logic 409, task and configuration logic 429, interrupt logic 417, status and device ID logic 437, data transfer logic 421 and address and range logic 445. It should be noted that address and range logic 445 is only present in DMA I/O controllers.

Command Logic

The command logic 409 decodes the I/O control commands and function codes addressed to the IOC. The command logic 409 determines: if the IOC can accept the I/O command and sets line PROCED— to a binary ZERO; if the IOC is busy and sets line PBUSY— to a binary ZERO; or if the IOC is temporarily busy it sets both lines PROCED— and PBUSY— to binary ZEROs to inform the CPU to wait and retry the I/O command. The command logic 409 determines the type of operation to be performed by the I/O controller, generates a command cycle and if the I/O command is accepted, enables a path from the system bus address/data lines to and from the I/O controller, or to the peripheral device. The command logic also maintains the dialog link between the system bus and the IOC. Function code decoder 415 decodes the function code of the I/O command control word (see FIG. 24). Channel number switch 411 is set when the system is installed to contain the channel number of the I/O controller. Channel number comparator 413 compares the channel number set in channel number switch 411 with the channel number appearing on the system address/data lines (BUSX00+ through BUSX08+) and if they are equal sets signal DMYCMD+ to a binary ONE. Signal DMYCMD+ is an input to request reset logic 406. In addition, the channel number contained in channel number switch 411 may be transferred to the CPU via the system bus address/data lines during a DMC data transfer request or during an I/O interrupt request sequence (see FIG. 17).

Only I/O commands with a channel number corresponding to the IOC's channel number in channel number switch 411 are accepted by the IOC. As will be seen hereinafter, some of the I/O command decoding is done by a decoder in request reset logic 406. The command cycle is a sequence that the IOC performs while executing any type of input or output command (see FIG. 20). For input commands, the IOC reads stored control information, status or device information and then transfers them onto the system bus. For output commands, the IOC transfers control information from the system bus into the device logic storage.

Task and Configuration Logic

During a command cycle, the task and configuration logic 429 is enabled after the command logic decodes a function code that specifies the reading or writing of the task word, configuration word A or configuration word B. The meaning of individual bits in the task word are device specific. The task word is intended for those functions which have to be output frequently as compared with relatively static information which is output via the configuration word commands. The meaning of individual bits in configuration words A and B are device specific. The configuration words are intended for those functions which are output only infrequently. Configuration word B is used when more information is required than can be coded into configuration word A. I/O controllers always contain a task word register 431 whereas the existence of configuration word A register 433 and configuration word B register 435 depend upon the amount of information required for a particular peripheral device. Some peripheral devices require no configuration words while other peripheral devices require only configuration word A and still other peripheral devices require configuration words A and B.

Interrupt Logic

During a command cycle, the interrupt logic 417 is enabled after the decoded function code specifies the reading or writing of the interrupt level contained in interrupt control word register 419. The interrupt logic is also used to generate an interrupt request when either of the following conditions are present: the interrupt level is not equal to zero and the previous peripheral device operation is complete, or a stop I/O command is complete. When one of these conditions is present, an interrupt cycle is initiated and the IOC sends an interrupt request to the CPU by setting signal DAINOK+ to a binary ONE which is an input to interrupt request logic 404. Setting of signal DAINOK+ to a binary ONE will result in the setting of signal PINTRX— on the system bus to a binary ZERO. When the CPU acknowledges the interrupt request, the IOC loads the interrupt level and channel number onto the system bus address/data lines for delivery to the CPU. The CPU then examines the interrupt level. If the interrupt level is acknowledged by the CPU setting line PROCED— to a binary ZERO, the interrupt operation is complete. If the interrupt level is not acknowledged by the CPU setting line PBUSY— to a binary ZERO, the I/O controller stacks the interrupt request within the interrupt logic 417 and waits for the CPU to send a resume interrupt (RESUM) I/O command. When the CPU sends a resume interrupt I/O command, the IOC will reinitiate the interrupt request.

Status and Device Identification Logic

The status and device identification (ID) logic 437 is enabled by the IOC to store the status word(s) and device ID code. The status word 1, 439, and status word 2, 441, contain peripheral device and main memory conditions. The meanings of individual bits in the status words are IOC specific. Status word 2 is only present in those I/O controllers which have more status information than can be coded into status word 1. The device ID code is contained in device ID word 443 and represents the type of peripheral device connected to the IOC. When the command logic decodes an input status word 1 or 2 command, the status word 1 or 2 is transferred to the CPU on the system bus address/data lines. When an input device ID command is decoded by the command logic, the device ID code is transferred to the CPU via the system bus address/data lines (BUSX00+ through BUSX15+). The main memory error (parity or nonexistent address) signals MEMPER— (on system bus B) and PMMPAR— (on system bus A) are input by status and device ID logic 437 and is used to set the appropriate bit in status word 1, 439, for later reporting to the CPU.

Data Transfer Logic

After the data transfer has been initiated, the command logic 409 enables the data transfer logic 421 for the transfer of data to or from the peripheral device. The IOC makes a data transfer request of the CPU by using signals DERSWT— and DMCINC— to cause DMA/DMC request logic 402 to set signal PDMARX— (for DMA IOCs) or signal PDMCRX— (for DMC IOCs) to a binary ZERO.

If the IOC is a DMC IOC, a DMC request is sent to the CPU from the I/O controller (see FIGS. 21A through 21D). The CPU acknowledges the request and the IOC's channel number is loaded onto the system bus address/data lines for delivery to the CPU. After channel number delivery, a DMC data transfer cycle is initiated and a byte of data is transferred by the CPU onto the system bus for the IOC (for output) or by the IOC onto the system bus for the CPU (for input). If output, a byte of data is taken from the system bus address/data lines and stored in data out register 423 before it is delivered to the peripheral device. If input, a byte of data is taken from the peripheral device and held in data in register 425 before being delivered to the CPU on the system bus address/data lines. In either case, for DMC I/O controllers, data byte align logic 427 is not present. For DMC IOCs data byte alignment is done by the CPU as the data is transferred from the DMC IOC to the main memory or from the main memory to the DMC IOC.

Address and Range Logic

Address and range logic 445 is found only in DMA IOCs. In DMC IOCs the function performed by address and range logic 445 is performed by the CPU using the program channel table. Address register counter 447 contains the 17-bit address output by the CPU during the output address function of an IOLD software instruction. Address register counter 447 is incremented as each word (or byte) of data is transferred between the main memory and the DMA IOC. Range register counter 449 is used to hold the range (in number of bytes) of the data to be transferred. The range counter is initially set by the output range function of an IOLD software instruction. As each word (or byte) of data is transferred between the DMA IOC and the main memory, the range register counter 449 is decremented. The contents of address register counter 447 can be transferred to the CPU by an input address or input module I/O command. The contents of range register counter 449 can be input to the CPU by an input range I/O command.

When the DMA IOC receives an acknowledge from the CPU in response to a DMA request, the controller is linked to the CPU for data transfer and a DMA cycle begins (see FIG. 22). Concurrent with the receipt of the CPU acknowledge, the address and range logic 445 activates the write byte 0 and write byte 1 lines (PWRTB0+ and PWRTB1+). These two lines indicate to the main memory the type of read/write operation that is to be performed. The address and range logic 445 loads the main memory address onto the system bus address/data lines (BUSX00+ through BUSX15+) and the CPU activates the enable bus to CPU line (PENBSX—) to obtain it. If a nonexistent main memory address error occurs, the CPU activates the main memory error lines (MEMPER— and PMMPAR—) during PENBSX— to notify the DMA IOC. When an input operation (write into main memory) is being executed, signal PENBSX— remains a binary ZERO to transfer the data word (or byte) from data in register 425 onto the system bus and into the main memory. When an output operation (read from main memory) is being executed, signal PENBSX— becomes a binary ONE. Upon receipt of an end-of-link command on system bus RDDT lines, the DMA IOC loads the contents of data in register 425 onto system bus address/data lines (for input) or unloads the system bus address/data lines into data out register 423 (for input). If a main memory parity error occurs, the CPU notifies the DMA IOC by activating signal MEMPER—/PMMPAR— during the end-of-link command. The DMA cycle is terminated and the data transfer sequence is complete.

Note that data byte align logic 427 in data transfer logic 421 is present only for DMA IOCs. During DMA output operations, data byte align logic 427 works in conjunction with address and range logic 445 to extract the proper byte from the word of data received from the main memory (contained in data out register 423) and transfers the byte or word of data to the peripheral device. It should be noted that a word of data is always read from main memory. During DMA input operations it is the function of the data byte align logic 427 to align the word (or byte) of data received from the peripheral device and place it in its proper position in data in register 425 so that it is properly aligned on the address/data lines for transfer to the main memory. It should be further noted that one, or the other, or both types of data may be written into main memory. Which of the two, or both, bytes is written into main memory is controlled by signals PWRTB0+ and PWRTB1+ which are set by address and range logic 445 during DMA data transfers.

I/O CONTROLLER TIMING LOGIC

As discussed hereinbefore, each IOC on a system bus is allocated a 500 nanosecond bus cycle slot during which it may make system bus requests. Each IOC on the bus determines when it is that IOC's bus cycle slot by using the PTIME3— and BCYCIN— signals from the system bus. The primary time 3 (PTIME3—) signal is distributed to each IOC on the system buses and is in the binary ZERO state for a hundred nanoseconds of the bus cycle and in the binary ONE state for the 400 nanoseconds of a system bus cycle as is shown in FIG. 13. FIG. 13 also shows that the bus cycle in (BCYCIN—) signal is a binary ONE for a period of 500 nanoseconds from the trailing edge of one primary time 3 pulse to the trailing edge of the next primary time 3 pulse. It should be noted that the system bus cycle in signal (BCYCIN—) of a particular IOC is the system bus cycle out (BCYCOT—) signal of the preceding IOC (i.e., the neighboring IOC which is closer to the CPU on the system bus).

Figure 39:
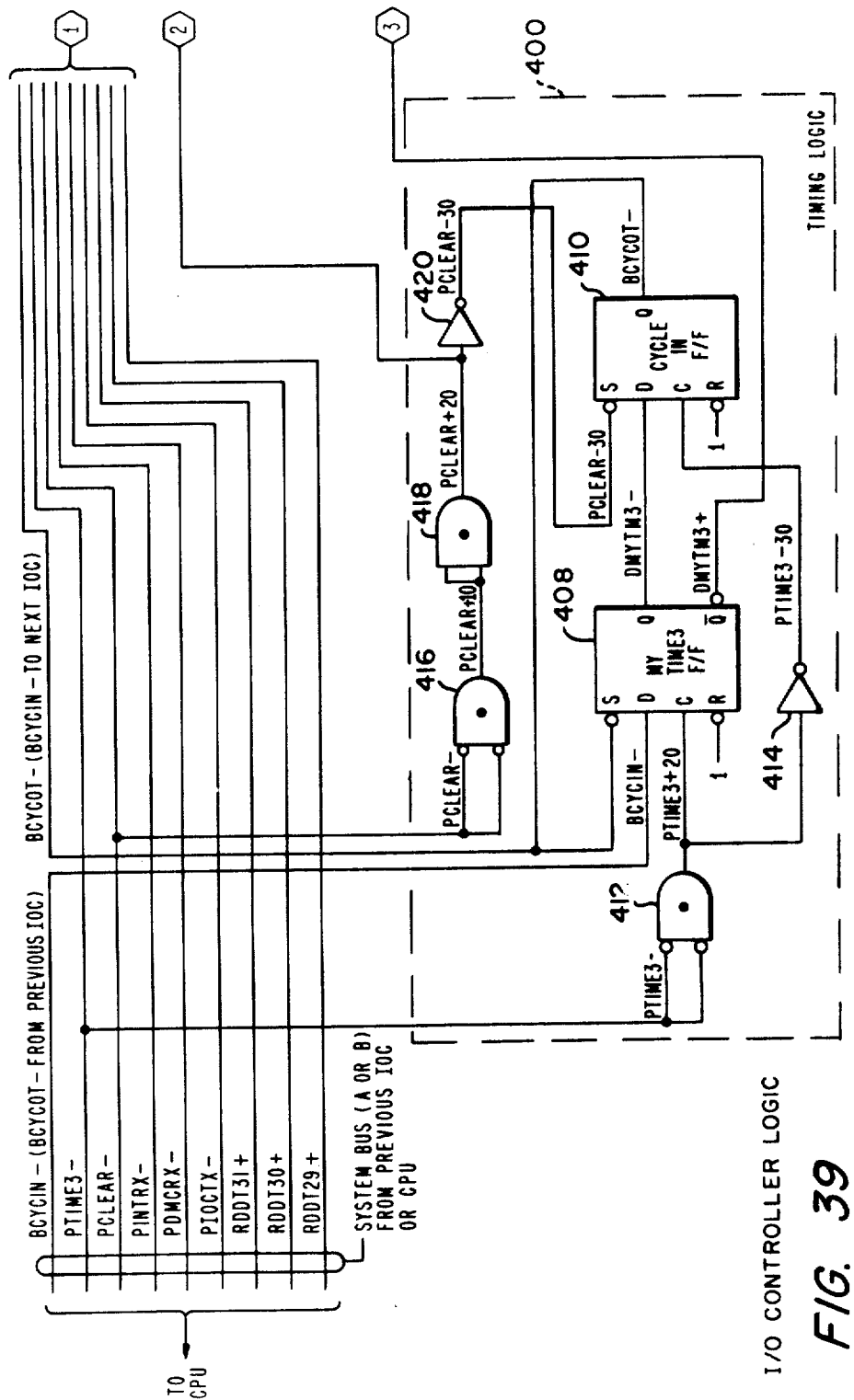
FIG. 39 illustrates the timing, request and reset logic of an I/O controller shown in FIG. 38.

Referring now to FIG. 39, the operation of timing logic 400 will be discussed in detail. My time 3 flip-flop 408 and cycle in flip-flop 410 are initially set (i.e., a binary ONE appears at the Q outputs thereof). My time 3 flip-flop is reset only during the primary time 3 time period of the current IOC. Cycle in flip-flop 410 is reset only during the cycle in time period of the current IOC. It should be noted that the terms current IOC, previous IOC and next IOC refer to the relative physical positions of the various IOCs on the system bus. Thus with reference to FIG. 1, if the current IOC is I/O controller 208 then the previous IOC is I/O controller 206 and the next IOC is I/O controller 210. The previous IOC is the adjacent IOC that is closer to the central processor on the system bus. The next IOC is the adjacent IOC that is further away from the CPU. Referring now to FIG. 39, it can be seen that each time the system bus primary time 3 signal (PTIME3—) transitions from the binary ONE to the binary ZERO state, the output of the AND gate 412 (signal PTIME3+20) will transition from a binary ZERO to the binary ONE state and clock my time 3 flip-flop 408. Initially, with bus cycle in time signal BCYCIN— being a binary ONE, indicating that it is not the cycle in time of the previous IOC, the flip-flop 408 will be set. With my time 3 flip-flop 408 being set or remaining set, the Q output thereof (signal DMYTM3—) will be a binary ONE which will be clocked into cycle in flip-flop 410 by signal PTIME3—30 transitioning from the binary ZERO to the binary ONE state at the end of primary time 3. Signal PTIME3—30 is the output of inverter 414 which inverts the outputs of AND gate 412. The relationship of clocking signals PTIME3+20 and PTIME3—30 to the primary time 3 system bus signal (PTIME3—) can be seen by referring to FIG. 40. FIG. 40 shows that when PTIME3— is a binary ONE, PTIME3+20 is a binary ZERO and PTIME3—30 is a binary ONE. It should be noted that the approximate 5 to 10 nanosecond delays associated with each of the logic elements is being ignored for the purposes of this discussion.

Referring now to FIGS. 39 and 40, at time A, the beginning of the first primary time 3 period, the transition of PTIME3+20 from the binary ZERO to the binary ONE state will set flip-flop 408 by gating the BCYCIN— signal at the data (D) inputs thereof onto the outputs (Q and $\bar{Q}$) thereof. If flip-flop 408 had been set previous to time A, its state will not be changed at time A. At time B, the end of the first primary time 3 period, the BCYCIN— signal on the system bus will transition from the binary ONE to the binary ZERO state indicating the start of the previous IOC's system bus cycle in time. At time C, the beginning of the second primary time 3 period, the PTIME3+20 signal again gates the D input of flip-flop 408 onto the outputs thereof and at this time, because the BCYCIN— signal on the bus is a binary ZERO, flip-flop 408 is reset and the Q output thereof, signal DMYTM3— becomes a binary ZERO. At time D, the end of the second primary time 3 period and the beginning of the current IOC's system bus cycle in time, the clocking signal (PTIME3—30) to cycle in flip-flop 410 transitions from the binary ZERO to the binary ONE state and gates the D input thereof onto the Q outputs thereof. At time D, the D input of flip-flop 410 (signal DMYTM3—) is a binary ZERO and therefore flip-flop 410 is reset indicating the beginning of the current IOC's system bus cycle in time.

The resetting of cycle in flip-flop 410 results in the Q output thereof, signal BCYCOT—, becoming a binary ZERO which when input to the set (S) input of my time 3 flip-flop 408, results in flip-flop 408 being set making the Q output thereof, signal DMYTM3—, a binary ONE. At time E, the end of the third primary time 3 period, the clocking signal (PTIME3−30) to flip-flop 410 again transitions from the binary ZERO to the binary ONE state thereby clocking the binary ONE signal at the D input thereof onto the Q output thereof thereby setting flip-flop 410 causing signal BCYCOT− to become a binary ONE. This transition of signal BCYCOT− from the binary ZERO to the binary ONE state completes the current IOC system bus cycle in time period and allows the next IOC to begin its cycle in time.

Referring once again to FIG. 39, it can be seen that cycle in flip-flop 410 will be set initially by the occurrence of the PCLEAR− signal on the bus being a binary ZERO. The PCLEAR− signal is set by the central processor unit during system initialization to clear all peripherals on the system buses. When the PCLEAR− signal is a binary ZERO, the output of AND gate 416 is a binary ONE as is the output of AND gate 418, signal PCLEAR+20. Inverter 420 inverts the output of AND gate 418. When the output of AND gate 418 is a binary ONE, inverter 420 produces a binary ZERO at the set (S) input of cycle in flip-flop 410 thereby initializing the Q output thereof to a binary ONE. This ability for the PCLEAR− signal to set cycle in flip-flop 410 is used by the system during a master clear operation to abort any input/output operation in progress at the time of the master clear.

Once again referring to FIG. 40, it can be seen that the Q output of my time 3 flip-flop 408 (signal DMYTM3−) is reset only during the primary time 3 period of the current IOC (time C to D) and that the Q output of cycle in flip-flop 410 (signal BCYCOT−) is reset only during the current IOC's system bus cycle in time period of 500 nanoseconds (time D to E).

I/O CONTROLLER REQUEST LOGIC

Now referring to FIG. 39, the operation of the DMC request logic 402-1 will be discussed in detail. For simplicity, the DMA/DMC request logic 402 of FIG. 38 is shown as DMC request logic 402-1 in FIG. 39 with the following discussion of FIG. 39 assuming that the I/O controller is a DMC IOC and therefore the data transfer request logic will make a DMC request by use of the signal PDMCRX−. If the IOC was of the DMA type containing address and range logic (445 in FIG. 38), the data transfer request logic would make a DMA request by use of the signal PDMARX−.

Initially, need DMC flip-flop 424 is reset indicating that the IOC does not currently need a DMC cycle to transfer a byte to data to or from a peripheral connected to the IOC. Later, when device logic 407 (FIG. 38) determines that a byte of data is needed to be read from or written into main memory, signal DMCINC− at the D input of flip-flop 424 becomes a binary ONE. Still later, when the device logic 407 clocks the data input signal of flip-flop 424 to the outputs thereof by transitioning the clocking signal DERSWT− from the binary ZERO to the binary ONE state, need DMC flip-flop 424 is set and causes the Q output thereof (signal DRQAOK+) to become a binary ONE. Once the need DMC flip-flop 424 is set, the IOC will request a DMC bus cycle during its next system bus cycle in time if another IOC on the same system bus is not already requesting a DMC cycle. Thus, if another IOC on the same system bus is not requesting a DMC cycle, the DMC request signal PDMCRX− on the system bus (denoted as signal DDMCRX− internally to the IOC) will be a binary ONE indicating that a DMC cycle is not being requested by an IOC on that system bus. With a binary ONE at two of the three inputs to NAND 426, i.e., DMC request flip-flop not set and need DMC flip-flop set, the occurrence of a binary ONE signal at the third input, signal DMYTM3+, will cause the output thereof, signal DMYDMC− to become a binary ZERO thereby setting DMC request flip-flop 428. As shown in FIG. 40, signal DMYTM3− becomes a binary ZERO (therefore signal DMYTM3+ becomes a binary ONE) at time C which is the beginning of primary time 3 for the current IOC's system bus cycle in time causing the system bus DMC request line signal PDMCRX− to become a binary ZERO.

Now referring to FIG. 39, it can be seen that the setting of DMC request flip-flop 428 results in the Q output thereof, signal DMDMCF+, becoming a binary ONE which in turn causes the output of NAND gate 430 to become a binary ZERO thereby requesting a DMC cycle on system bus line PDMCRX−. Once the DMC cycle request line is set to a binary ZERO, it can be seen by reference to FIG. 39, that no other DMC IOC on that system bus will be able to request a DMC cycle on its behalf until the DMC request line is reset by the current IOC. If should be noted that each DMC IOC on the system buses has DMC request logic similar to that shown in FIG. 39.

The DMC request flip-flop 428 of the current IOC can be reset by the occurrence of either of two events. A master clear operation will result in the system bus clear signal PCLEAR− becoming a binary ZERO resulting in the output of AND gate 418 (PCLEAR+20) becoming a binary ONE which is one input to NOR gate 422. When signal PCLEAR+20 becomes a binary ONE, the output of NOR gate 422, signal DMCCLR− will become a binary ZERO which in turn will reset need DMC flip-flop 424 and DMC request flip-flop 428. This resetting of flip-flops 424 and 428 via the clear signal results in the clearing of any stored, but not yet acted upon, need DMC request and the resetting of the system bus DMC request line if it is currently set by the DMC request flip-flop 428.

The second method by which flip-flops 424 and 428 can be reset is in response to an answer DMC command (ASDMC) being encoded on bus lines RDDT29+ through RDDT31+ which results in the setting of DMC link flip-flop 454. When DMC link flip-flop 454 is set, the output thereof, signal DDMCCY+, becomes a binary ONE which will clock the binary ZERO at the D input of DMC request flip-flop 428 onto the outputs thereof thereby resetting DMC request flip-flop 428. This also results in the output of NOR gate 422 becoming a binary ZERO which in turn causes the resetting of need DMC flip-flop 424. Thus, as will be seen hereinafter, when the CPU responds to the requesting IOC with the answer DMC command on the system bus, the requesting IOC's DMC request flip-flop 428 is reset as is its need DMC flip-flop 424. The resetting of DMC request flip-flop 428 results in the DMC request line (signal PDMCRX−) on the particular system bus to which the IOC is attached becoming a binary ONE thereby allowing another IOC, or the resetting IOC, to make a DMC request on that particular system bus by setting its DMC request flip-flop. If more than one IOC on a particular system bus has a need DMC flip-flop set, the first IOC to be granted its cycle in time on the system bus will be the IOC which is allowed to make the DMC request by setting its DMC request flip-flop. For example, in reference to FIG. 13, if the third IOC was granted a DMC data transfer request and during the processing of the third IOC's DMC transfer request the fourth IOC and the second IOC set their respective need DMC flip-flops and the DMC request flip-flop of the third IOC is reset during the system bus cycle in time of the first IOC, then the second IOC will be allowed to set its DMC request flip-flop during its system bus cycle in time. The fourth IOC will have to wait until a later one of its system bus cycle in times in which it finds that the DMC request line on its system bus has not already been set by another IOC on the same system bus before the fourth IOC can set its DMC request flip-flop and request a DMC data transfer cycle.

I/O CONTROLLER INTERRUPT REQUEST LOGIC

Again referring to FIG. 39, the operation of interrupt request logic 404 will be discussed. Interrupt request logic 404 operates in an analogous manner to that of DMC request logic 402-1. That is, need interrupt flip-flop 434 and interrupt request flip-flop 438 are initially reset producing a binary ZERO at their respective Q outputs thereof. When the I/O controller determines that an interrupt is needed, the clocking signal DAINOK+ of need flip-flop 434 transitions from the binary ZERO to the binary ONE state clocking the binary ONE at the data input thereof onto the Q output thereof thereby setting the flip-flop and causing the signal DBINOK+ to become a binary ONE. Later, during the cycle in time of the particular IOC, the occurrence of the timing signal DMYTM3+ becoming a binary ONE will enable NAND gate 436 and cause the output thereof to become a binary ZERO if the third input thereof, signal DINTRX−, is a binary ONE. Signal DINTRX− will be a binary ONE if the interrupt request line on the particular system bus, signal PINTRX−, is a binary ONE indicating that no other IOC on that particular system bus has already set its interrupt request flip-flop. If all three inputs to NAND gate 436 are a binary ONE, the output thereof, signal DMYINT−, becomes a binary ZERO thereby setting interrupt request flip-flop 438 and causing the Q output thereof, DMINTF+, to become a binary ONE. Setting of interrupt request flip-flop 438 causes the output of NAND gate 440, signal DINTRX−, to become a binary ZERO. This signal, DINTRX−, is the same as the interrupt request signal, PINTRX− on the system bus. The setting of interrupt request flip-flop 438 thereby precludes any other IOC on the same system bus from making an interrupt request until the interrupt request flip-flop of the currently requesting IOC is reset. As will be seen hereinafter, when the CPU responds with an answer interrupt command (ASINT) on system bus lines RDDT29+ through RDDT31+ the interrupt link flip-flop 450 is set causing the Q output thereof, signal DINTCY+, to become a binary ONE. Signal DINTCY+ becoming a binary ONE resets interrupt request flip-flop 438 by clocking the binary ZERO at the data input thereof onto the outputs thereof resulting in the resetting of the system bus interrupt request line (signal PINTRX−). Signal DINTCY+ becoming a binary ONE in response to the answer interrupt command from the CPU also results in the output of NOR gate 432 (signal DINSTS−) becoming a binary ZERO thereby resetting need interrupt flip-flop 434. Alternatively, as discussed with respect to DMC request logic 402-1, the occurrence of a master clear from the CPU will cause signal PCLEAR+20 to become a binary ONE and thereby cause the output of NOR gate 432 to become a binary ZERO which in turn will reset need flip-flop 434 and interrupt request flip-flop 438 thereby aborting any interrupt request currently in progress. This setting and resetting of the system bus interrupt request line PINTRX− is also illustrated in FIG. 23 which shows the system bus I/O interrupt sequence.

I/O CONTROLLER REQUEST RESET LOGIC

Again referring to FIG. 39, the operation of the IOC request reset logic 406 wil be discussed in detail. Command decoder 442 is used to decode the system bus commands generated by the CPU under firmware control and binary encoded on system bus lines RDDT29+ through RDDT31+. Command decoder 442 is a three-to-eight line decoder of the type number SN 74S138 manufactured by Texas Instruments Incorporated of Dallas, Texas and described in their publication entitled "The TTL Data Book for Design Engineers", Second Edition. Of the three enabling (EN) inputs which are ANDed together to enable the command decoder, only one is variable and that one is connected to system bus line PIOCTX− such that when a binary ZERO appears on that line decoder 442 is enabled and will decode the three binary inputs (I1, I2 and I4) and produce a binary ZERO at one of the eight outputs (Q0-Q7). The binary encoding of the three command lines is shown in FIG. 18 which describes the eight system bus commands. For example, if a binary 011 is encoded on system bus lines RDDT29+ through RDDT31+, a binary ZERO will appear at the Q3 output of command decoder 442 making the signal DASDMC− a binary ZERO. Thus, when command strobe signal PIOCTX− becomes a binary ZERO, one of the eight outputs of command decoder 442 becomes a binary ZERO and the other seven outputs thereof remain a binary ONE. Before command strobe signal PIOCTX− becomes a binary ZERO, i.e., when the enable signal is a binary ONE, all of the outputs of command decoder 442 are a binary ONE. The generation of command strobe signal PIOCTX− is controlled by CPU firmware word bits 32 through 34 as described hereinbefore and shown in FIG. 35C and FIG. 37D. With reference to FIG. 37D it can be seen that CPU firmware word bits 27 and 28 control which of the two or both system bus strobe command lines are enabled. That is, the microprogrammer of the CPU firmware has under his control through the use of bits 27 and 28 which of the system buses will receive a command strobe and through the use of bits 29 through 31 (see FIG. 37E) the command which will be strobed to the selected system bus, either system bus A or system bus B or both system buses A and B. Therefore, if a DMC request is being made on system bus A and another DMC request is being made on system bus B, the CPU firmware can be microprogrammed to respond with an answer DMC command on system bus lines RDDT29+ through RDDT31+. The ability to control the system bus command strobe to one or the other or both system buses is important in that the system bus command on lines RDDT29+ through RDDT31+ is broadcast on both system buses simultaneously and it is the bus command strobe signal (PIOCTX−) which is gated to only one of the two buses so that only one of the possible two requesting IOCs will be answered. As seen in FIG. 21, the command strobe signal PIOCTX− transitions from the binary ONE to the binary ZERO state at the end of primary time 0 thus enabling one of the eight outputs of command decoder 442.

Returning now to FIG. 39, it can be seen that one of the inputs of AND gate 452 is signal DASDMC− from command decoder 442. The other input to AND gate 452 is signal DMDMCF− which is the Q̄ output from DMC request flip-flop 428. Thus, it can be seen that if an answer DMC command is encoded on system bus lines RDDT29+ through RDDT31+ and command strobe line PIOCTX− is a binary ZERO on the same system bus, the signal DASDMC− will be a binary ZERO partially enabling AND gate 452. If the DMC request flip-flop 428 of the IOC is set, the bottom input to AND gate 452 will be enabled (a binary ZERO) thus fully enabling AND gate 452 and producing a binary ONE at its output, (signal DDMCCS+). With a binary ONE appearing at the data (D) input of D-type flip-flop 454, the occurrence of the clocking signal DMYLKC+ transitioning from a binary ZERO to a binary ONE state will set the DMC link flip-flop 454 and result in signal DDMCCY+ becoming a binary ONE.

As seen hereinbefore, the transition of the signal DDMCCY+ from a binary ZERO to a binary ONE state results in the clocking of the DMC request flip-flop 428 and the resetting thereof which results in the DMC request line PDMCRX− on the system bus becoming a binary ONE. As also seen hereinbefore, when signal DDMCCY+ becomes a binary ONE the need DMC flip-flop 424 is also reset.

Turning now to the generation of the clocking signal DMYLKC+ which clocks:command link flip-flop 446, interrupt link flip-flop 450, DMC link flip-flop 454 and IOC link flip-flop 468. As seen hereinbefore, the output of AND gate 452 will be a binary ONE if both inputs to it are a binary ZERO indicating that the IOC is receiving an answer DMC command from system bus lines RDDT29+ through RDDT31+ and that the particular I/O controller's DMC request flip-flop 428 is set. If these conditions are met, one of the inputs to OR gate 458 will be a binary ONE thereby making the output of it (signal DMYLKS+) a binary ONE. A binary ONE at the data input of reset request flip-flop 460 will be clocked onto the output at primary time 3 when the clocking signal PTIME3+20 transitions from a binary ZERO to a binary ONE state. The setting of reset request flip-flop 460 results in the output (signal DMYLKC+) transitioning from a binary ZERO to a binary ONE and results in the clocking of flip-flops 446, 450, 454 and 468. At any given point in time, only one of the three flip-flops 446, 450 and 454 will be set. The setting of one of these three flip-flops depends on the command encoded on the system bus lines and which of the associated request flip-flops (i.e., CPU command 470, interrupt request 438, or DMC request 428) is set.

From the above discussion it can be seen that AND gate 452 serves a dual purpose. The first purpose is to provide a binary ONE at the data input of DMC link flip-flop 454 if the I/O command encoded on the system bus is an answer DMC command and if the DMC request flip-flop of that particular IOC is set. If that particular IOC's DMC request flip-flop is not set, the setting of DMC link flip-flop 454 is not required to reset an unset (already reset) DMC request flip-flop 428. The second purpose of AND gate 452 is to generate one of the three signals which are ORed together by OR gate 458 the output of which is used in the setting of reset request flip-flop 460. In turn the output of flip-flop 460 is used to clock flip-flops 446, 450 and 454. Thus, this clocking signal DMYLKC+ is generated only if an I/O controller's: DMC request flip-flop 428 is set and an answer DMC command is received, or interrupt request flip-flop 438 is set and an answer interrupt command is received, or CPU command flip-flop 470 is set and an answer command is received on the system bus command lines RDDT29+ through RDDT31+. These later two conditions are established by AND gate 444 and AND gate 448, the outputs of which are respectively connected to the data inputs of command link flip-flop 446 and interrupt link flip-flop 450. Command link flip-flop 446 will therefore be set if CPU command flip-flop 470 is set and an answer command is received from the system bus. Correspondingly, interrupt link flip-flop 450 will be set if the interrupt request flip-flop 438 is set and an answer interrupt command is received on the system bus. The setting of the interrupt link flip-flop 450 will result in the signal DINTCY+ becoming a binary ONE which in turn results in the resetting of interrupt request flip-flop 438 and need interrupt flip-flop 434 as discussed hereinbefore. The setting of CPU command flip-flop 470 results in signal DMCMDF− becoming a binary ZERO which is in turn used by the IOC in developing the proceed or busy signals which are sent to the CPU by the I/O controller to indicate whether or not the IOC is in a condition to proceed with the command dialogue from the CPU.

CPU command flip-flop 470 is set by the IOC in response to receiving a CPU command on system bus lines RDDT29+ through RDDT31+ along with the intended IOC's channel number on system bus lines BUSX00+ through BUSX09+. The CPU command to IOC sequence is shown in FIG. 20 the time which the CPU command is encoded on the RDDT system bus lines, the IOC compares the channel number on the bus data lines (BUSX00+ through BUSX09+) with that of a manually settable switch in the IOC which has been preset to indicate the channel number of the particular IOC. If the channel number on the system bus equals that of the IOC, the CPU command flip-flop 470 is set by signal DMYCMD− transitioning from a binary ZERO to a binary ONE at the clock input, clocking the binary ONE at the data input. Setting flip-flop 470 causes the Q̄ output signal DMCMDF− to become a binary ZERO partially enabling AND gate 444 which will be fully enabled upon the occurrence of an answer command encoded on the RDDT system bus lines. CPU command flip-flop 470 is reset by signal DCMDR3− on the occurrence of a master clear on the system bus (signal PCLEAR+20 via NOR gate 472) or the occurrence of an end-of-link command (EOFLK) on the RDDT system bus lines at primary time 3 if command link flip-flop 446 is set (i.e., the output of AND gate 474 will be a binary ONE during the occurrence of an end-of-link terminating the CPU command system bus sequence). Note, signal PTIME3+40 is produced by inverter 476 inverting primary time 3 signal PTIME3−30 and signal DEOFLK+ is produced by inverter 478 inverting end-of-link signal DEOFLK−.

Continuing now to discuss FIG. 39, it can be seen that IOC link flip-flop 468 is clocked by the output of reset request flip-flop 460 which also clocks flip-flops 446, 450 and 454. With a binary ONE at the data input of IOC link flip-flop 468, IOC link flip-flop 468 will be set whenever one of the link flip-flops 446, 450 and 454 is set. Whenever IOC link flip-flop 468 is set, the Q̄ output of it, signal DMYLNK−, being a binary ZERO partially enables AND gate 456. The other input of AND gate 456 is the signal DEOFLK— which will be a binary ZERO when the end-of-link command is encoded on the system bus RDDT lines. Thus, the output of AND gate 456, signal DMYEND+, will be a binary ONE whenever the end-of-link command appears on the system bus and one of the three link flip-flops 446, 450 or 454 is set thus assuring that the link command on the system bus is directed to this particular IOC. With signal DMYEND+ being a binary ONE, the output of OR gate 462, signal DEOLK+, will be a binary ONE. The binary ONE at the D1 input of end link register 464 will be clocked to the Q1 output thereof and held there at the primary time 3 period of the bus cycle in which the end-of-link command is on the system bus. During primary time 3 of the next system bus cycle, the signal DLKD1+, being a binary ONE at the Q1 output and at the D2 input of end link register 464, will be clocked and held at the Q2 output thereof and signal DELKD2+ will be a binary ONE. With DELKD2+ being a binary ONE, the output of inverter 466, signal DELKD2— will become a binary ZERO, thereby resetting IOC link flip-flop 468 and the other link flip-flops 446, 450 and 454 and terminating the current link sequence in which the IOC was linked to the CPU. In addition to an end-of-link sequence resetting link flip-flops 446, 450, 454 and 468, a master clear on the system bus will also clear these flip-flops by applying the PCLEAR+20 to OR gate 462 which will in turn, after two primary time 3 periods, result in the resetting of these flip-flops.

The purpose of end-of-link register 464 is to delay the resetting of the link flip-flops for one system bus cycle time. It should be noted that the output thereof after inverter 466, signal DELKD2—, remains at a binary ZERO state for one full system bus cycle time from the beginning of one primary time 3 unitl the end of the next primary time 2 such that link flip-flops 446, 450, 454 and 468 can not be set until signal DELKD2— at their reset inputs becomes a binary ONE. Therefore, link flip-flops 446, 450, 454 and 468 cannot be set until two system bus cycles have passed following the system bus cycle in which the end-of-link command was encoded on system RDDT lines. In practice, this is not a limitation because the CPU bus commands on system bus RDDT lines are generated by CPU firmware and the CPU must perform one or more firmware steps (i.e., system bus cycles) between the processing of the end-of-link of the previous command and the answering of any outstanding bus requests by an answer command, answer interrupt, answer DMA or answer DMC bus command. As seen hereinbefore, the link flip-flop clocking signal DMYLKC+ is generated by setting reset request flip-flop 460. In order to generate a subsequent clocking signal, which requires that the signal DMYLKC+ transition from the binary ZERO to the binary ONE state, flip-flop 460 must be reset. Flip-flop 460 is reset during the next primary time 3 of the following bus cycle by insuring that the data input thereof, signal DMYLKS+ is a binary ZERO. This will be the case if the bus command encoded on the system bus RDDT lines is not an answer command, answer interrupt or answer DMC command thereby assuring that the output of OR gate 458 is a binary ZERO. This is accomplished by insuring that the CPU firmware microprogram does not encode two consecutive microinstructions which generate answer commands on the system bus. In practice, this is no restriction in light of the bus sequence dialogs.

DMA IOC REQUEST AND RESET LOGIC

A given I/O controller within the system is either a DMA or a DMC controller. The above discussion with respect to the request logic and request reset logic and link logic has been in terms of a DMC I/O controller but the logic is equally applicable to that of a DMA I/O controller. That is, in FIG. 39, need flip-flop 424, request flip-flop 428, and link flip-flop 454 could equally have been DMA flip-flops in which case the answer DMA signal (DASDMA—) from command decoder 442 would have been used to set the link flip-flop 454 via AND gate 452.

I/O CONTROLLER SYSTEM BUS REQUEST AND LINK LOGIC SUMMARY

Review briefly now the operation of the logic shown in FIG. 30. Timing logic 400 is mainly concerned with generating the timing signals used within a particular IOC and passing on the cycle in timing signal BCYCIN from the previous IOC on the bus and delaying it for 500 nanoseconds before passing it on as signal BCYCOT onto the next IOC on the system bus. In addition, the timing logic 400 generates the primary time 3 signals PTIME3+20 which is a binary ONE during every system bus cycle and signal DMYTM3+ which is a binary ONE only during the primary time 3 period of a particular IOC's system bus cycle in time. DMA request logic (not shown), DMA/DMC request logic 402 (FIG. 38), and interrupt request logic 404 are used to request a DMA, DMC, or interrupt request of the CPU respectively. The setting of an IOC's request flip-flop, for example, DMC request flip-flop 428, is allowed only during that particular IOC's cycle in time on the system bus thereby eliminating the possibility of more than one IOC on that particular system bus (A or B) trying to make a particular type request. Because the DMA, DMC and interrupt request lines on system bus A are separate and distinct from those on system bus B, an IOC on system bus A can, for example, make a DMC request at the same instant in time that an IOC on system bus B is making a DMC request because each IOC is currently experiencing its cycle in time. It should be further noted that a given IOC on a particular system bus may concurrently make an interrupt request and a DMC request (or a DMA request) because nothing in the request logic precludes more than one request logic within a given IOC should be set at a given instance in time. It being noted that the priorities between different request types (i.e., DMA, DMC or interrupt) are sorted out by CPU as well as competing requests of the same type between system bus A and B. Further examination of the request logic will show that during a particular cycle in time period a first IOC may reset its DMC request flip-flop 428 and a second IOC on the same system bus may set its DMC request flip-flop 428 if it is the second IOC's cycle in time period and if its need DMC flip-flop 424 is set. This can occur even though both IOCs on the same system bus will be receiving the answer DMC command on system bus RDDT lines. Only the first IOC will generate the DMC request flip-flop reset signal DDMCY+ from DMC link flip-flop 454 because only the first IOC's DMC request flip-flop 428 was set at the time the clocking signal PTIME3+20 clocks reset request flip-flop 460. At the leading edge of PTIME3+20 in the second IOC on the same system bus, the output of AND gate 452, signal DDMCCS+ will be a binary ZERO and consequently the output of OR gate 458, signal DMYLKS+ will be a binary ZERO so that reset request flip-flop 460 will not be set by clocking signal PTIME3+20. Because the second IOC's reset request flip-flop 460 will not be set, the Q output thereof, signal DMYLKC+, will remain a binary ZERO and DMC link flip-flop 454 will not be clocked and will remain reset.

The second IOC's output of OR gate 458, signal DMYLKS+, will be a binary ZERO because the other two inputs there to, signals DINTCS+ and DCMDCS+, will also be a binary ZERO at the leading edge of PTIME3+20 because at any given instant in time the CPU can only be giving one type of command on the system bus RDDT lines. Therefore only one output of command decoder 442 will be a binary ZERO and consequently only one, if any, output of AND gate 444, 448 and 452 can be a binary ONE at PTIME3+20. That is, reset request flip-flop 460 will be set and generate link flip-flop (446, 450, 454 and 468) clocking signal DMYLKC+ only if a request flip-flop (470, 438 or 428) is set and the corresponding command (ASCMD, ASINT or ASDMC respectively) is received from the CPU on the system bus RDDT lines.

Although a given peripheral device connected to a particular IOC will not normally, in any instant in time, be making both a DMA (or DMC) request in conjunction with an interrupt request, it is possible to have multiple peripheral devices connected to one IOC in which case that particular IOC could be requesting both an interrupt and a data transfer (DMA or DMC) at a particular instance in time, in which case it would have more than one of its request flip-flops set.

Once an IOC makes a system bus request, the CPU firmware will respond by an answer command on system bus RDDT lines. As shown in request reset logic 406, the response of the CPU to the system bus request produces two actions. The first action is that the request flip-flop of the requesting IOC is reset and the corresponding link flip-flop is set. Thus continuing with the DMC example, if an IOC on system bus A makes a DMC request the CPU firmware will answer with an answer DMC command on system bus RDDT lines for both system buses A and B, but will only respond on system bus A with the controller lines PIOCTX− (PIOCTA− in this case) being set to a binary ZERO. Thus, although the answer DMC command is broadcast both on system bus A and system bus B only the IOCs on system bus A will have their command decoders 442 enabled by system bus line PIOCTA− and so that only the IOCs on system bus A could possibly respond to the answer DMC command. Because only one IOC on system bus A can have its DMC request flip-flop set, only that IOC on system bus A will set its DMC link flip-flop 454 and reset its DMC request flip-flop 428. It should be noted that the broadcasting of the answer DMC command on the system bus RDDT lines and the resetting of that particular IOC on system bus A's DMC link flip-flop 454 can occur during any primary time 3 and need not necessarily occur during the DMC requesting IOC's cycle in time. Once a particular IOC's link flip-flop is set, that particular IOC and CPU are linked together and all further dialog on system bus address/data lines (BUSX00+ through BUSX15+) is dedicated to the particular request being processed. Thus, on system buses A and B only one IOC will have one of its link flip-flops 446, 450 or 454 set and it will remain set until the end-of-link command is sent by the CPU and received by that particular IOC. Because only one IOC in the system has a link flip-flop set, the end-of-link command can be broadcast by the CPU firmware on both system buses and only one IOC will reset by resetting its link flip-flop.

Again, it is to be noted that the CPU may broadcast the end-of-link command at any time and need not await the cycle in time period of the particular IOC that is currently linked to the CPU. Thus, it can be seen that the purpose of the cycle in time is to eliminate contention problems between IOCs on a particular system bus and that, once initiated, the bus dialog between IOC and the CPU can take place irrespective of the cycle in time of the involved IOC. As discussed hereinbefore and as illustrated in FIGS. 16, 17 and 18, the normal sequence for DMC, DMA and interrupt requests is: for the IOC to initiate a bus request during its cycle in time; for the CPU to respond with an answer at any time; followed by an end-of-link command from the CPU at any time. Further, as discussed hereinbefore and illustrated in FIG. 16, the CPU may initiate IOC activity by placing a CPU (CPCMD) command on system bus lines RDDT at any time and placing the particular IOC's channel number on the system bus address/data lines. As used herein, the term "any time" means that period of time that the system bus is not already in use by another IOC being linked to the CPU (i.e., that time during which no link flip-flop of an IOC is set) without regard to the cycle in time of the involved IOC. It should be further noted that the normal bus dialog sequence of: bus request by IOC; followed by an answer command from the CPU; followed by an end-of-link command from the CPU can be aborted at any point by a master clear (PCLEAR signal) which will reset the corresponding flip-flops and abort the sequence such that a new sequence may be initiated.

CPU LOGIC DETAILS

Figure 43:
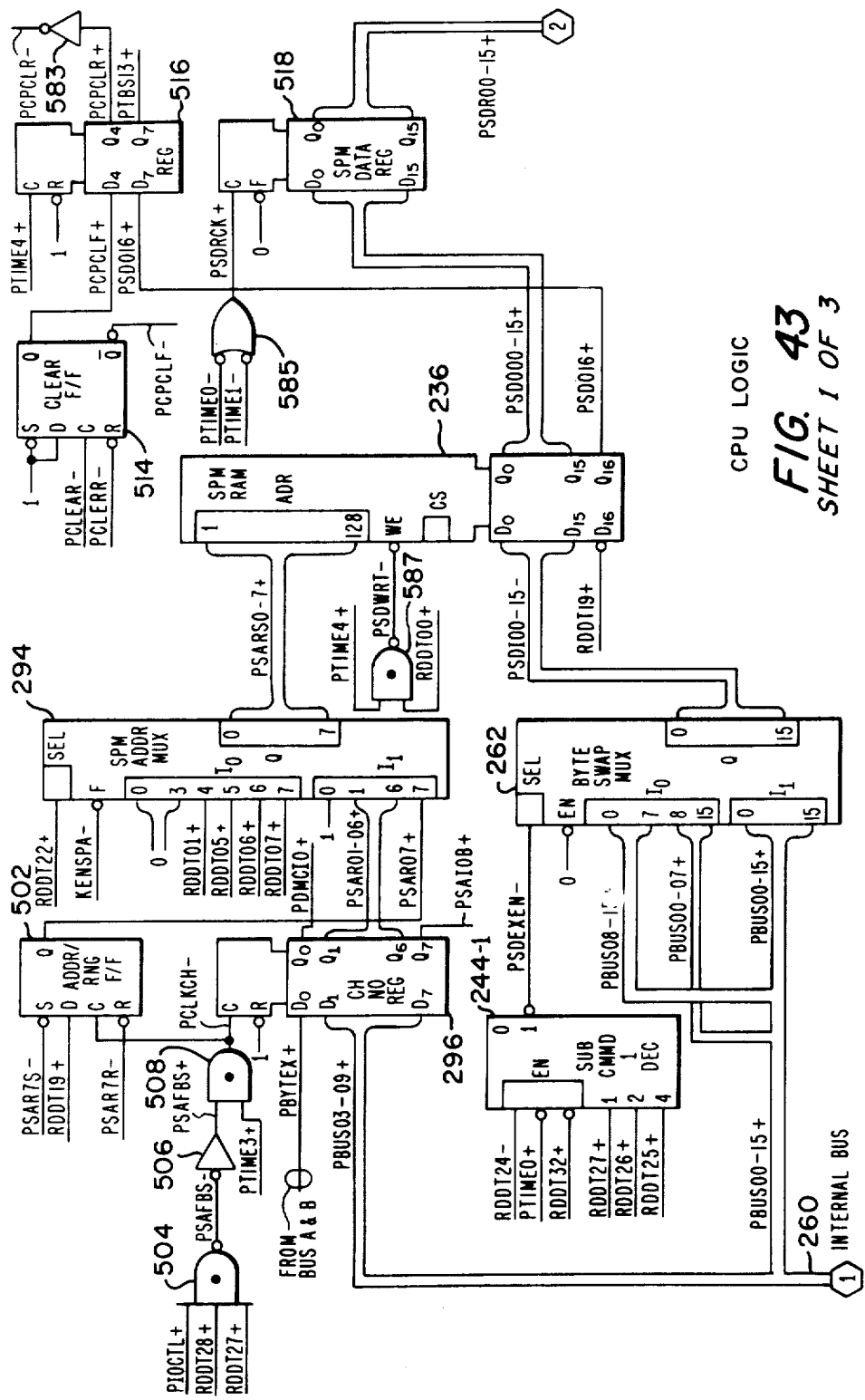
FIG. 43 illustrates the logic of the CPU shown in FIG. 8.
Figure 43:
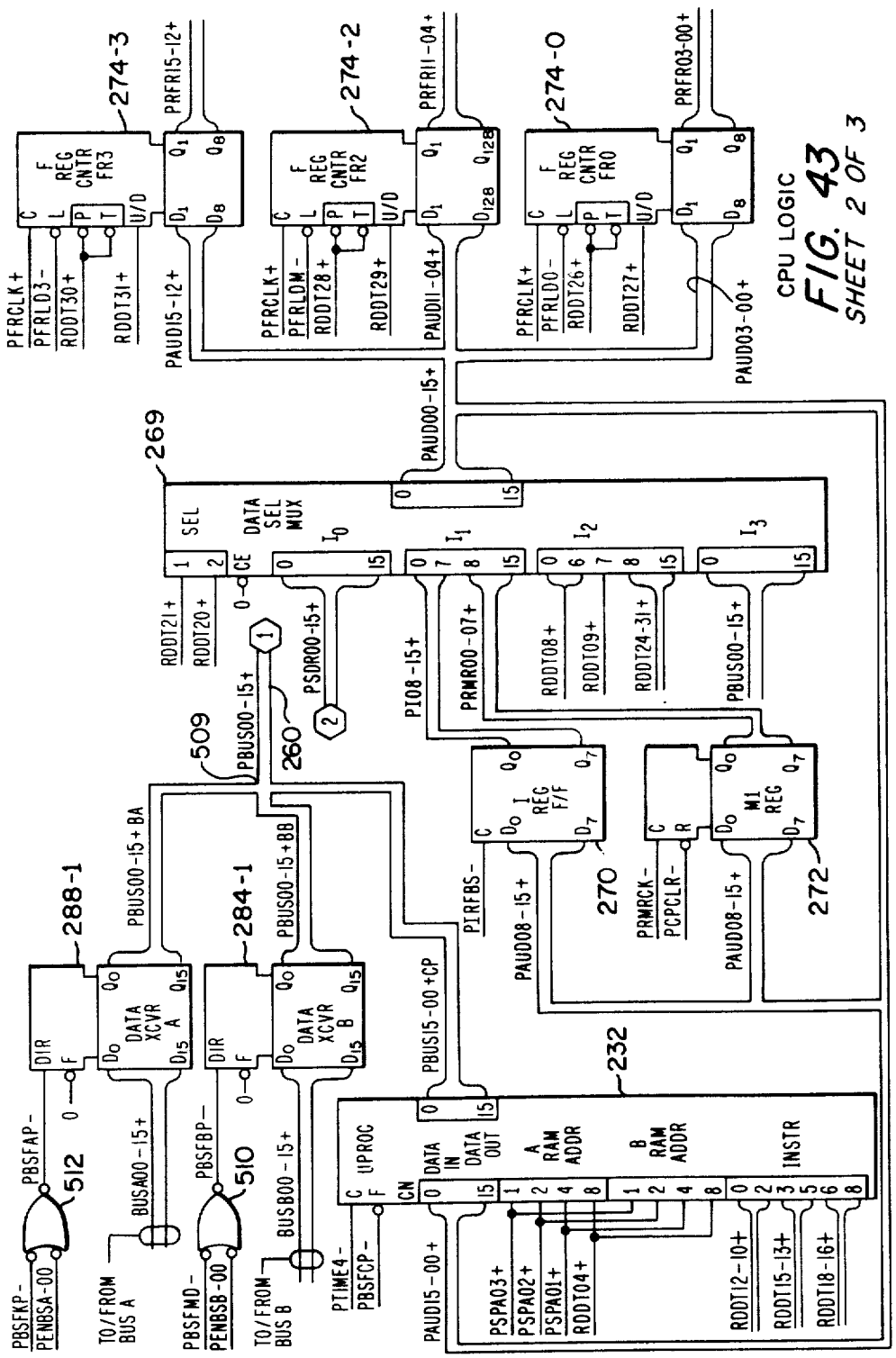
Figure 43:
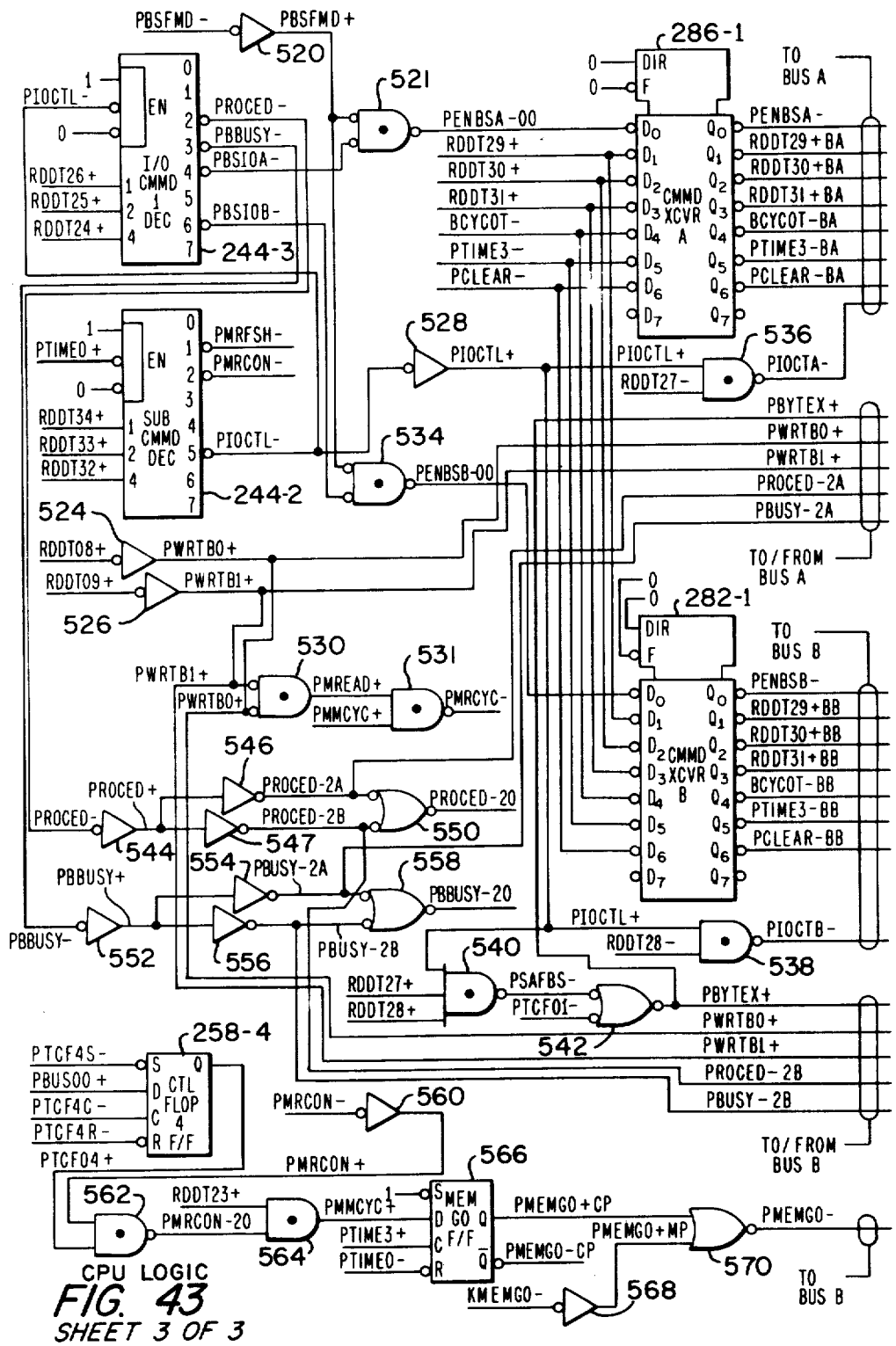

Having described the operation of the I/O controller logic, the CPU logic will now be described in detail. FIG. 42 illustrates the control store logic described above in conjunction with the control store block diagram, FIG. 9, and FIG. 43 shows the CPU logic described above in conjunction with the CPU block diagram, FIG. 8.

CONTROL STORE LOGIC DETAILS

Referring now to FIG. 42 the operation of the control store logic will be discussed in detail. When the system is initialized address register 1, 246-1, and address register 2, 246-2, are reset causing the 10-bit address output thereby to be set to zero. With the 10-bit ROS address (RADR00+ through RADR09+) set to zero, location zero is read out of ROS 1, 238-8, and ROS 2, 238-2, and loaded into local register 242 at the beginning of primary time 0. The 48-bit microinstruction firmware word contained in local register 242 is then fed throughout the CPU. Two bits in the firmware word read from ROS control the selection of one of four inputs to address generator 1 multiplexer, 248-1, some of the outputs of which are fed back to address register 1, 246-1, and the other outputs of which are fed to address generator 2, 248-2. The outputs of address generator 2, 248-2 are in turn fed to address register 2, 246-2. With the outputs of address registers 1 and 2, 246-1 and 246-2, being determined by the previous microinstruction firmware word, the address of the next microinstruction is presented to ROS 1 and 2, 238-1 and 238-2, and the next microinstruction is read and then clocked into local register 242 at the beginning of primary time 0. In this manner, without the occurrence of a hardware interrupt as described below, the current microinstruction determines the next microinstruction to be read from ROS.

ROS Address Generation Logic

Now returning to address register 1 and 2, 246-1 and 246-2, the above operation will be discussed in more detail. When the system is initialized, signal PCLEAR− becomes a binary ONE which in turn, as will be seen below, will cause PCPCLR+ to become a binary ONE and signal PCPCLR− to become a binary ZERO at the beginning of primary time 4. With signal PCPCLR+ being a binary ONE at one input of NOR gate 595 the output thereof, signal RARCRL− becomes a binary ZERO which in turn clears address register 1, 246-1, causing the 6 most significant bits of the 10-bit ROS address, signals RADR00+ through RADR05+, to become binary ZEROs. With signal PCPCLR− being a binary ZERO at the reset (R) input of address register 2, 246-2, the least significant bits of the 10-bit ROS address, signals RADR06+ through RADR09+ become a binary ZEROs thereby making the 10-bit ROS address all zeros. With the enable (EN) read inputs, signal KENROS−, being a binary ZERO, ROS 1, 238-1, addresses the location specified by the 10-bit address and places the 40-bit output thereof on lines PROS00+ through RROS23+ and RROS32+ through RROS47+. With the enable (EN) read inputs, signals KENROS− and PENBBT+ being binary ZEROs, the ROS 2, 238-2, addresses the location specified by the 10-bit address and puts the 8-bit output thereof on output lines RROS24+FM through RROS31+FM. It should be noted that ROS 1, 238-1, is composed of 10 PROMS of 4-bits by 1024 locations and that ROS 2, 238-2, and boot PROM, 240, are each composed of 2 PROMS of 4-bits by 1024 locations each. These 4-bit by 1024 location PROMs are of the type 82S137 manufactured by Signetics Corporation of Sunnyvale, Calif., and described in their publication "Signetics Bipolar and MOS Memory Data Manual", incorporated herein by reference. The 48-bit microinstruction firmware word read from ROS 1 and 2 is clocked into local register 242 at the beginning of primary time 0 by signal PTIME0−. The output of local register 242, signals RDDT00+ through RDDT47+, are used throughout the CPU to control the central processor unit and are also inverted by inverters (not shown) to produce control signals RDDT00− through RDDT47− when required.

Control store address generator 248 of FIG. 9 is composed of address generator 1 multiplexer, 248-1, and address generator 2 multiplexer, 248-2, in FIG. 42. Address generator 1 multiplexer, 248-1, which is composed of ten 4-to-1 multiplexers determines the address of the next microinstruction to be fetched from ROS 238 depending upon the branch types specified in bits 36 and 37 of the current firmware word. FIG. 35D shows that if both select (SEL) inputs RDDT37+ and RDDT36+ are a binary ZERO, the branch type specified in the current microinstruction is an unconditional branch and the 10-bit ROS address of the next microinstruction will be specified by the I0 inputs, signals RDDT38+ through RDDT47+. If bits 36 and 37 of the current microinstruction specify a binary 01, then a 2-way test branch is specified and the I1 inputs will be selected using: four bits from address register 1, 246-1, signals RADR00+ through RADR03+; five bits from the current microinstruction, signals RDDT42+ through RDDT46+; and the one bit from the branch on test network 254 (see FIG. 9), signal RASBT9+. If bits 36 and 37 of the current microinstruction specify a binary 10, address generator 1 multiplexer, selects the multiple test branch inputs, I2, and uses: 6-bits from the current microinstruction, signals RDDT38+, RDDT39+ and RDDT44+ through RDDT47+; and 4 bits from major branch network 256 (see FIG. 9), signals RAMBT2+ through RAMBT5+. If bits 36 and 37 of the current microinstruction specify a hardware interrupt return branch then the I3 inputs are used and the 10-bit address is determined by signals RITR00+ through RITR09+ from hardward interrupt return register 252. The outputs of address generator 1 multiplexer, 248-1, signals RADM00+ through RADM09+ are valid as long as output control (F) input signal KENRAM− remains a binary ZERO.

Address generator 2 multiplexer, 248-2, is used to select whether the four least significant bits of the 10-bit ROS address should come from the output of address generator 1 multiplexer, 248-1, or from hardward interrupt encoder 250-2. If no hardware interrupts are pending or if one or more interrupts are pending but hardware interrupts are inhibited, signal PHINTL+ will be a binary ZERO and the I0 inputs, signals RADM06+ through RADM09+ will be selected. If one or more hardware interrupts are pending and hardware interrupts are enabled, signal PHINTL+ will be a binary ONE and the I1 inputs, a binary ONE and signals PHINT7+ through PHINT9+ will be selected and the four least significant bits of the 10-bit ROS address will be determined by the encoding of the pending hardward interrupt.

The outputs of address generator 2 multiplexer, 248-2, signals RADN06+ through RADN09+, will be clocked into address register 2, 246-2, at the beginning of primary time 2 when signal PTIME2+ transitions from the binary ZERO to the binary ONE state. Similarly, address register 1, 246-1, will contain the sixth most significant bits of the 10-bit ROS address as determined by the output of address generator 1 multiplexer, 248-1. The 10-bit ROS address clocked into address register 1 and 2 at the beginning of primary time 2 is then used to address ROS 1 and ROS 2 to read a 48-bit firmware word which is then clocked into local register 242 at the beginning of primary time 0. In this manner, the current microinstruction determines the address of the next microinstruction to be read upon the occurrence of a hardware or software interrupt.

Hardware Interrupt Logic

Continuing to refer to FIG. 42, the handling of hardware and software interrupts will be discussed in detail. Once during each CPU cycle at the end of primary time 4 interrupt request register 250-1 is clocked by signal PRIME4−. The data inputs of interrupt request register 250-1 are connected respectively to: interrupt request system bus B (signal PINTR2−), interrupt request system bus A (signal PINTR1−), DMC data request system bus B (signal PDMCR2−), DMC data request system bus A (signal PDMCR1−), DMA data request system bus A (signal PDMAR1−), DMA data request system bus B (signal PDMAR2−), main memory refresh timeout (signal PHMRFL−), and main memory read cycle (signal PMRCYC−). The DMA and DMC data request and main memory refresh time-out output signals of interrupt request register 250-1 are connected to the inputs of hardware interrupt encoder 250-2. The ouput of parity error flip-flop 586, signal PHMPER−, and nonexistent memory flip-flop 592, signal PHNDXM−, are also connected as inputs to hardward interrupt encoder 250-2. Hardware interrupt encoder 250-2 is an 8-line to 3-line priority encoder of the type SN74148 manufactured by Texas Instruments Incorporated of Dalls, Texas. Hardware interrupt encoder 250-2 encodes the 8 input lines onto the three output lines, signals PHINT7+ through PHINT9+, whenever the enable (EN) output signal is a binary ZERO. The I output, signal PHINTP+, of hardware encoder 250-2 will be a binary ONE whenever one of the eight inputs thereof is a binary ZERO, indicating that there is a hardware interrupt pending.

If there is a hardware interrupt pending, the enable (I) output of hardward interrupt encoder 250-2, signal PHINTP+, will be a binary ONE partially enabling AND gate 591. If bit 35 of the current firmware work is a binary ONE, enabling hardware interrupts (see FIG. 35C), signal RDDT35+ will be a binary ONE fully enabling AND gate 591 and make the output signal PHINTL+ a binary ONE. With signal PHINTL+ being a binary ONE partially enabling AND gate 593, at the beginning of primary time 2 signal PTIME2+ becomes a binary ONE fully enabling AND gate 593 and making the output thereof, signal PHINTC+, a binary ONE. With one input of NOR gate 595 being a binary ONE, the output thereof, signal RARCLR−, will be a binary ZERO resetting address register 1, 246-1, thereby clearing to zero the six most significant bits of the 10-bit ROS address. With the output of AND gate 591, signal PHINTL+ being a binary ONE, address generator 2 multiplexer 248-2, will select the I1 inputs and encode on the three least significant bits of the 10-bit ROS address the address corresponding to the input number of the highest priority interrupt pending at an input of hardware interrupt encoder 250-2. With the fourth least significant bit of the 10-bit ROS address being set equal to a binary ONE by a binary ONE appearing at bit zero of input I1 of address generator 2 multiplexer 248-2, it can be seen that if a hardware interrupt is pending and hardware interrupts are enabled the combined output of address generator register 1 and address generator register 2 will be a 10-bit ROS address within the range of 8 through 15.

Thus it can be seen that if a hardware interrupt is pending and hardware interrupts are enabled, the outputs of hardware interrupt encoder 250-2 will clear the 6 most significant bits of the 10-bit ROS address by clearing address register 1, 246-1, and by selecting the encoded priority of the hardware interrupt via address generator 2 multiplexer 248-2 and address register 2, 246-2. By use of this mechanism a 10-bit ROS address for the microroutine coded to handle the particular pending hardware interrupt is generated and the microroutine is executed.

It is the function of hardware interrupt return register 252 to save the 10-bit ROS address of the next microinstruction prior to invoking a hardware interrupt microroutine. Thus, whenever a hardware interrupt microroutine is invoked, the output of AND gate 593, signal PHINTC+ will transition from a binary ZERO to a binary ONE state and clock hardware interrupt return register 252 thereby saving the 10-bit ROS address of what would have been the next microinstruction to be used from ROS. Since signal PHINTC+ transitions from the binary ZERO to the binary ONE state only once per hardware interrupt, and then only at the beginning of the hardware interrupt microroutine, hardware interrupt return register 252 will retain the contents of the 10-bit ROS address of the microinstruction that would have been read from ROS if there had not been a hardware interrupt all during the processing of the microroutine associated with the hardware interrupt. It should be noted that hardware interrupts are inhibited during the processing of the hardware interrupt microroutine (i.e., hardware interrupts are not nested). The last instruction of the microroutine for processing a hardware interrupt codes a hardward interrupt return branch in bits 36 and 37 of the firmware word causing signals RDDT36+ and RDDT37+ to be binary ONEs thereby selecting the I3 inputs of address generator 1 multiplexer, 248-1, thereby causing the 10-bit ROS address of the next microinstruction to be taken from the hardware interrupt return register 252 which effectively returns control to the microinstruction firmware word addressed by the 10-bit address produced by the address generator 1 multiplexer, 248-1, just prior to the occurrence of the hardware interrupt as discussed above with respect to FIG. 34.

An examination of FIG. 42 shows that the address of the next microinstruction is developed during the execution of the current microinstruction. Thus, if at the beginning (before primary time 2) of the current microinstruction a hardware interrupt signal at one of the inputs of hardware interrupt encoder 250-2 is a binary 0, and if hardware interrupts are enabled in the current microinstruction (bit 35 is a binary ONE, signal RDDT35+), the next microinstruction fetched will be the first microinstruction of the microroutine for servicing the highest priority interrupt pending. If interrupts are inhibited (bit 35 is a binary ZERO) by the current microinstruction, a hardware interrupt will not occur at the end of the current microinstruction and the next microinstruction will be the microinstruction addressed by the ROS addressing field of the current microinstruction.

Because microinstruction bit 35 controls what happens at the end of the current microinstruction, hardware interrupt service microroutines are microprogrammed such that hardware interrupts are enabled during the last microinstruction of the microroutine and the ROS addressing field (see FIG. 35D) specifies that the address of the next microinstruction is to be taken from the hardware interrupt return register 252 which will return control to the interrupted original microprogram (if no hardware interrupt is pending). If a hardware interrupt is pending during the last microinstruction of a first hardware interrupt service microroutine, the address generator 1 multiplexer 248-1 will select the I3 input (i.e., the address stored in hardware interrupt return register 252) and make its Q output (signals RADM00+ through RADM09+) equal to I3 input. The output of address generator 1 multiplexer 248-1 will then be restored in hardware interrupt return register 252 at primary time 2 when signal PHINTC+ transitions from a binary ZERO to a binary ONE. Further, address generator 2 multiplexer 248-2 will select the second hardware interrupt address at its I1 inputs and, at primary time 2, address register 1, 246-1, will be cleared by signal RARCLR− and address register 2, 246-2, will be set to the second hardware interrupt address. Thus, at primary time 2 of the current microinstruction, which is the last microinstruction of a first hardware interrupt service microroutine, the address contained in address register 1 and 2, 246-1 and 246-2, will be the address of the first microinstruction of a second hardware interrupt service microroutine.

A further examination of FIG. 42 will reveal that at the end of the second hardware interrupt service microroutine, if there are no further hardware interrupts pending, control will be returned to the microinstruction whose address is stored in hardware interrupt return register 252 thus returning control to the original microprogram at the point that it was interrupted by the first hardware interrupt. Thus it can be seen that back-to-back (i.e., consecutive) hardware interrupts can be serviced without returning to the interrupted original microprogram between the first and second hardware interrupt service microroutines.

Having described how a DMA data request or DMC data request on system bus A or B will cause a hardware interrupt to ROS locations 12 through 15 and invoke the associated hardware interrupt microroutine, the other hardware interrupt logic of FIG. 42 will now be described.

Main Memory Refresh Timeout Logic

Flip-flops 572 and 574 are used to insure that a main memory refresh signal PHMRFL— is generated every 8 to 15 microseconds. As described above with respect to FIG. 14, clocking signal BCNTL8+ will transition from the binary ZERO to a binary ONE state each four microseconds thereby clocking flip-flops 572 and 574. With 8 microsecond refresh flip-flop 572 being clocked each four microseconds, the output thereof, signal PMRFPM+ will be a binary ZERO for four microseconds following by a binary ONE for the next four microseconds thereby completing one cycle in eight microseconds. By cascading the output of eight microsecond refresh flip-flop 572, signal PMRFTM+, to the data (D) input of 16 microsecond refresh flip-flop 574, the output of flip-flop 574, signal PHMRFL— will be a binary ZERO for eight microseconds following by a binary ONE for eight microseconds completing one cycle in 16 microseconds. When the output of 16 microsecond refresh flip-flop 474 is a binary ZERO, output signal PHMRFH— of interrupt request register 250-1 will be a binary ZERO and cause a binary 101 to be encoded on hardware interrupt encoder 250-2 output lines PHINT7+ through PHINT9+ which in turn, when hardware interrupts are enabled, causes address generator 2 multiplier 248-2 to branch to ROS location 10 which begins the main memory refresh time out microroutine.

Returning now to flip-flops 572 and 574 it can be seen that both flip-flops are reset when the output of NOR gate 580, signal PMFRSH— is a binary ZERO. Signal PMRFSH— from subcommand decoder 244-2 (see FIG. 43) is set to a binary ONE if bits 32 through 34 of the firmware word are set equal to a binary 001 causing signals RDDT32+ and RDDT33+ to be binary ZEROs and RDDT34+ to be a binary ONE. Signal PMRFSH— is inverted by inverter 576 causing signal PMRFSH+ to be a binary ONE whenever the input is a binary ZERO. When signal PMRFSH+ is a binary ONE at the input of NOR gate 580, the output thereof, signal PMFRSH—, will be a binary ZERO resetting 8 microsecond flip-flop 572 and 16 microsecond refresh flip-flop 574 via their reset (R) inputs. Main memory refresh signal PMFRSH— is also transferred to the main memory via system bus B. Alternatively, signal PMFRSH— will be a binary ZERO whenever signal KEFRSH— is a binary ZERO and inverted via inverter 578 causing signal KEFRSH+ to be a binary ONE at the second input or NOR gate 580.

By examining the interaction of the flip-flops 572 and 574 with the hardware interrupt logic, it can be seen that the output of 16 microsecond refresh flip-flop 574, signal PHMRFL—, will become a binary ZERO 8 microseconds after a memory refresh signal (PMFRSH—) has been sent to the main memory via system bus B. Refresh interrupt signal PHMRFL— will remain a binary ZERO for 8 microseconds or until it is cleared by a subsequent memory refresh signal (PMFRSH— becoming a binary ZERO). Signal PHMRFL— being a binary ZERO will cause signal PHMRFH— to be a binary ZERO and, if hardware interrupts are permitted, cause the firmwear to branch to the microroutine which in turn will send a memory refresh signal (PMFRSH—) to the main memory via system bus B. Because the output of the 16 microsecond flip-flop 574, signal PHMRFL—, will become a binary ZERO 8 microseconds after the previous memory refresh, it is important that the CPU firmware be coded such that hardware interrupts are not inhibited for a period of longer than 7 microseconds in order to maintain the proper MOS memory refresh rate of 15 microseconds and not lose main memory information.

If the CPU firmware is not inhibiting hardware interrupts, the first memory refresh will occur at the end of 8 microseconds causing the CPU firmware to branch to the main memory refresh microroutine which in turn will cause a refresh command to be sent to the main memory on system bus B via signal PMFRSH— which in turn will reset the refresh flip-flops 572 and 574 and cause a second main memory refresh interrupt to be sent after 8 more microseconds. Because main memory refresh commands may also be encoded within the processing of software instructions, whenever the CPU microprogrammer determines that the main memory will not be used for the next two CPU cycles, not all refresh signals are generated by the expiration of the main memory refresh time (i.e., flip-flops 572 and 574). The purpose of refresh flip-flops 572 and 574 is to insure that at a minimum a refresh signal is sent to the main memory once every 15 microseconds but in actual practice the CPU firmware is coded such that during the processing of software instructions if it is known that the main memory will not be used during the next two CPU cycles, refresh commands are encoded within the CPU firmware microinstructions to generate main memory refresh signals more frequently than once each 15 microseconds.

Main Memory Parity Error Logic

During each main memory read operation, the memory generates two parity bits per 16-bit word (1 parity bit per 8-bit byte) read from memory and compares the generated parity with that read from memory. If the generated parity bits do not agree with the parity bits read from memory, the main memory generates a parity error signal which is sent via system bus B to the CPU on line MEMPER—.

Now continuing with FIG. 42, the occurrence of a parity error detected by the main memory will result in the setting of parity error flip-flop 586, which in turn may result in a hardware interrupt. If the main memory detects a parity error upon the memory read operation, main memory will set signal MEMPER— to a binary ZERO on system bus B. With signal MEMPER— being a binary ZERO the output of inverter 596 signal PMMPAR+ will be a binary ONE and signal PMMPAR+ is inverted by inverter 598 and sent to system bus A as signal PMMPAR—. If the memory read was performed in response to a DMA data request, these parity error signals, signal PMMPAR— on system bus A and signal MEMPER— on system bus B will be strobed into the status register of the requesting DMA IOC so that the error may be reported to the software program when the status of the I/O transfer is requested.

The main memory parity error signal PMMPAR+ at the data (D) input of parity error flip-flop 586 will be clocked when clocking signal PARFMD— transitions from a binary ZERO to a binary ONE. The clocking of the binary ONE at the data input of parity error flip-flop 586 will result in output signal PHMPER— becoming a binary ZERO and, when hardware interrupts are enabled, cause a hardware interrupt. Clocking signal PARFMD—, which is the output of NAND gate 582, will transition from the binary ZERO to the binary ONE state at the beginning of primary time 4 when signal PTIME4+ becomes a binary ONE if signal PBSFMD— is a binary ZERO. Signal PBSFMD— is a binary ZERO during the second cycle of a two cycle main memory read operation as can be seen in FIG. 19. Signal PBSFMD— is used by the main memory to enable the data read from main memory onto system bus B.

Parity error flip-flop 586 will remain set, thereby requesting a hardware interrupt, until it is cleared by a CPU initialize signal which will result in signal PCPCLR— becoming a binary ZERO at one input of NOR gate 584 causing the output thereof, signal PARCLR—, to become a binary ZERO thereby resetting flip-flop 586. Alternatively, parity error flip-flop 586 will be reset by a subsequent main memory read operation.

Nonexistent Memory Detection Logic

As mentioned above, the CPU within the system monitors each main memory address as it is presented to main memory to determine whether the addressed location is physically present in one of the main memory boards connected to system bus B. Continuing to refer to FIG. 42, before the system is put into operation the address of the last location (highest address) physically present in main memory is set in memory size switch 588 by binary encoding the five most significant bits of the 16-bit address. Memory comparator 590 is of the type SN74S85, manufactured by Texas Instruments Incorporated of Dallas, Texas and compares the five most significant bits of the address of the last memory location with the five most significant bits of the address from the internal bus 260 (signals PBUS00— through PBUS04+) and sets output signal PBUSLG+ to a binary ONE if the address on the bus exceeds the address of the last location physically present within the system. This comparison of the contents of the internal bus 260 with the address of the last location physically present in memory is made continuously but the output of this comparison, signal PBUSLG+ is only clocked into nonexistent memory flip-flop 592 by the transition of clocking signal PMEMGO+ from a binary ZERO to a binary ONE state.

Clocking signal PMEMGO+ transitions from a binary ZERO to a binary ONE state at the beginning of primary time 3 (see FIG. 19) when firmware word bit 23 is a binary ONE (see FIG. 35C). When PMEMGO+ is a binary ONE the contents of internal bus 260 will be the address of a location in main memory and therefore the data (D) input of non-existent memory flip-flop 592 will reflect whether or not the address location is physically present within main memory. If the addressed location is not physically present within main memory, signal PBUSLG+ will be a binary ONE and be clocked into nonexistent memory flip-flop 592 making the Q output thereof, signal PHNDXM+ a binary ONE and making the $\bar{Q}$ output thereof, signal PHNDXM— a binary ZERO. The setting of signal PHNDXM+ to a binary ONE will cause the output of NAND gate 594, signal MEMPER—, to become a binary ZERO as well as signal PMMPAR— via inverters 596 and 598.

Therefore, it can be seen that the detection of an attempt to address a nonexistent memory location will result in memory parity error signals MEMPER— and signal PMMPAR— becoming a binary ZERO and thereby signal I/O controllers on system buses A and B that a nonexistent memory location has been addressed. I/O controllers making a memory access will save the status of these error lines in their status register for later reporting of it to the software.

The setting of nonexistent memory flip-flop 592 causes signal PHNDXM— to become a binary ZERO at the highest priority input of hardware interrupt encoder 250-2 which in turn, when interrupts are permitted, will cause a nonexistent memory hardware interrupt to occur. The processing of the nonexistent memory hardware interrupt will cause the CPU firmware to branch to ROS location 8 and process the hardware interrupt. The nonexistent memory microroutine performs a memory refresh operation, using main memory address zero to insure there will not be a subsequent nonexistent memory error, which in turn will cause signal PBUSLG+ to become a binary ZERO thereby resetting nonexistent memory flip-flop 592 and clearing the pending nonexistent memory hardware interrupt.

Before leaving the nonexistent memory detection logic, it should be noted that the detection of an attempt to access a nonexistent memory location will result in the setting of nonexistent memory flip-flop 592 and also parity error flip-flop 586 via signal PMMPAR+, the output of inverter 596. Although the setting of nonexistent memory flip-flop 592 will also cause the setting of parity error flip-flop 586, only one hardware interrupt will be processed and that will be the nonexistent memory hardware interrupt which is of higher priority than memory parity error interrupt, which is the next highest priority. The hardware interrupt priority can be seen by examining inputs to hardware interrupt encoder 250-2. The memory parity error hardware interrupt will not occur because the main memory refresh operation performed in the nonexistent memory hardware interrupt microroutine will clear both the non-existent memory flip-flop 592 and parity error flip-flop 586. Therefore upon return from the nonexistent memory hardware inerrupt microroutine, signal PHMPER— will be a binary ONE and no memory parity hardware interrupt will be pending.

If a nonexistent memory address or memory parity error is detected during a DMA or DMC data transfer, signal PTIOGO— will be set to a binary ZERO during the CPU cycle (the second cycle) following the cycle in which the memory go signal is sent to the main memory (see FIG. 19). The setting of signal PTIGO— to a binary ZERO will cause the output of NOR gate 584, signal PARCLR—, to become a binary ZERO resulting in the resetting of nonexistent memory flip-flop 592 and parity error flip-flop 586 before hardware interrupts are enabled by the CPU firmware thus preventing the associated hardware interrupts. This resetting of flip-flops 592 and 586 masks potential hardware interrupts associated with data transfers to/from I/O controllers from interrupting the CPU firmware flow. It also assures that the occurrence of either the nonexistent memory address or memory parity error hardware interrupt is due to a memory access conducted by the CPU firmware during the course of executing a software instruction and not due to a DMA or DMC data transfer, which is also conducted by the CPU firmware.

Although the memory error lines PMMPAR— and MEMPER— are set when the CPU detects any attempt to access a non-existent memory location, in the case of a DMC data transfer which writes data into memory, the setting of the memory error line will occur only after the DMC I/O controllers have stopped looking at the error line. By referring to FIG. 21A, it can be seen the memory error line will be set, if an error occurs, only after the end-of-link (EOFLK) command has terminated the CPU and IOC link. IOCs only monitor the error line when the IOC is linked to the CPU, to insure that any error signal is directed to that particular IOC, and therefore a non-existent memory error would go unseen by a DMC IOC during an input data transfer cycle.

Figure 29:
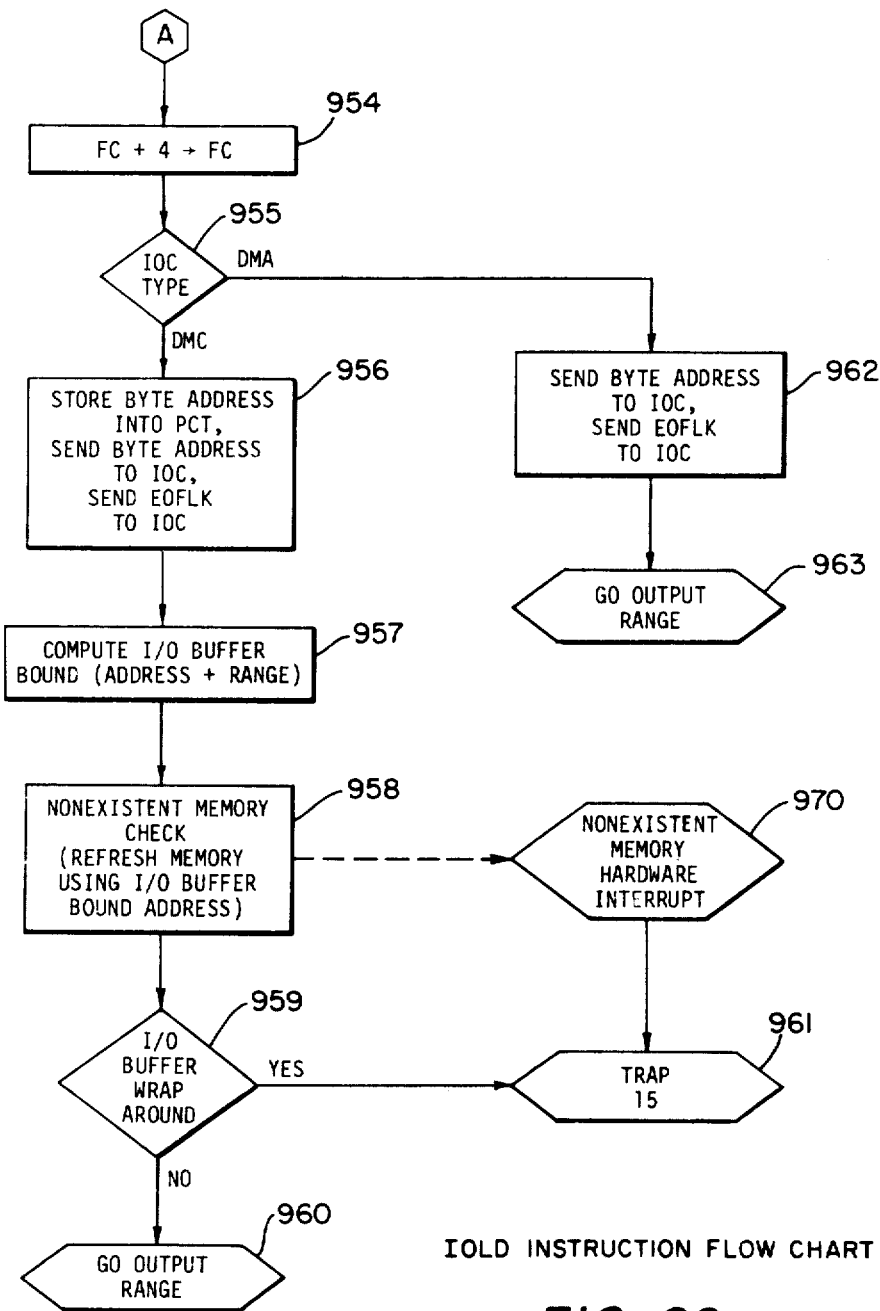
FIG. 29 illustrates a flow chart of the CPU firmware which implements the IOLD software instruction shown in FIG. 27A and FIG. 27B.

To insure that nonexistent memory errors do not go undetected, the upper bound (highest address) of the block to be transferred is checked during the execution of the IOLD software instruction before the DMC data transfer is begun (see FIG. 29 and the discussion thereof). It should be noted that this special check need only be performed for DMC input (write to memory) operations. It should be further noted that during memory write operations the memory error line is only set for nonexistent memory errors, there being no parity check performed when memory is written into. For DMC output and DMA input and output operations, the memory error line will be set before the end-of-link, while the IOC is still monitoring the memory error line, so that no special check is needed in these cases.

Software Interrupt Logic

Processing of software interrupts was described above with respect to FIG. 34. Now returning to FIG. 42 the software interrupt logic will be discussed in detail. Software interrupt encoder 257-1 is of the type SN74148 manufactured by Texas Instruments Incorporated of Dallas, Tex. Going from the highest to the lowest priority software interrupt, the inputs of software interrupt encoder 257-1 will be a binary ZERO depending upon the status of the associated software interrupt condition. Signal PFITRP— will be a binary ZERO if a register overflow is detected and the corresponding bit is set in mask (M1) register (see FIG. 4). Signal PFAILF— will be a binary ZERO if an impending power failure is detected. Signal PFINT1— will be a binary Zero if an I/O controller on system bus A is making an interrupt request and signal PFINT2— will be a binary ZERO if an I/O controller on system bus B is making an interrupt request. Signal PFITKL— will be a binary ZERO if a timer has expired.

The inputs of the software interrupt encoder 257-1 are binary encoded onto the three outputs thereof, signals PFINT3+ through PFINT5+. The enable (I) output signal PFINTP— of software interrupt encoder 257-1 will be a binary ZERO if any of the inputs thereof are a binary ZERO indicating that one or more software interrupts are pending. The four output signals of software interrupt encoder 257-1 are connected to the four input signals of the I3 input to major branch multiplexer 256-1 and are gated onto the four outputs thereof, signals RAMBT2+ through RAMBT5+ when multiplexer select signals RDDT41+ through RDDT43+ equal a binary 011 (see FIG. 35D). These four output signals of major branch multiplexer 256-1 are in turn connected to four of the ten inputs to the I2 inputs of address generator 1 multiplexer 248-1 thereby allowing the CPU firmware to test for the presence of a pending software interrupt by specifying the appropriate multiple test branch within the firmware microinstruction. As seen above in discussing FIG. 34, the CPU firmware is coded such that the presence of a pending software interrupt is tested at the beginning of the execution of each software instruction thereby allowing the CPU firmware to branch to the microroutine coded to handle the particular software interrupt.

Boot PROM Logic

As described above in the discussion of the system startup and initialization sequence in conjuction with FIG. 16, the system has the ability to read a software program stored in boot PROM and load it into main memory for execution from main memory. Referring now to FIG. 42, it can be seen that 8 bits of the 48-bit CPU firmware microinstruction word are contained in parallel PROM memories. Specifically, bit 24 through 31 of the 48 bit microinstruction word may be read from either boot PROM 240 or ROS 2, 238-2. As described above, normally these eight bits are read from ROS 2, 238-2 when ROS 2 is enabled by both signals KENROS— and PENBBT+ being a binary ZERO. Alternatively, during systems start up, signal PENBBT—, the input of inverter 589, may be set to a binary ZERO by encoding a binary 0010 in bits 24 through 27 of the firmware word and a binary ZERO in bit 32 (see FIGS. 35C and 37F). Microinstruction word bits 24 through 27 and bit 32 are decoded by a decoder which is enabled by the clock signal PTIME0+ at an inverted enabling input. Therefore, signal PENBBT— will be a binary ZERO from the beginning of primary time 1 through the end of primary time 4.

If the firmware microinstruction indicates that the boot PROM should be read, signal PENDBT— being a binary ZERO will partially enable boot PROM 240 and, if no clear operation is in progress, signal PCPCLR+ will also be a binary ZERO fully enabling boot PROM 240 allowing the 8 bits thereof, signals RROS24+BT through RROS31+BT to be output. With the signal PENBBT— being a binary ZERO the output of inverter 589 will be a binary ONE disabling ROS2, 238-2, causing no data to be read therefrom. The tri-state outputs of boot PROM 240 and ROS 2, 238-2, are wire ORed together at point 599 producing signals RROS24+ through RROS31' which in turn are clocked into local register 242 at the beginning of primary time 0 by clocking signal PTIME0+. By examining FIG. 42 it can be seen that if a current CPU firmware microinstruction enables boot PROM 240, bits 24 through 31 of the next microinstruction read from the control store will be taken from boot PROM 240 as opposed to being taken from ROS 2, 238-2. The address inputs to boot PROM 240, signals PRFR15+ through PRFR06+, are the 10 least significant bits from the function (F) register. Therefore, as will be seen below, the CPU firmware has the ability to load an address into the function (F) register and control the incrementing or decrementing of the F register along with other necessary control required to allow the CPU firmware to access the bytes of data stored in boot PROM 240 and store them into main memory.

Before leaving the discussion of the boot PROM logic it should be noted by referring to FIG. 35C that the 8 bits which are read from boot PROM memory are substituted into the 8 bits which would otherwise be used to hold a constant when the subcommand decode field, bits 32 through 34, equals a binary 111. This allows those microinstructions in which the 8 bits from boot PROM 240 are substituted for the 8 bits from ROS 2, 238-2, to still perform most of the microinstruction had there been no substitution of the 8 bits from the boot PROM for the 8 bits from ROS 2.

For simplicity, in FIG. 42, local register 242 is shown as one register containing 48 bits. In the preferred embodiment, local register 242 is implemented by six 8-bit registers. For simplicity in FIG. 42 the reset (R) input to local register 242 is shown as being a binary ONE thereby indicating that local register 242 is never cleared. In the preferred embodiment, the reset input of the 8-bit register which output signals RDDT16+ through RDDT23+ has as its reset (R) input the signal PCPCLF— which allows these 8 bits to be cleared during system initialization.

CPU LOGIC DETAILS

FIG. 43 shows the CPU logic described above in conjunction with FIGS. 8 and 12.

Internal bus 260 consists of 16 lines, signals PBUS00+ through PBUS15+, which are used to carry addresses and data throughout the CPU. The tri-state outputs of data transceiver A, 288-1, data transceiver B, 284-1, and microprocessor 232 are wire ORed together at point 509. Data transceiver A and B, 288-1 and 284-1, are each composed of two 8-bit bus transceivers of the type SN74LS245 manufactured by Texas Instruments Incorporated of Dallas, Tex. Depending upon the status of the direction (DIR) input, data transceivers A and B either receive data from sytem bus A and system bus B and place it on internal bus 260 or take the data from internal bus 260 and transmit it to system bus A and system bus B. If the signal at the DIR input of data transceiver A or data transceiver B is a binary ZERO the signals at the D inputs are placed on the Q outputs (i.e., data is received from the system bus). If the signal at the DIR input is a binary ONE, the signals at the Q inputs are placed on the D outputs (i.e., the data on the internal bus is transmitted to the system bus).

Data Transceiver Logic

As discussed above, the transmission or reception of data by data transceiver A and data transceiver B is controlled separately by the CPU firmware. Therefore, when a main memory on system bus B is providing data to the CPU or an I/O controller which may be located on either system bus A or system bus B, data transceiver B will be set to receive the data from the system bus via signals BUSB00+ through BUSB15+ and pass it to the internal bus and data transceiver A will be controlled to take the information from the internal bus and place it onto system bus A via signals BUSA00+ through BUSA15+. When data is being sent by the CPU to either the main memory on system bus B or an I/O controller on system bus A or B, both data transceiver A and B will be controlled to take the information from the internal bus and transmit it to system bus A and system bus B. If an IOC on either system bus A or B is sending information to the CPU or main memory, CPU firmware will control the data transceiver A and data transceiver B such that the data transceiver associated with the system bus on which the send IOC is located will receive the information from the system bus and place it on the internal bus and the other data receiver will take the information from the internal bus and place it on its associated system bus. By controlling data transceiver A and data transceiver B, 288-1 and 284-1, in this manner, the data appearing on the 16 address/data lines on the system buses is always the same.

Looking now at data transceiver A, 288-1, the direction (DIR) input, signal PBSFAP— is the output of NOR gate 512. One input of NOR gate 512 is signal PBSFKP— which is a binary ZERO when bits 24 through 27 of the microinstruction word are a binary 0101 (see FIG. 37F) which is decoded by a decoder (not shown) with signal PTIMEO+ at an inverted enabling input. The other input to NOR gate 512, signal PENBSA-00, is derived from an I/O command 1 decoder, 244-3, when bits 24 through 26 equal binary 100 (see FIG. 37C) via NAND gate 521. Turning now to data transceiver B, 284-1, the direction (DIR) input, signal PBSFBP— is the output of NOR gate 510. One input of NOR gate 510 is signal PBSFMD— which is one of the outputs of interrupt request register 250-1 (see FIG. 42) which is loaded with signal PMRCYC—, the output of NAND gate 531. The other input to NOR gate 510 is signal PENBSB-00 which is also derived from I/O command 1 decoder 244-3, via NAND gate 534 when bits 24 through 26 equal a binary 110 (see FIG. 37C).

Data on internal bus 260 may be loaded into channel number register 296 and from there into scratch pad memory address multiplexer 294, the output of which is used to address scratch pad memory 236. Alternatively, the data on internal bus 260 may be loaded into byte swapping multiplexer 262, the output of which may be written into scratch pad memory 236. In addition, data on the internal bus 260 may be loaded into data select multiplexer 269, the output of which may be loaded into the F register 274, I register 270, M1 register 272 and microprocessor 232.

Scratch Pad Memory Logic

Channel number register 296 will be loaded with the seven least significant bits of the 10-bit channel number by clocking internal bus 260 data lines PBUSO3+ through PBUSO9+ onto the data inputs thereof when the clocking signal PCLKCH— transitions from the binary ZERO to the binary ONE state. Because the channel number register is used in conjunction with DMC I/O controllers to address the PCT table in scratch pad memory 236, only the 7 least significant bits of the channel number need to be saved in the channel number register (see FIG. 24). The three most significant bits of the DMC channel numbers are always zero.

The state of signal PBYTEX+ from system bus A and B is also input to channel number register 296 and output as signal PDMCIO+. Channel number register 296 clocking signal PCLKCH— is derived from NAND gate 504. One input of NAND gate 504, signal PIOCTL+ is output by inverter 528 which inverts the output of subcommand decoder 244-2 which decodes the status of firmware word bits 32 through 34 (see FIG. 35C). The two other inputs to NAND gate 504 are signals RDDT27+ and RDDT28+ which are output by local register 242 (see FIG. 42) and when both set equal to a binary ONE (see FIG. 37D) fully enable NAND gate 504 making the output thereof, signal PSAFBS—, a binary ZERO. When signals PSAFBS— is a binary ZERO the output of inverter 506, signal PSAFBS+, will be a binary ONE partially enabling AND gate 508. AND gate 508 will be fully enabled when the signal PTIME3+ transitions from the binary ZERO to the binary ONE state at the beginning of primary time 3 thereby causing the clocking signal PCLKCH— to transition from the binary ZERO to the binary ONE state and clock channel number register 296.

The outputs of channel number register, signals PSAR01+ through PSAR06+, are inputted to the I1 inputs of SMP address multiplexer 294. The other two outputs of channel number register 296, signals PDMCIO+ and signal PSAIOB+, are input to the branch on test network 254 (FIG. 9) the output of which, signal RASBT9+ is input into address generator 1 multiplexer, 248-1, (FIG. 42). Signal RASBT9+ is used by the CPU firmware to test whether the IOC type is a DMA IOC or a DMC IOC when derived from signal PDMCIO+, or whether the input channel or output channel is being used when signal RASBT9 is derived from signal PSAIOB+.

In addition to clocking channel number register 296, signal PCLKCH— also clocks address/range flip-flop 502. Clocking signal PCLKCH— clocks the RDDT19+ signal at the data (D) input of address/range flip-flop 502. By controlling the state of bit 19 of the CPU firmware word and the clocking of the address/range flip-flop 502, the CPU firmware can control the setting or resetting of flip-flop 502. The setting and resetting of the address/range flip-flop 502 are also controlled by signals PSAR7S— and PSAR7R— at the set (S) and reset (R) inputs thereof, which are in turn output from a decode of firmware word bits 24 through 26.

The outputs of address/range flip-flop 502, signal PSAR07+ is input to the I1 input of SPM address multiplexer 294 and is used as the least significant bit in addressing scratch pad memory 236. A binary ONE is set at the most significant bit of the I1 inputs of SPM multiplexer 294 and when the I1 inputs are selected by signal RDDT22+ being a binary ONE at the select (SEL) input of SPM address multiplexer 294 the program channel table located in the scratch pad memory 236 is accessed. When addressing the PCT in SPM, the least significant bit of the SPM address determines whether the address word or the range word of the PCT entry address by the 6 bits from channel number register 296 is referenced. That is, if address/range flip-flop 502 is set, causing the output thereof (signal PSAR07+) to be a binary ONE, the range word of a PCT channel pair is addressed and if flip-flop 502 is reset, the address word of the PCT channel pair entry is addressed (see FIG. 10).

The I0 inputs of SPM address multiplexer 294 have their four most significant bits set equal to a binary ZERO and the other four bits are signals RDDT01+ and RDDT05+ through RDDT07+. This allows four bits from the microinstruction CPU firmware word to address the SPM 236 when the I0 inputs are selected by signal RDDT22+ being a binary ZERO (see FIGS. 35A and 35C). The outputs of SPM address multiplexer 294 are enabled when the signal KENSPA— at the output control (F) input thereof is a binary ZERO.

Scratch pad memory 236 receives its 8-bit address, signals PSARS0+ through PSARS7+, from the SPM address multiplexer 294. Scratch pad memory 236 is composed of 17 1-bit by 256 RAM chips of the type 5539-2 manufactured by Intersil Incorporated of Cupertino, California, and described in their publication entitled "Intersil Semiconductor Products Catalog", incorporated herein by reference. The RAM chips are arranged so that SPM 236 provides 256 words of 17-bits each as shown in FIG. 10. Writing into SPM 236 is enabled by placing a binary ZERO at the write enable (WE) input of the scratch pad memory. If bit 0 of the firmware word is a binary ONE, signal RDDT00+ will be a binary ONE partially enabling NAND gate 587. NAND gate 587 will be fully enabled when clock signal PTIME4+ transitions from a binary ZERO to the binary ONE state at the beginning of primary time 4 and cause the output of NAND gate 587, signal PSDWRT—, to become a binary ZERO.

The 16 most significant bits of the data input to SPM 236 are signals PSDI00— through PSDI15— from the output of byte swapping multiplexer 262. The least significant bit of the data input signals to SPM 236 is signal RDDT19+ which is derived from bit 19 of the firmware word. The output of SPM 236 is signals PSDO00+ through PSDO16+. SPM data register 518 is composed of two 8-bit D-type transparent latches of the type SN74S373 manufactured by Texas Instruments Incorporated of Dallas, Texas. The inputs of SPM data register 518 are enabled onto the outputs thereof during primary time 0 and primary time 1 via signals PTIME0— and PTIME1— at OR gate 585. The output of OR gate 585, signal PSDRCK+, is connected to the clock (C) input of SPM data register 518. The output of SPM data register 518 is always enabled by a binary ZERO appearing at the output control (F) input thereof. The outputs of SPM data register 518, signals PSDR00+ through PSDR15+ are connected to the I0 inputs of data selecter multiplexer 269.

Clear flip-flop 514 is set when the clocking signal PCLEAR— transitions from the binary ZERO to the binary ONE state and can be reset by the signal PCLERR— becoming a binary ZERO at the reset (R) input thereof. The Q output of flip-flop 514, signal PCPCLF+, and signal PSD016+, which contains the least significant bit of the 17-bit work read from the scratch pad memory 236, are clocked into register 516 when the clocking signal PTIME4+ transitions from the binary ZERO to the binary ONE state at the beginning of primary time 4. The other output of clear flip-flop 514, signal PCPCLF—, is used to clear bits 16 through 23 of the microinstruction firmware word contained in local register 242 (see FIG. 42).

Signal PCPCLR+, from register 516, and signal PCPCLR—, from inverter 583, are used throughout the CPU to clear various registers and flip-flops. For example, signal PCPCLR+ is used to clear address register 1, 246-1, via NOR gate 595 and signal PCPCLR— is used to clear address register 2, 246-2, (see FIG. 42). Signal PCPCLR+ is also used to disable the reading of data from boot PROM 240 (see FIG. 42). The other output shown on register 516, signal PTBS13+ which reflects the state of the least significant bit of the word read from the scratch pad memory 236, goes to branch on test network 254 (FIG. 9) and is used to determine bit RASBT9+ which is input into address generator 1 multiplexer 248-1 (FIG. 42).

Byte Swapping Logic

Turning now to byte swapping multiplexer 262, in FIG. 43, the manner in which the CPU firmware can control the swapping of the left and right bytes of the data on the internal bus prior to writing it into scratch pad memory 236 will be described. Subcommand 1 decoder 244-1 is used to decode bits 25 through 27 of the microinstruction firmware word and when set equal to binary 001 (see FIG. 37F) cause one of the outputs thereof, signal PSDEXEN−, to be set equal to a binary ZERO. The output of the subcommand 1 decoder 244-1 is partially enabled by signal RDDT24− being a binary ONE and signal RDDT32+ being a binary ZERO and is fully enabled by signal PTIME0+ transitioning from a binary ONE to a binary ZERO state at the beginning of primary time 1 and staying in the binary ZERO state until the end of primary time 4. When signal PSDEXEN− is a binary ZERO the I0 inputs of byte swapping multiplexer 262 are enabled onto the outputs thereof causing the interchange of the left and right bytes appearing on internal bus 260. If signal PSDEXEN− is a binary ONE, the I1 inputs of byte swapping multiplexer 262 are selected and the data on the internal bus is transferred to the outputs of multiplexer 262 without swapping the bytes. In this manner the swapping of the bytes of the data from the internal bus 260 may be controlled prior to the data being written into the scratch pad memory 236.

Microprocessor and Data Selection Logic

As described above, the third input to internal bus 260 is from the data output by microprocessor 232. Microprocessor 232 receives 16 bits of input data, signals PAUD15+ through PAUD00+, from the output of data selecter multiplexer 269. The microprocessor register file is addressed by bits PSPA03+ through PSPA01+ and bit RDDT04+. File register address bits PSPA03+ through PSPA01+ are derived from file address multiplexer 276 shown in FIG. 8. The file address multiplexer selection is controlled by bits 2 and 3 of the firmware word (see FIG. 35A). The instruction performed by the microprocessor 232 is controlled by the 9 instruction (INSTR) inputs, signals RDDT10+ through RDDT18+, which are obtained from the firmware word bits 10 through 18 (see FIG. 35B). As described above, the data output of microprocessor 232, signals PBUS15+CP through PBUS00+CP are wire ORed with the output of data transceiver A, 288-1, and data transceiver B, 284-1, at point 509.

The I1 inputs of data selecter multiplexer 269 are derived from the 8 bits of indicator (I) register flip-flop 270, signals PI08+ through PI15+, and the outputs of mask (M1) register 272, signals PRMR00+ through PRMR07+. The I2 inputs of data selecter multiplexer 269 are signals RDDT08+, RDDT09+ and RDDT24+ through RDDT31+. The output of data selecter multiplexer 269 is selected from the four inputs by signals RDDT20+ and RDDT21+ at the two selecter (SEL) inputs thereof. The binary ZERO at the strobe (CE) input of data selecter multiplexer 269 enables the outputs. By controlling firmware word bits 20 and 21 the output of data selecter multiplexer 269 may be selected from: scratch pad memory data register 518; I register 270 and M1 register 272; a constant from microinstruction word bits 8, 9 and 24 through 31; and the internal bus 260 (see FIG. 35C).

I, M1 and F Register Logic

The indicator (I) register 270 is composed of eight D-type flip-flops, each of which is clocked by signal PIRFBS− when it transitions from a binary ZERO to the binary ONE state. Signal PIRFBS− is generated by decoding microinstruction firmware bits 24 through 27 which, when they equal a binary 110, will set signal PIRFBS− to a binary ZERO (see FIG. 37F). Mask (M1) register 272 is clocked by signal PRMRCK− transitioning from a binary ZERO to a binary ONE state. Signal PRMRCK− is generated by decoding bits 28 through 31 of the microinstruction firmware word which, when equaled to a binary 1100, will set the signal to the binary ZERO state (see FIG. 37G). M1 register 272 will be cleared by signal PCPCLR− being set to a binary ZERO. It should be noted that clocking signals PIRFBS− and PRMRCK− are generated by decoders which are enabled at an inverting enabling input by signal PTIME4−; therefore both of these clocking signals will transition from the binary ZERO to the binary ONE state at the end of primary time 4.

The function (F) register is comprised of F register counter FR0, 274-0, F register counter FR2, 274-2, and F register counter FR3, 274-3. FR0, 274-0, and FR3, 274-3, are each comprised of one type SN74LS169A synchronous 4-bit up/down counter manufactured by Texas Instruments Incorporated of Dallas, Texas. FR2, 274-2, is comprised of two type SN74LS169A counters. The clocking of FR0, FR2 and FR3 is controlled by the signal PRFCLK+ at the clock (C) input thereof. Signal PFRCLK+ will transition from a binary ZERO to the binary ONE state at the end of primary time 3 if microinstruction firmware word bits 32 through 34 equal a binary 100 (see FIG. 35C). The loading of F register counter FR0, 274-0, is controlled by signal PFRLD0− at the load (L) input thereof. Signal PFRLD0− is produced by NANDing together signals RDDT26+ and RDDT27+. The loading of F register counter FR2, 274-2, is controlled by signal PRFLDM− at the load (L) input thereof. Signal PFRLDM+ is produced by NANDing together signals RDDT28+ and RDDT29+. The loading of F register counter FR3 with input signals PAUD15+ through PAUD12+ is controlled by signal PFRLD3− at the load (L) input thereof. Signal PFRLD3+ is produced by NANDing together signals RDDT30+ and RDDT31+.

F register counter FR0, 274-0, is enabled to count by signal RDDT26+ at the count enable (P and T) inputs thereof. F register FR2, 274-2, is enabled to count by signal RDDT28+ at the count enable (P and T) inputs thereof. F register counter FR3, 274-3, is enabled to count by signal RDDT30+ at the count enable (P and T) inputs thereof. The direction of count of F register counter FR0, 274-0, is controlled by signal RDDT27+ at the up/down (U/D) input thereof. F register counter FR2, 274-2, direction of count is controlled by signal RDDT29+ at the up/down (U/D) input thereof. The direction of count of F register counter FR3, 274-3, is controlled by signal RDDT31+ at the up/down (U/D) input thereof. Some of the outputs of the F register are inputs of the boot PROM 240 (FIG. 42), file address multiplexer 276 (FIG. 8), and the branch on test network 254 (FIG. 9). The outputs of the F register are also used in other places within the CPU logic.

Bus Command Logic

The various command signals which go from the CPU to the I/O controllers and the main memory on system bus A and B are illustrated in FIG. 43. The signals originating from command tranceiver A, 286-1, and command transceiver B, 282-1, and signals PIOCTA— and PIOCTB— all originate in the CPU and are transmitted on the system buses to the I/O controllers or main memory. Other command signals such as PBYTEX+, PBUSY—2A and PBUSY—2B, etc., can originate in the CPU and be sent to the I/O controllers or main memory or may originate in an I/O controller and be sent to the CPU via the system buses.

I/O Command Logic

Referring now to FIG. 43, command transceiver A, 286-1, and command transceiver B, 282-1, are of the type SN74LS245 manufactured by Texas Instruments Inc., of Dallas, Texas, and are as discussed above with respect to data transceiver A, 288-1, and data transceiver B, 284-1. By having binary ZEROs at the direction (DIR) and output enable (F) inputs of command transceiver A and command transceiver B, both transceivers are conditioned to always having their outputs enabled and the direction of information transfer is from the CPU (D) inputs to the system bus A and B (Q) outputs. Input signals RDDT29+ through RDDT31+ are derived from firmware word bits 29 through 31 and are used to send I/O commands (see FIG. 37E) to the I/O controllers on system buses A and B and are common to command transceiver A and command transceiver B, 286-1 and 282-1. Signals BCYCOT— and PTIME3— are timing signals derived from the clock logic shown in FIG. 14 and are transmitted on both system bus A and system bus B by command transceiver A, 286-1, and command transceiver B, 282-1. Initialization signal PCLEAR— is likewise transmitted on both system bus A and system bus B. Enable IOC data driver signal PENBSA—00 is the output of NOR gate 534 and are transmitted to system bus A and system bus B by command transceiver A 286-1, and command transceiver B, 282-1, respectively.

Subcommand decoder 244-2 is enabled at the beginning of primary time 1 and remains enabled through primary time 4 by signal PTIME0+ at the enable (EN) input. Subcommand decoder 244-2 decodes signals RDDT32+ through RDDT34+ and produces signals PRMFSH—, PMRCON— as described above, and signal PIOCTL (see FIG. 35C). Signal PIOCTL is inverted by inverter 528 to produce signal PIOCTL+. Signal PIOCTL+ partially enables NAND gate 536 and NAND gate 538. When NAND gate 536 is fully enabled by signal RDDT27— being a binary ZERO, the output thereof, signal PIOCTA—, is a binary ZERO indicating to the IOCs on system bus A that the I/O command encoded on lines RDDT29+BA through RDDT31+BA is valid. In a similar manner, NAND gate 538 is fully enabled by signal RDDT28— being a binary ZERO. This makes the output of NAND gate 538, signal PIOCTB—, a binary ZERO indicating to IOCs on system bus B that an I/O command encoded on lines RDDT29+BB through RDDT31+BB is valid (see FIG. 37D).

Subcommand decoder 244-2 output signal PIOCTL— is also used to enable I/O command 1 decoder, 244-3, which decodes signals RDDT24+ through RDDT26+ (see FI. 37C). I/O command 1 decoder, 244-3, output signas PBSIOA— and PBSIOB— are each connected to NAND gate 521 and NAND gate 534 respectively, partially enabling the respective NAND gates when the decode of bits 24 through 26 of the microinstruction firmware word sets the respective output signals to a binary ZERO. NAND gates 521 and 534 are fully enabled by signals PBSFMD+ being a binary ZERO. Signal PBSFMD+ is the output of inverter 520 which inverts signal PBSFMD— originating from interrupt request register 250-1 (see FIG. 42).

Proceed and Busy Logic

Output signal PROCED— from I/O command 1 decoder, 244-3, is inverted by inverter 544 to produce signal PROCED+ which is in turn inverted by inverters 546 to produce signal PROCED—2A and inverter 547 to produce signal PROCED—2B. Signal PROCED—2A goes to system bus A and signal PROCED—2B goes to system bus B to indicate to I/O controllers on the respective buses that the CPU has accepted the last interrupt request from an IOC on the respective system buses. Alternatively, the CPU may receive a proceed signal from an IOC on system bus A on line PROCED—2A and by an IOC on system bus B on line PROCED—2B. Both of these lines are input to NOR gate 550 which produces signal PROCED—20 which in turn goes to branch on test network 254 (see FIG. 9) which produces signal RASBT9+ used by address generator 1 multiplexer 248-1 (see FIG. 42) thereby allowing the CPU firmware to test whether the addressed IOC on system bus A or B has accepted the I/O command on system bus lines RDDT29+ through RDDT31+.

Signal PBBUSY—, at the output of I/O command 1 decoder, 244-3, goes into logic similar to that of the proceed logic described immediately above to produce and receive busy signals to and from I/O controllers on system bus A and B. Specifically, signal PBBUSY— is inverted by inverter 552 to produce signal PBBUSY+ which is in turn inverted by inverter 554 to produce signal PBUSY—2A which goes to or comes from system bus A and inverter 556 which produces signal PBUSY—2B which goes to or comes from system bus B. Signals PBUSY—2A and PBUSY—2B are input into NOR gate 558 which produces signal PBBUSY—20 which goes to branch on test network 254 (see FIG. 9) the output of which, signal RASBT9+ goes to address generator 1 multiplexer, 248-1 (see FIG. 42).

Read/Write Byte Logic

Write byte 0 and write byte 1 signals, PWRTB0+ and PWRTB1+, can originate from the CPU by inverting RDDT08+ through inverter 524 and RDDT09+ through inverter 526 respectively or they may be received from an IOC located on system bus A or system bus B. Therefore, the write byte signals may be controlled by bits 8 and bits 9 of the firmware word (see FIG. 35B) or received from an IOC on one of the system buses. Signals PWRTB0+ and PWRTB1+ are both used to partially enable AND gate 530 which produces output signal PMREAD+. Signal PMREAD+, when a binary ONE, partially enables NAND gate 531 which will be fully enabled when signal PMMCYC+ output by AND gate 564 is a binary ONE. The output of NAND gate 531, signal PMRCYC—, goes to one of the inputs of the interrupt request register 250-1 (see FIG. 42).

Memory Go Logic

The main memory go signal, which informs the memory to perform a read, write or refresh cycle, is primarily generated by controlling bits 23 of the firmware word (see FIG. 35C). Conditional read signal PMRCON— is one of the outputs of subcommand decoder 244-2 and is inverted by inverter 560 to produce signal PMRCON+ which partially enables NAND gate 562. Control flop 4 flip-flop 258-4 is set by signal PTCF4S— being a binary ZERO at the set (S) input thereof and can be reset by the signal PTCF4R— being a binary ZERO at the reset (R) input thereof. Control flop 4 flip-flop 258-4 can also be set by gating the most significant bit of the 16-bit internal bus 260 appearing on line PBUS00+ at the data (D) input thereof by clocking signal PCTF4C— transitioning from the binary ZERO to the binary ONE state. Signals PTCF4S—, PTCF4C— and PTCF4R— are produced by decoding bits 28 through 31 of the firmware word (see FIG. 37G). When set, the output of control flop 4 flip-flop 258-4, signal PTCF04+, will be a binary ONE fully enabling NAND gate 562 and setting signal PRMCON—20 at the output thereof to the binary ZERO state. By doing a conditional read, signal PMRCON— being a binary ZERO, and by setting control flop 4 flip-flop 258-4, signal PTCF04+ being a binary ONE, signal PMRCON—20 will be a binary ZERO and disable AND gate 564. Disabling AND gate 564 will inhibit the generation of the memory go signal which would otherwise occur if bit 23 of the microinstruction is a binary ONE.

This ability to inhibit the generation of a memory go signal is used by the CPU firmware in those situations (such as in processing store type software instructions) in which it is not desired to do a memory read prior to doing a store into the same main memory location. In these situations, the main memory read (which might detect a memory parity error) is inhibited and only the memory write operation is permitted (which does not check for parity errors) to eliminate the possibility of a memory parity error trap.

If signal RDDT23+ is a binary ONE and signal PMRCON—20 is a binary ONE, AND gate 564 will be fully enabled and the output signal PMMCYC+ will be a binary ONE at the data (D) input of memory go flip-flop 566. A binary ONE at the data input of memory go flip-flop 566 will be clocked by signal PTIME3+ transitioning from the binary ZERO to the binary ONE state at the beginning of primary time 3 thereby setting the flip-flop and making output signal PMEMGO+CP a binary ONE. Memory go flip-flop 566 will be reset at the beginning of primary time 0 when signal PTIME0— transitions from a binary ONE to the binary ZERO state. Signal KMEMGO— is inverted by inverter 568 producing signal PMEMGO+MP. If either signals PMEMGO+CP or PMEMG0+MP at the inputs of NOR gate 570 are a binary ONE, the output signal PMEMGO— will be a binary ZERO and signal the memory on system bus B to begin a main memory read, write or refresh cycle.

MAIN MEMORY DESCRIPTION

Main memory is a high-speed, Random Access Memory (RAM) that is capable of performing all read/write functions without restrictions on address sequence, data patterns, or memory repetition rates. Its basic architecture consists of a unique memory configuration designed to provide a minimum to maximum, read/write storage (RAM) of 16K to 64K 16-bit words, respectively. Also included are two parity bits per word. The main memory performance characteristics consist of memory read, write, or refresh cycles of 1000 nanoseconds each (i.e., two consecutive 500 nanosecond CPU cycles), a memory read access time of 500 nanoseconds, and a memory refresh rate of 15 microseconds.

SYSTEM BUS INTERFACE

All transfer of information (i.e., addresses, data, or CPU commands) between main memory and the CPU, or between main memory with I/O controllers, is over system bus B. Main memory control is provided by memory commands sent exclusively by the CPU. The interface signals between main memory and the system bus are: BUSX00+ through BUSX15+, PTIME3—, PCLEAR—, PWRTB0+, PWRTB1+, MEMPER—, PMEMGO—, PMFRSH— and PBSFMD—, and are shown in FIGS. 6 and 7.

Data Word

The main memory data word consists of 16 data bits (2 bytes) as shown in FIG. 5 with 2 parity bits (1 parity bit per byte). Because the 2 parity bits are unique to the main memory, they are not transmitted over the system bus to the CPU or IOC's.

Address Word

The memory address word (see FIG. 5) permits software to access a memory location in a main memory module within a main memory configuration.

MAIN MEMORY ORGANIZATIONAL OVERVIEW

A main memory configuration is organized as a read/write memory (RAM) by utilizing one or more main memory boards. A main memory board provides 16K, 32K, or 64K of read/write storage. The minimum to maximum storage capacity for a main memory configuration is 16K to 64K 16-bit words (16KW to 64KW), respectively. The main memory address field, set in address switches on the one or more main memory boards must: (1) be contiguous from location 0 in a main memory configuration to the end of the memory configuration; (2) always start on a 4KW address boundary; and (3) always maintain the largest size main memory board (or module) in low-order memory (0-X), with each additional smaller main memory board starting at the last address (X), plus one (i.e., X+1), of its preceding larger main memory board (or module).

MODULE PHYSICAL/ORGANIZATIONAL CHARACTERISTICS

The main memory boards utilize 16K by 1-bit RAM chips to form a unique RAM data and parity array on each main memory board for addressing ease and storage versatility. The array is organized into four rows (0 through 3). Each row utilizes 18 RAM chips that are arranged to provide 16K 16-bit words with 2 parity bits per word within each row. Each main memory board can be configured to provide 16KW, 32KW, or 64KW of read/write storage capacity by populating each row accordingly. The storage capacity on an assembled main memory module can be determined by the number of rows populated with the 16KW RAM chip (e.g., population of rows 0 and 1 on a main memory board equals 32KW of storage).

Module Addressing

An address switch assembly is used to assign a main memory board with a fixed address range in a main memory configuration and to indicate the amount of memory on the main memory board.

The address switch assemblies are used exclusively to form a main memory address within a main memory module. This address is compared with the one in the segment identifier field (bits 0 through 3) from the system bus address lines to determine the main memory module being addressed. Each module size switch in the address switch assembly on the main memory module enables a 4KW main memory address field when placed in its OFF position, thus enabling manual formation of a 16KW to 64KW main memory size in 4K increments.

MEMORY SAVE UNIT

The memory save unit (element 222 in FIG. 1) is used with the main memory boards. The memory save unit maintains dc power on the RAM array on the main memory boards when ac source power to the system is unexpectedly interrupted and, as long as the memory save unit remains active, enables continuous refresh cycles until the ac source power is restored.

MAIN MEMORY FUNCTIONAL OVERVIEW

This section provides a functional overview of main memory to highlight its activity in the processing of data from the system bus.

FIG. 41 illustrates the major elements in a main memory module and shows the data flow activity between main memory and the system bus. Control information (i.e., refresh commands, read/write commands, address, etc.) are fetched from the system bus by main memory and temporarily stored into pertinent memory registers to process the data, or to refresh main memory as needed. The applicable activity is implemented when a memory cycle is initiated by a memory start request from the CPU (signal PMEMGO— becoming a binary ZERO).

When a refresh command is received, a selected row in each RAM chip may be refreshed as described in subsequent paragraphs. When a read or write command is received, the memory address is first tested to verify that it does not exceed the prescribed address boundaries (i.e., after the starting address and within the starting address plus the memory size). If the boundaries are exceeded, the memory cycle is terminated. If they are not exceeded, the memory cycle continues to process the request by examining the command register for a read or write command. Receipt of a read command initiates a memory read cycle to fetch a 2-byte data word from a main memory location to the system bus. Similarly, receipt of a write command for a word or byte memory operation initiates a memory write cycle to fetch a data word from the system bus and to store the word, or either byte from the word, into a prescribed main memory location. The CPU enables the system bus to accept data for a memory read operation, and ensures that data is on the system bus for a memory write operation.

In a write data operation, a 2-byte data word is fetched from the system bus and stored into a memory data-in register. Then, depending upon the type of write function (word or byte write), a word or byte write memory operation is performed to store the word or byte in memory, and a parity bit is generated and stored for each byte (i.e., 2 parity bits per word, or 1 parity bit per byte). In a byte operation, when byte 0 (left) or byte 1 (right) is stored into a memory location, the adjacent location (opposite) byte of the memory location is unaffected.

In a read cycle a 2-byte data word, along with its 2 parity bits, is fetched from a prescribed memory location. The 2 parity bits are sent directly to the parity check logic, while the 16-bit data word is sent directly to the data out register where it is placed on the system bus for acquisition by the CPU. This data word is also recirculated from the data out register, through the data in register, and to the parity check logic where, along with the 2 parity bits, it is checked for a possible parity error. When a parity error occurs, it is latched up in a memory error latch, an error light on the defective main memory board is illuminated, and the CPU is notified accordingly (over the system bus on line MEMPER—).

When main memory receives and accepts a refresh command (sent by the CPU every 15 microseconds or less), data to the system bus is inhibited, and a read cycle is initiated to restore data in the selected locations in the RAM array on each main memory board. Upon completion, a refresh address counter is incremented by one in preparation for the next refresh command.

Main Memory Timing

A main memory operation utilizes two consecutive 500-nanosecond CPU cycles that coincide with a 1000-nanosecond memory cycle. The first CPU cycle requests a memory cycle (memory go) and provides a memory address and the respective commands. The second CPU cycle provides system bus data for, or receives system bus data from, a prescribed memory address.

In the first CPU cycle, main memory receives a refresh or a read/write command, and a low-level memory go (binary ZERO PMEMGO—) signal. The refresh or read/write command conditions a main memory board for the applicable operation. However, it should be noted that a low-level refresh command signal (PMFRSH—) is placed on the system bus approximately 200 nanoseconds before a memory cycle is requested to alert main memory of the forthcoming refresh command.

The memory go signal (PMEMGO—) is distributed to each main memory module within the main memory configuration, and starts the clock generator in each main memory board. If a refresh command is received, the memory read cycle is initiated for a full memory cycle to refresh one row of each RAM chip within the array. If a read/write command is received, the four most significant bits (0-3) of the memory address from the system bus are compared with the segment address in each main memory module. A successful compare in any one main memory module defines it as the one being addressed, and also produces a memory present (MMPRES) signal. This signal (MMPRES) initiates a memory cycle for a read or write operation within the selected main memory board. If a miscompare occurs, the request is aborted and the memory cycle is terminated.

During the second 500-nanosecond CPU cycle in a write memory operation, data is made available on the system bus from an external source (CPU or I/O controller). In a memory read operation, a low-level enable memory data signal (PBSFMD —) is received from the system bus to enable memory data onto the bus. Concurrently, memory also sends a parity error (MEM-PER —) signal that when high, indicates an error-free read memory operation and when low, indicates that a parity error occurred in the current memory cycle.

Main Memory Modules

This subsection provides a brief functional description of the logic used in main memory modules (boards).

FIG. 41 is a block diagram of main memory boards that shows the signal and the data transfer paths between each element. The key elements are the RAM data array 630 and RAM parity array 632 (jointly referred to as the RAM or arrays) used to provide a storage capacity of up to 64K-by-16-bit words for a main memory board (2 parity bits per word are included). All other elements support the arrays to transfer data between them and the system bus, and to check or generate parity for each data word during a read or write memory operation.

Timing Generator

The timing generator 602 provides the timing pulses to activate and synchronize all operations performed in a main memory module (see FIG. 41). It is activated with a request for a memory cycle from the system bus (i.e., a PMEMGO— signal), or with a no prior refresh request (MNOPRR+) signal activated by the power on signal (BPOWON+) when ac source power to the system is disabled. The timing generator 602 generates timing signals that are distributed throughout the main memory board for clocking address register 604, data in register 606, and write enable and for strobing the column address and row address.

Negative 5 Volt Generator

The RAM chip requires a —5 Vdc that is generated by a —5-Vdc generator 608 located on the main memory board. A +12 Vdc and +5 Vdc from the system power supply or memory save unit drive the —5-Vdc generator. The resulting —5 Vdc from the generator is filtered and routed to the RAM chip in the array.

Power Failure Logic

The power failure logic 628 monitors the bus power on (BPOWON+) signal to warn memory of any forthcoming ac power interruptions. This monitoring allows the CPU an additional 2 milliseconds to update memory with pertinent system information before central processor unit operation terminates due to ac power failure. After ac power failure, the main memory module is set into an internal refresh mode of operation and cannot be accessed until ac power is restored to the system.

RAM Address Control and Distribution Logic

The address field for a 16KW RAM array is organized into 7 rows and 7 columns to form a 128-row-by-128-column matrix. The RAM address control and distribution logic 604 is designed to address a specific location in this array by generating row, column and refresh address register enable signals. It performs this task with the 16-bit memory address word stored from the system bus into the data in register 606 at the beginning of a memory read or write data cycle. Data in register 606 bit 3 and bits 10 through 15 form a row address field, and data register bit 2 and bits 4 through 9 form a column address field. Both fields are concurrently stored into their respective row and column address registers (634 and 636). The contents of the row address register 634 are strobed into the array when a row address strobe signal goes low. The contents of the column address register 636 are then strobed into the array by a low-level column address strobe signal. Both the row and column addresses remain in the array until overlayed with a new row and column address.

The memory address control and distribution logic 604 also separates and stores a 2-bit memory address field from the data in register 606 into a chip select register in chip select logic 624 to select the applicable row in a main memory module. The specific bits are bits 0 and 1. This field, in conjunction with the 16KW chip functionality in the register, selects row 0, 1, 2, or 3 in a main memory module.

The contents of a refresh row address counter in refresh logic 622 are loaded into refresh row address register 639 during a refresh operation, and are strobed into the array in the same manner as the contents from the row address register. In addition, a refresh memory cycle signal is held low during a refresh operation: (1) to refresh an array by enabling all chips in the applicable array(s), and (2), to prevent the transfer of data from the chip array onto the system bus.

Segment Select Logic

The segment select logic 610 defines the address range of a main memory module (using some of the switch settings from address switch assembly 638), validates this range with a memory address from the system bus, and implements a memory cycle within the main memory module when the address range is not exceeded. If exceeded, a memory cycle is not implemented. A refresh operation or ac power failure overrides the select logic to simulate an address present condition and activate the refresh operation in the main memory module.

Data In/Data Out Registers

The data in and data out registers (606 and 612) are used as temporary data buffers for the transfer of data between the system bus (BUSX00+ through BUSX15+) and the RAM data array 630 during a write or read memory operation. They are also used in a read operation to recirculate output data to the parity detect logic where this data is checked for a possible parity error.

Parity Generator and Check Logic

The parity generator and check logic 616 monitors the data in register to generate and store, into the parity array 632, 2 parity bits for each 16-bit data word, or 1 parity bit for each data byte during a word or byte write memory operation. During a read memory operation the parity generator and check logic also monitors the data out and parity out registers (612 and 614) to check parity in each data word.

In a write word operation both parity bits are stored into the parity array. However, in a write byte operation, only the applicable parity bit for the byte being stored is stored into the parity array. The adjacent location in the parity array for the opposite parity bit is unaffected.

In a read memory operation a data word from the data in register 606 and 2 parity bits from the parity out register 614 are checked in the parity check logic for a possible parity error. If a parity error occurs, an error flop is set in error logic 626 to send a low-level memory parity error (MEMPER —) signal to the system bus, and to turn on the light emitting diode (LED) parity error indicator 618 on the main memory board.

Read/Write Control Logic

The read/write control logic 620 monitors the system bus for a read/write command code encoded on lines PWRTB0+ and PWRTB1+, decodes this code (see FIG. 6) for a read (word), write byte 0, write byte 1, or write word command, and sends the encoded command to the RAM array for execution. When a refresh command is received, the read command is automatically encoded in the read/write control logic 620 to refresh the array.

Refresh Logic

The purpose of the refresh logic 622 is to activate and control the refresh cycles required to restore data in main (RAM) memory every 2 milliseconds (ms). Restoration of RAM data at regular intervals is necessary because of the dynamic characteristics of a MOS RAM device (e.g., when a MOS RAM device is used as a dynamic memory, deterioration of its charged data commences within a finite time unless recharged before that time expires). The refresh logic is designed to support a refresh cycle every 15 microseconds to maintain the data in a main memory configuration. The 15-microsecond refresh cycle is determined by the 16K RAM chip array (i.e., 2 milliseconds/128 rows=15 microseconds).

The refresh logic monitors the system bus for a normal refresh command (PMFRSH— being a binary ZERO) to implement a refresh cycle. This command must be on the system bus 200 nanoseconds before a memory request (PMEMGO— a binary ZERO) is initiated to alert memory that a refresh command is forthcoming. Upon receipt of a memory go signal, the refresh logic accepts the command, tests it to verify that it has been 15 microseconds since the last normal refresh command, and initiates a memory refresh cycle (row address strobe only) to implement the command.

The refresh logic also inhibits any data transfer onto the system bus throughout the current refresh cycle. If this is a normal command, then a logical row in every RAM chip is refreshed (recharged) with its resident data via the current refresh cycle. Upon completion, a refresh row address counter is incremented by one in preparation for the next normal refresh command. If a second refresh command is received on the system bus from the CPU within 15 microseconds, then no refresh operation is performed on any RAM array row in the main memory module, the data is not transferred onto the system bus, and the refresh row address counter is unaffected.

Chip Select Logic

The chip select logic 624 (also referred to as the start address logic) allows the addition of other main memory modules in a main memory configuration. It performs this function by relocating the main memory board address field within the address field of a main memory configuration. It also defines physical row 0 on the main memory board as the first row of RAM chips. Two switches on the address switch assembly 638 form a 2-bit binary address field used to set one of four starting addresses (0K, 16K, 32K, or 48K). The four starting addresses represent a logical row position in a main memory configuration (logical row 0=16KW, row 1=32KW, row 2=48KW and row 3=64KW).

A more complete explanation of the chip select logic 624 can be found in copending U.S. patent application Ser. No. 921,292 filed July 3, 1978 by Chester M. Nibby, Jr. et al. entitled "Rotating Chip Selection Technique and Apparatus" and incorporated herein by reference.

MAIN MEMORY SUMMARY

The main memory of the systems is configured by attaching one to four main memory modules to system bus B to provide a total of 16K to 64K words of main memory. Each main memory module (or board) contains 16K, 32K or 64K words. Each word is composed of two 8-bit bytes for data and 2 parity bits (1 parity bit per data byte).

All main memory must be located on system bus B which has some signals unique to main memory that are not found on system bus A. Further, the CPU must implicitly know on which system bus the main memory is when data is to be read from main memory in order to permit the CPU to control the system buses data line transceivers (i.e., the transceiver for the system bus on which the data is coming from must be controlled to receive data and the other system bus transceiver must be controlled to transmit the data). By the CPU controlling the system buses transceivers in this manner, the data on both system buses A and B will be identical and, during the cycle that the data is coming from main memory, the CPU need not take into account on which system bus the IOC requesting the data is located. It should be noted that, during the cycle that data is being sent to main memory, the CPU does take into account on which bus the IOC is located so that the system bus transceivers can be controlled to receive from the system bus on which the IOC is located and to transmit to the other system bus, again insuring that the data (or address) on both system buses is identical.

The MOS main memory is refreshed every 2 milliseconds by logic contained on the main memory board but each row of the RAM chips is only refreshed after receiving a refresh signal from the CPU. The CPU generates the refresh signal at least once every 15 microseconds (15 microseconds×128 rows=2 milliseconds). The refresh operation takes two CPU cycles during which the CPU will not access main memory. By the CPU controlling the main memory refresh in this manner, the CPU (and also all I/O controllers which communicate with main memory under CPU firmware control) can be guaranteed that the main memory will be available when an access is attempted. Therefore no system bus signals or recovery logic must be provided to signal the CPU that the main memory is busy refreshing and the access must be reattempted. This guaranteed main memory availability reduces system bus width and system logic requirements.

MAIN MEMORY REFRESH LOGIC DETAILS

Figure 44:
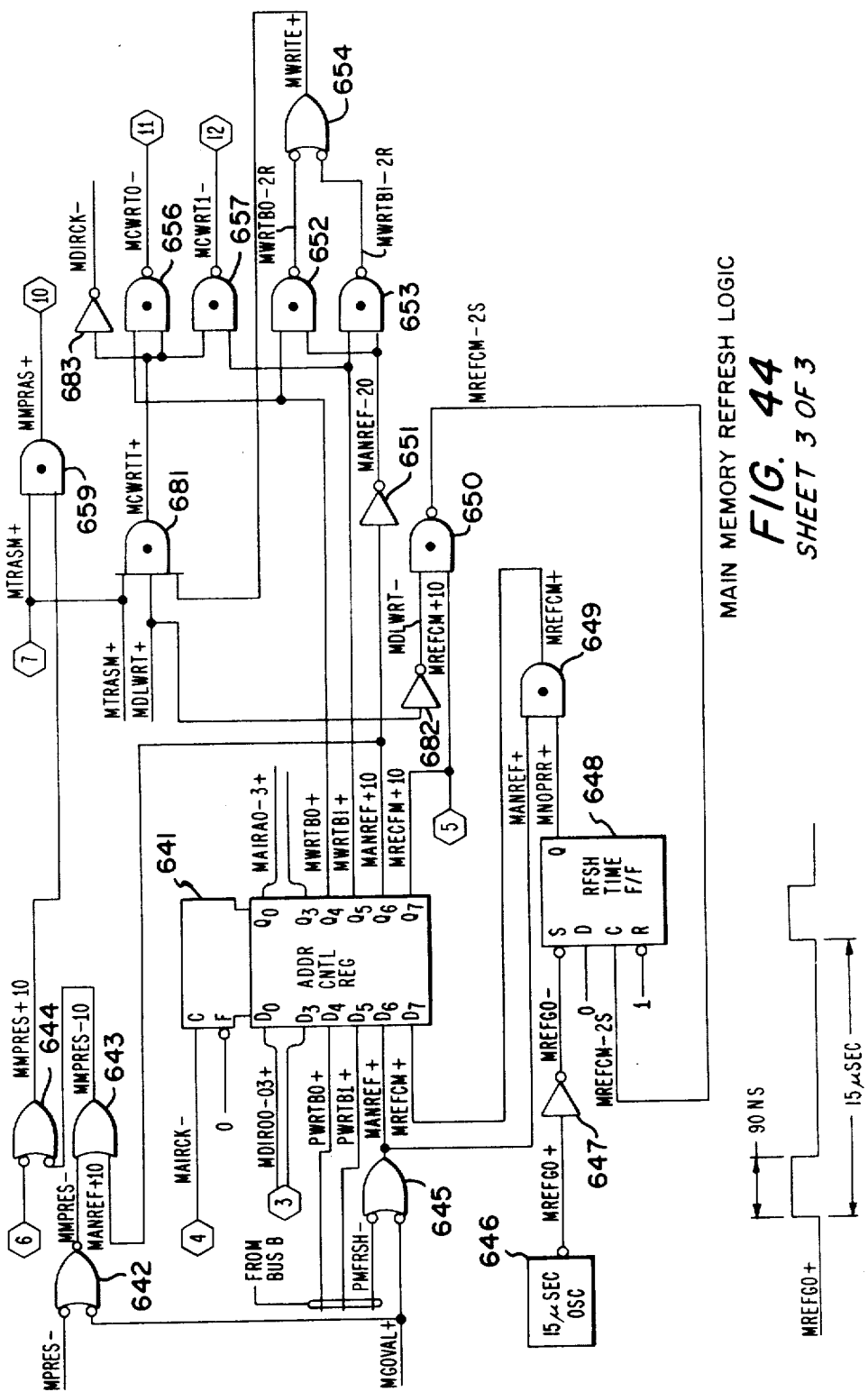
FIG. 44 illustrates the refresh logic of a main memory module of the present invention.

The operation of the main memory refresh logic will be discussed in detail with reference to FIGS. 44 and 45.

The main elements of FIG. 44 will now be discussed briefly. During a normal memory read or memory write operation, data in register 606 receives a 16-bit main memory address on the system bus address/data lines (BUSX00+ through BUSX15+). Seven bits of the 16-bit address are distributed to row address register 634, another seven bits to column address register 636, and four bits to address control register 641. When row address register 634 is enabled, the 7-bit row address is used to address one of the 128 rows within the RAM chips in the RAM array and later when the column address register 636 is enabled the 7-bit column address is used to address one of the 128 columns within the RAM chips. With 14 of the 16-bit memory address bits being used to select one bit within each of the RAM chips, the other two high-order bits of the 16-bit memory address are input to row decoder 661 and are used to select one of four RAM array rows (row 0 through row 3). During a memory refresh cycle, the main memory address from the system bus in the data in register 606 is ignored and refresh row address counter 640 is used to generate the 7-bit row address which is used to select one of the 128 rows within the RAM chips. During a memory refresh cycle, only a row address is supplied to the RAM chips. One row within each RAM chip is refreshed during each memory refresh cycle and refresh row address counter 640 is incremented by one at the end of memory refresh cycle so that the refresh row address register 639 will refresh the next row in the RAM chips during the next memory refresh cycle. During a memory read cycle, data from one of the four RAM array rows will be locked into data out register 612 which will later be enabled onto the address/data lines of the system bus. During a memory write cycle, the data in register 606 will receive data to be written into memory during the second CPU cycle. The data will be written into only one of the RAM array rows. During a memory refresh cycle, the CPU firmware indicates that the main memory is to perform a memory refresh cycle by setting signal PMFRSH− to a binary ZERO on the system bus. As described above, the CPU firmware will set the refresh signal to a binary ZERO at least once every 15 microseconds and possibly more frequently if the CPU firmware determines that it will not be using the main memory for the next two CPU cycles. Because refreshing a row within the RAM chip consumes power, it is desirable not to refresh each row in the RAM chips more frequently than once per 15 microseconds. Therefore, a 15 microsecond oscillator 646 and refresh time flip-flop 648 are used to effectively block CPU command refresh cycles which would otherwise result in a more frequent refreshing of the RAM chips.

Memory refresh timing diagram FIG. 45 will now be discussed briefly. FIG. 45 illustrates that one memory cycle takes 1000 nanoseconds which is equivalent to two CPU cycles. FIG. 45 also shows that main memory refresh signal PMFRSH− becomes a binary ZERO approximately 200 nanoseconds before memory go signal PMEMGO− becomes a binary ZERO. FIG. 45 also shows that the memory read/write signals (PWRTB0+ and PWRTB1+) become binary ONES approximately 100 nanoseconds before PMEMGO− becomes a binary ZERO. Timing generator 602 (see FIG. 41) uses memory go signal PMEMGO− to generate the address register latching signal MAIRCK−, column address strobe signal MCASGN−, row address strobe signal MTRASM+ and write enable time signal MDLWRT+.

A more detailed discussion of the operating characteristics of the 16K by 1-bit dynamic RAM chips of the type MK4116(P)4 manufactured by Mostek Corporation of Carrollton, Texas, and used in the main memory of the preferred embodiment can be found in their publication entitled "Memory Data Book and Designers Guide, Mostek 1978" which is incorporated herein by reference.

Refresh Cycle Signal Generation

Returning now to FIG. 44, the generation of the refresh cycle signals will be discussed in detail. As indicated above, the CPU firmware which executes software instructions is microprogrammed such that when the main memory will not be used for the next two firmware microsteps (CPU cycles), the first microinstruction, of the two microinstructions sequence, specifies a main memory refresh cycle by setting bits 23 and 34 to a binary ONE and bits 32 and 33 to binary ZERO (see FIG. 35C). Because bits 32 through 34 are also used for subcommand decoding, a main memory refresh cycle may only be coded in a CPU firmware microinstruction which would otherwise be using subcommand 1 and subcommand 2 (i.e., bit 32 equal to a binary ZERO).

With PMFRSH− a binary ZERO at the one input of OR gate 645, the output thereof (signal MANREF+) will be a binary ONE. Alternatively, refresh signal MANREF+ will be a binary ONE if signal MGOVAL+ is a binary ZERO, indicating that the ac source power to the system is disabled. Signal MGOVAL+ is generated by powered valid logic 628 (see FIG. 41) by using signal BPOWON+ from the system bus. Registers 634, 636, 639 and 641 are transparent latches, the outputs of which are enabled by a binary ZERO at their function (F) input and then are latched when clocking (C) signal MAIRCK− becomes a binary ZERO. Therefore, signal MANREF+ being a binary ONE at one input of address control register 641 will result in the corresponding output thereof (signal MANREF+10) being a binary ONE. The outputs of register 641 will later be latched by signal MAIRCK− becoming a binary ZERO (see FIG. 45).

Fifteen microsecond oscillator 646 generates signal MREFGO+ which is a binary ONE for approximately 90 nanoseconds and a binary ZERO for the remaining portion of its 15 microsecond period. Signal MREFGO+ is inverted by inverter 647 to produce signal MREFGO− as the set (S) input of refresh time flip-flop 648. When refresh time flip-flop 648 is set by signal MREFGO− becoming a binary ZERO during the 15 microsecond row refresh period, signal MNOPRR+ becomes a binary ONE partially enabling AND gate 649. The next occurrence of a memory refresh signal (MANREF+ being a binary ONE) will fully enable AND gate 649 making signal MREFCM+ a binary ONE. With signal MREFCM+ a binary ONE at one input of address control register 641, the corresponding output thereof (signal MREFCM+10) will be a binary ONE at one input of NAND gate 650. With write enable time signal MDLWRT+ (from timing generator 602 in FIG. 41) being a binary ZERO (see FIG. 45) at the input of inverter 682, the output thereof, signal MDLWRT−, will be a binary ONE making the output of NAND gate 650 (signal MREFCM−2S) a binary ZERO. Later, when one of the inputs of NAND gate 650 becomes a binary ZERO, the output thereof (signal MREFCM−2S) will become a binary ONE thereby clocking refresh time flip-flop 648 and make signal MNOPRR+ a binary ZERO. Signal MNOPRR+ becoming a binary ZERO results in the output of AND gate 649 (signal MREFCM+) becoming a binary ZERO.

To summarize the refresh signal generation, the output of OR gate 645, signal MANREF+, becomes a binary ONE when the system indicates that it is okay to perform a main memory refresh cycle. The CPU firmware can initiate a refresh cycle by setting signal PMFRSH− to a binary ZERO. Alternatively, if ac source system power fails, refreshing will be continually called for by a signal MGOVAL+ being a binary ZERO. Excess refresh requests are thrown away by AND gate 649 which requires that in addition to the CPU indicating that a refresh cycle can be performed, refresh time flip-flop 648 must indicate that a refresh cycle has not been performed in the previous 15 microseconds. Signal MDLWRT−, at one input of a NAND gate 650, is used to insure that refresh time flip-flop 648 clocking signal MREFCM−2S transitions from the binary ZERO to the binary ONE state when the ac source power to the system has been disabled.

Refresh Row Address Logic

Refresh row address counter 640 is used to generate the 7-bit refresh row address which is loaded into refresh row address register 639. Refresh row address counter 640 is configured to increment by one, an 8-bit counter, each time a refresh cycle is completed (i.e., when signal MREFCM+10 transitions from the binary ONE to the binary ZERO state, signal MREFCM−20 at the output of inverter 678 transitions from the binary ZERO to the binary ONE state clocking refresh row address counter 640). The 7 least significant bits of the 8-bit counter, signals MRAD0+ through MRAD6+, will be latched into refresh row address register 639 by signal MAIRCK− following the next memory go signal. The 7-bit addresses from registers 634, 636 and 639 are wire ORed together at point 679. NAND gates 675, 676 and 677 along with inverter 674 are used to insure that at any instant in time only one of tri-state output registers 634, 636 and 639 is enabled. Initially, during a memory cycle, signal MCASGN− is a binary ONE partially enabling NAND gates 675 and 677. If the memory cycle is a refresh cycle, signal MANREF+10 will be a binary ONE and NAND gate 677 will be fully enabled making the output thereof, signal MENRRF−, a binary ZERO thereby enabling refresh row addess register 639. If the main memory cycle is not a refresh cycle, signal MANREF+10 will be a binary ZERO making the output of inverter 674, signal MANREF−20, a binary ONE fully enabling NAND gate 675 and make the output thereof, signal MENROW− a binary ZERO thereby enabling row address register 634. Later in the memory cycle, when signal MCASGN− becomes a binary ZERO, the output of NAND gate 676 becomes a binary ONE making the output of inverter 684, signal MENCOL−, a binary ZERO thereby enabling column address register 636 and disabling row address register 634 and refresh row address register 639 (see FIG. 45).

The eighth input of registers 634, 636 and 639 is preset to a binary ONE or a binary ZERO and the corresponding register outputs are wire ORed together at point 680 producing signal MTRCAS−. Signal MTRCAS− is inverted by inverter 658 to produce signal MTCASM−. Signal MTRCAS− will be a binary ZERO when the 7-bit column address is on lines MAIRA0+ through MAIRA6+ and a binary ONE when a row address from row address register 634 or refresh row address register 639 is on the 7 address lines. The 7-bit RAM chip address signals MAIRA0+ through MAIRA6+ are inverted by inverter 684 to produce signals MAIRA0− through MAIRA6+ which are used by each RAM chip in each RAM array row when its corresponding row address strobe or column address strobe is a binary ZERO.

Figure 45:
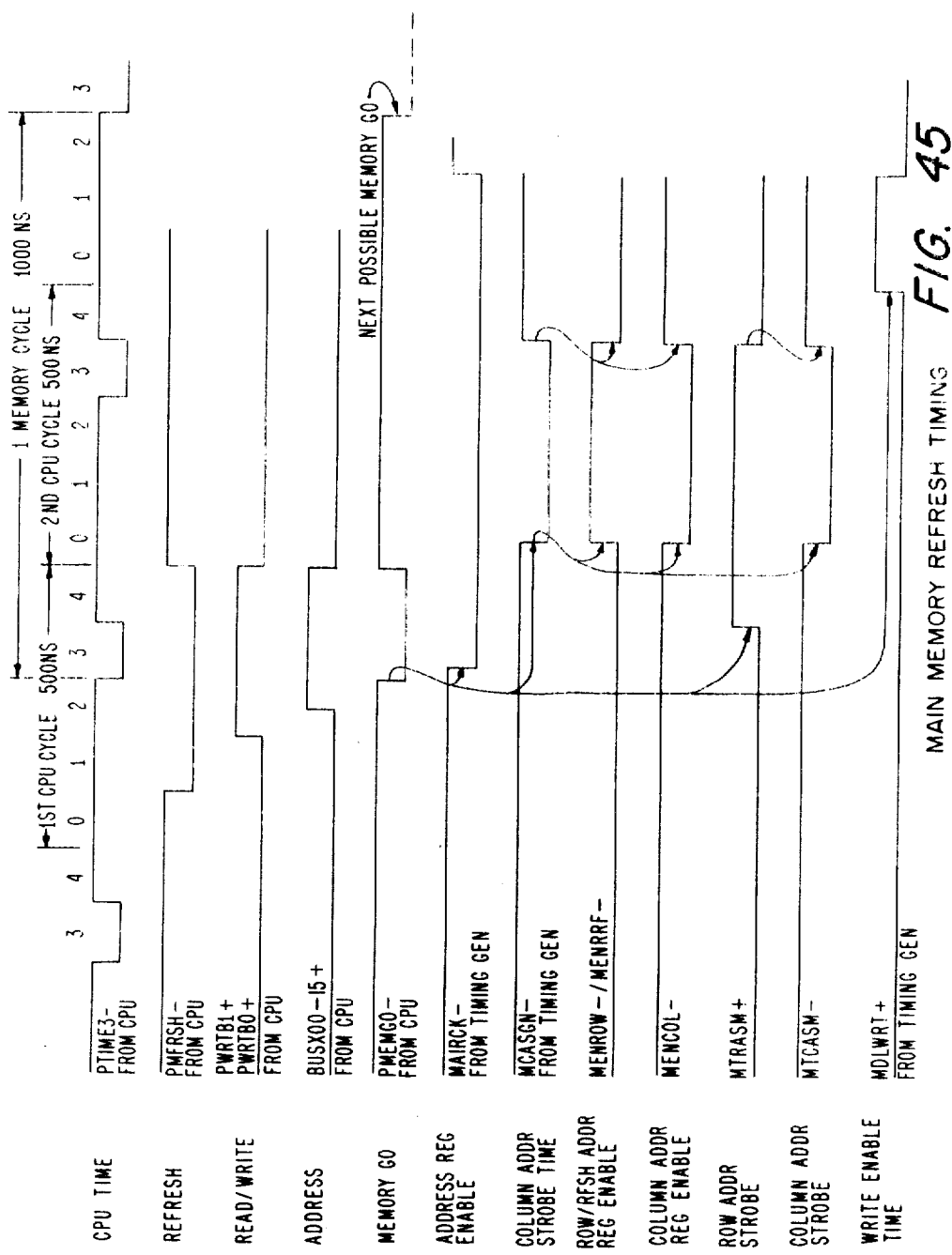
FIG. 45 illustrates a timing diagram of the signals found on the system bus and in a main memory module of the present invention.

As shown in FIG. 45, signal MTRASM+ becomes a binary ONE, early in a memory cycle, partially enabling NAND gate 660. NAND gate 660 is fully enabled by signal MTCASM+ becoming a binary ONE making the output thereof, signal MTCASM−, a binary ZERO. Signal MTRASM+ is generated by timing generator 602 in conjunction with read and write memory signals.

Refresh Row Address Strobe Logic

As indicated above with respect to FIG. 41, each time the main memory module receives a memory go signal, a check is performed to determine whether the addressed main memory location is contained within the particular main memory module. This is done by comparing the four high order bits of the main memory address contained in address control register 641, signals MAIRA0+ through MAIRA3+, with the segment address set in the address switch assembly 638 (see FIG. 41). If the addressed location is present in the main memory module, signal MPRES− is set to a binary ZERO. With one input of NOR gate 642 being a binary ZERO, the output thereof, signal MMPRES−, will be a binary ZERO.

During ac source power disable conditions, there will be no address from the CPU on the system bus but signal MGOVAL+ will be a binary ZERO holding the output of NOR gate 642 to a binary ZERO to indicate that the addressed location is present in the main memory module. If this is not a main memory refresh cycle, signal MANREF+10, at the input of OR gate 643 will be a binary ZERO which, in conjunction with main memory present signal MMPRES− being a binary ZERO, will result in the output thereof, signal MMPRES−10, being a binary ZERO. With signal MMPRES−10 being a binary ZERO, the output of OR gate 644, signal MMPRES+10, will be a binary ONE indicating that the addressed main memory location is present in this particular main memory module.

Alternatively if the current memory cycle is a refresh cycle, signal MANREF+10 at the input of OR gate 643 will be a binary ONE making the output thereof, signal MMPRES−10, a binary ONE. With signal MMPRES−10 a binary ONE, the output of OR gate 644, signal MMPRES+10, will be a binary ONE only if the other input of OR gate 644, signal MREFCM−20, is a binary ZERO. Signal MREFCM−20 will be a binary ZERO if the current memory cycle is a memory refresh cycle and if refresh time flip-flop 648 is set indicating that no prior refresh has been performed during the previous 15 microseconds.

Before leaving the main memory present signal MMPRES+10, a brief review is in order. During a memory read cycle or memory write cycle, signal MMPRES+10 will be a binary ONE in only one main memory module and a binary ZERO in all other main memory modules within the system (i.e., the address main memory location will only be present in one main memory module within the system, if present at all). Signal MANREF+10 in conjunction with OR gate 643 is used to block main memory present signal MMPRES− during all main memory refresh cycles. Signal MREFCM−20 is used to generate a main memory present signal for those main memory refresh cycles during which a refresh operation will actually take place (i.e., when refresh time flip-flop 648 is set making the output thereof, signal MNOPRR+, a binary ONE).

During a main memory refresh cycle, the read/write memory signals PWRTB0+ and PWRTB1+ are overridden to indicate a memory read operation. Signals PWRTB0+ and PWRTB1+ are inputs to address control register 641 and latched by signal MAIRCK− becoming a binary ZERO as indicated above. The latched write byte 0 signal MWRTB0+ is one input to NAND gate 656 and one input to NAND gate 652. The latched write byte 1 signal MWRTB1+ is one input to NAND gate 657 and one input to NAND gate 653. The other input to NAND gates 652 and 653 is signal MANREF−20 which is the output of inverter 651. Signal MANREF−20 will be a binary ZERO during a refresh cycle and disable NAND gates 652 and 653 making the outputs thereof, signals MWRTB0−2R and MWRTB1−2R, a binary ONE and making the output of OR gate 654, signal MWRITE+, a binary ZERO. Signal MWRITE+ being a binary ZERO indicates that a read operation is to be performed and neither byte 0 nor byte 1 is to be written into main memory. Signal MWRITE+ being a binary ZERO disables AND gate 681, making the output thereof, signal MCWRTT+, a binary ZERO. This in turn partially disables NAND gates 656 and 657 making the outputs thereof, signals MCWRT0− and MCWRT1−, binary ONEs. This condition results in neither byte 0 nor byte 1 on any RAM array row being enabled for writing. During a memory write cycle, signal MWRITE+ will be a binary ONE partially enabling AND gate 681 which will later be fully enabled when both signals MTRASM+ and MDLWRT+ become a binary ONE making the output thereof, signal MCWRTT+, a binary ONE (see FIG. 45). Signal MCWRTT+ being a binary ONE is inverted by inverter 683 which results in signal MDIRCK− being a binary ZERO which will latch data in register 606. During a memory write cycle, when data in register 606 is latched, the data contained in the register will be the data to be written into one of the RAM array rows.

As discussed above, a main memory module may have one, two, or four RAM array rows present providing 16KW, 32KW or 64KW of data. During a memory read or write cycle, the two most significant bits of the 16-bit memory address are presented to row decoder 661 as signals MARR00+ and MARR01+. Row decoder 661 decodes the two input signals and makes one of the signals MRCS0− through MRCS3− a binary ZERO which in turn results in the corresponding signal MSROW0+ through MSROW3+ a binary ONE. With one of NAND gates 666, 667, 668 and 669 partially enabled by one of the outputs of row decoder 661, the transition of the signal MMPRAS+ from the binary ZERO to the binary ONE state will fully enable one of the NAND gates and cause the corresponding row address strobe signal MTRAS0− through MTRAS3− to become a binary ZERO. The binary ZERO row address strobe signal will strobe RAM array row 0 (element 670), RAM array row 1 (element 671), RAM array row 2 (element 672) or RAM array row 3 (element 673). As can be seen in this case, only one of the RAM array rows will have a row address strobe signal in the binary ZERO state. However, during a memory refresh cycle, MREFCM−20 will be a binary ZERO causing the output of OR gates 662, 663, 664 and 665 to all be a binary ONE which in turn, when signal MMPRAS+ transitions from the binary ZERO to the binary ONE state, will result in a row address strobe being presented to each RAM array row thereby allowing RAM chips in each array row to be refreshed simultaneously.

During a memory read cycle, signal MDORCK− at the clock (C) input of data out register 612 will become a binary ZERO latching the data read from one of the RAM array rows. When signal MBUSOC− becomes a binary ZERO, the outputs of data out register 612 will be enabled onto the system bus (i.e., the data read from main memory will be placed on the system bus address/data lines). During a memory read cycle, signal MBUSOC− will transition from the binary ONE to the binary ZERO state when the memory driver enable signal PBSFMD− transitions from the binary ONE to the binary ZERO state (see FIG. 19). As noted above, with reference to FIG. 45, refresh signal PMFRSH− is placed on the system bus approximately 200 nanoseconds before memory go signal PMEMGO− and also approximately 100 nanoseconds before read/write signals PWRTB0+ and PWRTB1+. The reason for placing the signals on the system bus in this sequence is to precondition the main memory logic for a refresh cycle, and in particular to block write signals PWRTB0+ and PWRTB1+ which are on the system bus before PMEMGO− but after PMFRSH−. This preconditioning of the memory logic puts the memory into a read mode and insures that the RAM chip write enable signals (MCWRT0− and MCWRT1−) are stable before the row address strobe is applied to the RAM chips.

MAIN MEMORY REFRESH SUMMARY

During normal system operation, the refreshing of the dynamic RAM chips in the main memory is done under CPU control. By setting the appropriate bits in the CPU firmware microinstruction, the CPU can send a memory refresh and memory go signal on the system bus to the main memory modules. The sending of the refresh signal (PMFRSH−) and the memory go signal (PMEMGO−) conditions the main memory module to do a memory refresh cycle without regard to the memory address on the address/data lines (BUSX00+ through BUSX15+) of the system bus and without regard to the memory read/write byte lines (PWRTB0+ and PWRTB1+) of the system bus. The CPU firmware is microprogrammed such that during the course of executing a software instruction, if it is predetermined that the main memory will not be used for the next two CPU cycles, the first microinstruction of a two microinstruction sequence will have bit 23 and bits 32 through 35 coded to send a memory go signal, a memory refresh signal, and to inhibit hardware interrupts. Inhibiting hardware interrupts in the first microinstruction of the two microinstruction memory refresh sequence insures that a hardware interrupt will not occur at the end of the first microinstruction. Failure to inhibit hardware interrupts could result in transfer of control to a hardware interrupt microroutine which initiates a main memory read, write or refresh cycle in its first microinstruction.

Because of the random time sequence in which memory refresh commands can be sent to main memory, the system can not depend upon the CPU firmware to send them frequently enough while executing software instructions. Therefore, the CPU also contains a refresh timer which will cause a memory refresh hardware interrupt to become pending 8 microseconds after the previous memory refresh command has been sent to main memory. This CPU refresh timer thus guarantees that a refresh command will be sent to the main memory by the CPU at least once every 15 microseconds.

In order to conserve system power during normal operation, the main memory module itself has a 15 microsecond timer which assures that no more than one memory refresh cycle will be performed each 15 microseconds. This timer, which comprises a 15 microsecond oscillator and a flip-flop, discards memory refresh commands received from the CPU that would otherwise cause a main memory to refresh more than once per 15 microseconds. This same main memory refresh timer is also used to generate refresh commands when the ac source power to the system has been disabled and the contents of main memory are being maintained using power from the memory save unit. This assures that the contents of the main memory are saved during a power outage that does not exceed the capacity of the battery backup (memory save) unit and also assures that the minimum amount of power is used to maintain the contents of main memory in its refreshed state.

Because all accesses to main memory occur through and under the control of the CPU, by having the CPU control the refreshing of main memory in this manner, the CPU (or an IOC accessing the main memory via the CPU) is guaranteed that the main memory is available for accessing and no logic need be provided within the system or main memory to handle the case of the CPU or an IOC attempting an access while the main memory is refreshing.

SINGLE MICROSTEP FUNCTIONAL OVERVIEW

As a debugging aid for the maintenance of the system, the system provides the ability to single step the CPU firmware. In the single microstep mode of operation, each time the operator pushes a step push button on the control panel the CPU will complete one CPU cycle stepping the CPU firmware one microstep (i.e., execute one microinstruction of the CPU firmware). The single microstep operation is provided for by logic within the control panel and CPU which permits the basic system timing logic shown in FIG. 14 to cycle one complete CPU cycle (i.e., generate PTIME1 through PTIME0 shown in FIG. 15). The single microstep is accomplished by allowing the basic system timing logic to run at full speed for one CPU cycle and inhibiting the starting of the next CPU cycle.

Because the main memory is refreshed under the control of the CPU firmware, freezing execution of the CPU firmware also freezes the generation of the required main memory refresh signal (PMFRSH −) and memory go signal (PMEMGO −). To prevent the contents of the main memory from being lost, the control panel generates memory refresh and memory go signals every 7 microseconds. This frequency is more than sufficient to meet the one refresh signal per 15 microsecond requirement of semiconductor dynamic RAM chips of the main memory modules.

The operation of the single microstep logic will be discussed in detail with reference to FIGS. 46, 47 and 48.

MAIN MEMORY REFRESH SIGNAL TIMING LOGIC

FIG. 46 shows the single microstep logic found in the control panel (element 201 in FIG. 1). FIG. 46 also shows related logic found in the CPU and shown in FIGS. 14, 42 and 43.

The necessary main memory refresh (PMFRSH −) and main memory go (PMEMGO −) signals which are placed on system bus B to control main memory refreshing are primarily generated by using three one-shot pulse generators shown in FIG. 46 as elements 701, 702 and 704. Element 703 is also a one-shot but its function is to inhibit the occurrence of a single microstep during a control panel initiated main memory refresh operation. One-shots 701, 702, 703 and 704 are of the type S9602 monostable multivibrators manufactured by Signetics Corporation of Menlo Park, Calif. and described in their document entitled "Signetics Data Book" which is incorporated herein by reference. One-shots 701, 702, 703 and 704 are triggered by the signal at their trigger (T) input going from a binary ZERO to the binary ONE state. The positive output (Q) of the one-shot becomes a binary ONE when the one-shot is triggered and remains a binary ONE for the length of time preselected by connecting various valued capacitors and resistors to the one-shots. It should be noted that the capacitors and resistors used to determine the time period of the one-shots are not shown in FIG. 46 but appropriate values for the capacitors and resistors are chosen to provide the time periods shown in FIGS. 46, 47 and 48 (i.e., 6 microseconds for 701, 300 nanoseconds for 702, 5 microseconds for 703 and 1 microsecond for 704).

The 6 microsecond period produced by one-shot 701 is used to time the interval between the end of one memory refresh cycle and the beginning of the next memory refresh cycle (see FIG. 47). The 300 nanosecond period provided by one-shot 702 is used to insure that the memory refresh signal is present on system bus B 300 nanoseconds before the beginning of the memory go signal. It should be noted that the control panel provides 300 nanoseconds between the beginning of the memory refresh signal (PMFRSH −) and the beginning of the memory go signal (PMEMGO −), whereas a main memory refresh command generated by the CPU firmware provides for a period of 200 nanoseconds between the beginnings of the memory refresh and the memory go signals. As seen in the above discussion of the main memory refresh logic, the timing signals used within the main memory modules are generated from the beginning of the memory go signal and the timing requirement is that the memory refresh signal appear at the main memory modules sufficiently ahead of the memory go signal to insure that the memory will be preselected into a read mode during the refresh operation.

The one microsecond period provided by one-shot 704 is used to time the length of the memory refresh cycle which is one microsecond (i.e., two CPU cycles of 500 nanoseconds each). The 5 microsecond period provided by one-shot 703 is used to define the 5 microsecond segment of the 7 microsecond period (6 microsecond from 701 plus 1 microsecond from 704) during which the execution of a single microinstruction of the CPU firmware may be initiated under the control of the control panel and be assured that any main memory operation initiated by single microstepping the CPU firmware will be completed before the control panel initiates a memory refresh cycle. This 5 microsecond period also insures that any control panel initiated memory refresh cycle is completed before any memory operation is initiated by the single stepping of the CPU firmware.

Looked at another way, for 2 microseconds of each 7 microsecond period, single stepping of the CPU firmware is inhibited to prevent a conflict between control panel initiated memory refresh cycles and CPU firmware initiated memory read, write or refresh cycles. At the end of the 2 microsecond period, a single microstep called for during the 2 microsecond period will be allowed to execute. The first 1 microsecond of the 2 microsecond period is to permit a control panel initiated memory refresh cycle to complete. The second 1 microsecond of the 2 microsecond period is to insure that any CPU firmware initiated memory cycle is allowed to complete before any memory refresh cycle can be initiated by the control panel. It should be noted that although a CPU cycle is only 500 nanoseconds long, a main memory cycle is performed as one indivisable cycle of 1 microsecond with all timing within the main memory derived from the beginning of the memory go signal (PMEMGO−). Therefore, if the CPU firmware microinstruction which is to be single stepped does a memory operation, the CPU will execute the microinstruction in 500 nanoseconds but the main memory cycle will take 500 nanoseconds more to complete. If a control panel initiated memory refresh cycle was allowed to overlap a CPU firmware initiated memory cycle, an unspecified main memory operation may occur with unspecified results.

The memory refresh timing logic shown in FIG. 46 will now be discussed in detail in conjunction with the timing diagram 47. In response to power being supplied to the system or, if power is already on, the system operator pushing a clear button on the control panel, signal PCPCLR− goes from the binary ZERO to the binary ONE state (time G in FIG. 47) making the output of AND gate 720, signal KCLEAR+, a binary ZERO which in turn makes the output of inverter 721, signal KCLEAR−, a binary ONE partially enabling AND gate 705. Assuming that one-shot 704 is quiescent, the inverted output thereof, signal KCOS03−, will be a binary ONE at the other input of AND gate 705. Fully enabling AND gate 705 makes signal KOSCLK+ a binary ONE and which in turn triggers one-shot 701 to begin producing its 6 microsecond time period (from time G to time H in FIG. 47).

The output of one-shot 701, signal KCOS01−, is connected to the trigger (T) inputs of one-shots 702 and 704. Therefore at time H in FIG. 47, when signal KCOS01 transitions from the binary ZERO to the binary ONE state, one-shots 702 and 704 will be triggered and begin their 300 nanosecond and 1 microsecond periods respectively (see FIG. 47). At the end of one-shot's 704 1 microsecond time period (time J in FIG. 47), the inverted output thereof, signal KCOS03−, will transition from the binary ZERO to the binary ONE state. Signal KCLEAR− is still a binary ONE at the other input of AND gate 705 at time J in FIG. 47 so that one-shot 701 will again be triggered by signal KOSCLK+ transitioning from the binary ZERO to the binary ONE state. The triggering of one-shot 701 will again trigger one-shots 702 and 704 as described above. This sequence of one-shot 701 triggering one-shots 702 and 704 followed by one-shot 704 retriggering one-shot 701 in a circular fashion will continue as long as signal PCPCLR− remains in the binary ONE state. Signal PCPCLR− remains in the binary ONE state as long as the system is not being cleared. Therefore, it can be seen that one-shots 701, 702 and 704 are freewheeling within the control panel and will continually provide timing pulses after the system is cleared without regard to the status of the panel switch 706 or step push button switch 719. It can also be seen that these control panel timing pulses are not synchronized with the CPU clock.

At time I in FIG. 47, when panel switch 706 is changed from the normal panel off position, in which signal KFORCE− is a binary ONE, to the panel on position (as shown in FIG. 46), in which signal KFORCE− is a binary ZERO, the output of inverter 716, signal KFORCE+, will become a binary ONE partially enabling AND gate 709. Signal KFORCE+ becoming a binary ONE at the reset (R) input of one-shot 703 will allow the occurrence of a binary ONE at the trigger (T) input thereof to initiate the 5 microsecond period provided by one-shot 703. Therefore, at time J in FIG. 47, when signal KCOS03− becomes a binary ONE at the trigger input of one-shot 704, the output thereof, signal KCOS04+, will become a binary ONE and remain a binary ONE for 5 microseconds (until time JJ in FIG. 47). One-shot 703 will continue to be triggered by the output of one-shot 704 as long as panel switch 706 is in the on position (i.e., at times J, M and P in FIG. 47).

At time K in FIG. 47, the 6 microsecond period of one-shot 701 expires and signal KCOS01− transitions from the binary ZERO to the binary ONE state triggering one-shots 702 and 704 which in turn cause their output signals KCOS02− and KCOS03− to transition from the binary ONE to the binary ZERO state. When signal KCOS03− becomes a binary ONE (at time K in FIG. 47), it fully enables AND gate 709 causing the output thereof, signal KRFRSH+, to become a binary ONE and makes the output of inverter 710, signal KEFRSH−, a binary ZERO. Signal KEFRSH− from the control panel goes to inverter 578 within the CPU control store logic and is inverted to make signal KEFRSH+ a binary ONE at one input of NOR gate 580 making the output thereof a binary ZERO. The output of NOR gate 580, memory refresh signal PMFRSH−, is distributed to all main memory modules on system bus B. As will be seen below, at this time signal PMRFSH+ at the other input of NOR gate 580 will be a binary ZERO because the no CPU firmware microinstruction will be in the processor being executed while the CPU clock is frozen.

At time L in FIG. 47, the 300 nanosecond time period of one-shot 702 will expire making the output thereof, signal KCOS02−, a binary ONE which in turn fully enables AND gate 708 making the output thereof, signal KMEMGO+, a binary ONE. Signal KMEMGO+ is inverted by inverter 707 to produce signal KMEMGO− which at time L becomes a binary ZERO (see FIG. 47). Signal KMEMGO− is inverted by inverter 568 in the CPU logic to produce signal PMEMGO+MP. Signal PMEMGO+MP becoming a binary ONE at one input of NOR gate 570 makes the output thereof, memory go signal PMEMGO−, a binary ZERO. Memory go signal PMEMGO− is distributed to all memory modules on system bus B and initiates main memory read, write and refresh cycles when it transitions from the binary ONE to the binary ZERO state. Again, as in the case of memory refresh signal PMFRSH— at the output of NOR gate 580, the other input of NOR gate 570, signal PMEMGO+CP, is a binary ZERO because no CPU firmware microinstruction is executing at this time while the CPU clock is frozen.

By referencing FIG. 47, it can be seen that memory refresh signal PMFRSH— becomes a binary ZERO at time K and 300 nanoseconds later (the time period of one-shot 702) memory go signal PMEMGO— becomes a binary ZERO initiating the main memory refresh cycle. At time M, the expiration of the 1 microsecond period from one-shot 704, memory refresh signal PMFRSH— and memory go signal PMEMGO— become binary ONEs in preparation for the next memory refresh cycle. Six microseconds after time M, at time N, memory refresh signal PMFRSH— again becomes a binary ZERO and preconditions the main memory modules for a refresh cycle. Three hundred nanoseconds later at time O, memory go signal PMEMGO— becomes a binary ZERO initiating the memory refresh cycle. At time P, memory refresh signal PMFRSH— and memory go signal PMEMGO— again become binary ONEs in preparation for the next memory refresh cycle. This process of a 1 microsecond memory refresh cycle followed by 6 microseconds between memory refresh cycles repeats until panel switch 706 is turned to the off position which will cause signal KFORCE+ to become a binary ZERO. This will disable AND gate 709 and make the output thereof, signal KRFRSH+, a binary ZERO which in turn inhibits the further generation of memory refresh and memory go signals by the control panel. As will be seen below, the setting of the panel switch 706 to the off position will unfreeze the CPU clock which in turn will initiate the execution of the CPU firmware. The CPU firmware then resumes responsibility for the generation of the required memory refresh and memory go signals (signal PMRFSH+ at the input of NOR gate 580 and signal PMEMGO+CP at the input of NOR gate 570).

CPU CLOCK SINGLE CYCLE LOGIC

The logic within the control panel which permits the control panel to allow the CPU clock to run for one CPU cycle when a step push button on a control panel is pushed will now be discussed with respect to FIGS. 46 and 48.

Initially, when the control panel switch 706 is turned to the on position, signal KFORCE— becomes a binary ZERO making the output of inverter 716, signal KFORCE+, a binary ONE (time Q in FIG. 48). Signal KFORCE+ being a binary ONE will partially enable AND gate 714. The other input to AND gate 714, signal KMINCR—, will initially be a binary ONE: therefore the occurrence of signal KFORCE+ becoming a binary ONE will make the output of AND gate 714, signal KFREEZ+, a binary ONE which, when inverted by inverter 717, makes the output signal KFREEZ— a binary ZERO. Signal KFREEZ— is sent to the CPU basic system timing logic and inverted by inverter 287 to produce signal PFREEZ+ which will become a binary ONE at time Q in FIG. 48. When signal PFREEZ+ is a binary ONE, it disables AND gate 293 and holds the output thereof, signal PTIMIN+, at a binary ZERO. With signal PTIMIN+ being held at a binary ZERO by signal PFREEZ+ being held at a binary ONE, the occurrence of 6 or less clocking pulses from 10 megahertz oscillator 290 will result in any bit in shift register 291 being shifted off of the end and result in a freezing of the CPU clock with no timing signal (signals PTIME0+ through PTIME4+) being in the binary ONE state (see FIGS. 14 and 15). That is with reference to FIG. 14, once the current bit in shift register 291 is shifted out of the fifth position no new bit will be clocked into the shift register because the data (D) input signal PTIMIN+ is being held at a binary ZERO.

Returning now to FIG. 46, the operation of step push button switch 719 and CPU cycle flip-flop 715 will now be discussed. When step push button switch 719 is in its normally closed position, signal KXCYCL+ is a binary ZERO and partially disables NAND gate 713 making the output thereof, signal KMINCR—, a binary ONE which in turn partially enables AND gate 714. When step push button switch 719 is pushed, signal KXCYCL— becomes a binary ZERO and is inverted by inverter 711 to make signal KXCYCL+ a binary ONE partially enabling NAND gate 713. Prior to pushing step push button switch 719, signal KXCYCL+ was a binary ZERO at the reset (R) input of CPU cycle flip-flop 715 holding the inverted output thereof, signal KMLACH—, in the binary ONE state and partially enabling NAND gate 713. After pushing step push button switch 719, signal KXCYCL+ becomes a binary ONE at the reset (R) and data (D) inputs of CPU cycle flip-flop 715 allowing the flip-flop to be clocked by signal KTIME3+ transitioning from the binary ZERO to the binary ONE state. With both signals KXCYCL+ and KMLACH— in the binary ONE state at the input of NAND gate 713, the occurrence of signal KCOS04+ transitioning from the binary ZERO to the binary ONE state at time T in FIG. 48 will result in NAND gate 713 being fully enabled and make the output thereof, signal KMINCR—, a binary ZERO which will disable AND gate 714 and make the output thereof, signal KFREEZ+, a binary ZERO.

Signal KFREEZ+ becoming a binary ZERO at time T in FIG. 48 results in signal PFREEZ+ becoming a binary ZERO at the input of AND gate 293. With the other four inputs of AND gate 293, signals PTIME1+ through PTIME4+ being in the binary ZERO state, the transition of signal PFREEZ+ from the binary ONE to the binary ZERO state will enable AND gate 293 making the output thereof, signal PTIMIN+, a binary ONE at the data (D) input of shift register 291. The binary ONE at the data input of shift register 291 will then be shifted on the PTIME1+ output by clocking pulse PCLOCK— and subsequently to the PTIME2+ through PTIME0+ outputs of shift register 291. When one of signals PTIME1+ through PTIME4+ becomes a binary ONE, AND gate 293 will be disabled making the output thereof, signal PTIMIM+, a binary ZERO at the data input of shift register 291. On the third PCLOCK— clock pulse, the binary ONE originally at the data input of shift register 291, which occurred when signal PFREEZ+ became a binary ZERO, will be shifted into the third position making the output thereof, signal PTIME3+, a binary ONE. Signal PTIME3+ is inverted by inverter 289 to make signal PTIME3— a binary ZERO which is in turn output by transceiver A, element 286-1, as signal PTIME3—BA on system bus A.

Signal PTIME3—BA is received by the control panel logic at AND gate 718 and when a binary ZERO at time U in FIG. 48 enables AND gate 718 making signal KTIME3+ transition from a binary ZERO to the binary ONE state at the clock (C) input of CPU cycle flip-flop 715. The clocking of CPU cycle flip-flop 715, by signal KTIME3+ becoming a binary ONE, results in signal KXCYCL+ (a binary ONE at time U) being clocked onto the inverted output thereof making signal KMLACH— become a binary ZERO at time U. Signal KMLACH— becoming a binary ZERO disables NAND gate 713 making the output thereof, signal KMINCR—, a binary ONE which in turn fully enables AND gate 714 and makes the output thereof, signal KFREEZ+, a binary ONE. Signal KFREEZ+ becoming a binary ONE at time U in FIG. 48 results in signal PFREEZ+ becoming a binary ONE which in turn results in the disabling AND gate 293 and makes signal PTIMIN+ a binary ZERO. Holding signal PTIMIN+ in the binary ZERO state and inhibiting shift register 291 from generating the next CPU cycle of primary time 1 through primary time 0.

Reviewing briefly, it can be seen that panel switch 706 when turned to the on position causes the CPU clock to be inhibited from generating the next CPU cycle (signal PFREEZ+ becomes a binary ONE and results in AND gate 293 being disabled). The pushing of step push button switch 719 results in the unfreezing of the CPU clock for one complete CPU cycle (primary time 1 through primary time 0) after which the CPU clock is again frozen. It should be noted that during the one CPU cycle during which the clock is unfrozen, the CPU clock operates at full speed (i.e., each primary time is 100 nanoseconds giving a full cycle time of 500 nanoseconds).

When the step push button switch 719 is released at time V, signal KXCYCL+ becomes a binary ZERO at the input of NAND gate 713, which is already partially disabled by signal KMLACH— being a binary ZERO. Therefore the output of NAND gate 713, signal KMINCR—, remains a binary ONE. Signal KXCYCL+ becoming a binary ZERO at the reset (R) input of CPU cycle flip-flop 715 results in the resetting of flip-flop 715 and makes the output thereof, signal KMLACH—, a binary ONE which partially enables NAND gate 713. Signal KMLACH— becoming a binary ONE at time V does not change the output of NAND gate 713 because signal KXCYCL+ is a binary ZERO and disables NAND gate 713 and holds signal KMINCR— in the binary ONE state. It should be noted that signal KXCYCL+ becomes a binary ZERO and disables NAND gate 713 before the output of CPU cycle flip-flop 715, signal KMLACH—, can become a binary ONE and fully enable NAND gate 713. At time W in FIG. 48, one-shot 703 is again triggered and signal KCOS04+ becomes a binary ONE. it should be noted that time W occurs during the last 300 nanoseconds of the memory refresh cycle.

At time X in FIG. 48, the step push button switch is again depressed, and because signal KCOS04+ is already a binary ONE partially enabling NAND gate 713, the transition of signal KXCYCL+ to the binary ONE state results in NAND gate 713, being fully enabled, making the output thereof, signal KMINCR—, a binary ZERO. Signal KMINCR— being a binary ZERO disables AND gate 714 and makes the output thereof, signal KFREEZ+, a binary ZERO. As seen above, signal KFREEZ+ becoming a binary ZERO results in the enabling of the basic system timing logic within the CPU which in turn will generate a primary time 3 clock pulse which will set CPU cycle flip-flop 715 during the CPU cycle and result in the refreezing of the basic system timing logic. That is, at time Y in FIG. 48, the occurrence of clock signal PTIME3— becoming a binary ZERO will result in signal KMLACH— becoming a binary ZERO which in turn will result in signals KFREEZ+ and PFREEZ+ becoming binary ONEs which will again freeze the basic system timing logic. At time Z in FIG. 48, the release of the step push button switch 719 results in the resetting of CPU cycle flip-flop 715 after NAND gate 713 is disabled by signal KXCYCL+ becoming a binary ZERO so that the freeze of the basic system timing logic is maintained.

At time AA in FIG. 48, when the panel switch 706 is turned to the off position making the output thereof, signal KFORCE—, a binary ONE which in turn is inverted by inverter 716 to make signal KFORCE+ a binary ZERO which in turn will disable AND gate 714 making the output thereof, signal KFREEZ+, a binary ZERO. Signal KFREEZ+ becoming a binary ZERO enables the CPU basic system timing logic to begin a CPU cycle. The occurrence of primary time 3 pulse PTIME3—BA becoming a binary ZERO at the input of AND gate 718 at time BB will result in an attempt to clock CPU cycle flip-flop 715. If step push button switch 719 is in the normally closed position (i.e., released), the output thereof, signal KXCYCL+, will be a binary ZERO at the reset input of CPU cycle flip-flop 715 and the flip-flop will not be set and the output thereof, signal KMLACH—, will remain a binary ONE. Alternatively, if step push button switch 719 was depressed when the control panel switch 706 was turned to the off position, signal KXCYCL+ will be a binary ONE at both the data and the reset inputs of CPU cycle flip-flop 715 which will result in the flip-flop being set and signal KMLACH— becoming a binary ZERO. In either case, the output of NAND gate 713 is not important at time BB in FIG. 48 because AND gate 714 is disabled by signal KFORCE+ being a binary ZERO which will inhibit the output of AND gate 714, signal KFREEZ+, from beginning a binary ONE and prevent a refreezing of the basic system timing logic. Therefore, after time AA in FIG. 48, the CPU clock logic will be free to generate a continuous sequence of primary time pulses (PTIME1+ through PTIME0+) and the CPU firmware will be executed by a continuous sequence of CPU cycles.

SINGLE MICROSTEP FUNCTIONAL SUMMARY

Because of the overall system organization of the central processing unit, main memory modules, I/O controllers and the control panel, the system as a whole will function in a single microstep mode of operation as described above. In the single step mode of operation, the control panel takes over the responsibility for generating main memory refresh commands which are necessary to prevent loss of main memory information. In the single step mode of operation, the CPU clock is frozen between CPU cycles. This is opposed to being stalled in one time period of the CPU cycle or to continually re-execute a time period of the CPU cycle. In the system, none of the CPU cycle timing signals are set while the CPU clock is frozen (i.e., signals PTIME0+ through PTIME4+ are all frozen in the binary ZERO state).

While frozen between CPU cycles, the logic in the CPU associated with the generation of the memory refresh and memory go signals will be in a state such that the logic within the control panel can generate the necessary main memory refresh commands. For example, an examination of FIG. 43 will reveal that, even if the last CPU firmware microinstruction executed was a microinstruction which initiated a memory refresh command, the control panel can generate the necessary memory refresh commands to maintain the contents of the main memory. With the CPU clock frozen, the clock signal PTIME0+ at the enable input of subcommand decoder 244-2 will be a binary ZERO enabling the outputs thereof (PTIME0+ being a binary ZERO indicates that it is not primary time 0). If the previous CPU firmware microinstruction was a refresh command, the output of subcommand decoder 244-2 will have signal PMRFSH— being held in the binary ZERO state. Signal PMRFSH— is inverted by inverter 576 and NOR gate 580 making system bus refresh signal PMFRSH— a binary ZERO (see FIG. 42). The fact that the memory refresh signal PMFRSH— is held in the binary ZERO state by the CPU firmware will not interfere with the control panel which also will attempt to set the refresh signal to the binary ZERO state once each 6 microseconds. An examination of the main memory logic of FIG. 44 will show that the main memory logic does not depend upon the transition of the refresh signal from one binary state to the other binary state but only that the refresh signal be in the binary ZERO state in sufficient time before the beginning of the memory go signal.

Further examination of FIG. 42 shows that if the CPU firmware is holding the memory refresh signal in the binary ZERO state it will prevent the setting of the memory refresh hardware interrupt flip-flops 572 and 574. Therefore the CPU logic itself will never call for a main memory refresh by the hardware interrupt refresh time out as the CPU firmware is single stepped. Alternatively, if the previous CPU firmware microinstruction is not a main memory refresh command, the signal PMRFSH— will be a binary ONE at the output of subcommand decoder 244-2 and NOR gate 580 will generate a refresh command to the main memory in response to signal KEFRSH— from the control panel. In this latter case, the refresh signal being generated by the control panel every 6 microseconds will also reset flip-flops 572 and 574 which in turn inhibits their requesting a memory refresh hardware interrupt.

Returning to FIG. 43, it can be seen by an examination of memory go flip-flop 566 that the flip-flop will be reset at the end of each CPU cycle by signal PTIME0— as the CPU firmware is single stepped such that the output thereof, signal PMEMGO+CP, will be a binary ZERO at the input of NOR gate 570. Signal PMEMGO+CP being a binary ZERO allows the transition of the memory go signal KMEMGO— at the input of inverter 568 to cause the system bus memory go line PMEMGO— to transition from the binary ONE to the binary ZERO state and initiate a memory cycle. It should be noted again that the timing within the main memory modules is derived from the beginning of the memory go signal (i.e., the transition from the binary ONE to binary ZERO state).

An examination of FIGS. 42 and 43 will also reveal that the CPU logic associated with software interrupts and hardware interrupts will also function in a single step mode of operation thereby permitting software interrupts and hardware interrupts to be processed without loss of data. The ability to process both hardware and software interrupts is important in allowing the system to perform I/O commands, I/O data transfers, and I/O interrupt sequences in the single step mode of operation.

An examination of the I/O controller logic in FIG. 39 will show that the input/output controllers are synchronized with the CPU and therefore will function in a single step mode of operation. Transfers between the CPU and an IOC will work in the single step mode without loss of data because these transfers are timed from primary time 3 (i.e., I/O commands and I/O interrupts function without loss of information). It should be noted that the I/O bus sequences are timed using primary time 3 on the system bus and that the CPU-IOC link is terminated by the end-of-link (EOFLK) command. Transfers of data from main memory to an IOC will function without loss of information between the main memory and the IOC (i.e., main memory read operations) but there can be data underrun between the IOC and the peripheral device if the peripheral device cannot tolerate long delays between the availability of requested words (or bytes) of data. On the other hand, transfers from an IOC to the main memory (i.e., main memory write operations) will result in invalid data being written into main memory and there is further the possibility of data overruns between the IOC and the peripheral device if the peripheral device must deliver data to the IOC before the IOC has delivered the data to the main memory.

Further examination of the system logic will reveal that data transfers from the main memory to the CPU or an IOC (i.e., a memory read) will work properly even though the first CPU cycle which initiated the memory read is not immediately followed by the second CPU cycle. As seen above when discussing the main memory logic, when a memory read command is initiated during the first CPU cycle, the main memory has all information required to access the word in main memory. Main memory puts the word of data retrieved in data out register 612 (see FIG. 44). During the second CPU cycle when the CPU firmware microinstruction enables the data in data out register 612 onto the bus, by setting signal PBSFMD— to a binary ZERO, the data will be transferred to the CPU or the IOC. The data will be valid even though the two CPU cycles were not executed consecutively. Further, the data is valid even though many main memory refresh cycles may have occurred under the direction of the control panel refresh logic between the first CPU cycle which initiated the read and the second CPU cycle which took the data from data out register 612. This is possible because data out register 612 clocking signal PDORCK— will not clock any data into the data output register during any one of the intervening memory refresh cycles.

Because the main memory cycle is one indivisable cycle of one microsecond, when data is to be written into memory the data must be available during the one microsecond memory cycle. Therefore, if the CPU firmware microinstruction specifies a memory write operation, in the single step mode of operation invalid data will be written into main memory because the memory write will be initiated during the first CPU cycle and the required data will not be available on the system bus to be gated into the data in register 606 during the latter half of the memory write cycle.

This single step mode of operation, in which the CPU cycle is performed at full speed, allows timing problems within the system to be seen in the single step mode of operation because all operations within a CPU cycle are performed at their full speed (i.e., logic ringing problems will be visible). Further, this single step mode of operation does not require synchronization of clocks between the control panel and the CPU. That is, the CPU clock is frozen and then restarted without synchronizing it with any timing signal from the control panel and the control panel generates its memory refresh commands without having to be synchronized with the CPU clock signals.

The above description of apparatus for the single stepping of a microprogrammed control store unit which controls the refreshing of a rechargeable memory was by way of illustration only. It should be understood that the control store could be in a unit other than the CPU and could, for example, be in an I/O controller, a peripheral device or other unit in a system. It should be further understood that the system need not be a data processing system and that the memory could be other than the main memory of the system. For example, the rechargeable memory could be a data buffer in an I/O controller. It also should be understood that the microprogrammed control store unit could be coupled to the rechargeable memory by other than a common bus. It should be still further understood that the addition of logic to the control panel, including a decrementable counter preloaded from an operator settable switch, would allow for execution of multiple microinstruction steps per push of the step pushbutton 716 in FIG. 46. That is, the preset counter would be decremented by the clock pulses (e.g., signal PTIME3−) and, when it reached zero, CPU cycle flip-flop 715 would be set to freeze the CPU clock by inhibiting the beginning of the next full clock cycle. In order for this multiple microinstruction step execution function to operate properly, additional changes understood by those skilled in the art would be required to prevent the control panel logic from issuing a memory refresh cycle (i.e., setting signal KEFRSH− to a binary ZERO) during the CPU cycles in which signal KFREEZ+ is a binary ZERO (see FIGS. 46 and 48). Other more extensive changes are envisioned in which less than a full CPU cycle is executed per push of the control panel step push button.

While the invention has been shown and described with reference to a preferred embodiment thereof, it will be understood by those skilled in the art that the foregoing and other changes in form and detail may be made herein without departing from the spirit and scope of the invention.

What is claimed is:

1. A diagnostic system for a microprogrammed processing unit, said microprogrammed processing unit coupled to a rechargeable memory for storing information, said microprogrammed processing unit including an addressable control store having a plurality of storage locations for storing microinstruction words, a decoding means coupled to said control store for decoding said microinstruction words to generate signals to control the operation of said microprogrammed processing unit, a first means coupled to said decoder means and to said rechargeable memory for generating a memory refresh command in response to bits appearing in one or more control fields in said microinstruction words, said diagnostic system for single stepping said microprogrammed processing unit one microinstruction at a time thereby allowing said microprogrammed processing unit and the results of executing a current one of said microinstruction words to be examined before proceeding to the execution of a next one of said microinstruction words, said diagnostic system comprising:

A. second means, coupled to said microprogrammed processing unit, for inhibiting the execution of said next one of said microinstruction words; and B. third means, coupled to said second means and to said rechargeable memory, for alternatively generating memory refresh commands at a frequency sufficient to prevent the loss of information in said rechargeable memory whereby the memory refresh commands generated by said third means during the period that the execution of said next one of said microinstruction words is inhibited replace the refresh commands that would normally be generated by said first means.

2. A system as in claim 1 wherein said microprogrammed processing unit further comprises a unit clock, coupled to said control store, said decoding means and said first means, said unit clock for generating unit clock cycles used by said microprogrammed processing unit during the execution of said microinstruction words wherein one of said microinstruction words is executed during one of said unit clock cycles and wherein said second means is coupled to said unit clock and operative to inhibit the generation of a next one of said unit clock cycles thereby bringing said microprogrammed processing unit to an orderly halt at the end of the execution of said current one of said microinstruction words.

3. A system as in claim 2 wherein said diagnostic system further comprises:

A. fourth means, included in said third means and coupled to said second means, for generating refresh signals, said refresh signals combined with memory signals generated by said third means form said refresh commands; and B. first switch means, included in said second means and coupled to said fourth means and said unit clock, for initiating the generation of said refresh signals by said fourth means and for inhibiting the generation of said next one of said unit clock cycles by said unit clock when said first switch means is in a first state.

4. A system as in claim 3 wherein said diagnostic system further comprises a fifth means, included in said second means and coupled to said first switch means, for enabling the generation of said next one of said unit clock cycles when said first switch means is in a second state thereby permitting the execution of said next one of said microinstruction words by said microprogrammed processing unit.

5. A system as in claim 4 wherein each of said unit clock cycles has N phases each having an associated phase signal, said unit clock being inhibited at the end of an Nth phase of said N phases such that none of said phase signals is in an active state when said unit clock is inhibited and said microprogrammed processing unit being clocked only when one of said phase signals is in said active state.

6. A system as in claim 5 wherein each of said unit clock cycles has N phases each having an associated phase signal, said unit clock being inhibited at the end of an Nth phase of said N phases such that none of said phase signals is in an active state when said unit clock is inhibited and said microprogrammed processing unit being clocked only when one of said phase signals is in said active state.

7. A system as in claim 5 wherein said unit clock comprises:

A. an oscillator means;
B. a multiposition shift register, coupled to said oscillator means, said shift register having at least N shift positions, each of said N shift positions having an output for producing said associated phase signal of said N phases of each of said unit clock cycles; and
C. an AND gate with inverted inputs, coupled to said shift register, said AND gate inverted inputs coupled to a first N−1 outputs of said shift register and an output of said AND gate coupled to a data input of said shift register and an Nth input of said AND gate coupled to said fifth means and wherein said fifth means further comprises:
A. step switch means; and
B. a bistable means, an input of said bistable means coupled to an output of said step switch means and an output of said bistable means coupled to said Nth input of said AND gate such that the pressing of said step switch means will result in said bistable means changing state and the enabling of said AND gate and thereby permit the generation of said next one of said unit clock cycles.

8. A system as in claim 4, said microprogrammed processing unit being included in a central processing unit (CPU) within a data processing system, said rechargeable memory being a main memory used for the storage of software instructions, said CPU being coupled to said main memory by a common bus, one or more input/output controllers (IOCs) being coupled to said CPU and said main memory by said common bus, the transfer of information between said one or more IOCs and said CPU taking place in a single step mode of operation during which a single one of said microinstruction words is executed during a single one of said unit clock cycles without loss of information, the transfer of information from said main memory to said CPU taking place in said single step mode of operation without the loss of information, a memory cycle of said main memory comprising two of said unit clock cycles, and wherein said diagnostic system further comprises a sixth means, included in said second means and coupled to said fifth means, said sixth means for controlling said fifth means such that said fifth means will enable the generation of said next one of said unit clock cycles only during periods of time in which any memory refresh operation performed by said rechargeable memory in response to said memory refresh commands generated by said third means or by said first means will have completed, thereby insuring that the execution of said next one of said microinstruction words will not interfere with a memory refresh operation.

* * * * *